(12) United States Patent
Yoshimura et al.

(10) Patent No.: US 6,684,007 B2
(45) Date of Patent: Jan. 27, 2004

(54) OPTICAL COUPLING STRUCTURES AND THE FABRICATION PROCESSES

(75) Inventors: Tetsuzo Yoshimura, Tokyo (JP); Yasuhito Takahashi, Nagano (JP); James Roman, Sunnyvale, CA (US); Mark Thomas McCormack, Livermore, CA (US); Solomon I. Beilin, San Carlos, CA (US); Wen-chou Vincent Wang, Cupertino, CA (US); Masaaki Inao, Machida (JP)

(73) Assignee: Fujitsu Limited, Kawasaki (JP)

( * ) Notice: Subject to any disclaimer, the term of this patent is extended or adjusted under 35 U.S.C. 154(b) by 310 days.

(21) Appl. No.: 09/853,449

(22) Filed: May 9, 2001

(65) Prior Publication Data

US 2002/0028045 A1 Mar. 7, 2002

Related U.S. Application Data

(63) Continuation-in-part of application No. 09/574,422, filed on May 19, 2000, which is a continuation-in-part of application No. 09/295,628, filed on Apr. 20, 1999, said application No. 09/574,422, is a continuation-in-part of application No. 09/295,813, filed on Apr. 20, 1999, and a continuation-in-part of application No. 09/295,431, filed on Apr. 20, 1999.
(60) Provisional application No. 60/103,726, filed on Oct. 9, 1998.

(51) Int. Cl.[7] .................................................. G02B 6/26
(52) U.S. Cl. ............................................ 385/31; 385/50
(58) Field of Search ................................ 385/31, 50, 2, 385/8, 12, 13, 14, 15, 27, 34, 53, 58, 70, 73, 88–89, 129, 130

(56) References Cited

U.S. PATENT DOCUMENTS

| | | | |
|---|---|---|---|
| 3,872,236 A | 3/1975 | Swengel, Sr. et al. | 174/251 |
| 4,007,978 A | 2/1977 | Holton | 350/96 |
| 4,114,257 A | 9/1978 | Bellavance | 29/572 |
| 4,240,849 A | 12/1980 | Kurokawa et al. | 156/73.2 |

(List continued on next page.)

FOREIGN PATENT DOCUMENTS

EP 0 617 314 A1 9/1993 ........... G02F/1/313

(List continued on next page.)

OTHER PUBLICATIONS

U.S. patent application Ser. No. 09/192,003, Jiang et al., filed Nov. 13, 1998.

U.S. patent application Ser. No. 09/203,126, McCormack et al., filed Dec. 1, 1998.

(List continued on next page.)

Primary Examiner—Frank G. Font
Assistant Examiner—Kaveh C Kianni
(74) Attorney, Agent, or Firm—Sheppard Mullin Richter & Hampton LLP

(57) ABSTRACT

An optical apparatus including an optical substrate having an embedded waveguide and an optical device adapted to receive light transmitted from an end of the waveguide. The optical apparatus includes a coupling structure for coupling the optical device to the substrate. The coupling structure has a thin metallic layer with an aperture. At least a portion of the optical device is disposed in the aperture. A method for making an optical apparatus comprising forming an optical substrate having a waveguide embedded therein; depositing a metal layer over an end of the waveguide; and depositing a polymeric layer over the metal layer. An aperture is formed in the metal layer and in the polymeric layer by removing a portion of the metal layer and a portion of the polymeric layer disposed over the end of the waveguide. The method for making an optical apparatus also comprises inserting at least a portion of an optical device within the aperture so that the optical device is positioned to receive light from the first end of the waveguide.

4 Claims, 149 Drawing Sheets

U.S. PATENT DOCUMENTS

| | | |
|---|---|---|
| 4,609,252 A | 9/1986 | Wong et al. ............. 350/96.12 |
| 4,630,883 A | 12/1986 | Taylor et al. ............ 350/96.15 |
| 4,749,245 A | 6/1988 | Kawatsuki et al. ...... 350/96.12 |
| 4,750,799 A | 6/1988 | Kawachi et al. ......... 350/96.11 |
| 4,755,866 A | 7/1988 | Marshall et al. .............. 357/81 |
| 4,756,627 A * | 7/1988 | Nelson ....................... 374/159 |
| 4,762,381 A | 8/1988 | Uemiya et al. .......... 350/96.11 |
| 4,776,661 A | 10/1988 | Handa ..................... 350/96.19 |
| 4,787,691 A | 11/1988 | Lorenzo et al. .......... 350/96.14 |
| 4,805,038 A | 2/1989 | Seligson ..................... 385/116 |
| 4,806,454 A | 2/1989 | Yoshida et al. ............. 430/321 |
| 4,871,224 A | 10/1989 | Karstensen et al. ...... 350/96.15 |
| 4,892,374 A | 1/1990 | Ackerman et al. ............ 385/14 |
| 4,969,712 A | 11/1990 | Westwood et al. ............ 385/14 |
| 5,009,476 A | 4/1991 | Reid et al. ................ 359/96.11 |
| 5,054,870 A | 10/1991 | Losch et al. .................. 385/14 |
| 5,054,872 A | 10/1991 | Fan et al. ................... 385/130 |
| 5,059,475 A | 10/1991 | Sun et al. ................... 428/195 |
| 5,061,028 A | 10/1991 | Khanarian et al. .......... 385/132 |
| 5,091,045 A * | 2/1992 | Froning et al. ............... 216/24 |
| 5,104,771 A | 4/1992 | Murray et al. .............. 430/290 |
| 5,116,461 A | 5/1992 | Lebby et al. ............... 156/643 |
| 5,159,700 A | 10/1992 | Reid et al. .................... 385/14 |
| 5,170,448 A | 12/1992 | Ackley et al. ................ 385/31 |
| 5,179,601 A | 1/1993 | Gotoh et al. .................. 385/14 |
| 5,192,716 A | 3/1993 | Jacobs ........................ 437/209 |
| 5,194,548 A | 3/1993 | Yoshimura .................. 529/285 |
| 5,208,879 A | 5/1993 | Gallo et al. ................... 385/14 |
| 5,208,892 A | 5/1993 | Burack et al. .............. 385/129 |
| 5,219,710 A | 6/1993 | Horn et al. ................. 430/270 |
| 5,219,787 A | 6/1993 | Carey et al. ................ 437/187 |
| 5,220,628 A | 6/1993 | Delbare et al. ............... 385/14 |
| 5,237,434 A | 8/1993 | Feldman et al. .............. 359/19 |
| 5,247,593 A | 9/1993 | Lin et al. ...................... 385/17 |
| 5,249,245 A | 9/1993 | Lebby et al. ................. 385/89 |
| 5,258,236 A | 11/1993 | Arjavalingam et al. ..... 428/626 |
| 5,263,111 A | 11/1993 | Nurse et al. ................ 385/130 |
| 5,268,973 A | 12/1993 | Jenevein ...................... 385/74 |
| 5,291,567 A | 3/1994 | Revelli et al. ................ 385/14 |
| 5,317,657 A | 5/1994 | Gallo et al. ................... 385/14 |
| 5,332,690 A | 7/1994 | Cho et al. ................... 437/126 |
| 5,334,804 A | 8/1994 | Love et al. .................. 174/267 |
| 5,352,566 A | 10/1994 | Springer et al. ............ 430/321 |
| 5,358,896 A | 10/1994 | Komatsu et al. .............. 437/89 |
| 5,371,818 A | 12/1994 | Presby ........................ 385/49 |
| 5,375,184 A | 12/1994 | Sullivan ...................... 385/129 |
| 5,394,490 A | 2/1995 | Kato et al. .................... 385/14 |
| 5,416,861 A | 5/1995 | Koh et al. ..................... 385/14 |
| 5,428,698 A | 6/1995 | Jenkins et al. ................ 385/27 |
| 5,444,811 A | 8/1995 | Yoshimura et al. ......... 385/141 |
| 5,459,232 A | 10/1995 | Sotoyama et al. .......... 528/353 |
| 5,465,860 A | 11/1995 | Fujimoto et al. ............. 216/24 |
| 5,469,518 A | 11/1995 | Song et al. ................... 385/89 |
| 5,488,682 A | 1/1996 | Sauter et al. ................. 385/53 |
| 5,500,540 A | 3/1996 | Jewell et al. ................. 257/82 |
| 5,513,021 A | 4/1996 | Kaneshiro et al. ............ 359/15 |
| 5,513,283 A | 4/1996 | Whang et al. ................ 385/14 |
| 5,521,992 A | 5/1996 | Chun et al. ................... 385/14 |
| 5,525,190 A | 6/1996 | Wojnarowski et al. ...... 358/133 |
| 5,541,039 A | 7/1996 | McFarland et al. ......... 430/290 |
| 5,546,480 A | 8/1996 | Leonard ........................ 385/3 |
| 5,555,326 A | 9/1996 | Hwang et al. ................. 385/2 |
| 5,561,733 A | 10/1996 | Ermer et al. ................ 385/143 |
| 5,562,838 A | 10/1996 | Wojnarowski et al. ........ 216/24 |
| 5,568,574 A | 10/1996 | Tanguay, Jr. et al. ......... 385/14 |
| 5,581,646 A | 12/1996 | Tsukatmoto et al. .......... 385/96 |
| 5,594,093 A | 1/1997 | Sotoyama et al. .......... 528/353 |
| 5,611,008 A | 3/1997 | Yap ............................. 385/14 |
| 5,621,837 A | 4/1997 | Yamada et al. ................ 385/88 |
| 5,638,469 A | 6/1997 | Feldman et al. .............. 385/14 |
| 5,652,811 A | 7/1997 | Cook et al. .................... 385/14 |
| 5,658,966 A | 8/1997 | Tsukamoto et al. ........... 522/99 |
| 5,659,648 A | 8/1997 | Knapp et al. ................ 385/129 |
| 5,708,178 A | 1/1998 | Ermer et al. ............... 546/276.7 |
| 5,723,176 A | 3/1998 | Keyworth et al. ........ 427/163.2 |
| 5,751,867 A | 5/1998 | Schaffner et al. ............... 385/3 |
| 5,757,989 A | 5/1998 | Yoshimura et al. ........... 358/14 |
| 5,761,350 A | 6/1998 | Koh ............................ 385/14 |
| 5,764,820 A | 6/1998 | De Dobbelaere et al. ..... 385/14 |
| 5,770,466 A | 6/1998 | Sasaki et al. .................. 437/89 |
| 5,770,851 A | 6/1998 | Park et al. ................. 250/208.1 |
| 5,796,883 A | 8/1998 | Hamamoto et al. ........... 358/14 |
| 5,801,439 A | 9/1998 | Fujisawa et al. ............. 257/686 |
| 5,817,541 A | 10/1998 | Averkiou et al. ............ 438/107 |
| 5,818,983 A | 10/1998 | Yoshimura et al. ........... 385/14 |
| 5,835,646 A | 11/1998 | Yoshimura et al. ........... 385/14 |
| 5,854,868 A | 12/1998 | Yoshimura et al. ........... 385/50 |
| 5,902,715 A | 5/1999 | Tsukamoto et al. ......... 430/290 |
| 5,917,980 A | 6/1999 | Yoshimura et al. ......... 385/129 |
| 5,980,831 A | 11/1999 | Braiman et al. .............. 385/12 |
| 6,017,681 A | 1/2000 | Tsukamoto et al. ......... 430/321 |
| 6,031,945 A | 2/2000 | You et al. ..................... 385/14 |
| 6,054,761 A | 4/2000 | McCormack et al. ....... 257/698 |
| 6,091,879 A | 7/2000 | Chan et al. ................. 385/143 |
| 6,163,957 A | 12/2000 | Jiang et al. ................... 29/852 |
| 6,229,947 B1 | 5/2001 | Vawter et al. ................. 385/49 |

FOREIGN PATENT DOCUMENTS

| | | | |
|---|---|---|---|
| EP | 0-689 067 A2 | 6/1995 | |
| EP | 0 689 067 A2 | 6/1995 | ............ G02B/6/10 |
| JP | 7-077637 A | 3/1995 | |
| JP | 8-007626 A | 1/1996 | |
| JP | 8-008389 A | 1/1996 | |
| JP | 8-065251 A | 3/1996 | |
| JP | 8-069024 A | 3/1996 | |
| JP | 8-253758 A | 10/1996 | |
| JP | 8-262246 A | 10/1996 | |
| JP | 8-262265 A | 10/1996 | |
| JP | 8-262265 A | 10/1996 | |
| JP | 8-320422 A | 12/1996 | |
| JP | 9-157352 A | 4/1997 | |
| JP | 9-0090153 A | 6/1997 | |

OTHER PUBLICATIONS

"Lighting the Way in Computer Design," Circuits & Devices, Jan. 1998, © 1998 IEEE, pp. 23–30.

U.S. patent application Ser. No. 09/192,003, Jiang et al., filed Nov. 13, 1998.

U.S. patent application Ser. No. 09/203,126, McCormack et al., filed Dec. 1, 1998.

G. D. Boyd, et al., "Directional Reactive Ion Etching at Oblique Angles," Applied Physics Letters vol. 36, No. 7, pp. 583–585, Apr. 1, 1980.

Chang, Yablonovitch, et al., "Vapor Phase Epitaxial Liftoff Process of GaAs", Paper H10.1 of Session H10 of the Fall 1997 Materials Research Symposium, Abstract and private manuscript, 1997.

Norio Murata, "Adhesives for Optical Devices", the $48^{th}$ conference of the Electronic Components and Technology Conference (ECTC), pp. 1178–1185, Seattle, May 25–28, 1998.

Jianhua Gan, et al., "Integration of 45–degree Micro–couplers in Guided–wave Optical Clock Distribution System for Supercomputer," 1998 International Symposium on Microelectronics, San Diego, USA, Nov. 1, 1998, pp. 359–363.

Yoshimura, et al., "Optoelectronic Amplifier/Driver–Less Substrate ,OE–ADLES. For Polymer–Waveguide–Based Board Level Interconnection–Calculation Of Delay And Power Dissipation," the 8th Iketani Conference, $4^{th}$ International Conference On Organic Nonlinear Optics (ICONO'4), Oct. 12, 1998, Chitose, Hokkaido, Japan.

G. D. Boyd, et al., "Directional Reactive Ion Etching at Oblique Angles," Applied Physics Letters vol. 36, No. 7, pp. 583–585, Apr. 1, 1980.

Chang, Yablonovitch, et al., "Vapor Phase Epitaxial Liftoff Process of GaAs", Paper H10.1 of Session H10 of the Fall 1997 Materials Research Symposium, Abstract and private manuscript. 1997.

Norio Murata, "Adhesives for Optical Devices", the $48^{th}$ conference of the Electronic Components and Technology Conference (ECTC), pp. 1178–1185, Seattle, May 25–28, 1998.

Jianhua Gan, et al., "Integration of 45–degree Micro–couplers in Guided–wave Optical Clock Distribution System for Supercomputer," 1998 International Symposium on Microelectronics, San Diego, USA, Nov. 1, 1998, pp. 359–363.

Yoshimura, et al., "Optoelectronic Amplifier/Driver–Less Substrate ,OE–ADLES. For Polymer–Waveguide–Based Board Level Interconnection–Calculation Of Delay And Power Dissipation," the 8th Iketani Conference, $4^{th}$ International Conference On Organic Nonlinear Optics (ICONO'4), Oct. 12, 1998, Chitose, Hokkaido, Japan.

* cited by examiner

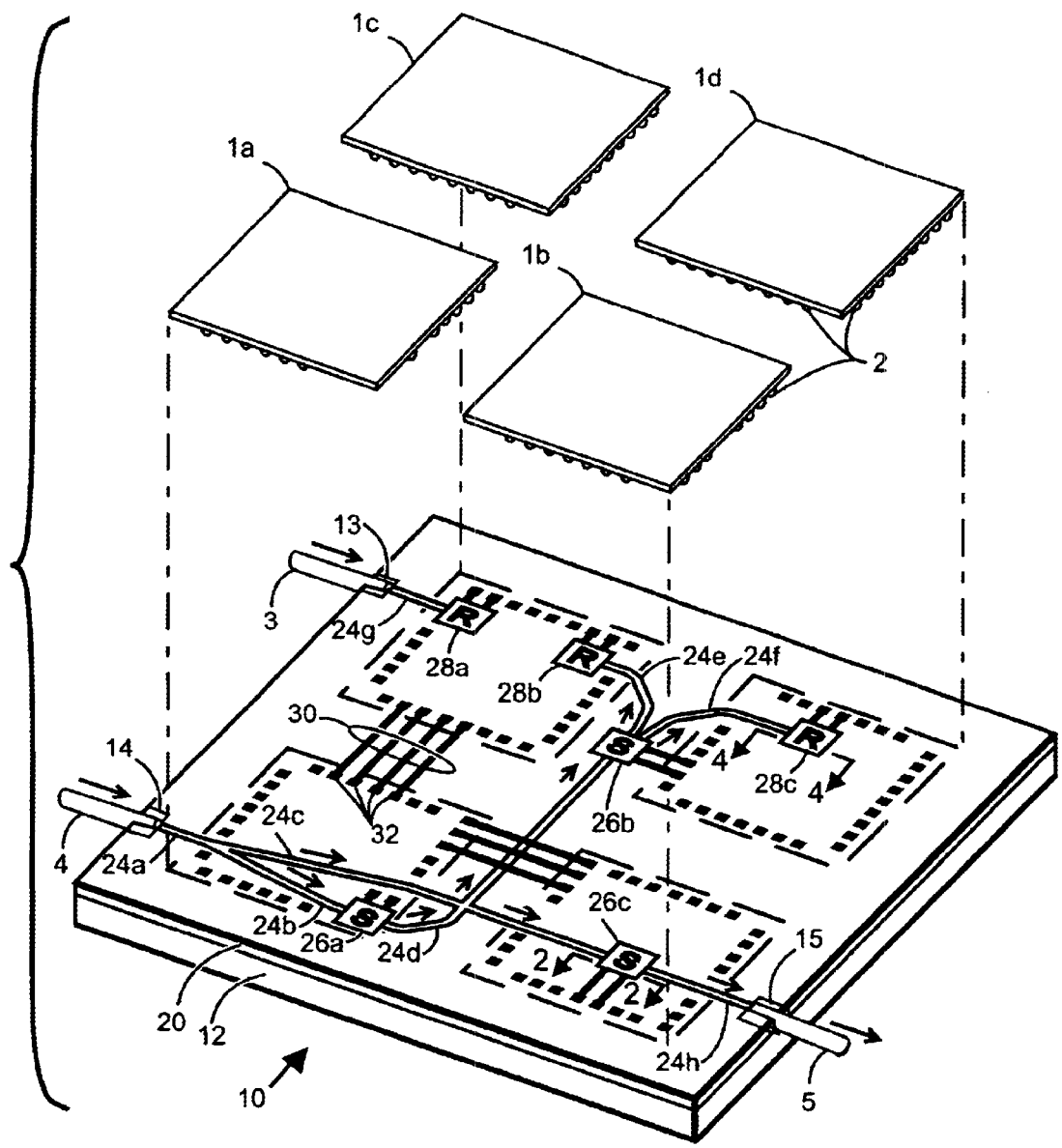
FIG._1

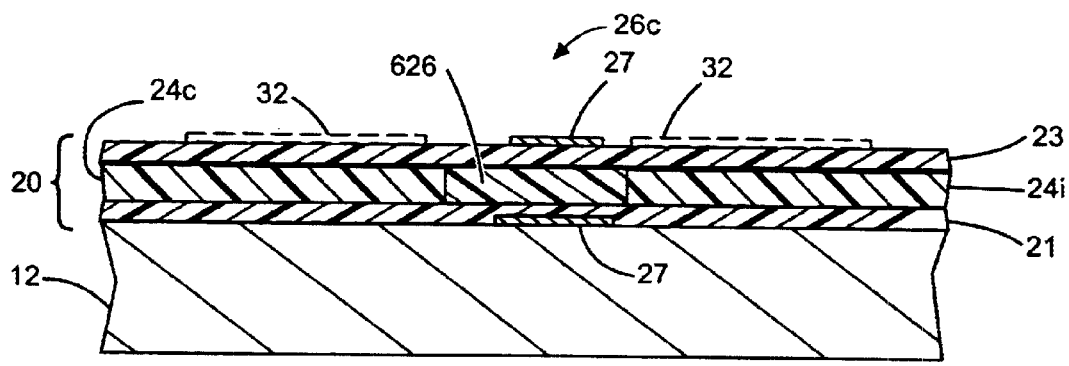
FIG._2
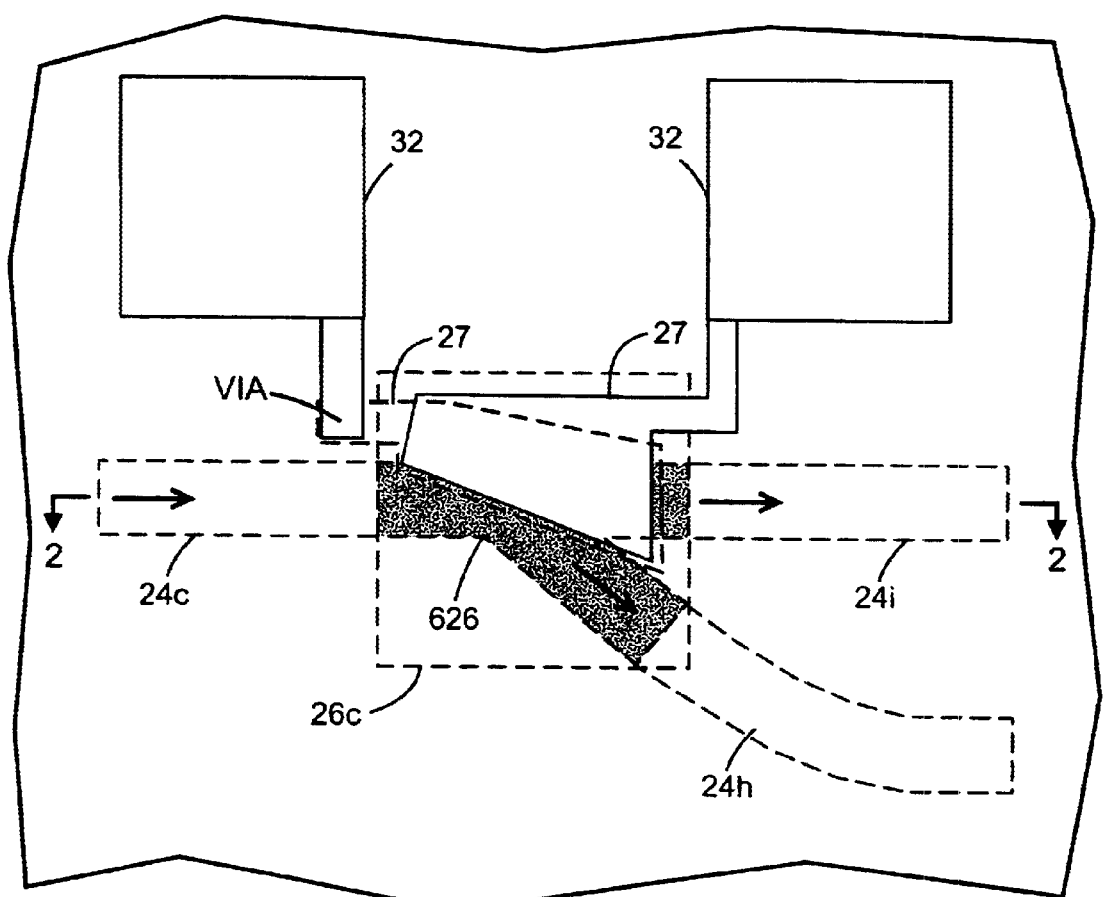
FIG._3

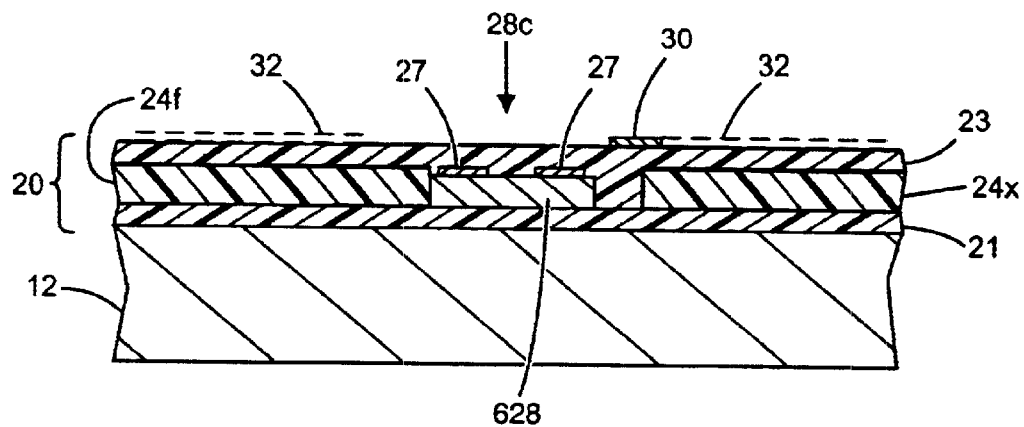
FIG._4-1
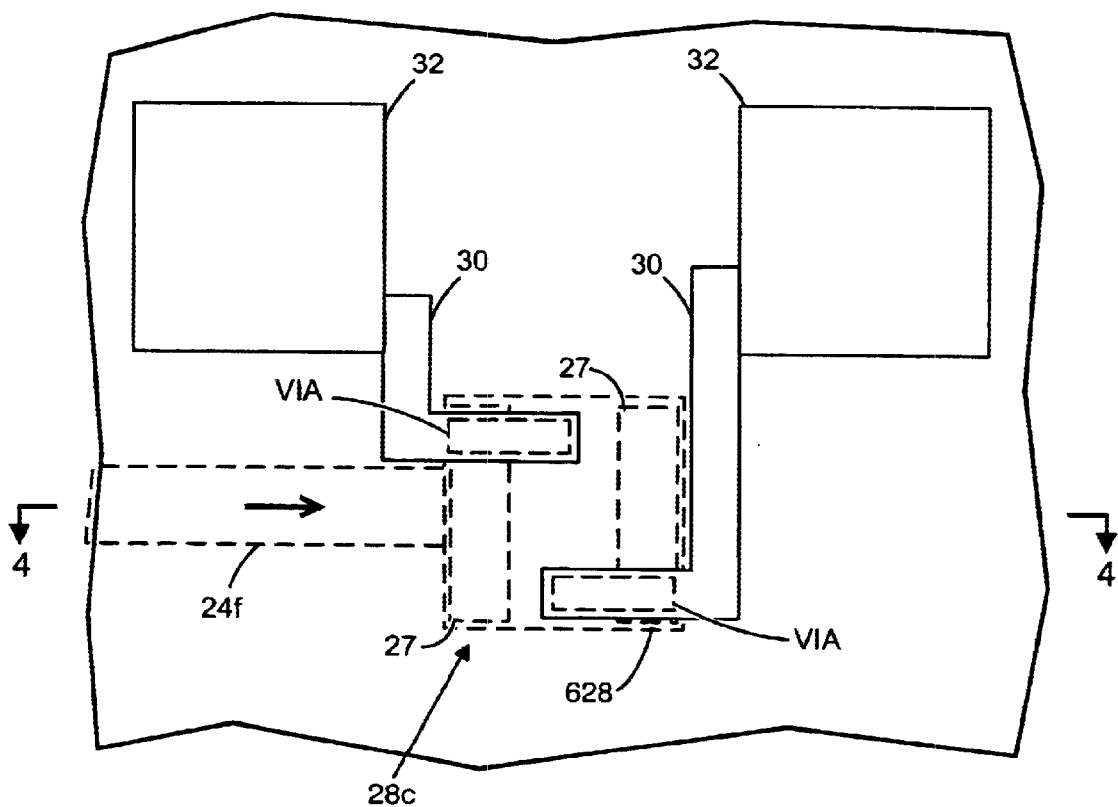
FIG._5-1

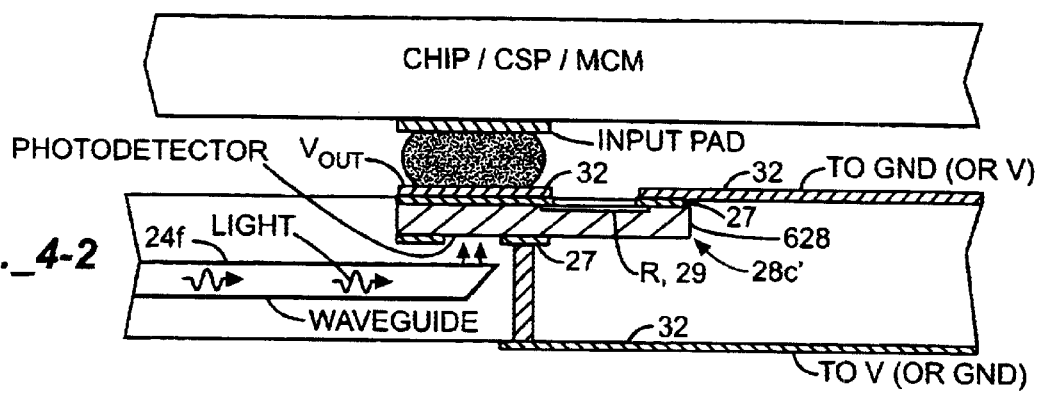
FIG._4-2
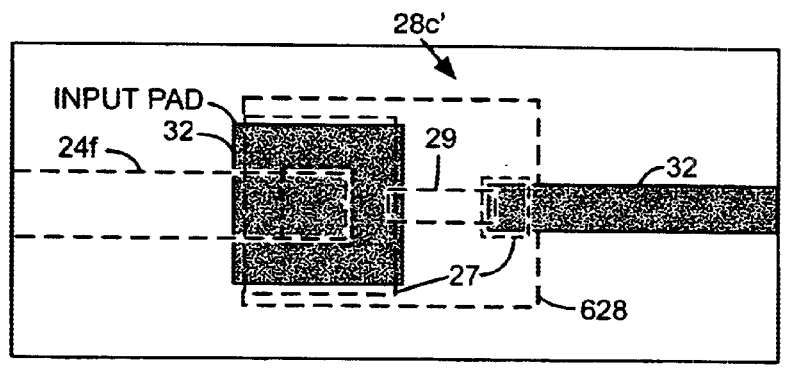
FIG._5-2
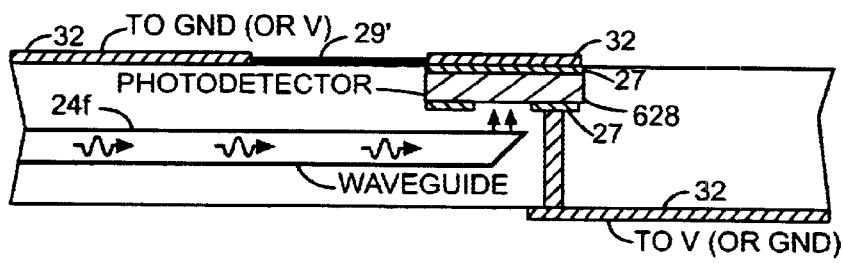
FIG._4-3
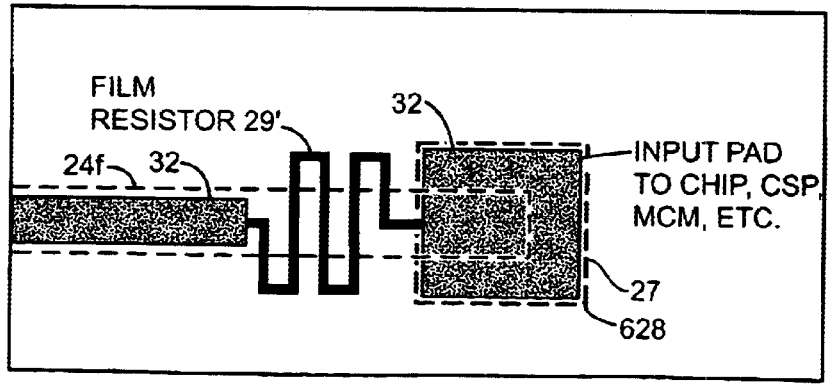
FIG._5-3

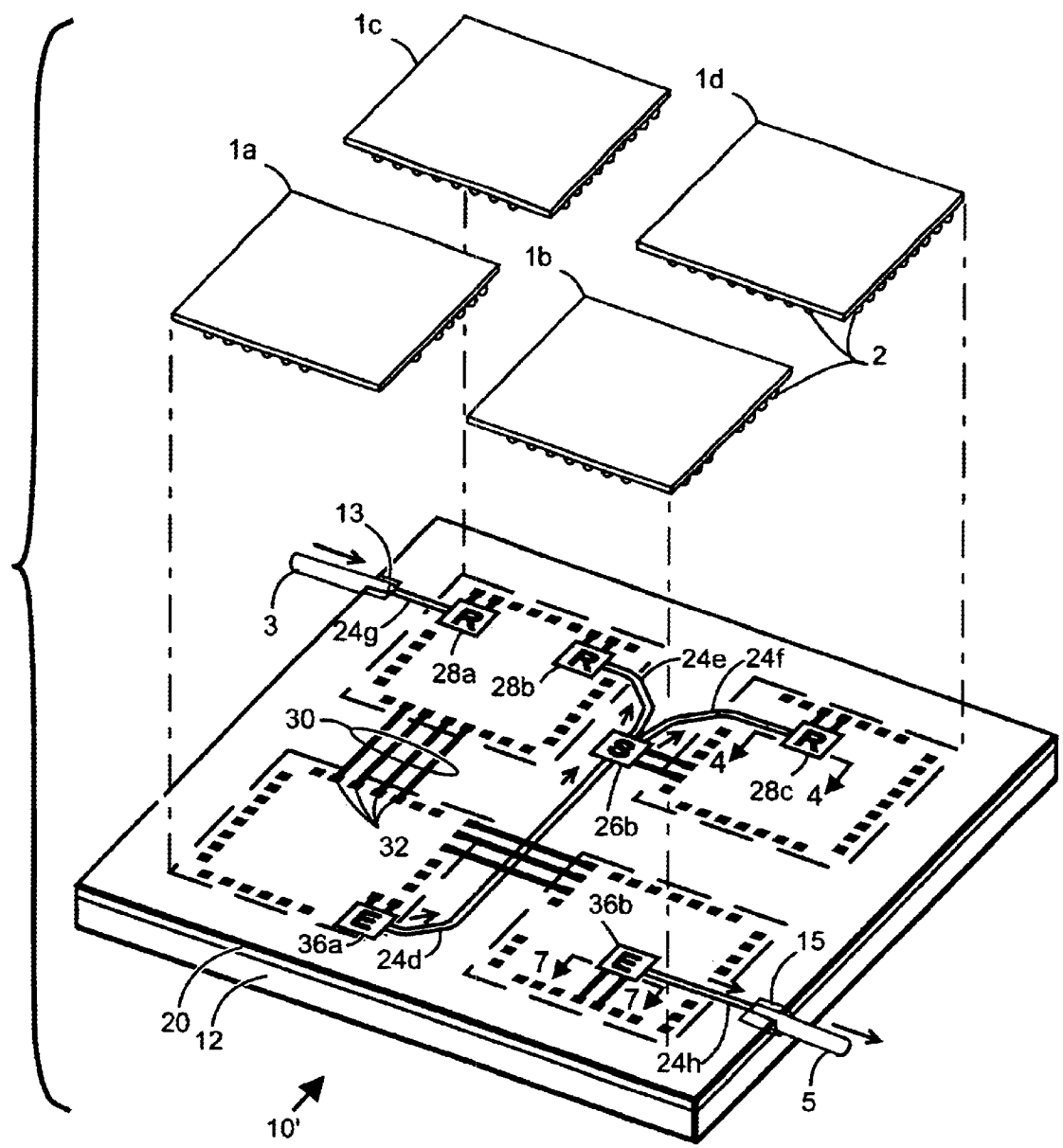
FIG._6

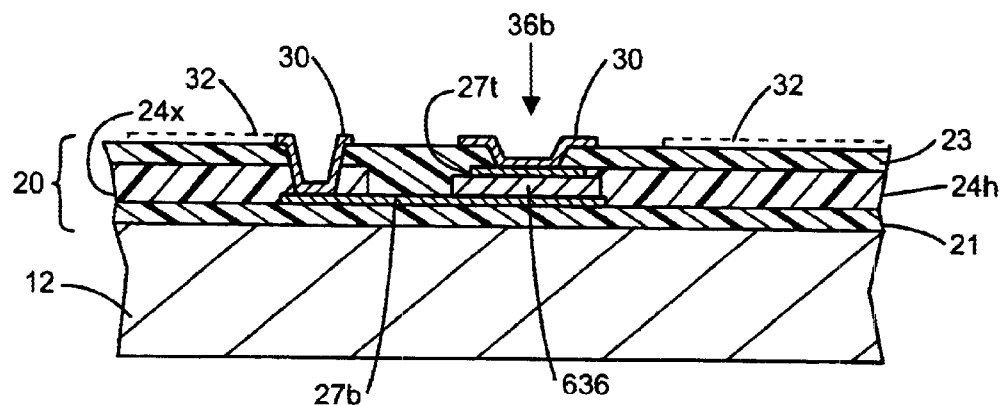
FIG._7
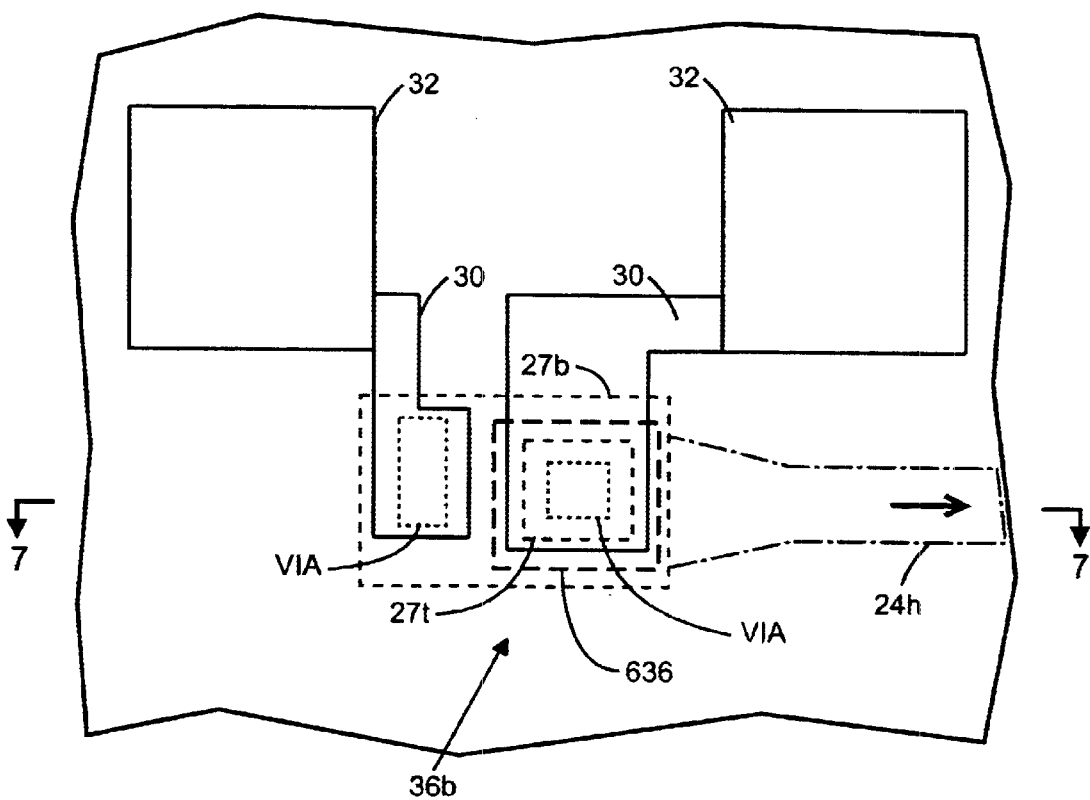
FIG._8

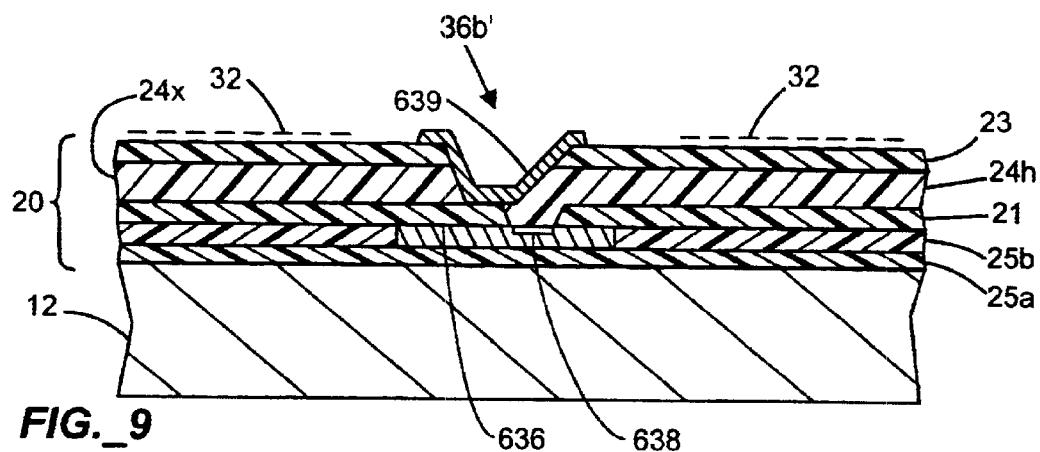
FIG._9
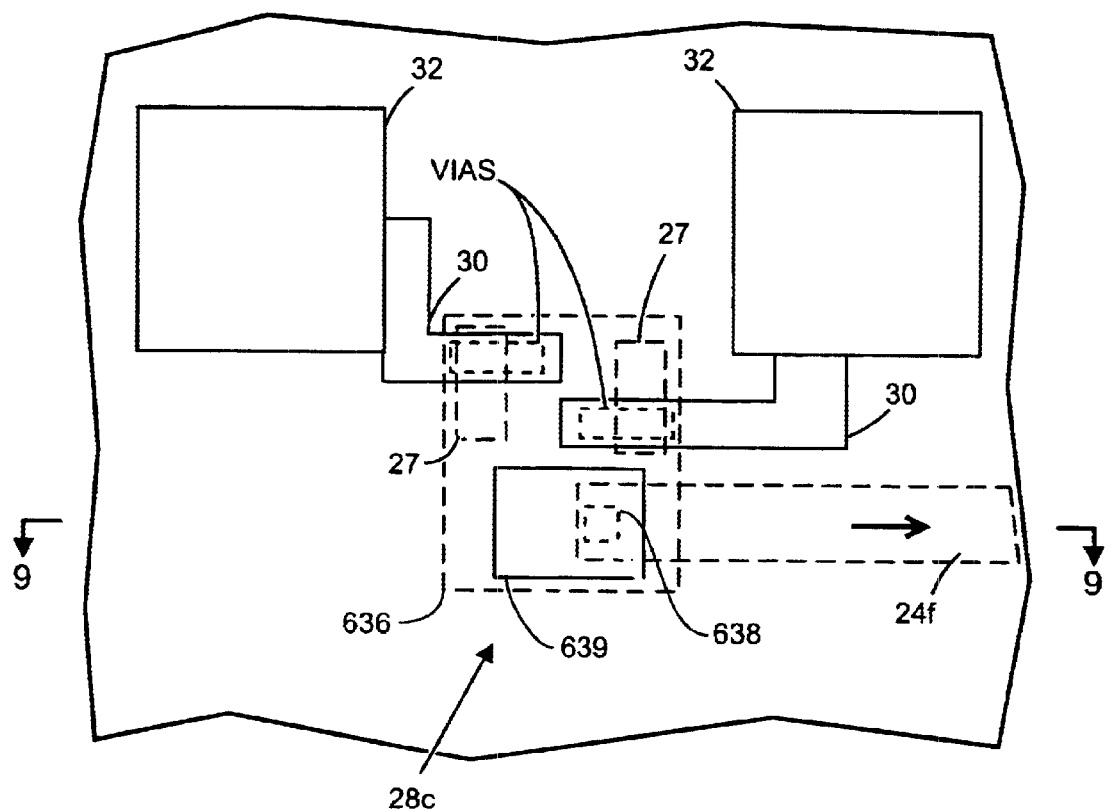
FIG._10

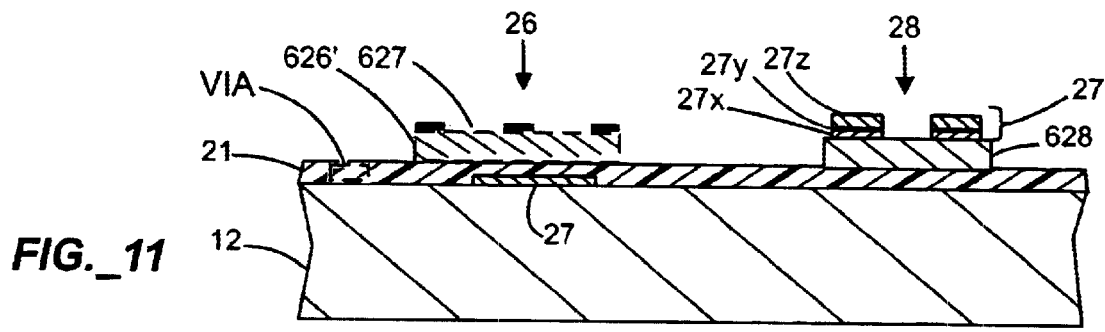
FIG._11
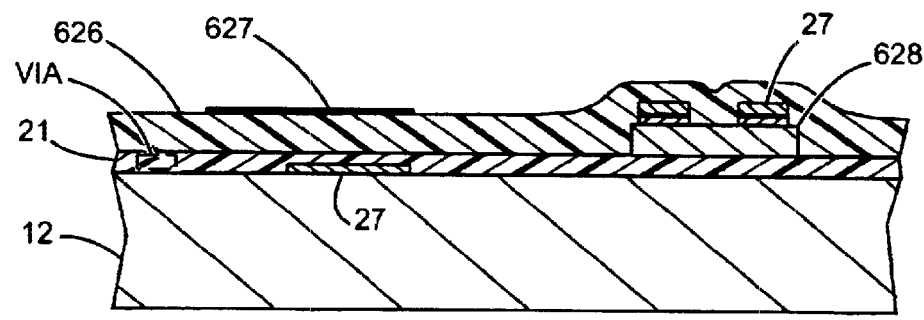
FIG._12
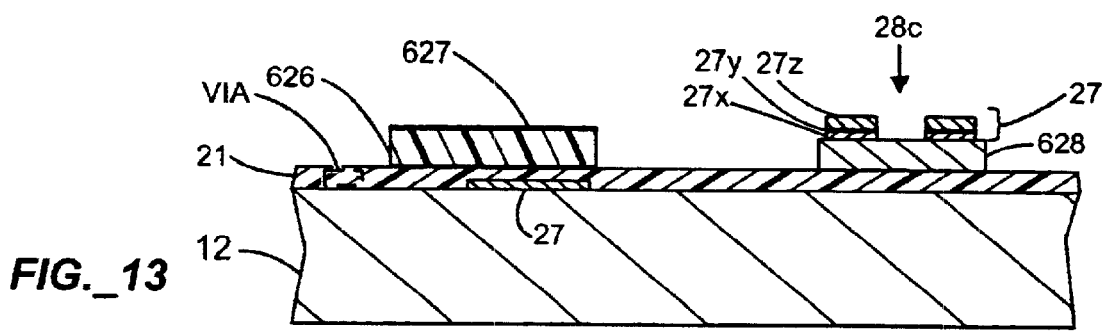
FIG._13
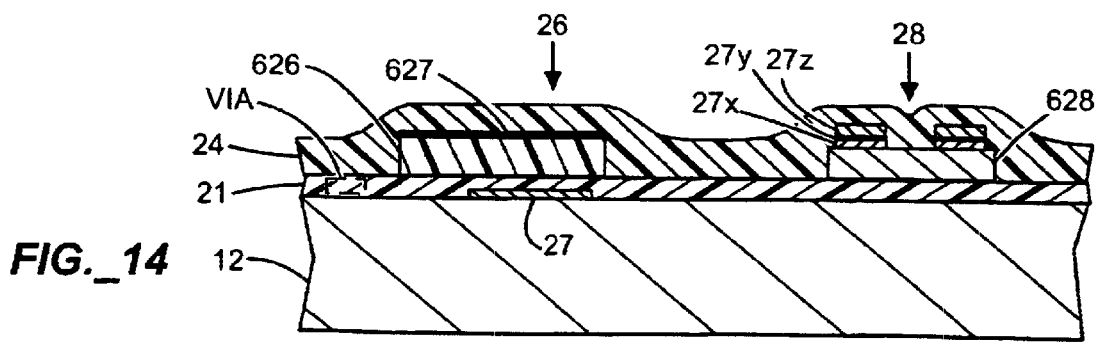
FIG._14

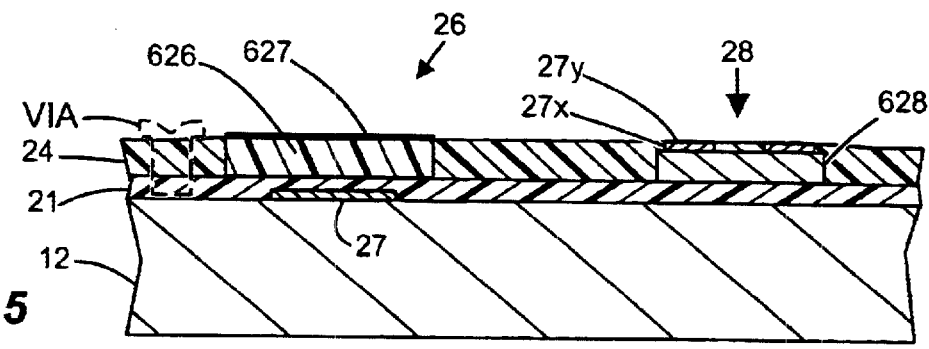
*FIG._15*
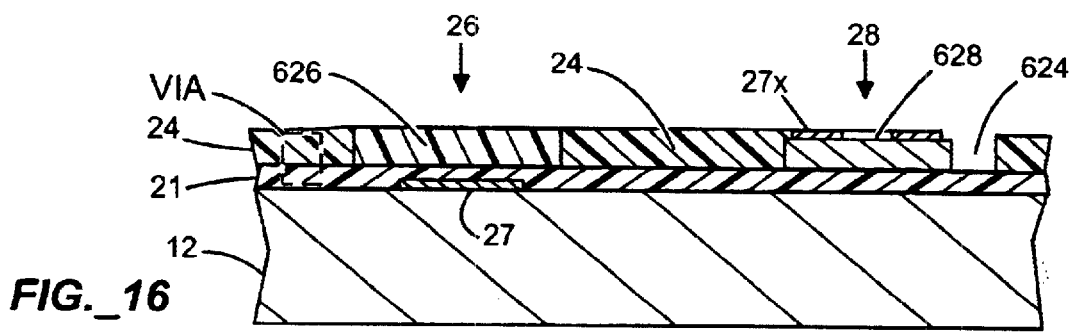
*FIG._16*
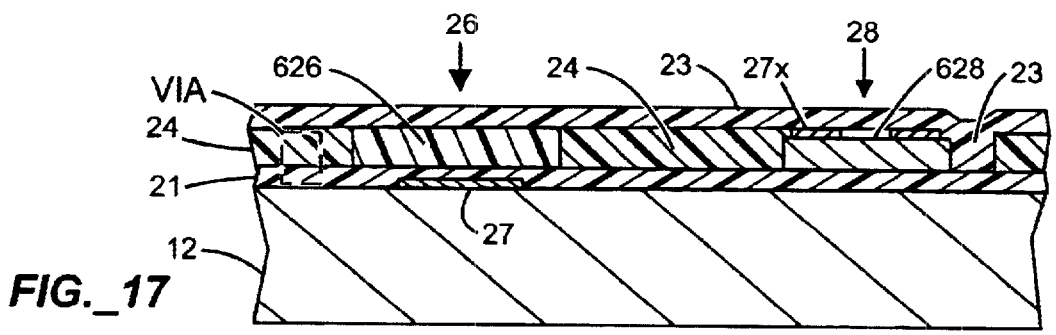
*FIG._17*
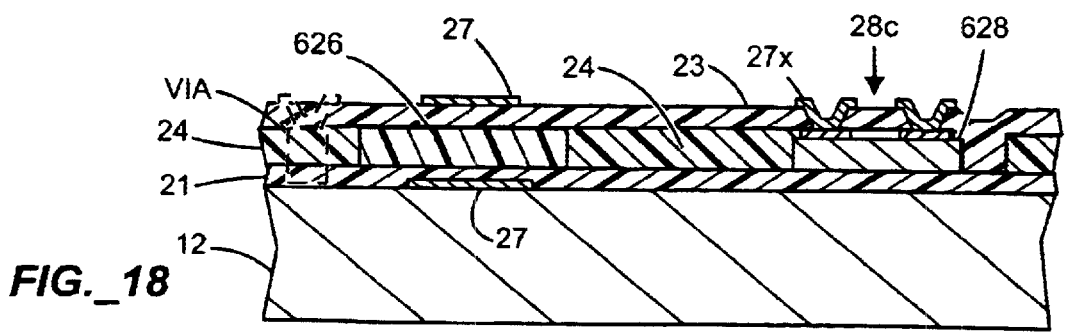
*FIG._18*

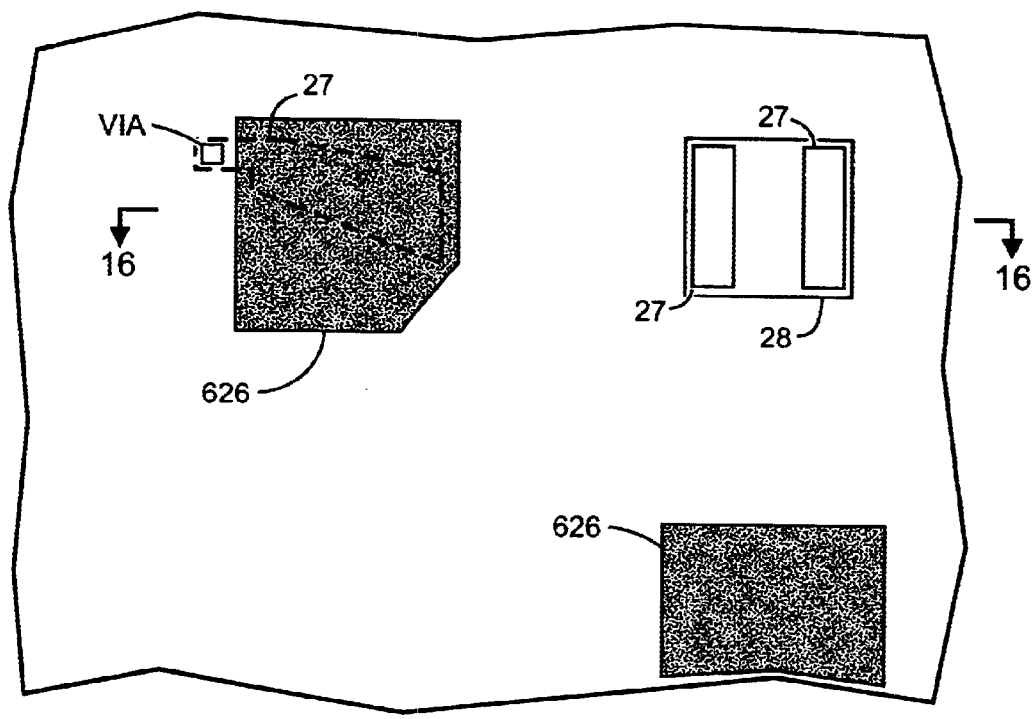
*FIG._19*
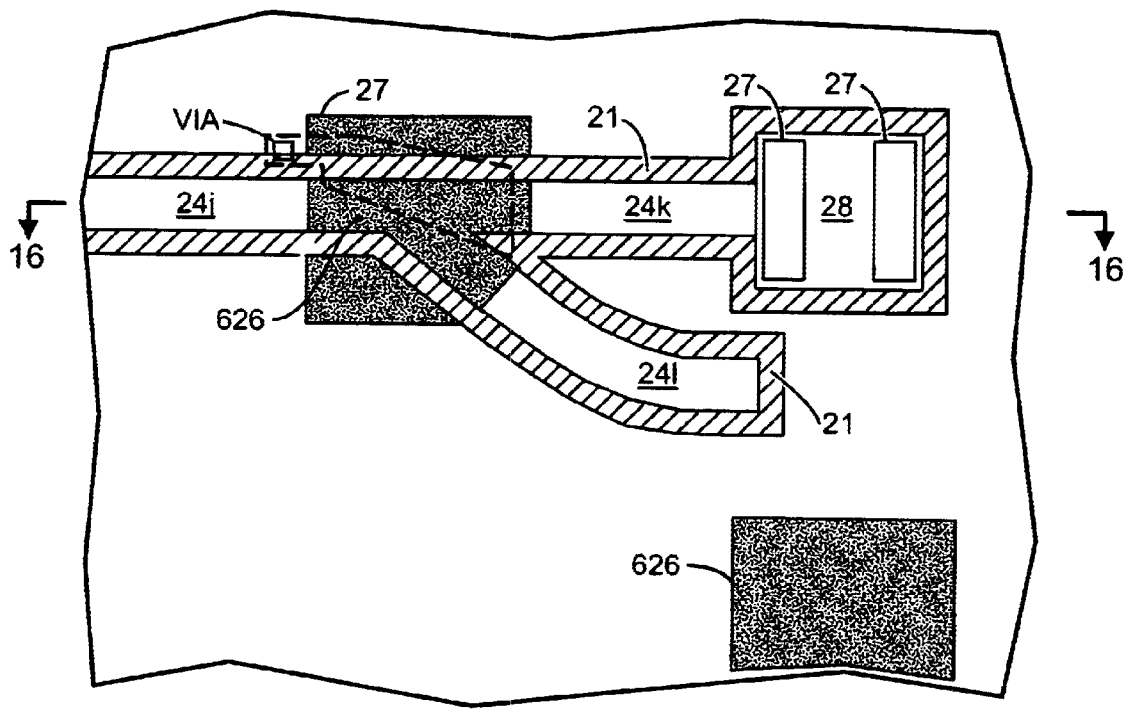
*FIG._20*

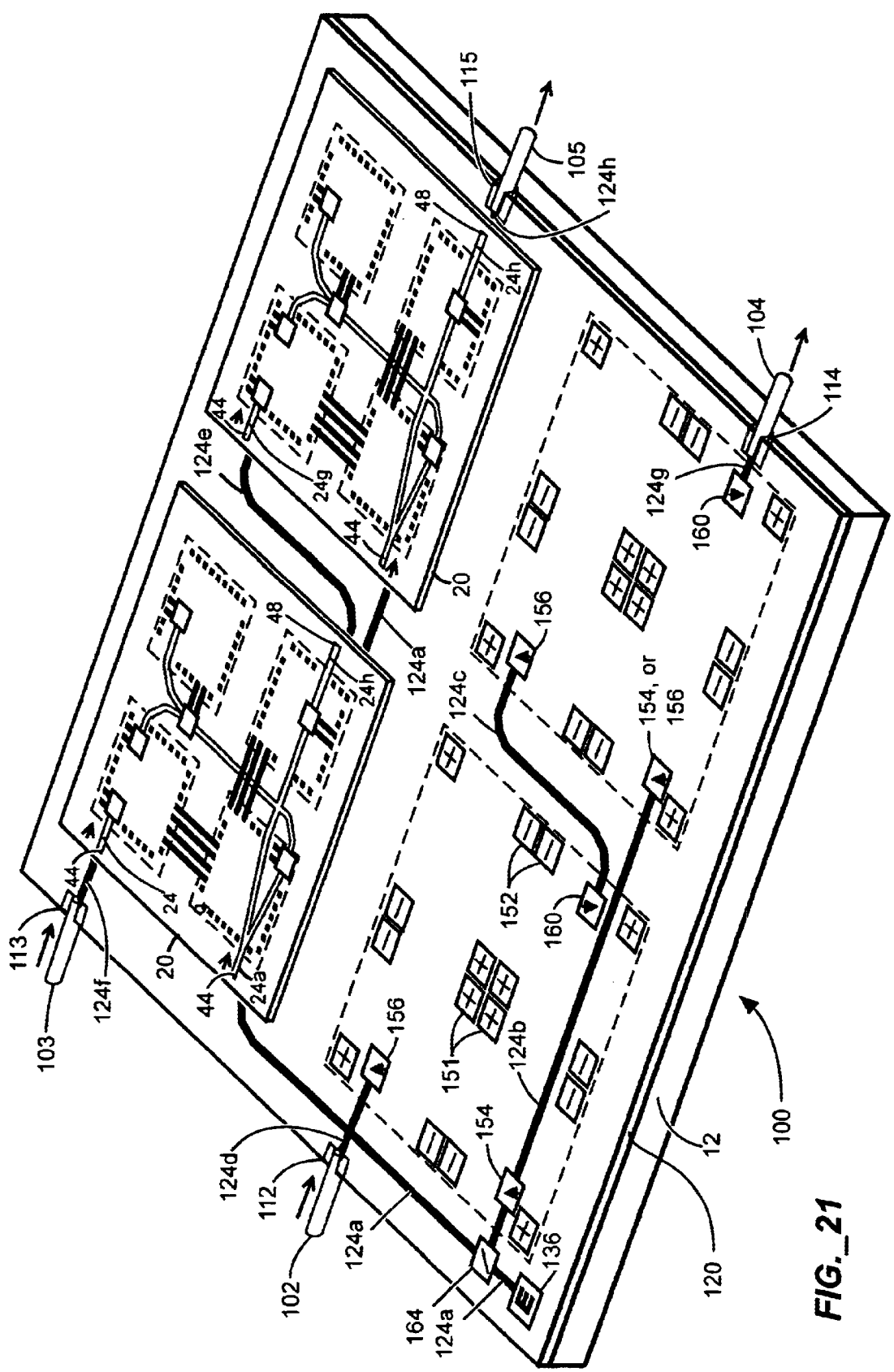
FIG._21

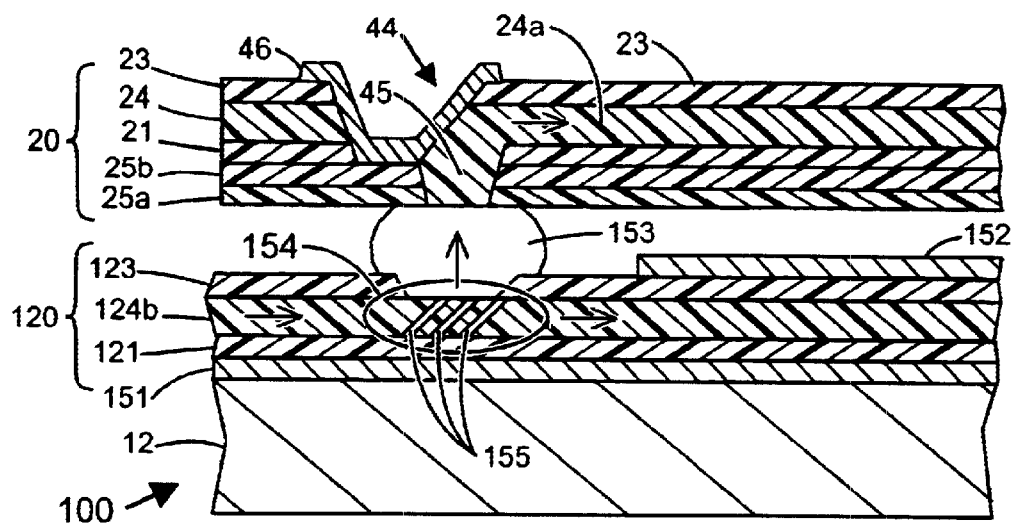
FIG._22
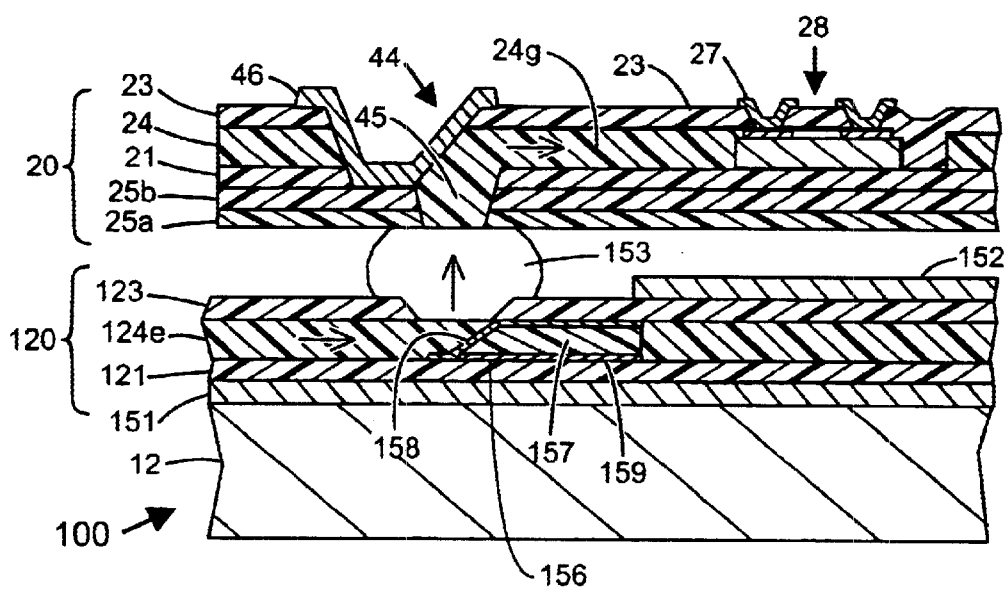
FIG._23

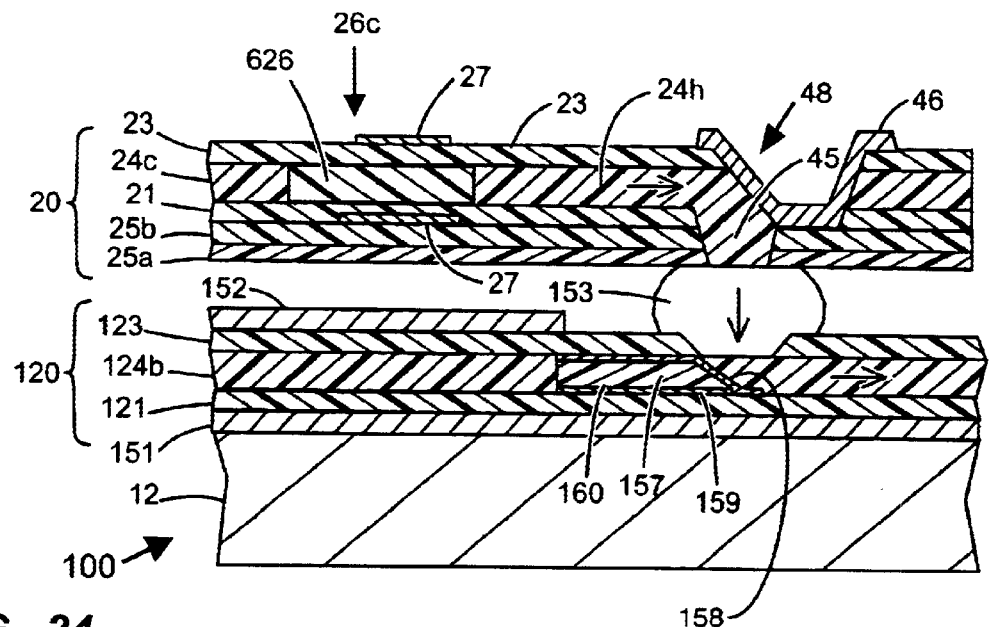
FIG._24
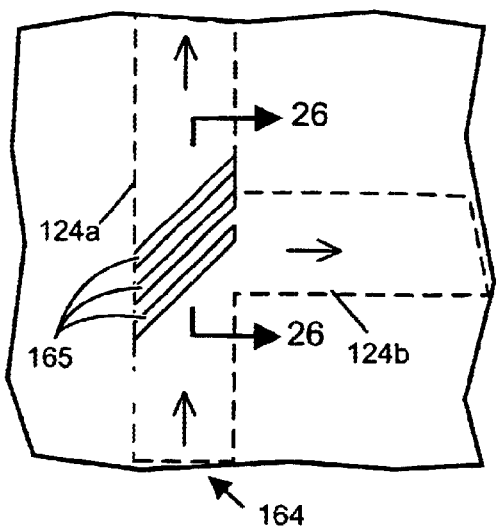
FIG._25
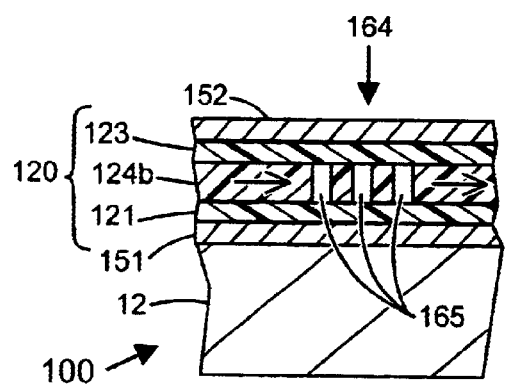
FIG._26

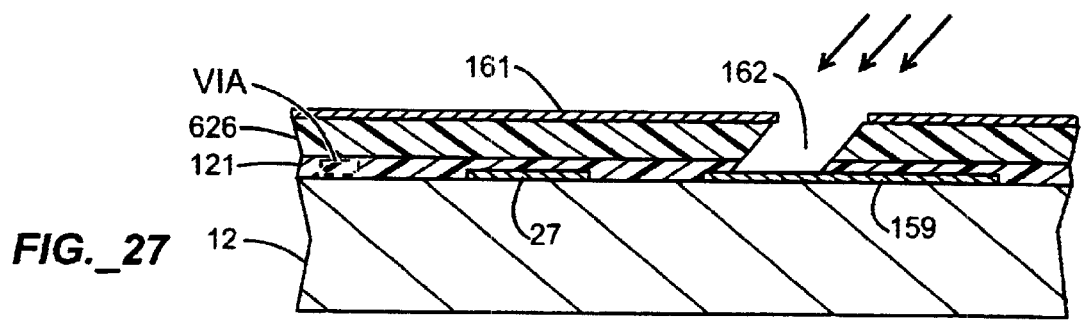
FIG._27
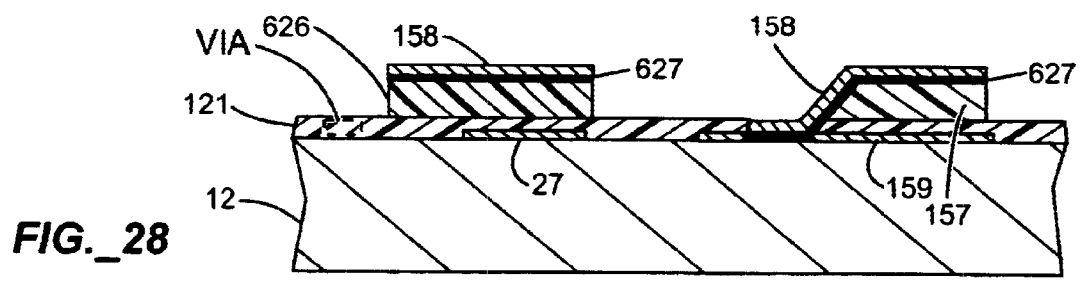
FIG._28
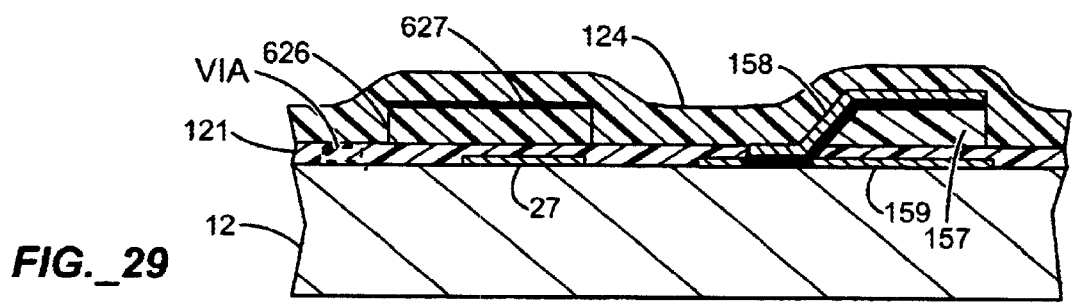
FIG._29
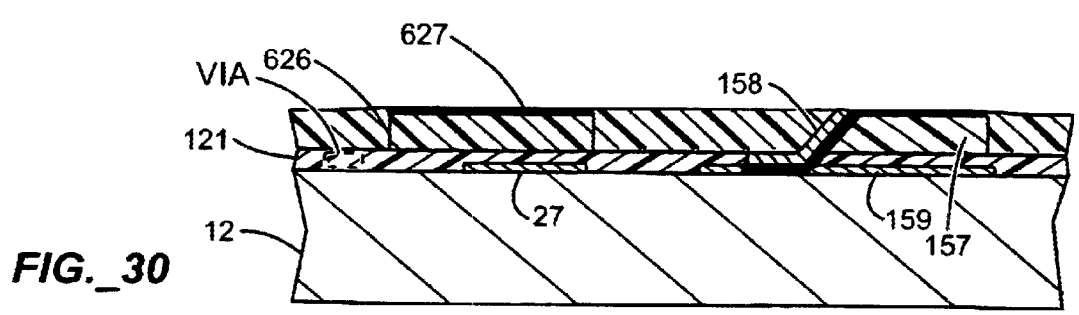
FIG._30

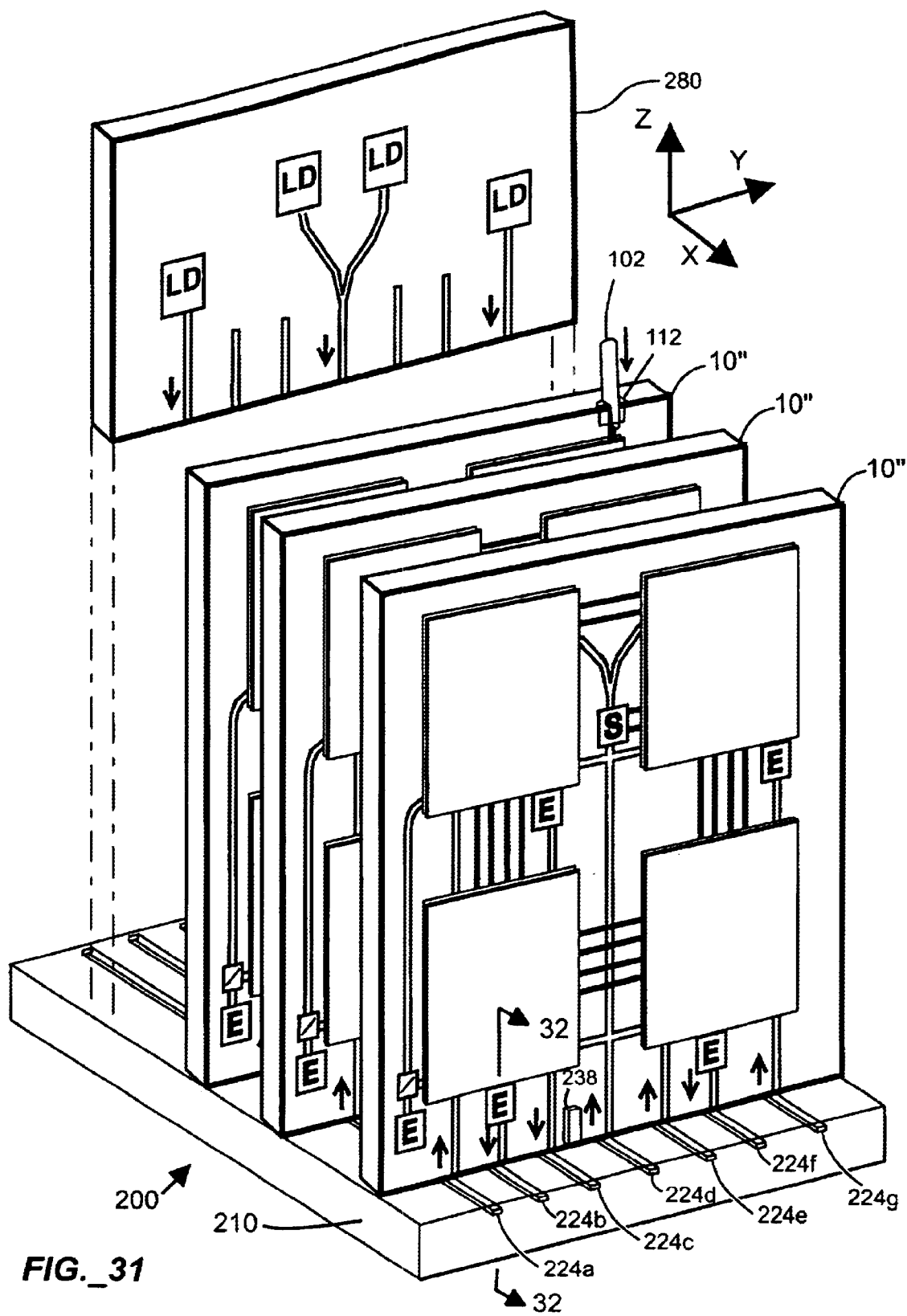
FIG._31

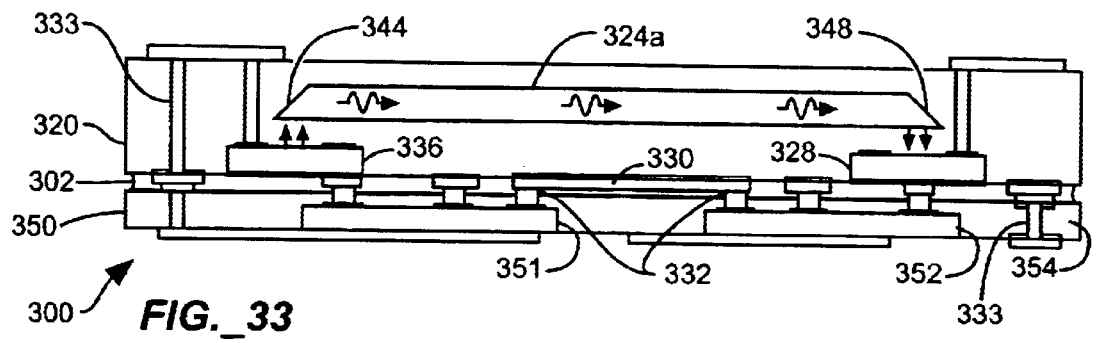
FIG._33
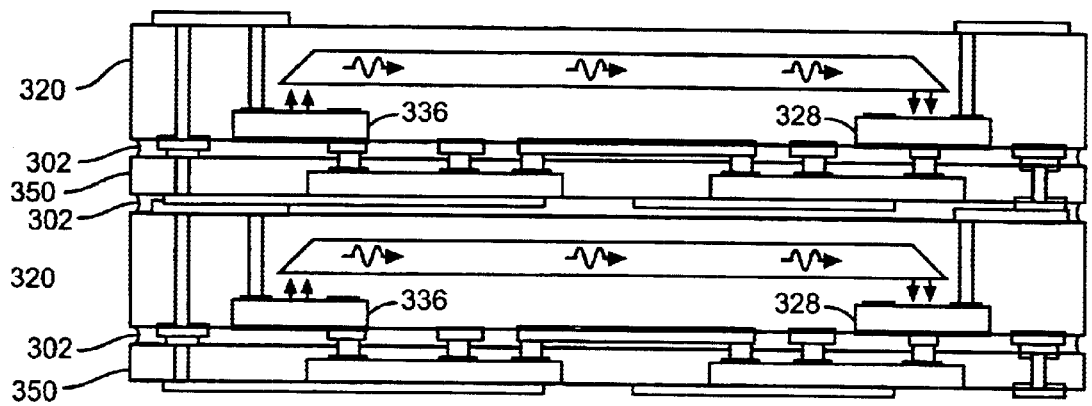
FIG._34
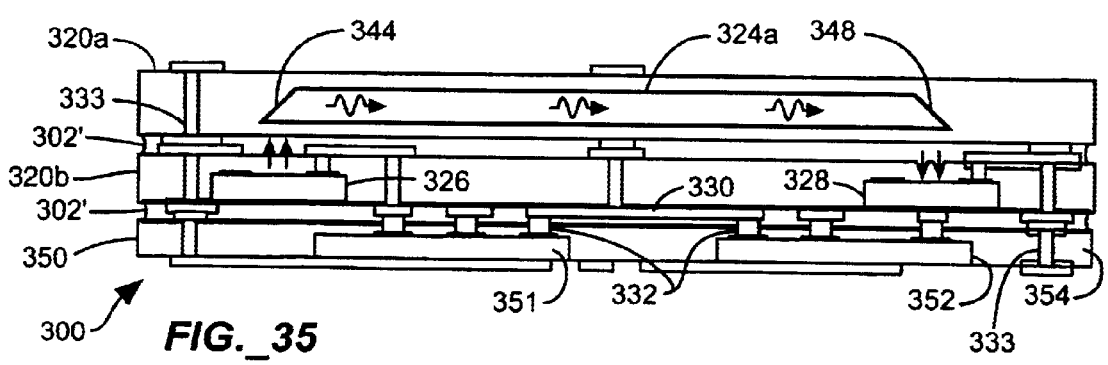
FIG._35

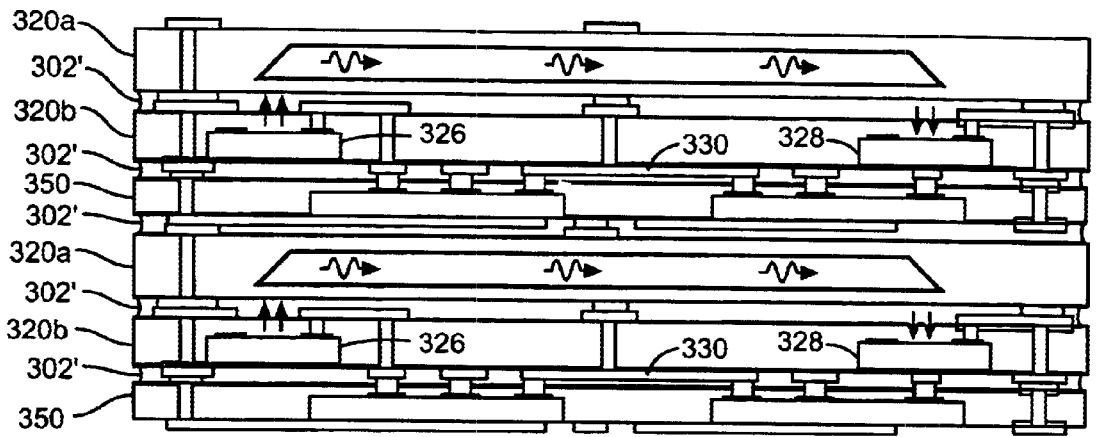
FIG._36
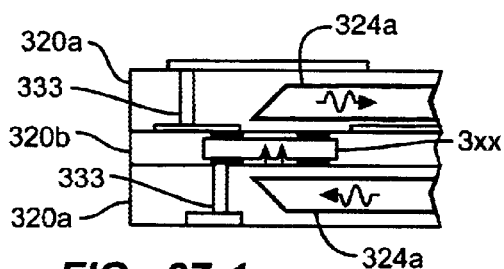
FIG._37-1
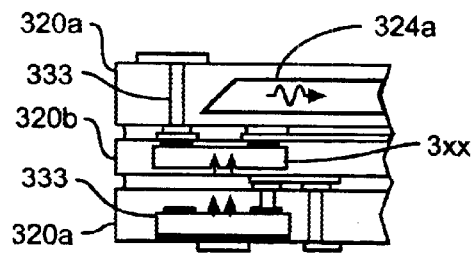
FIG._37-2
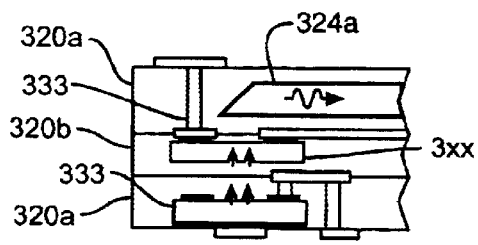
FIG._37-3
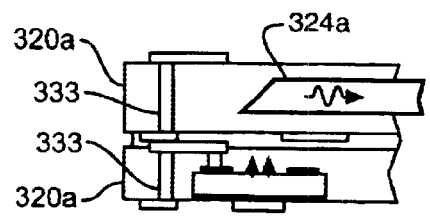
FIG._37-4

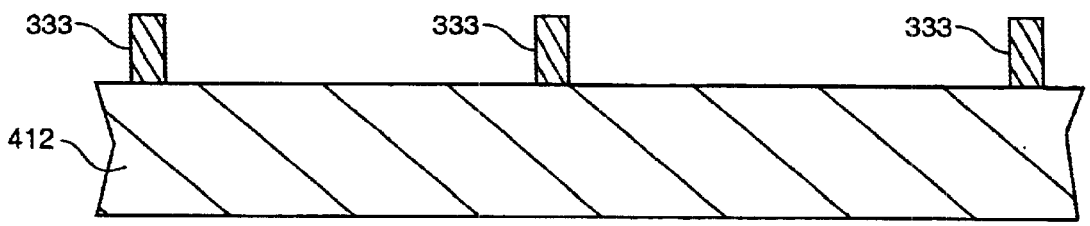
FIG._38
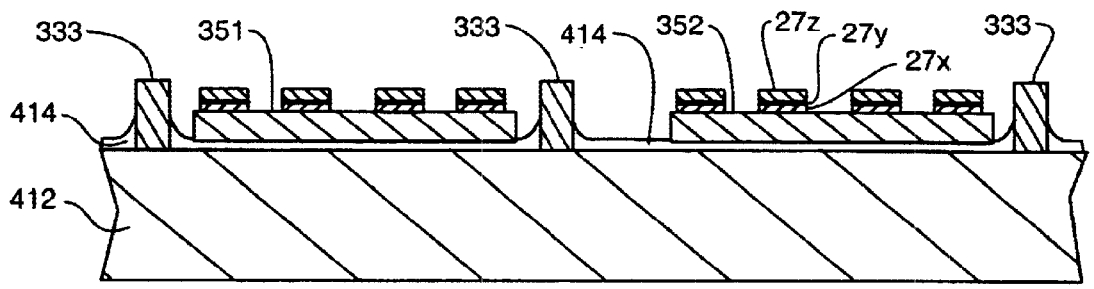
FIG._39
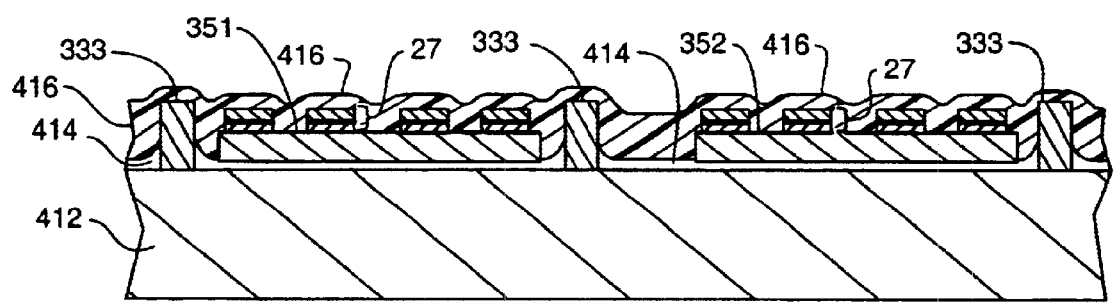
FIG._40
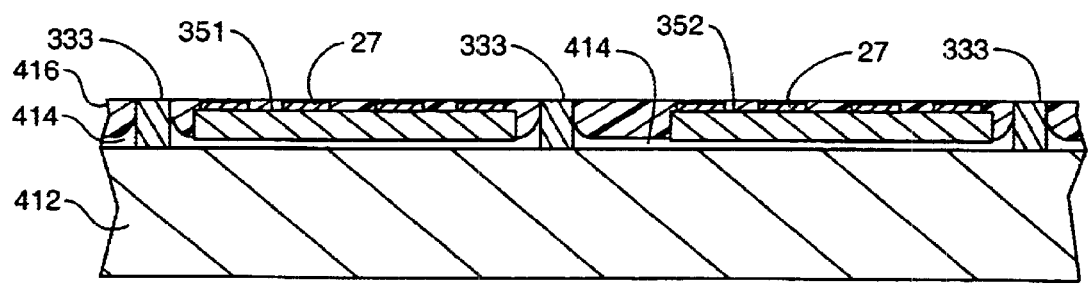
FIG._41

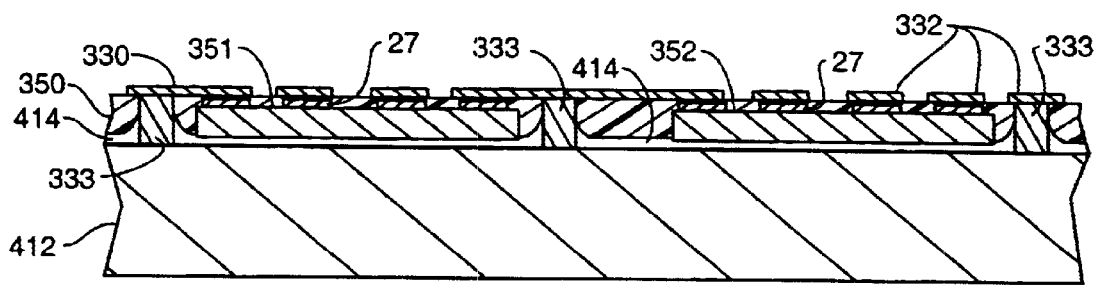
FIG._42
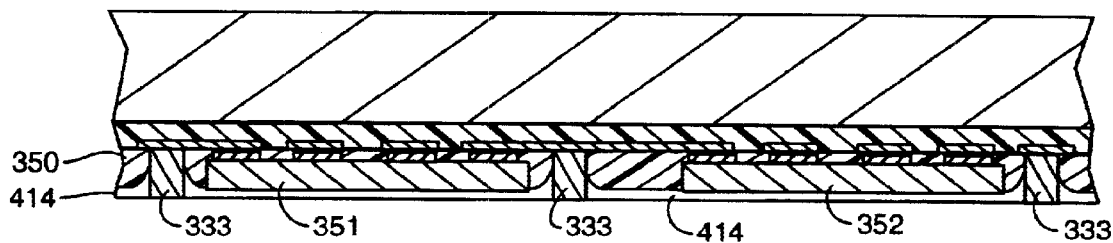
FIG._43
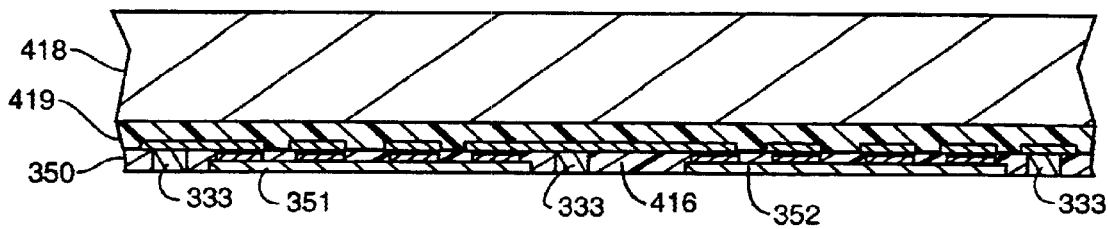
FIG._44
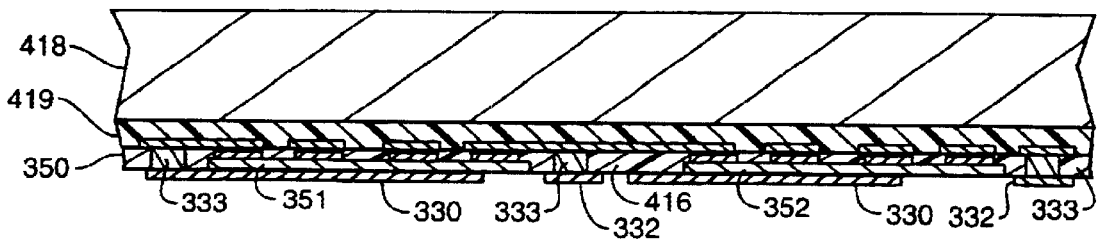
FIG._45

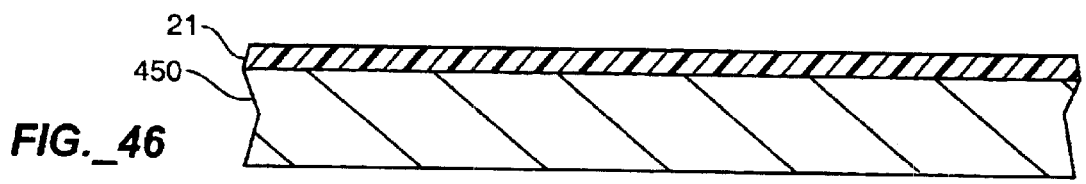
FIG._46
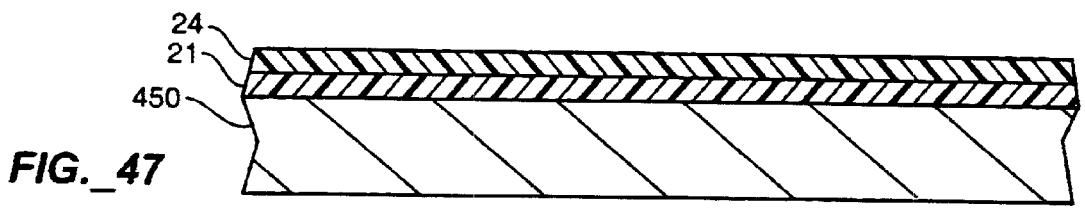
FIG._47
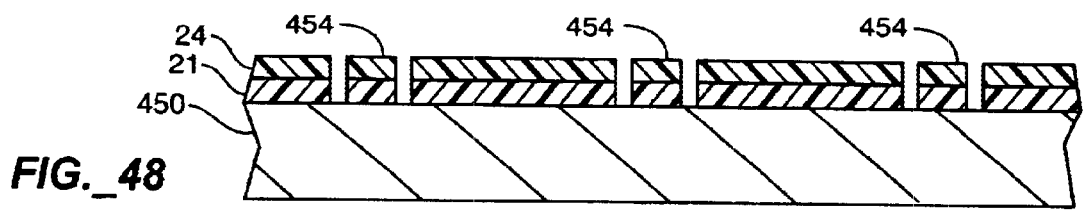
FIG._48
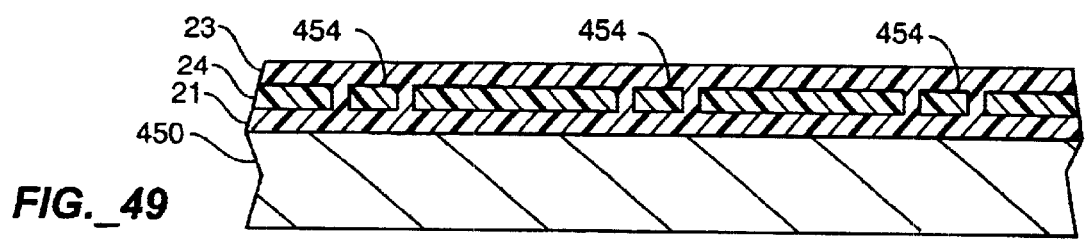
FIG._49
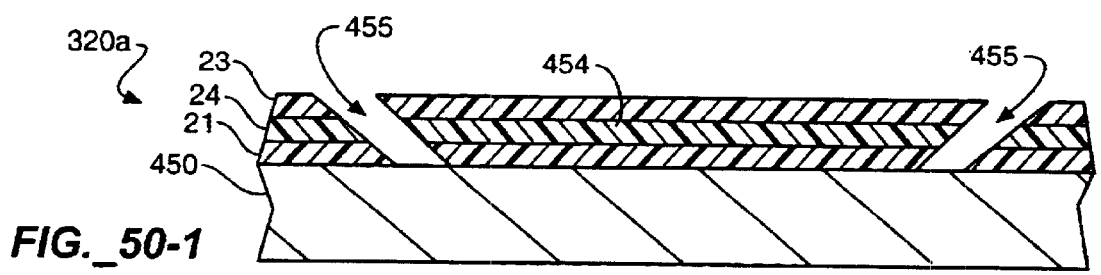
FIG._50-1
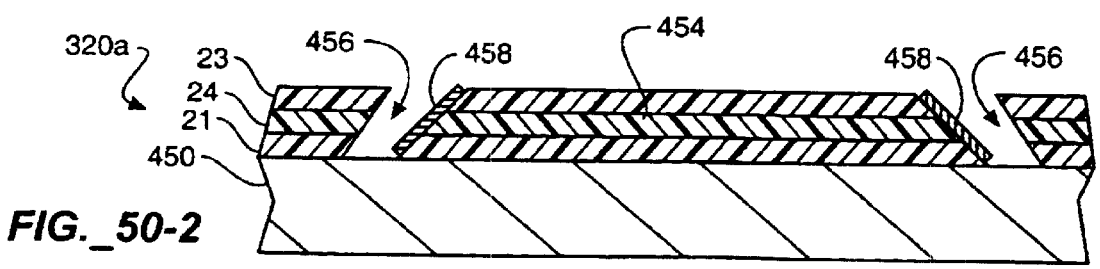
FIG._50-2

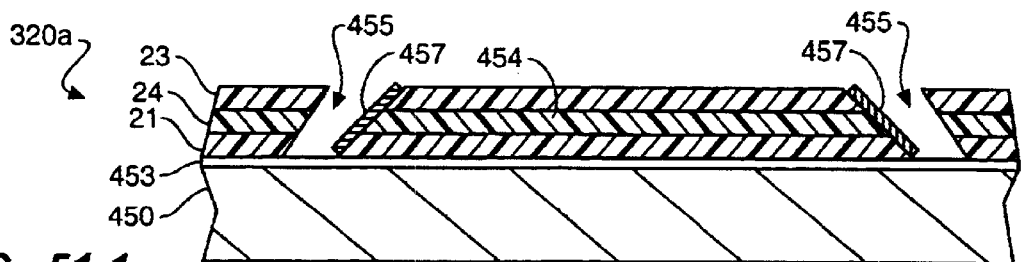
FIG._51-1
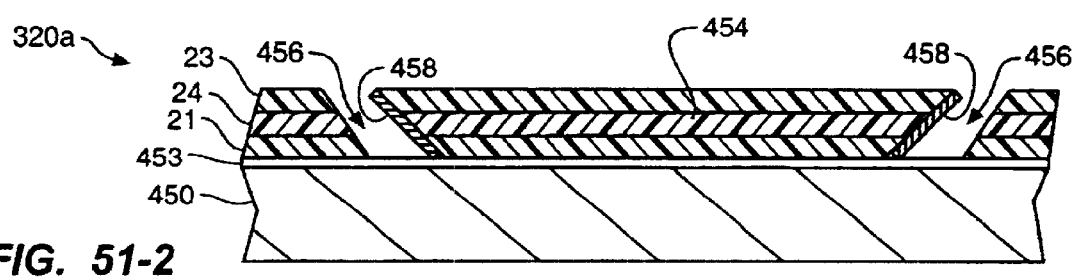
FIG._51-2
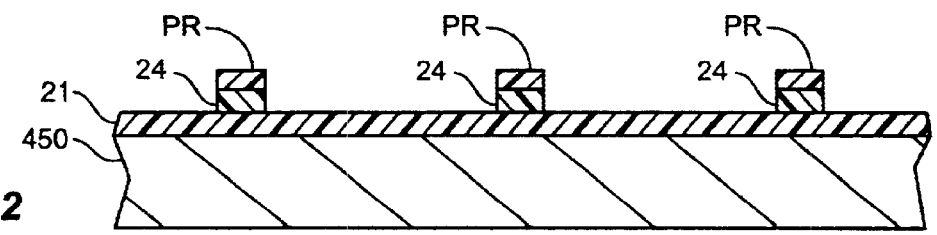
FIG._52
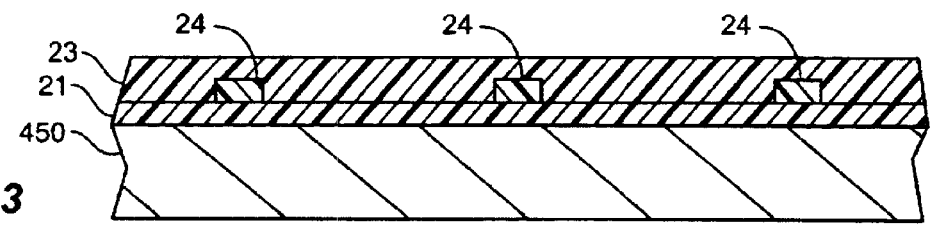
FIG._53

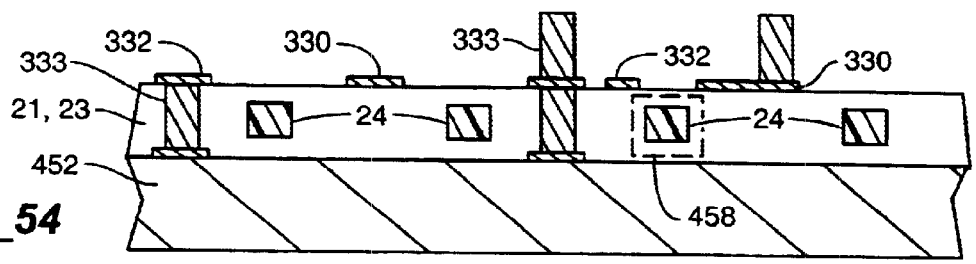
FIG._54
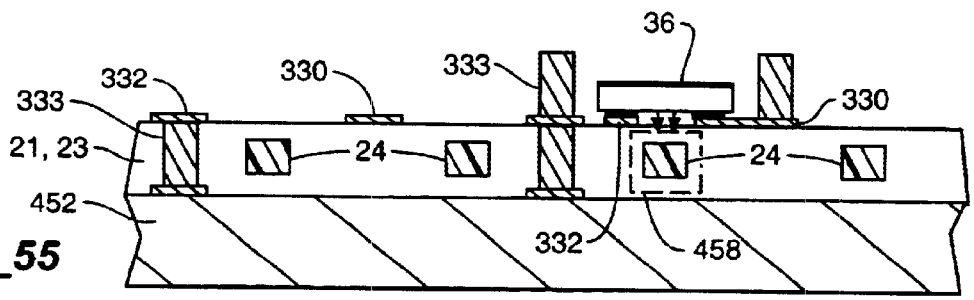
FIG._55
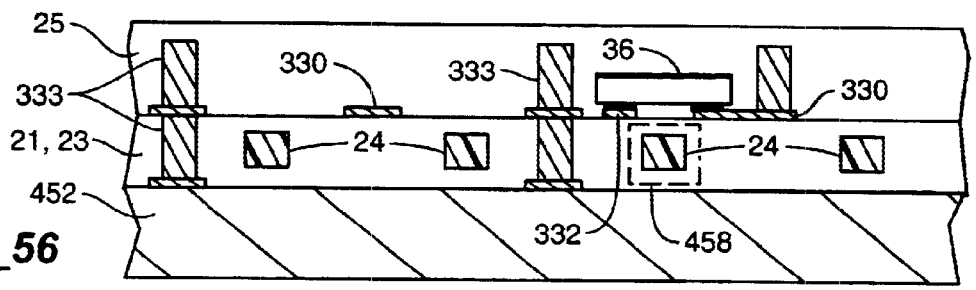
FIG._56
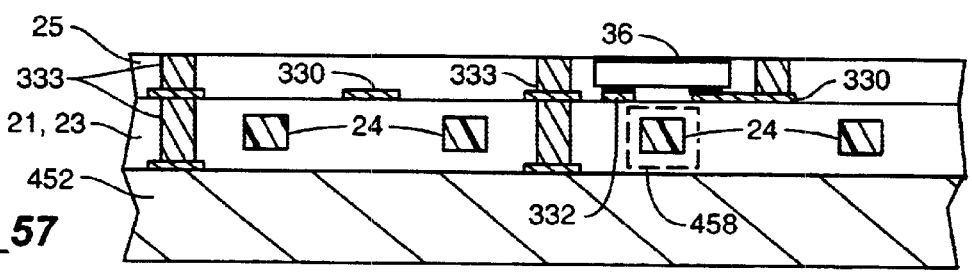
FIG._57
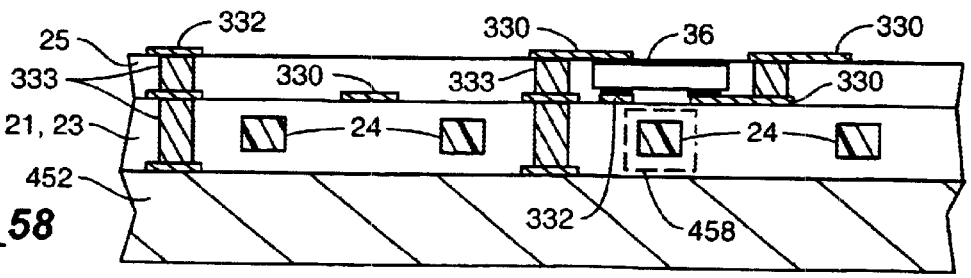
FIG._58

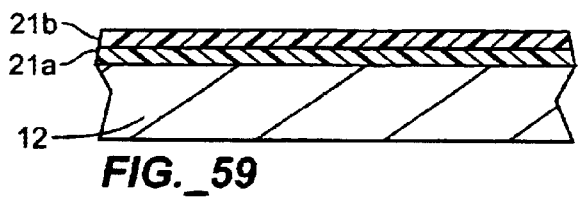
FIG._59
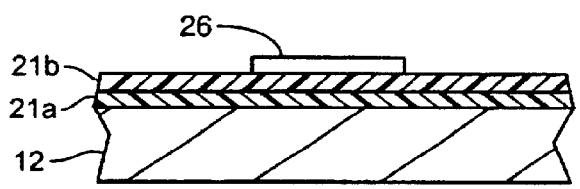
FIG._60
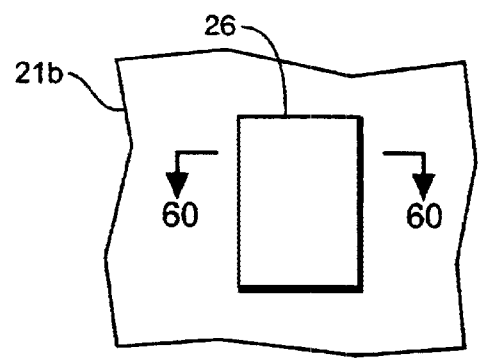
FIG._61
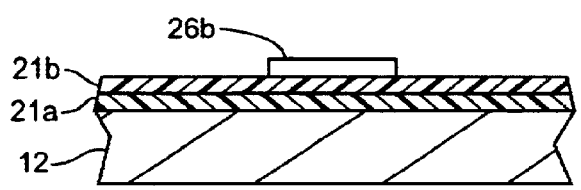
FIG._62
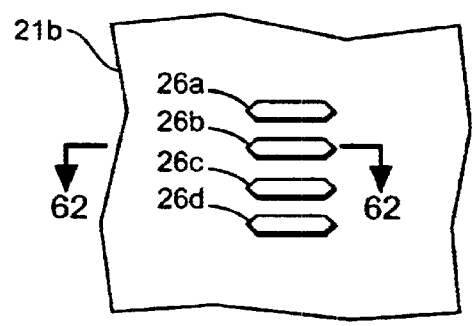
FIG._63
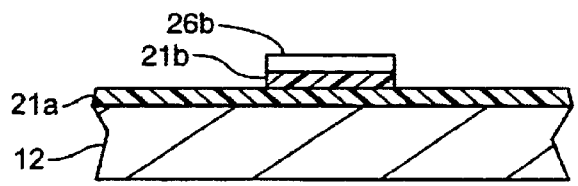
FIG._64
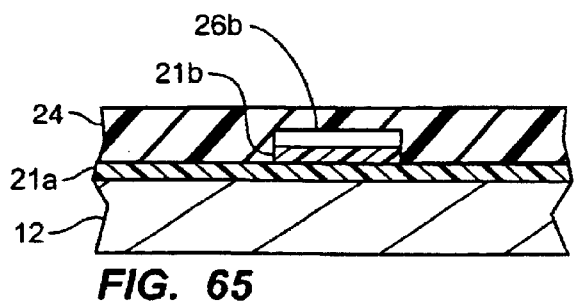
FIG._65

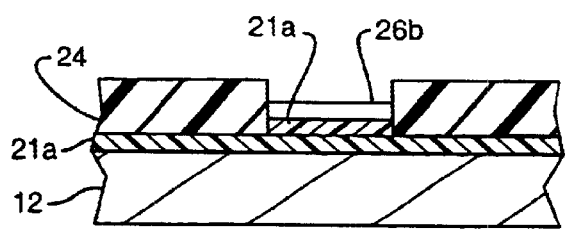
FIG._66
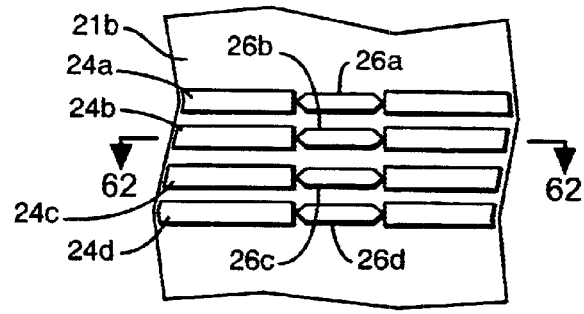
FIG._67
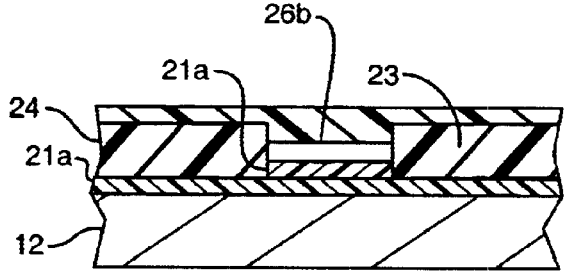
FIG._68
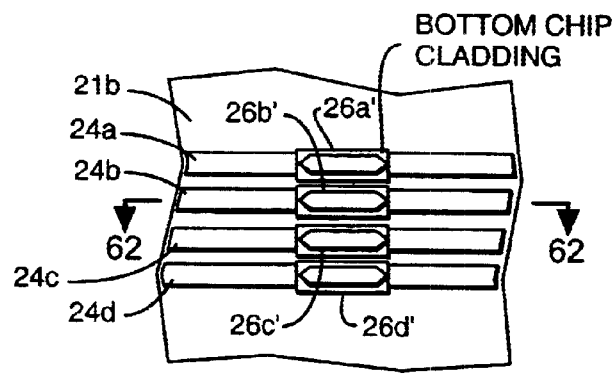
FIG._67-2
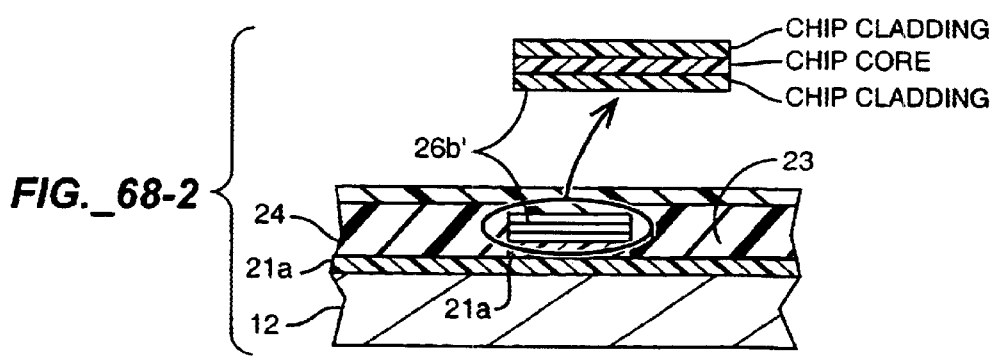
FIG._68-2

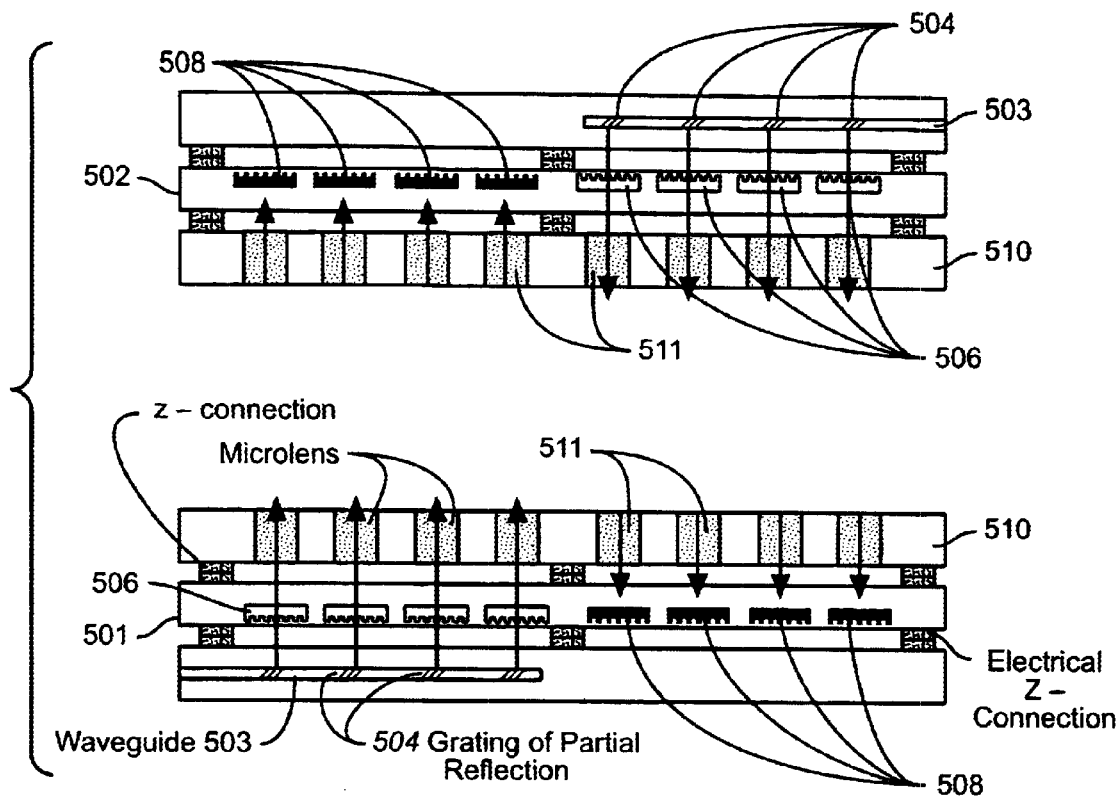
FIG._69
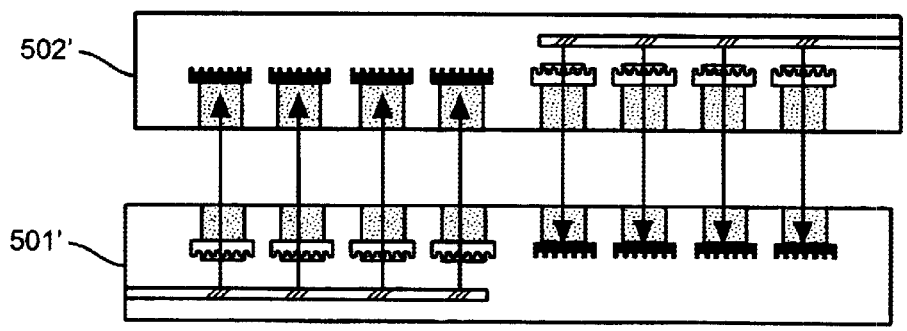
FIG._70

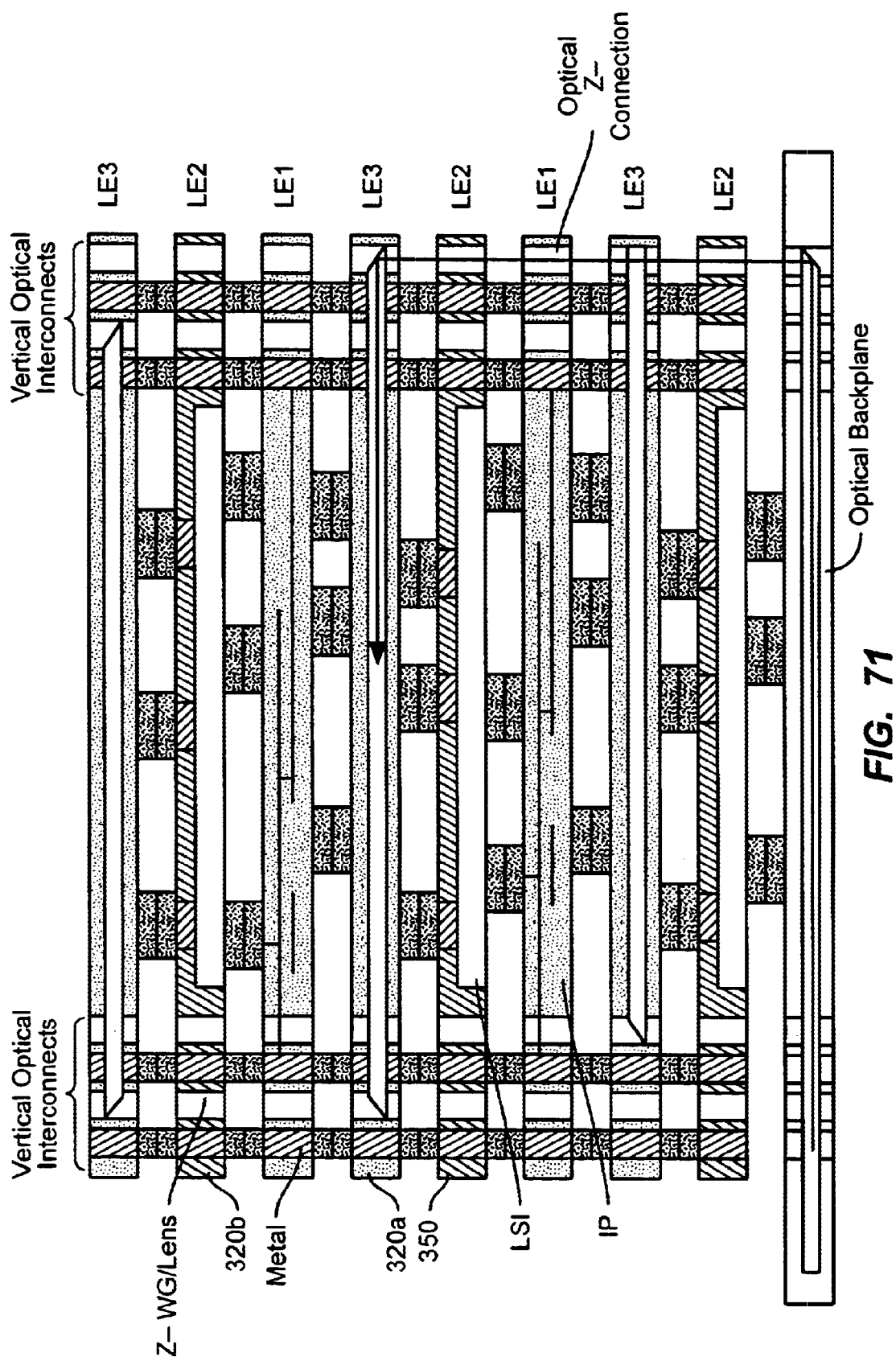
FIG._71

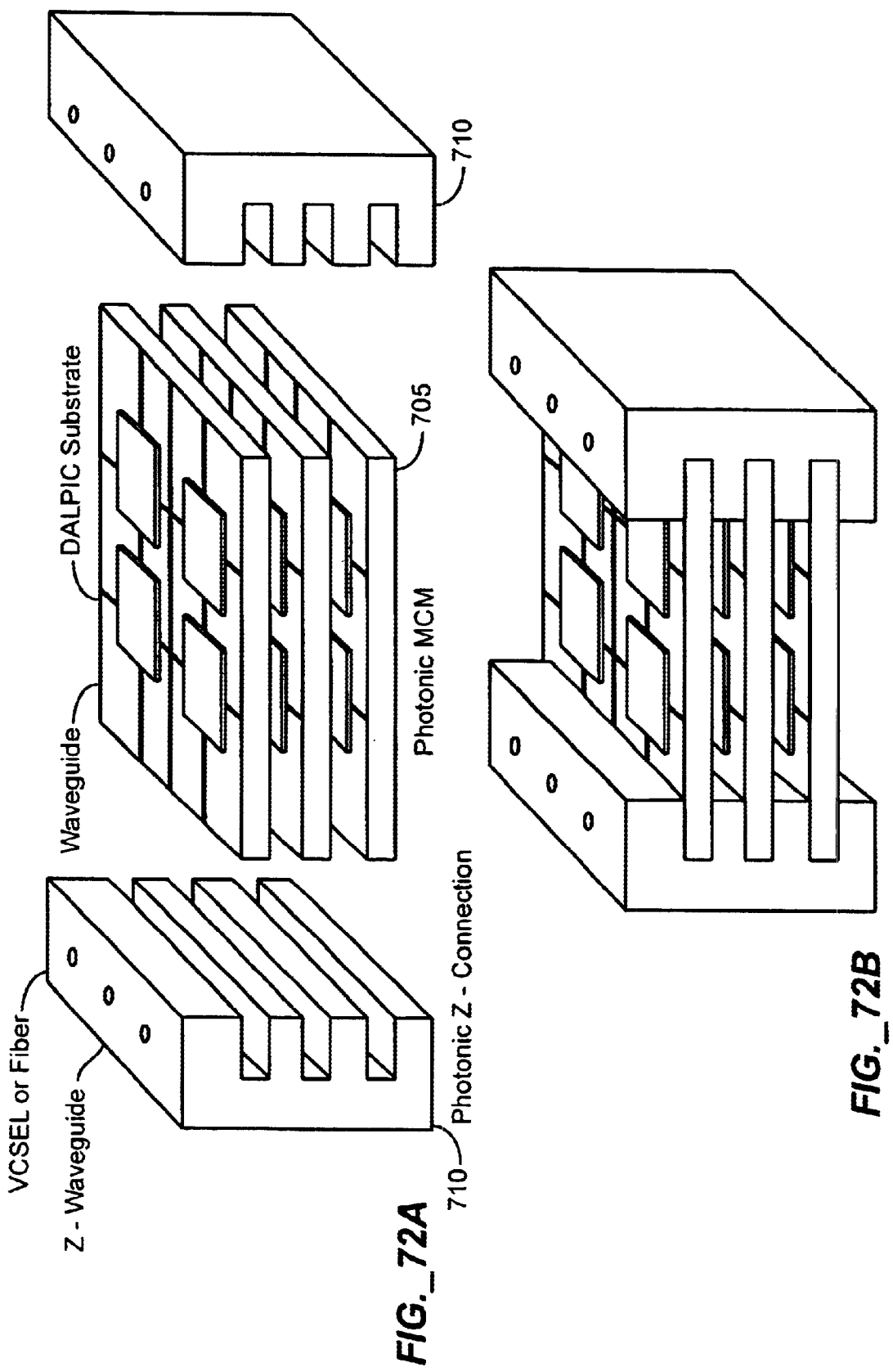
FIG._72A
FIG._72B

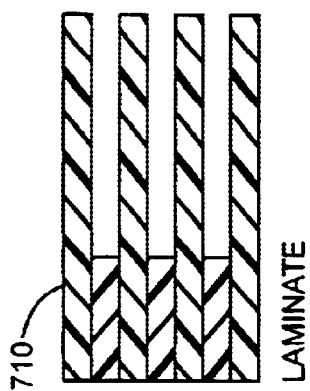
FIG._73-1 FLEXIBLE PHOTO-IMAGABLE SHEETS (POLYGUIDE)
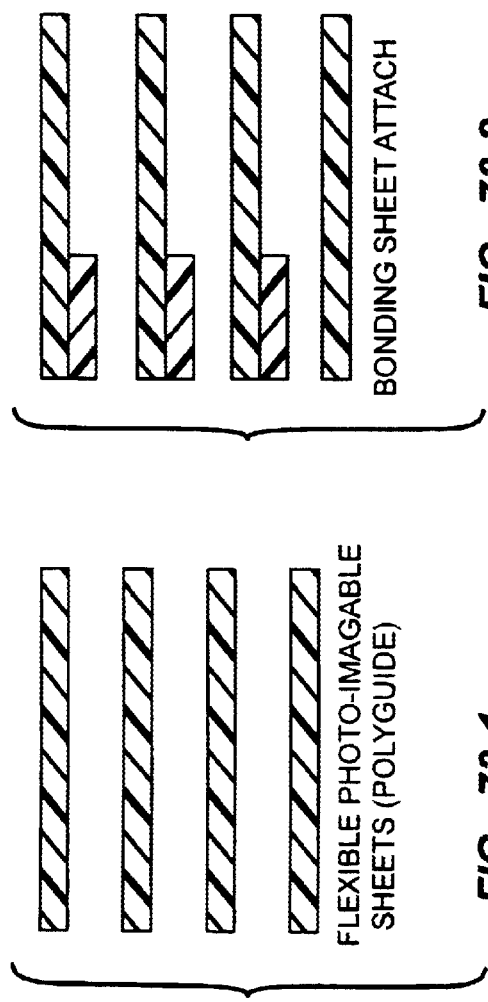
FIG._73-2 BONDING SHEET ATTACH
FIG._73-3 LAMINATE
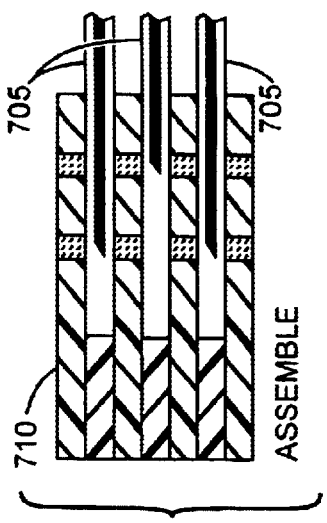
FIG._73-6 ASSEMBLE
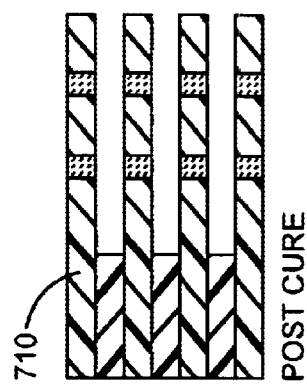
FIG._73-5 POST CURE
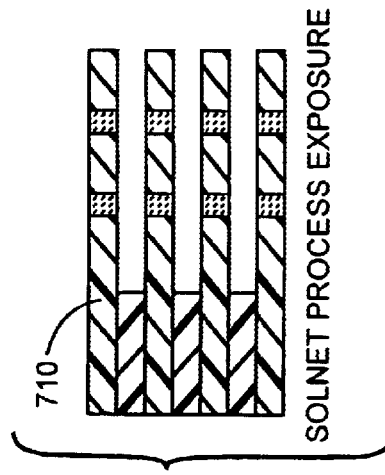
FIG._73-4 SOLNET PROCESS EXPOSURE

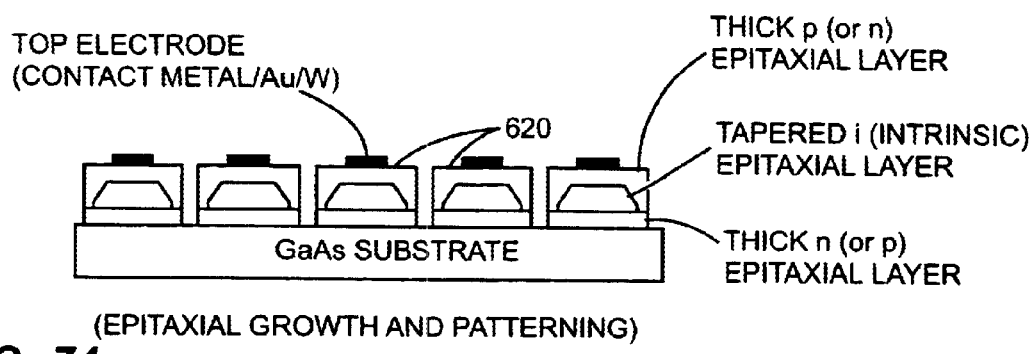
FIG._74
(EPITAXIAL GROWTH AND PATTERNING)
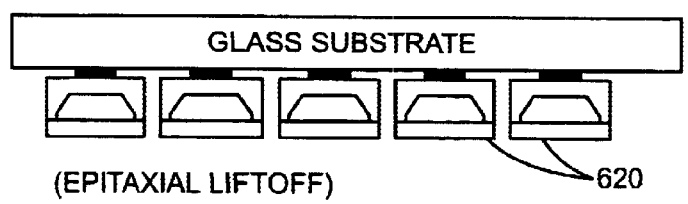
FIG._75
(EPITAXIAL LIFTOFF)
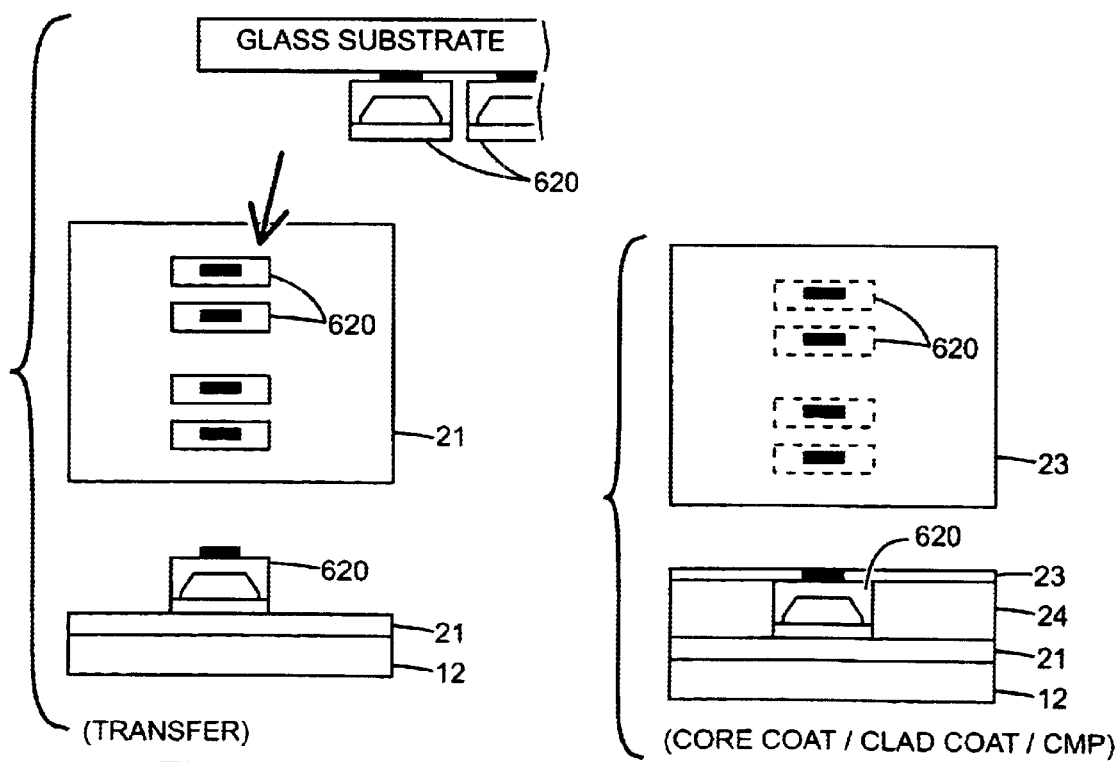
FIG._76
(TRANSFER)
FIG._77
(CORE COAT / CLAD COAT / CMP)

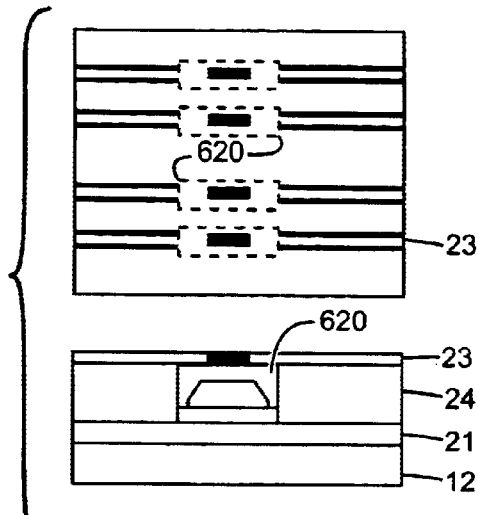
FIG._78 (CORE PATTERNING)
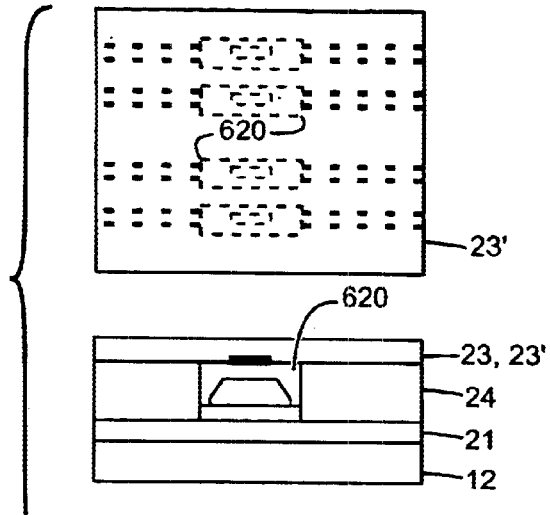
FIG._79 (CLAD COATING)
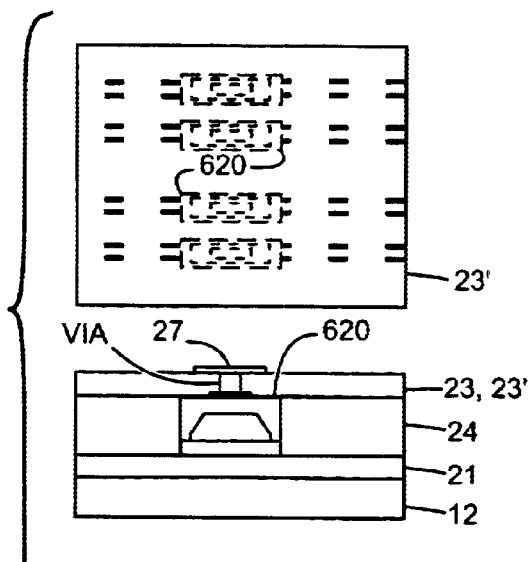
(VIA AND ELECTRODE FORMATION)
FIG._80
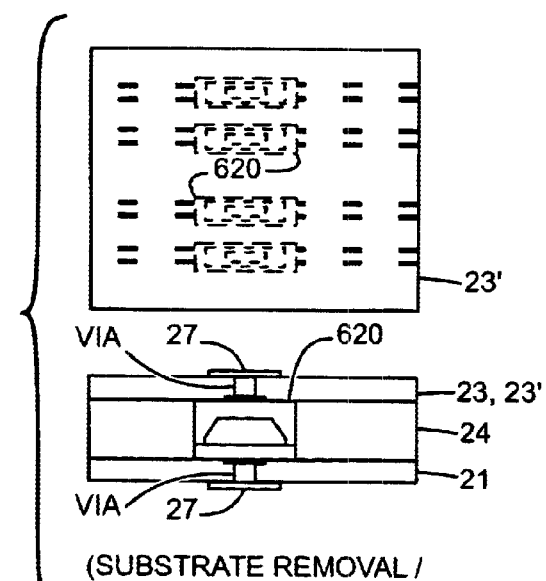
(SUBSTRATE REMOVAL / BACK-SIDE METALIZATION)
FIG._81

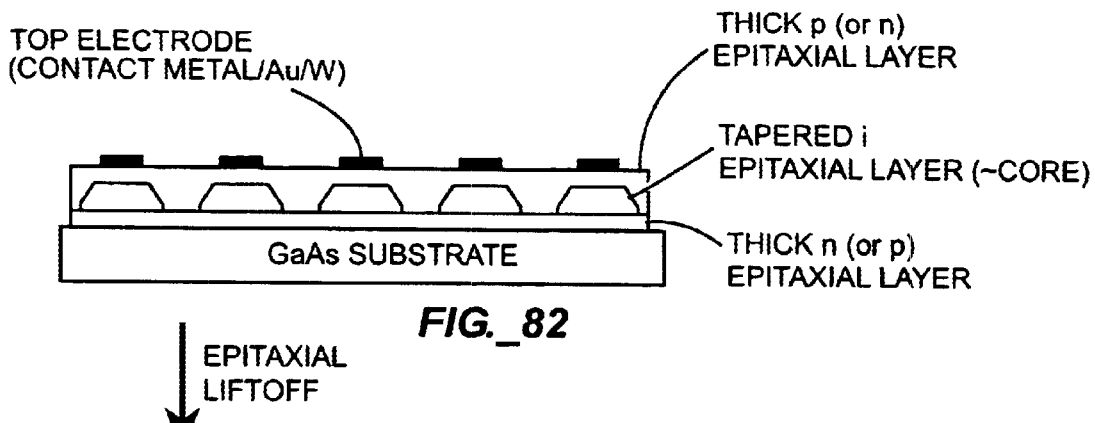
FIG._82
FIG._83
(EPITAXIAL LIFTOFF AND METALIZATION)
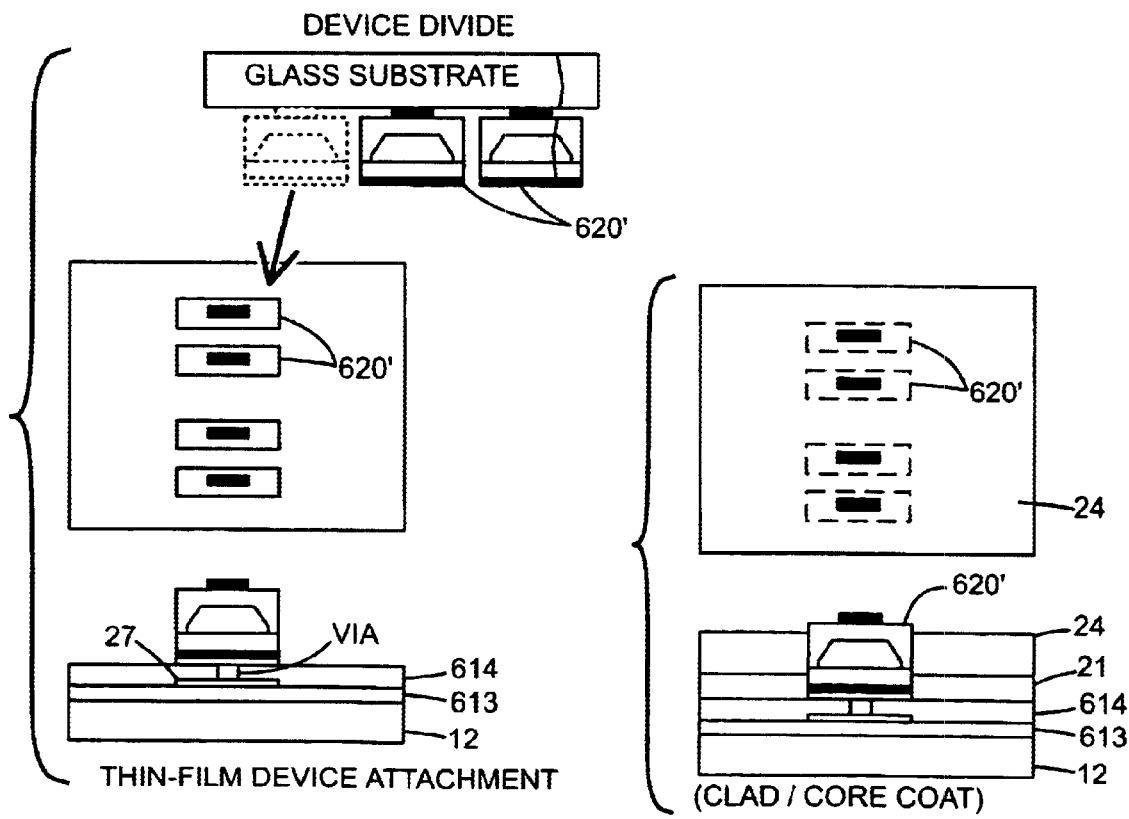
FIG._84
THIN-FILM DEVICE ATTACHMENT
FIG._85
(CLAD / CORE COAT)

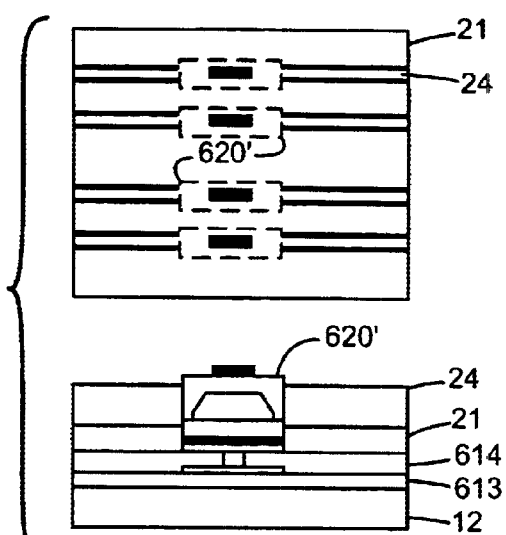
FIG._86 (CORE PATTERNING)
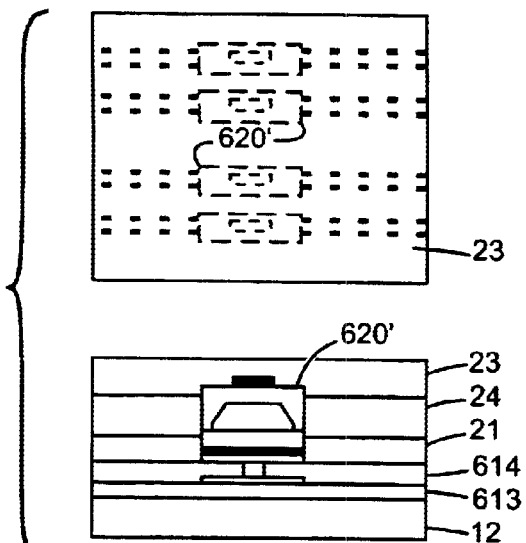
FIG._87 (CLAD COATING)
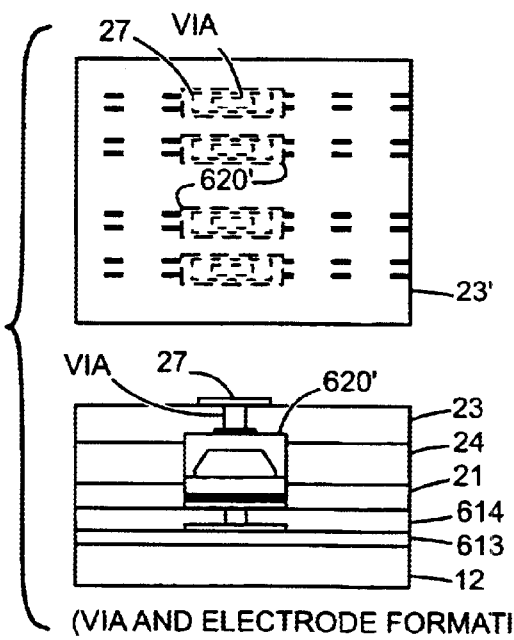
(VIA AND ELECTRODE FORMATION)
FIG._88
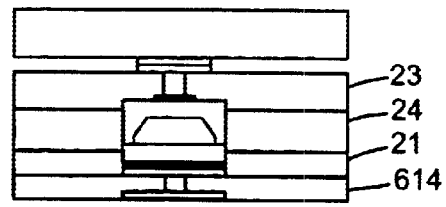
FIG._89

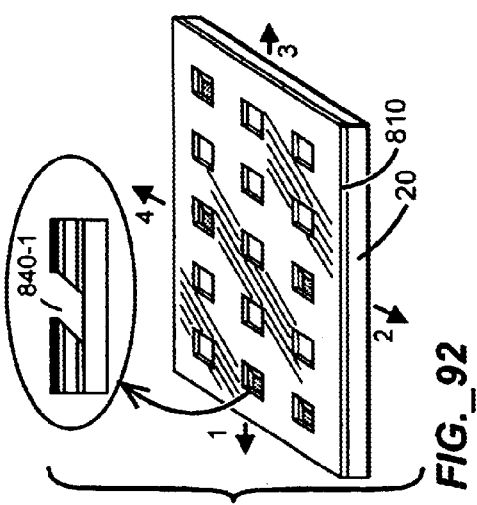
FIG._92
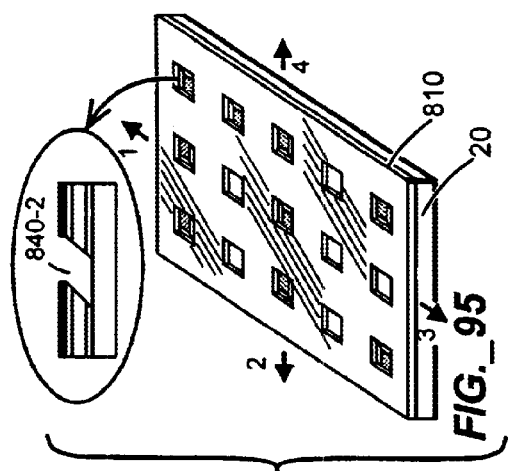
FIG._95
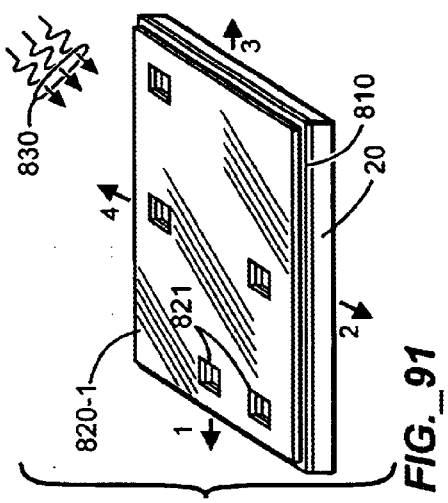
FIG._91
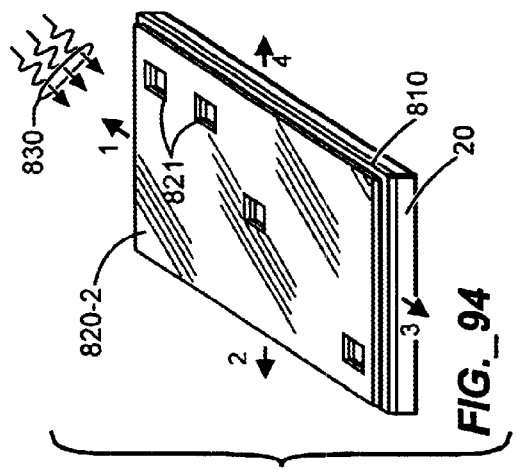
FIG._94
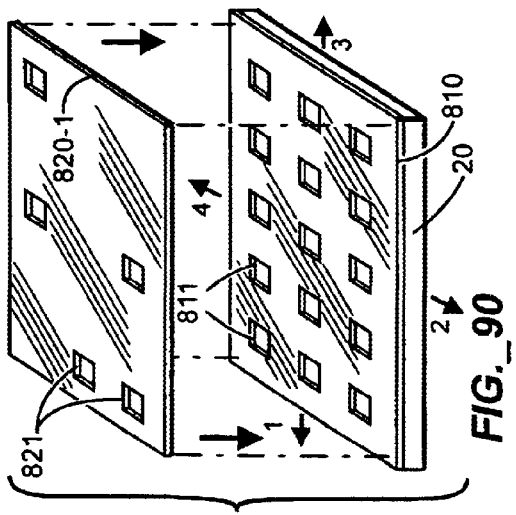
FIG._90
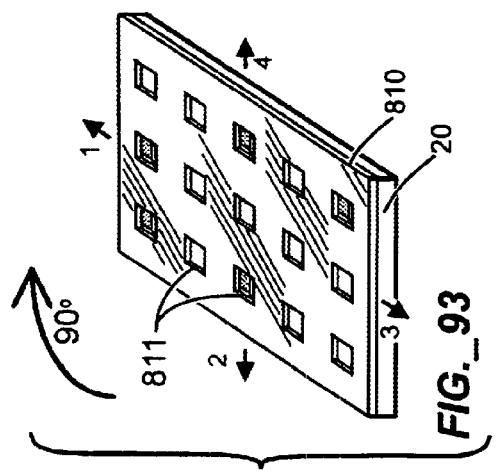
FIG._93

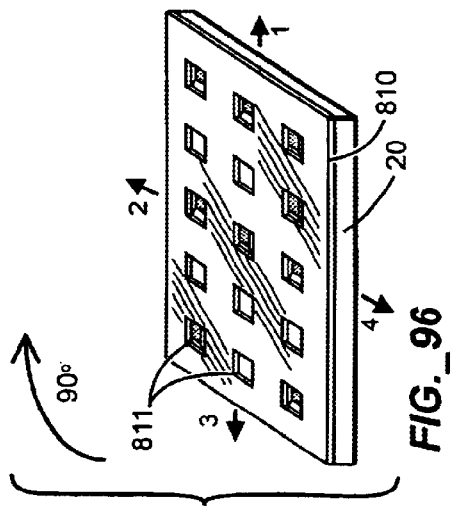
FIG._96
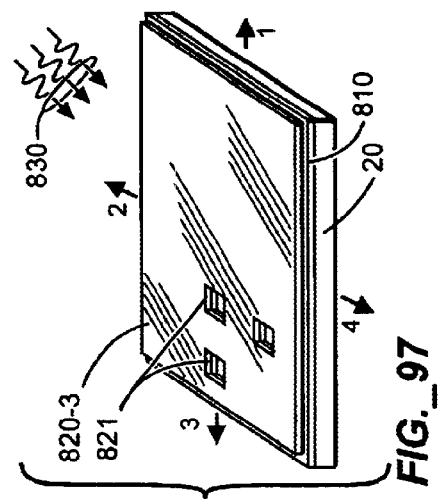
FIG._97
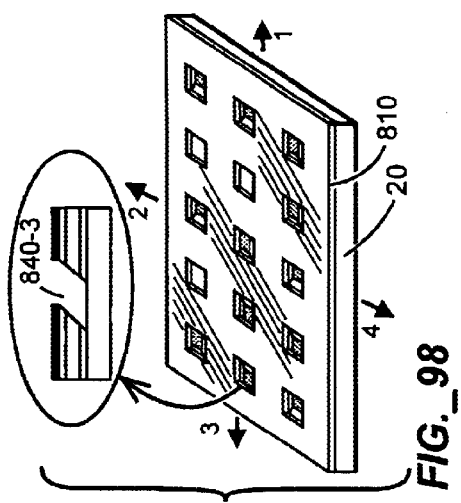
FIG._98
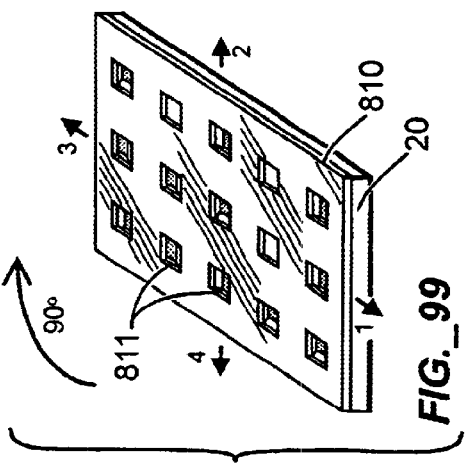
FIG._99
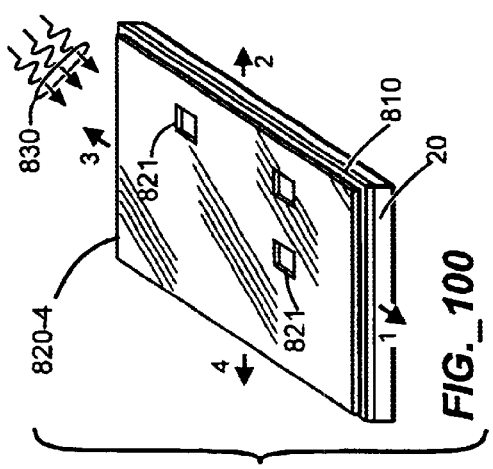
FIG._100
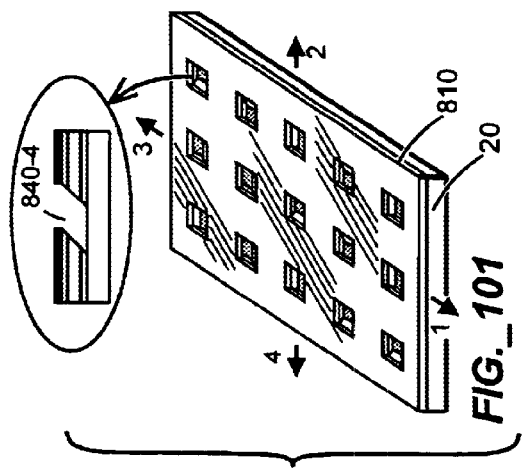
FIG._101

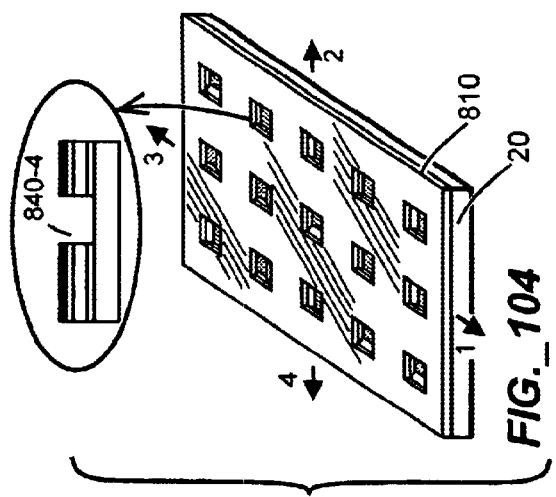
FIG._104
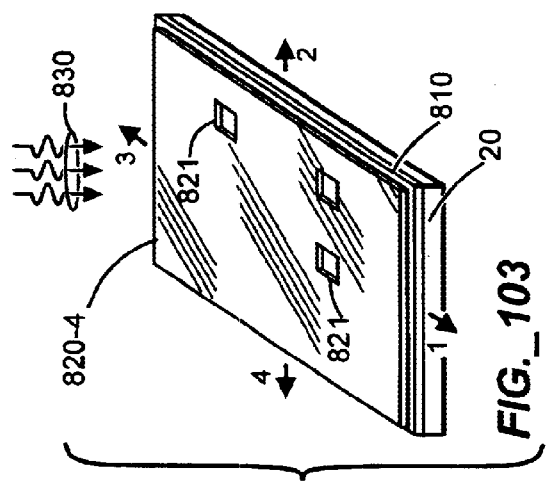
FIG._103
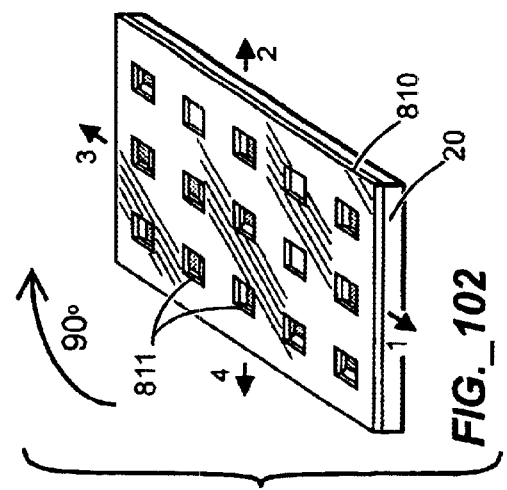
FIG._102

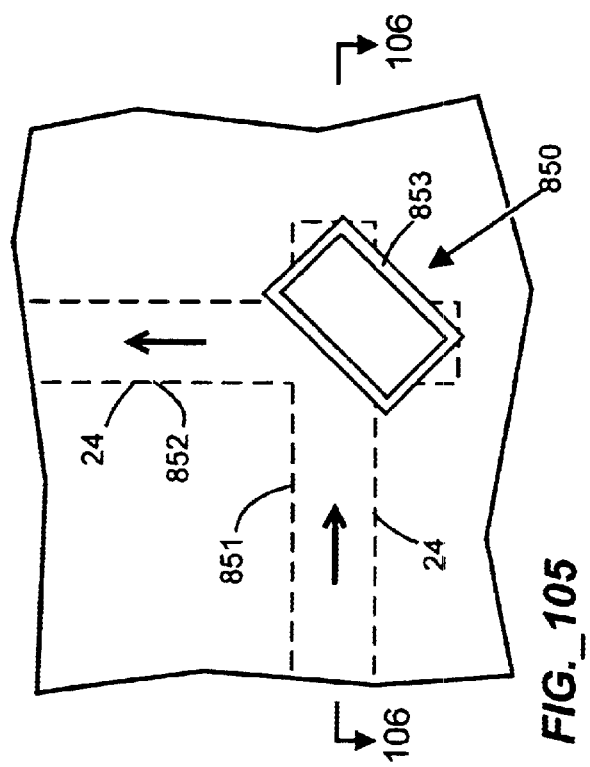
FIG._105
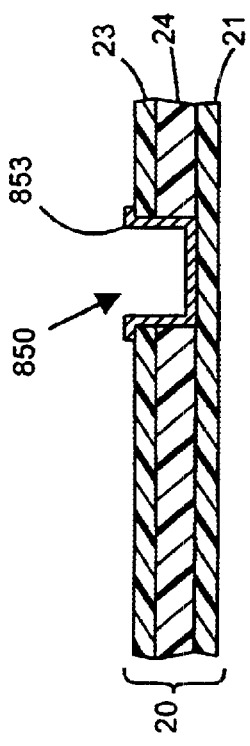
FIG._106
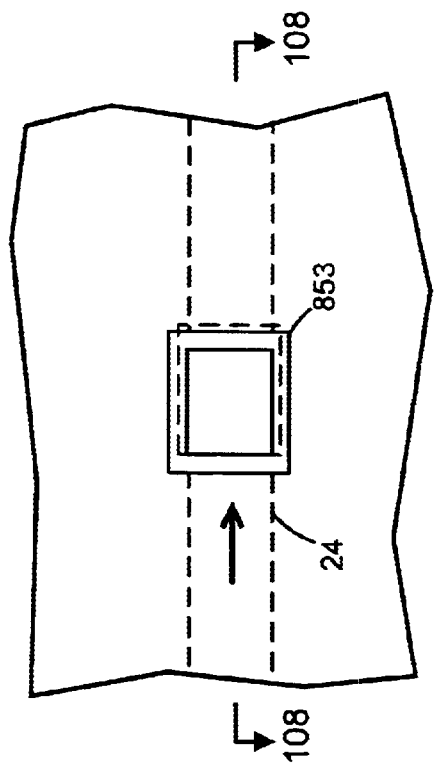
FIG._107
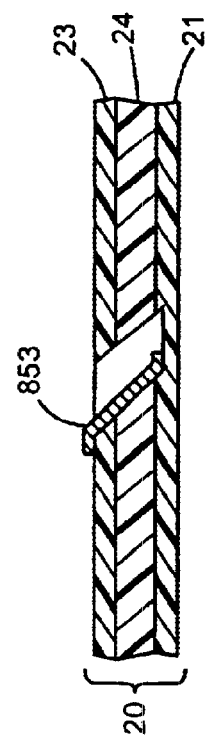
FIG._108

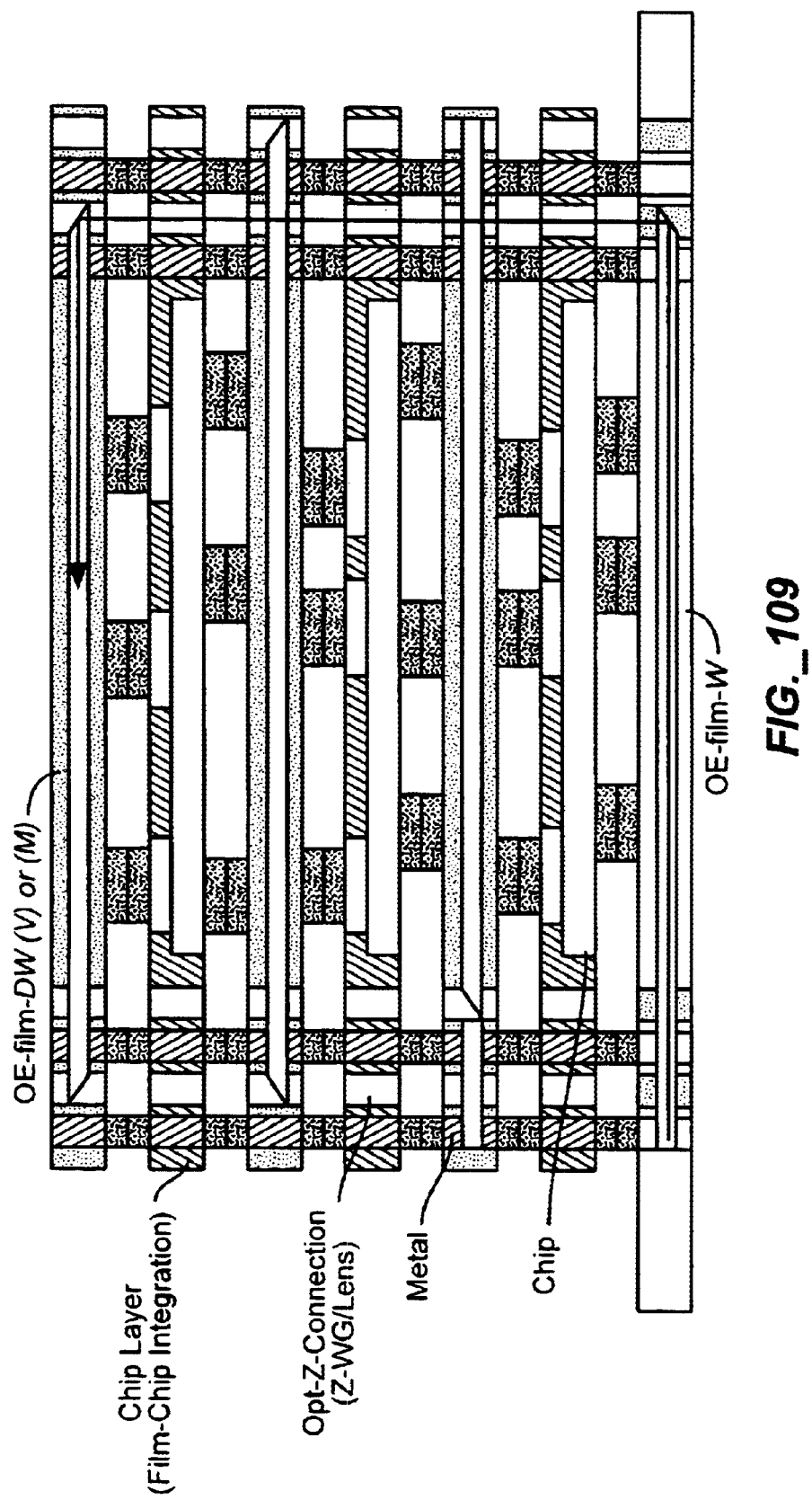

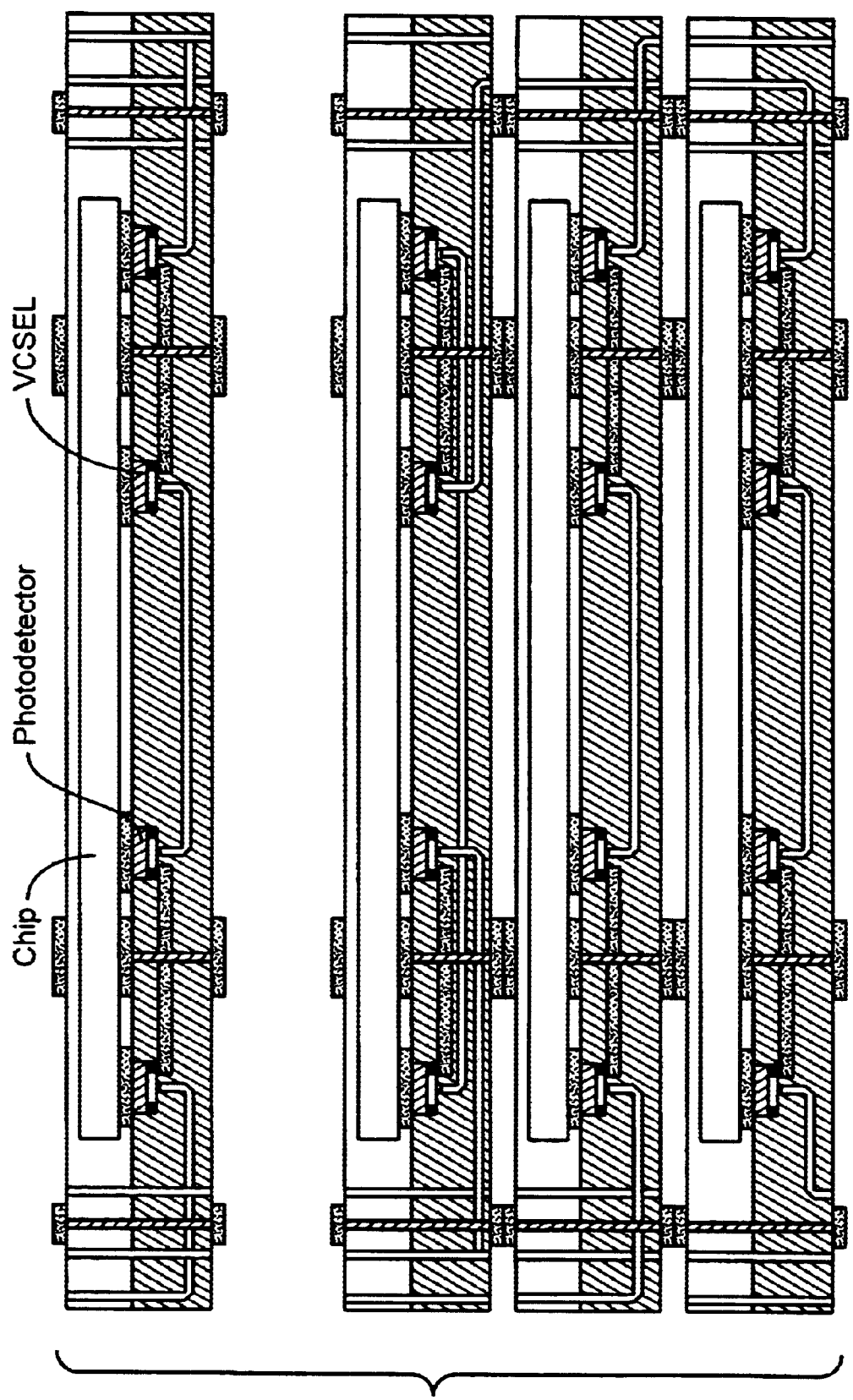
FIG._110

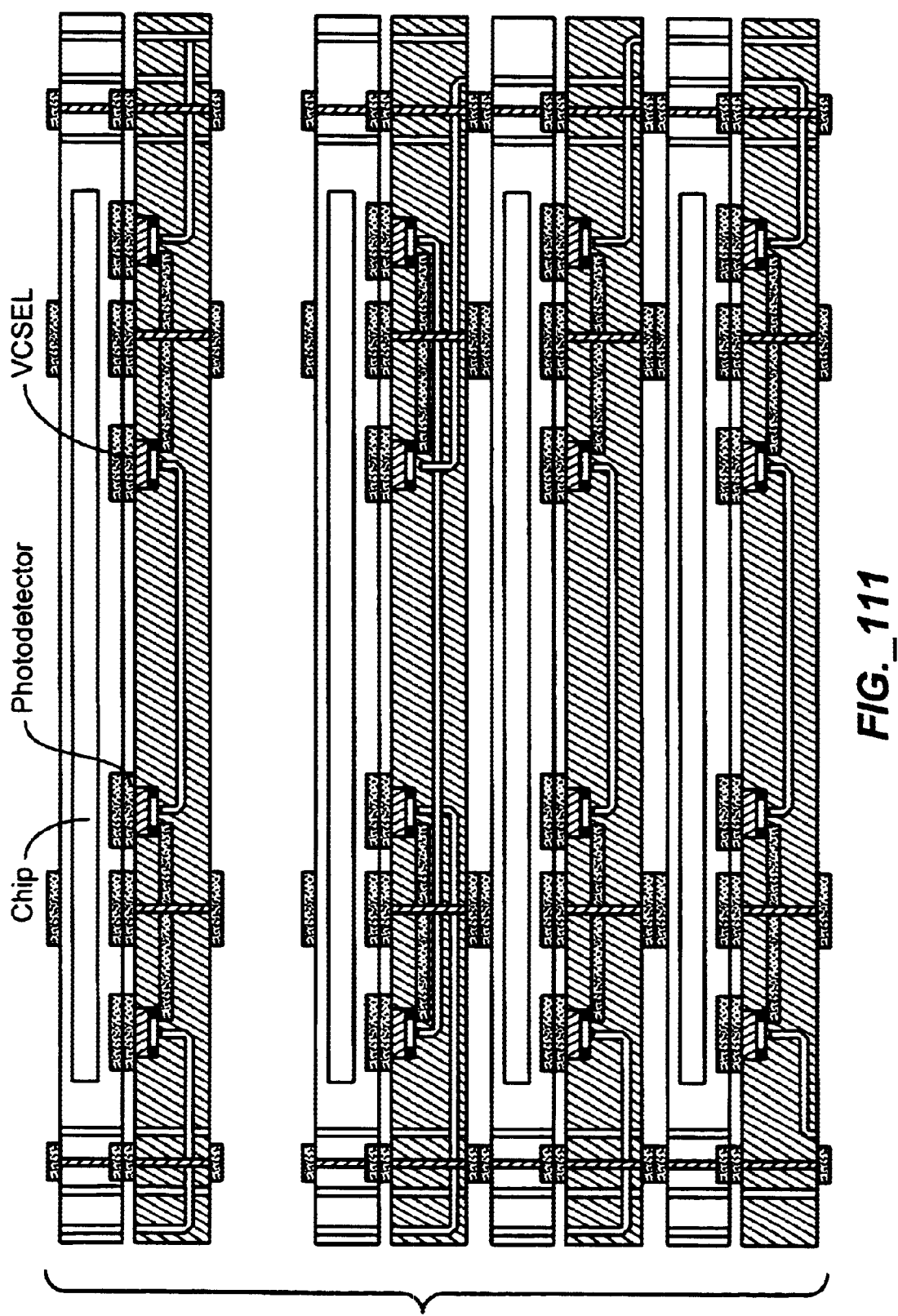
FIG._111

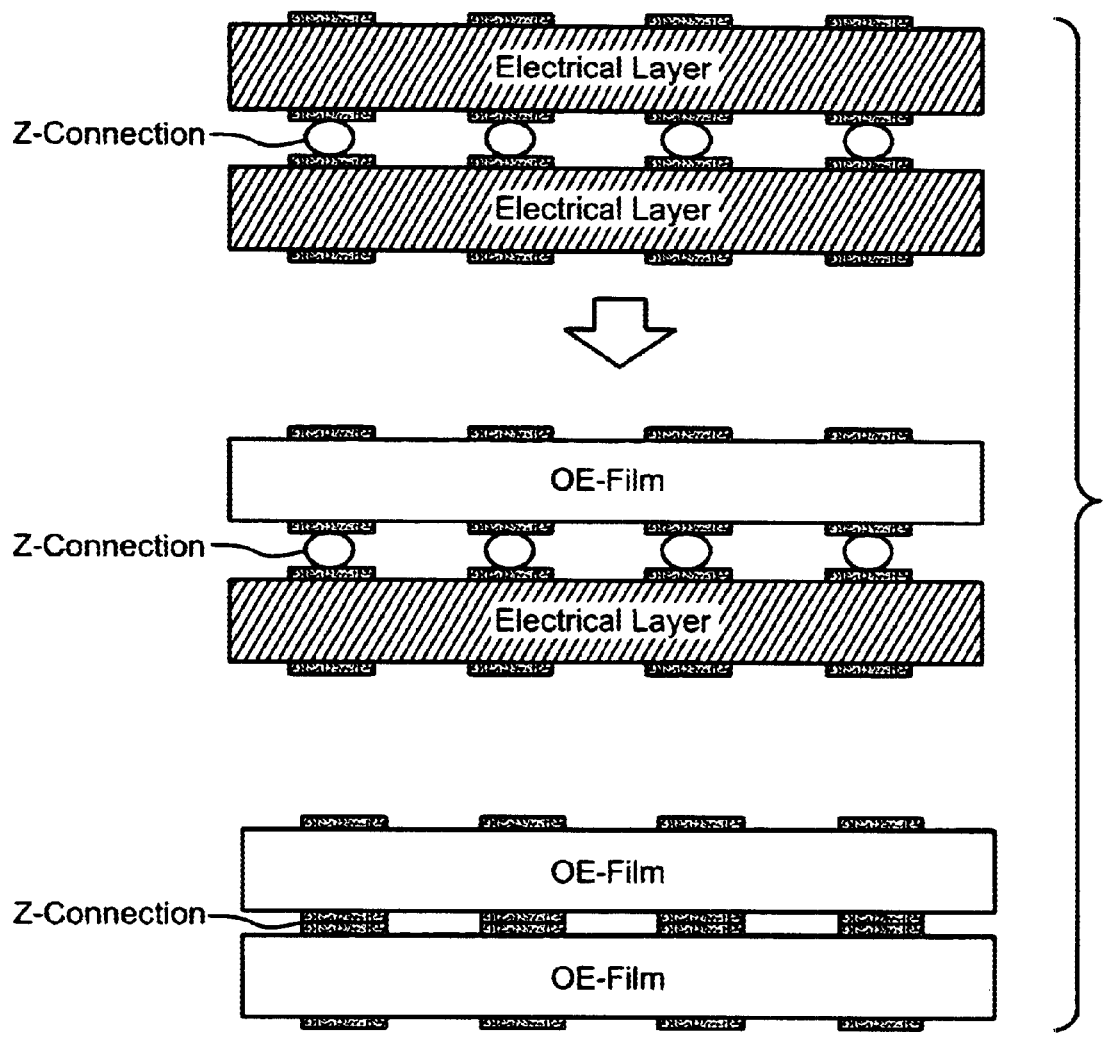
FIG._112

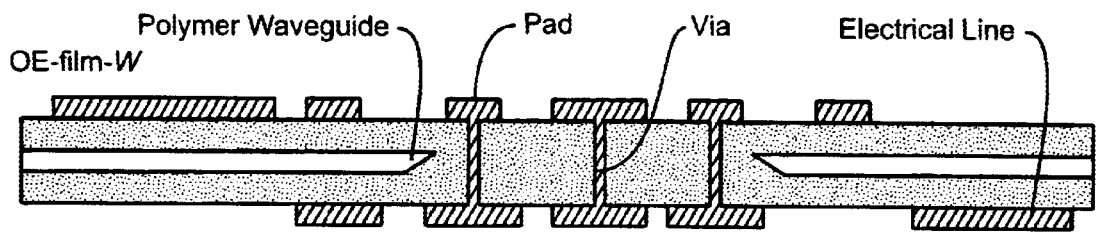
FIG._113
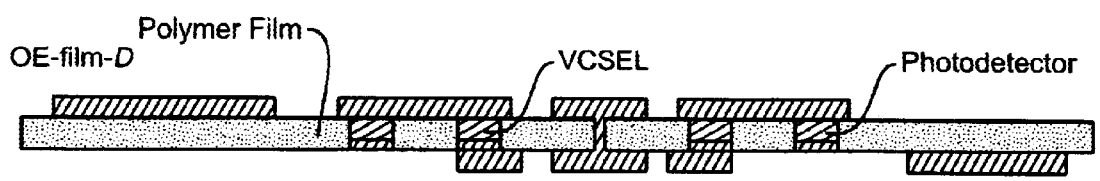
FIG._114
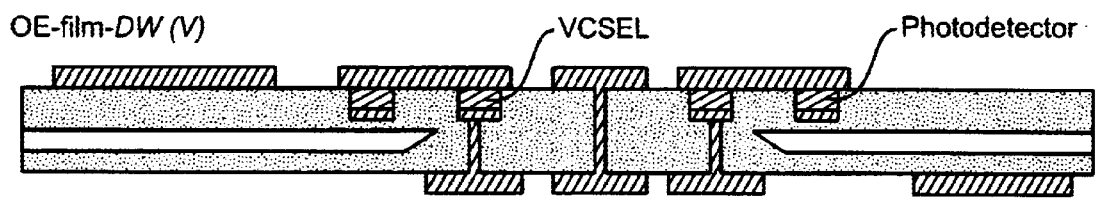
FIG._115
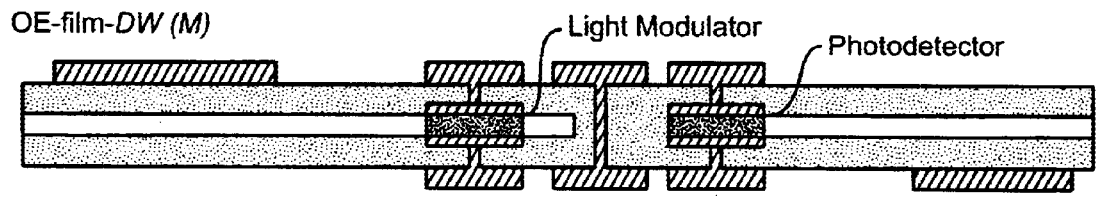
FIG._116

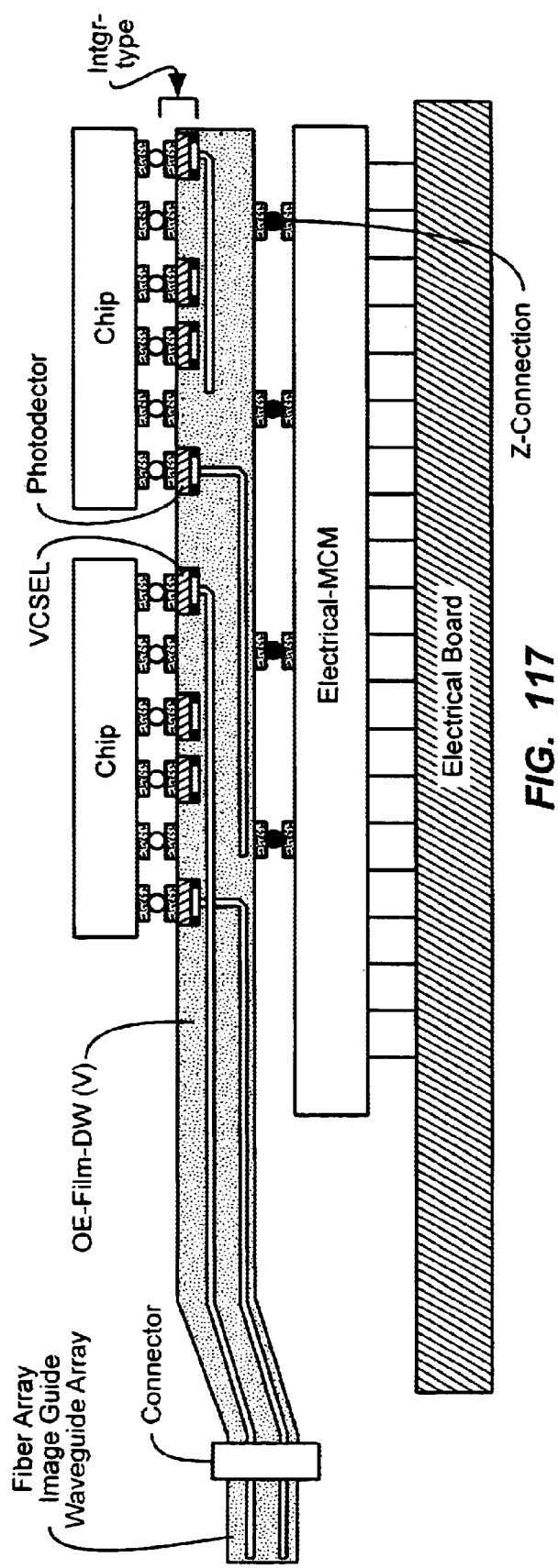
FIG._117

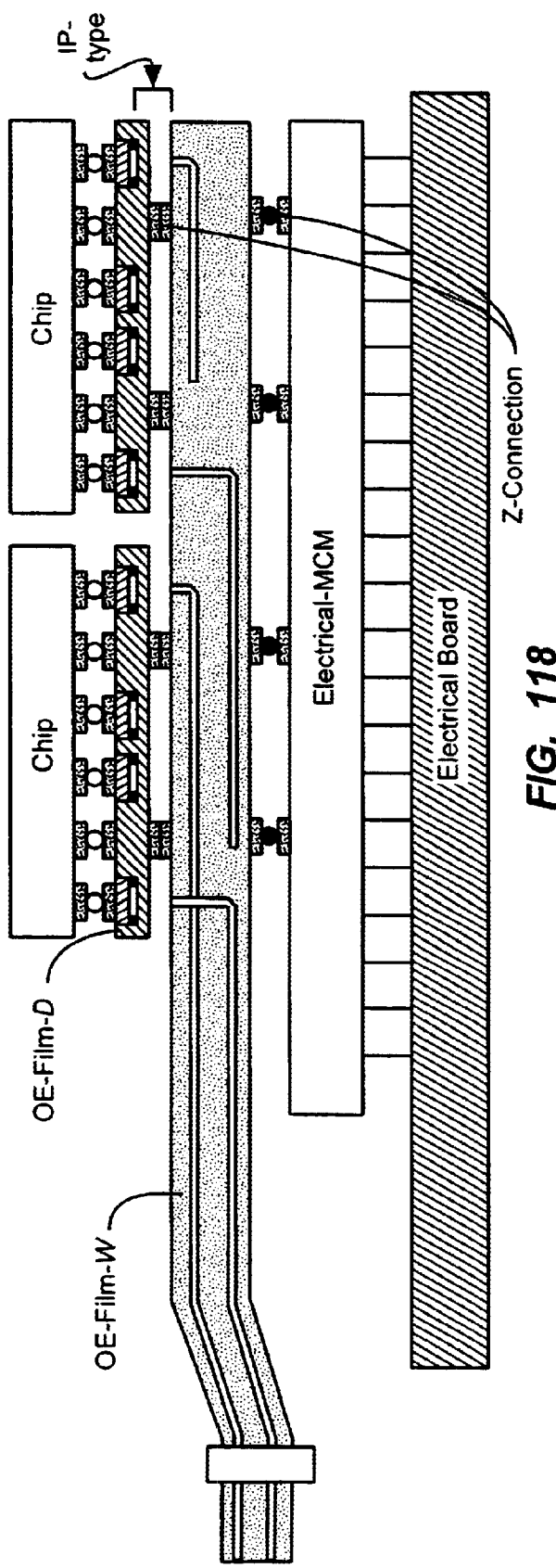
FIG._118

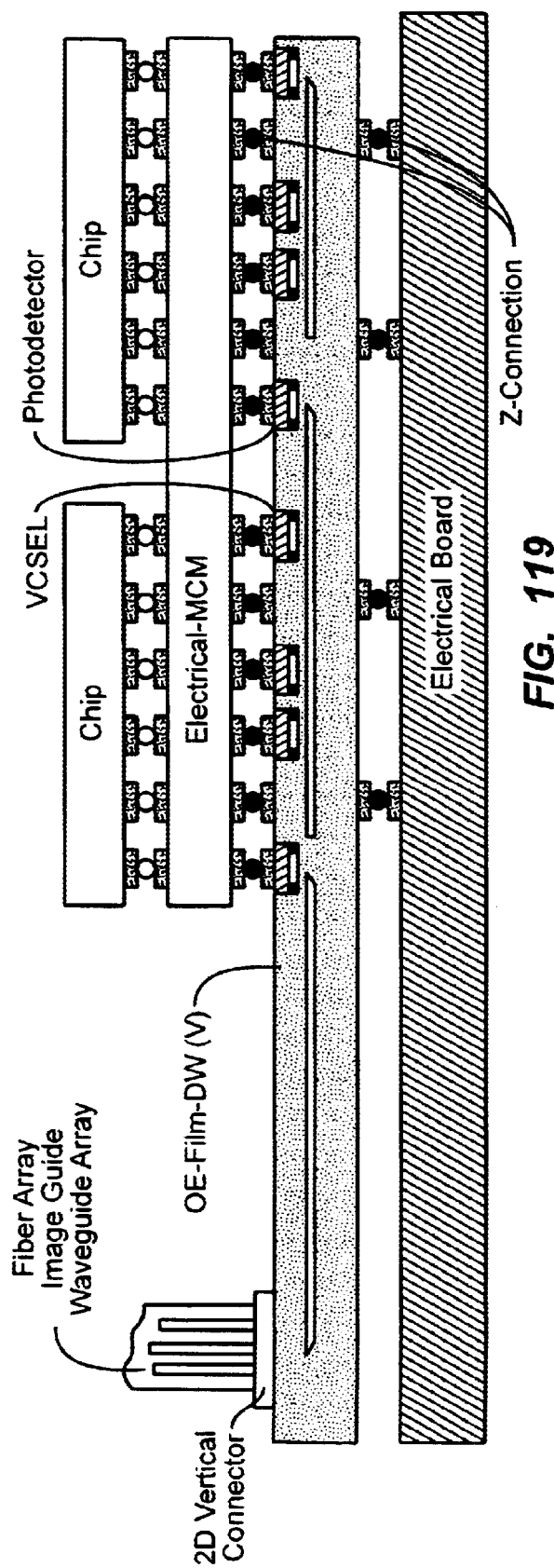
FIG._119

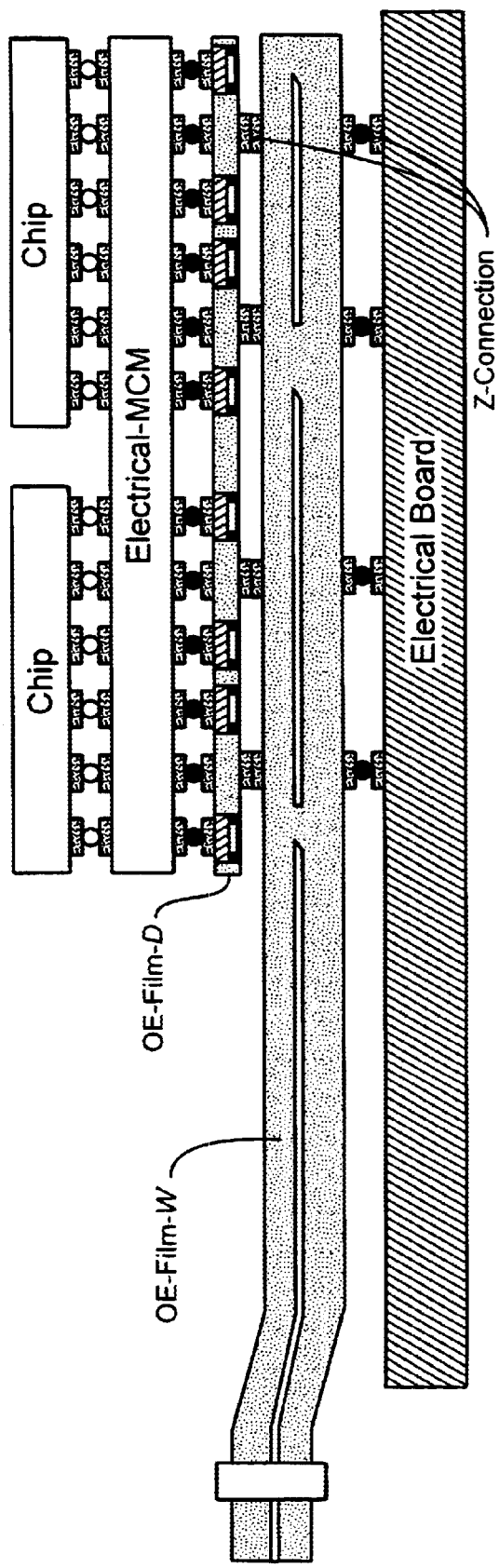
FIG._120

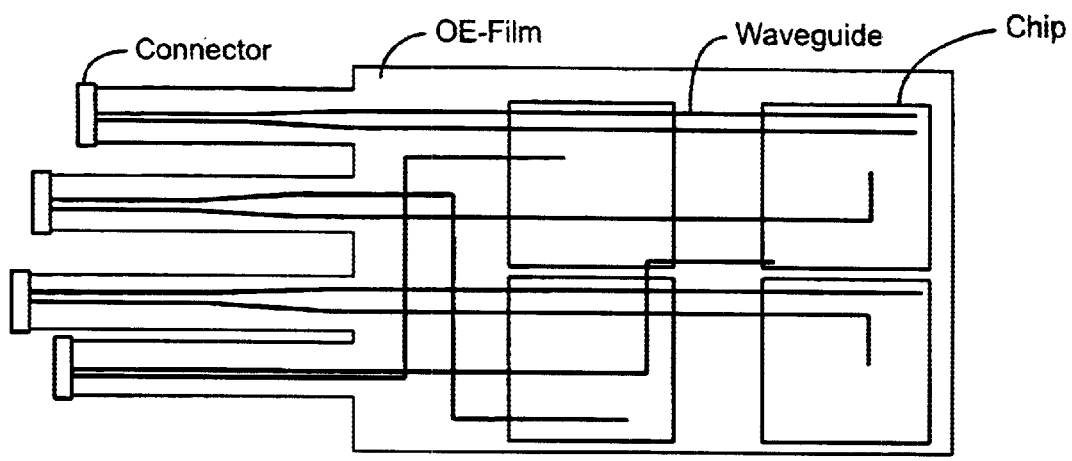
FIG._121
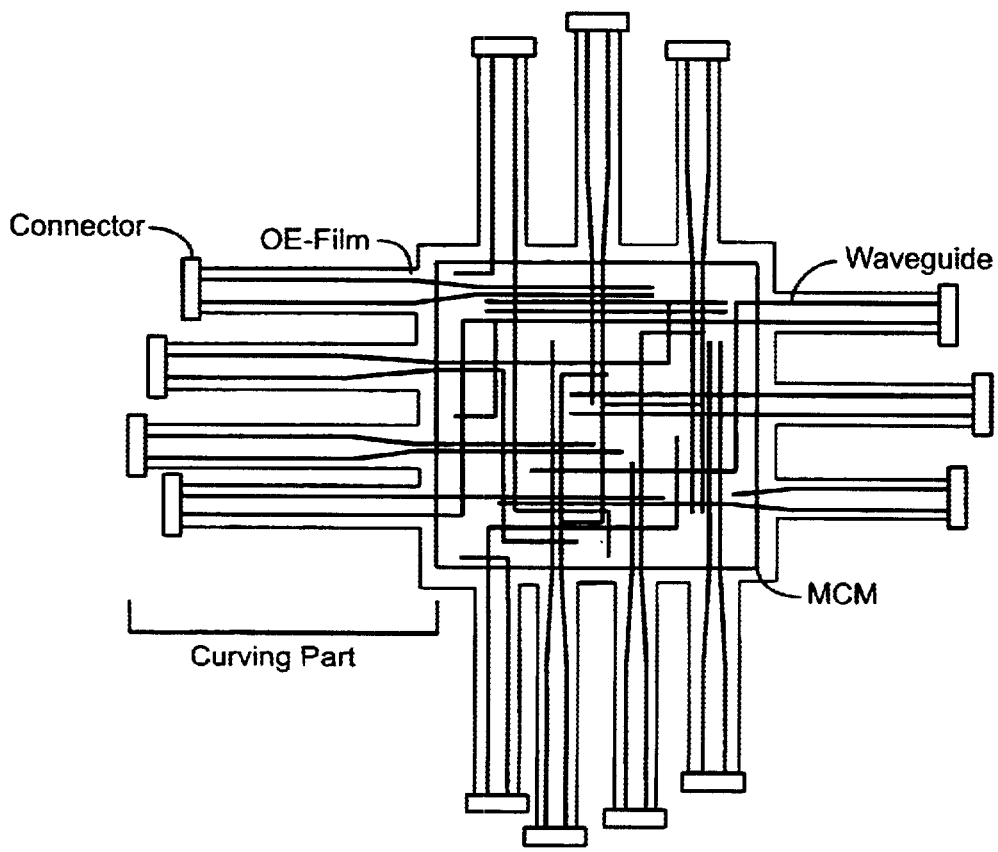
FIG._122

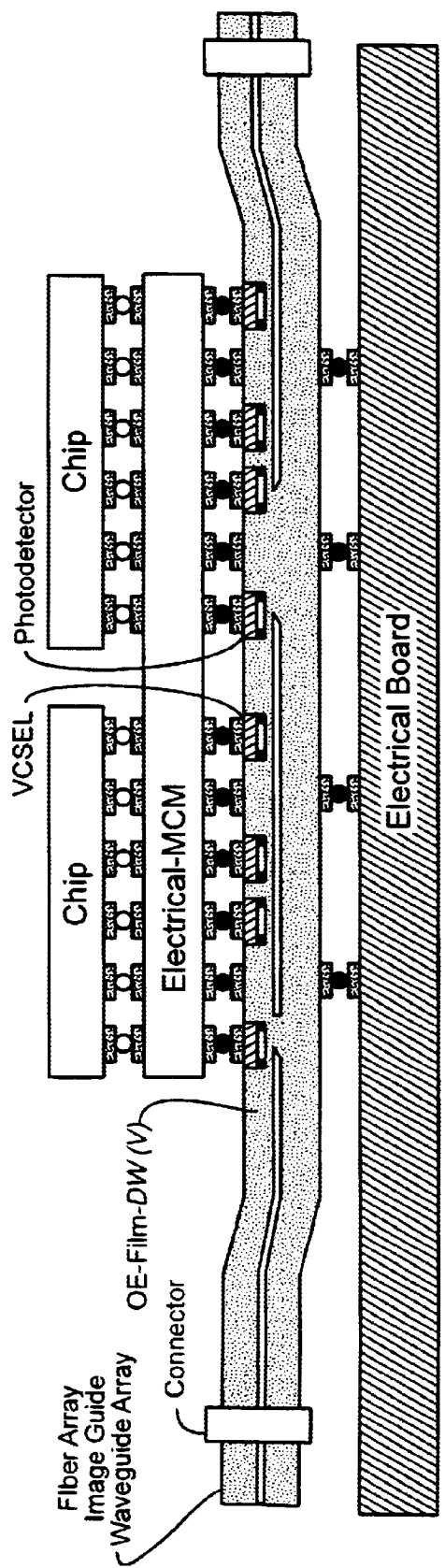
FIG._123
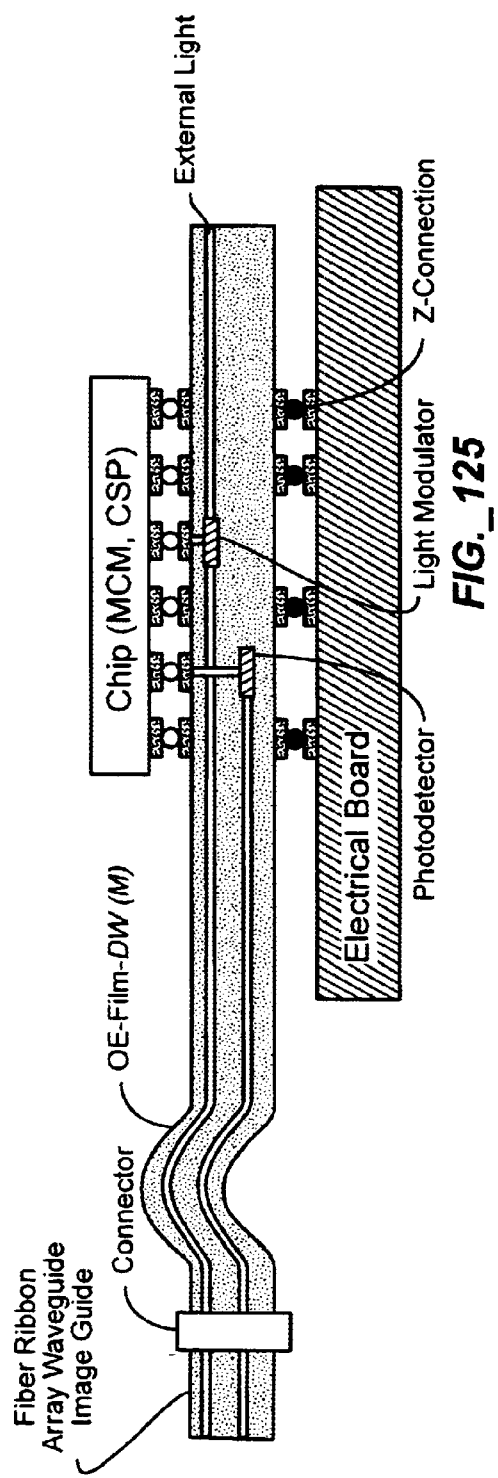
FIG._125

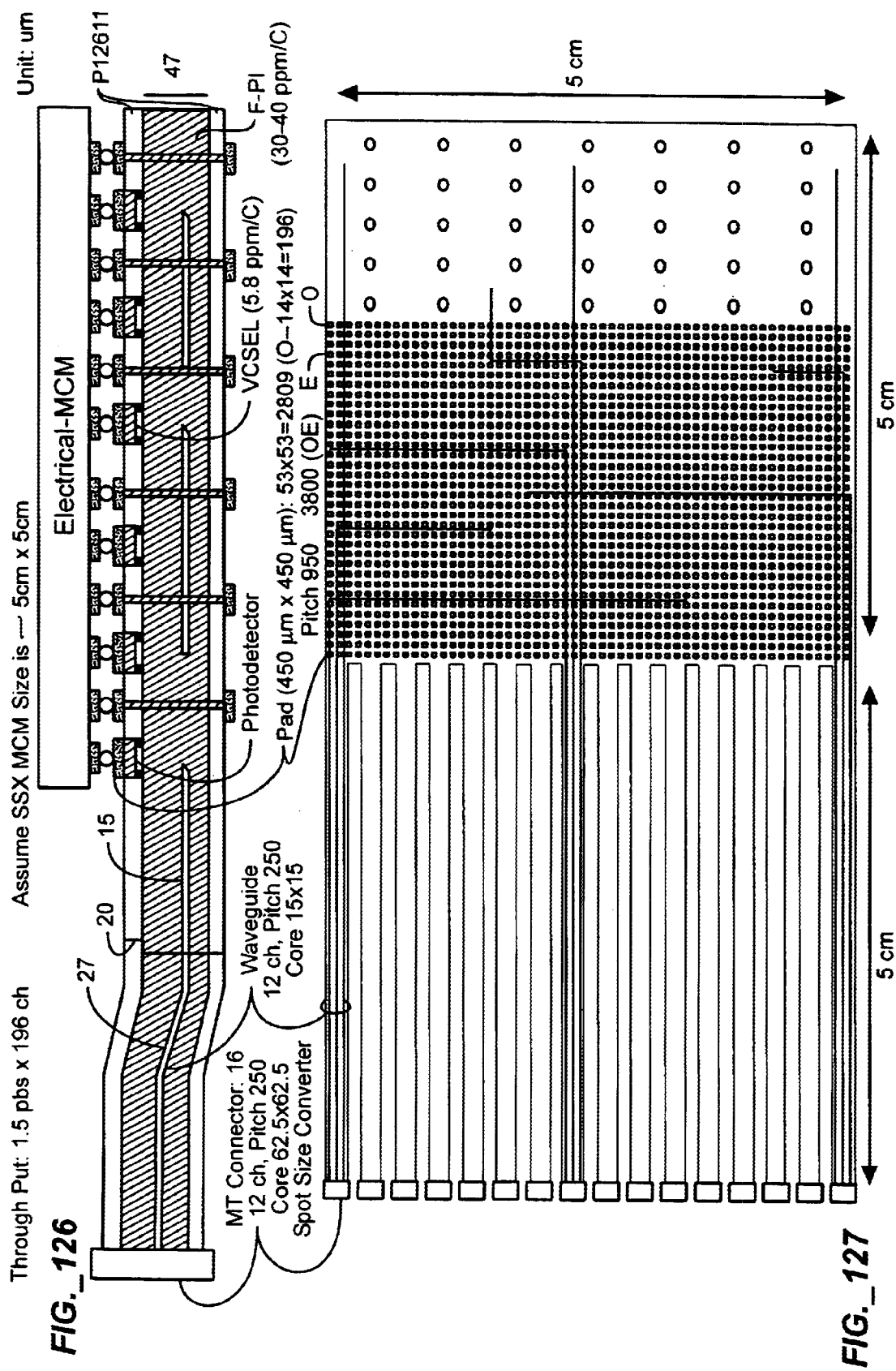
FIG._126
FIG._127

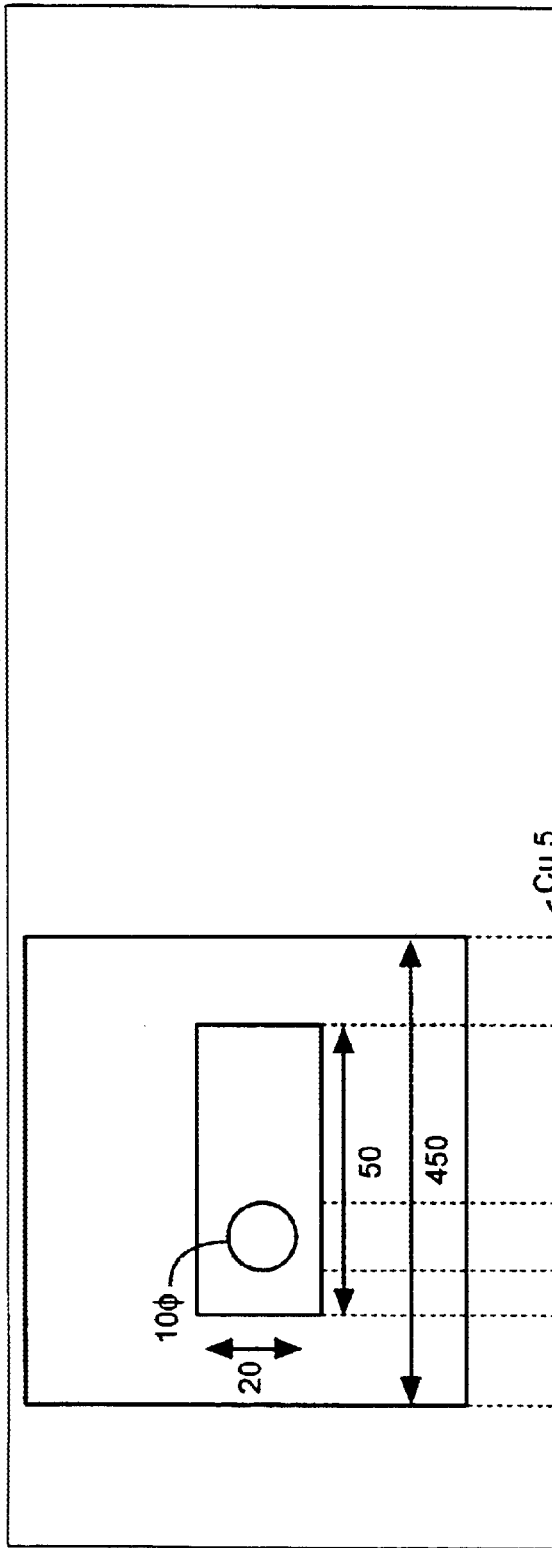
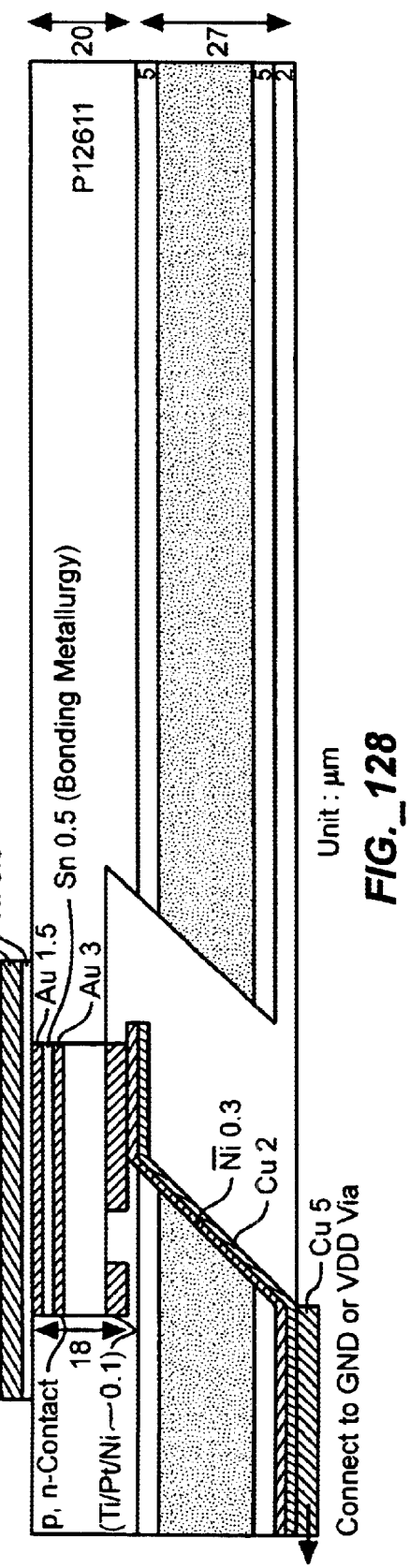
FIG._129
FIG._128

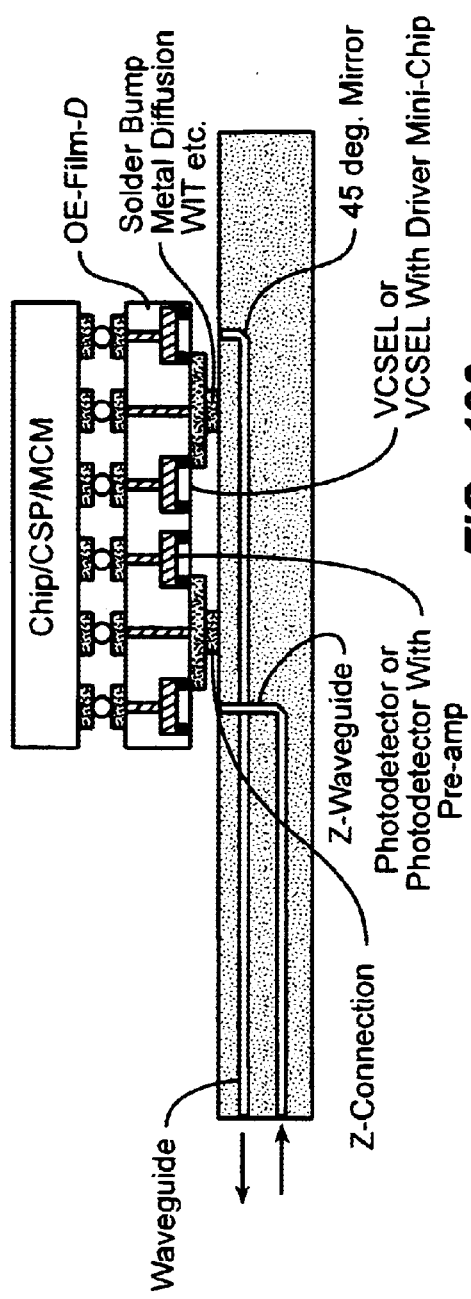
FIG._130
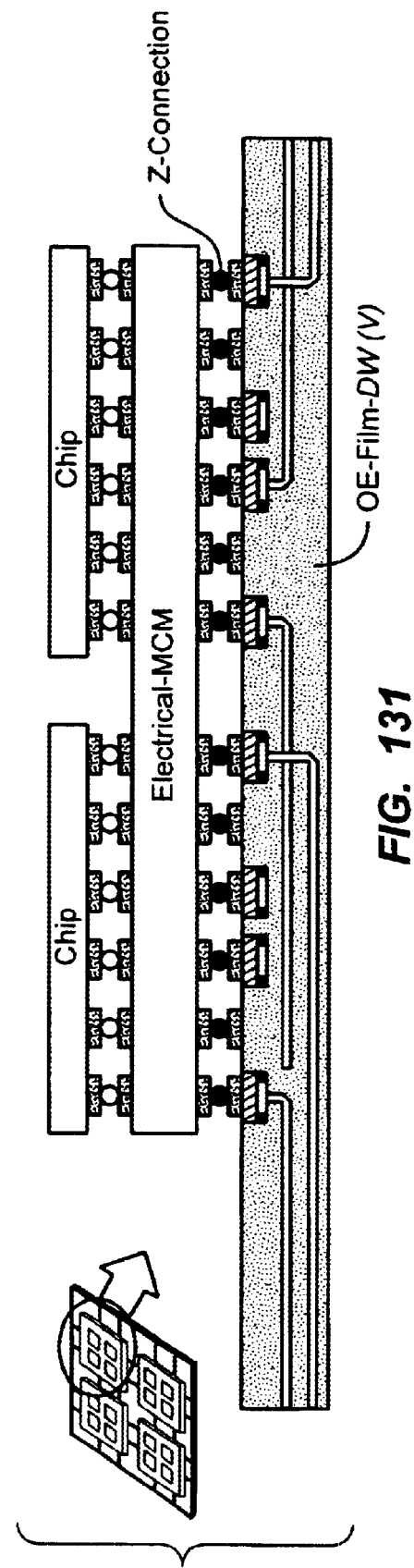
FIG._131

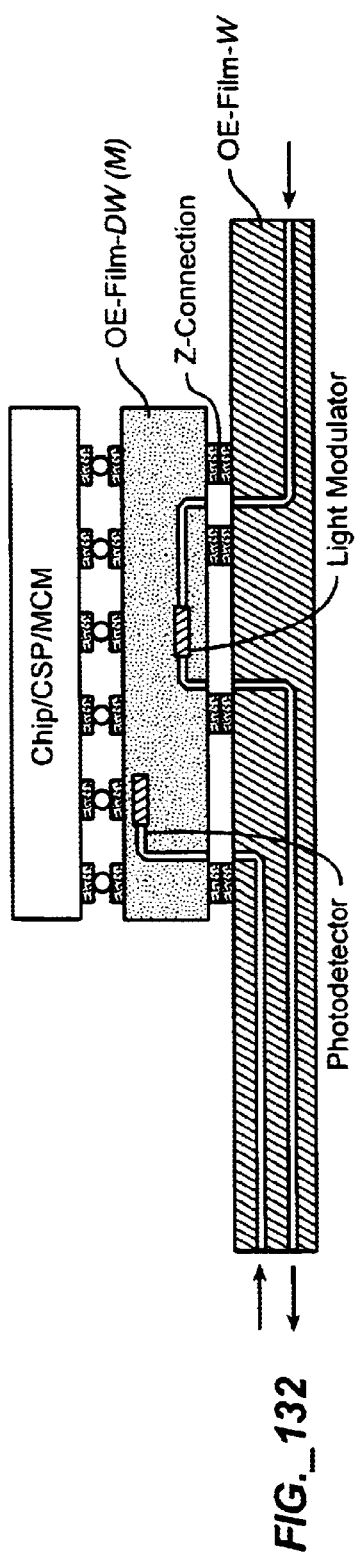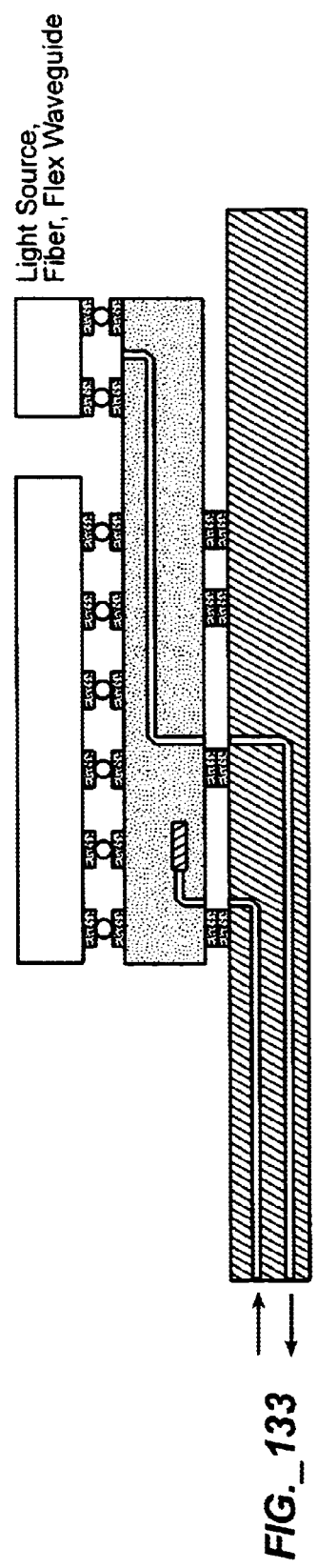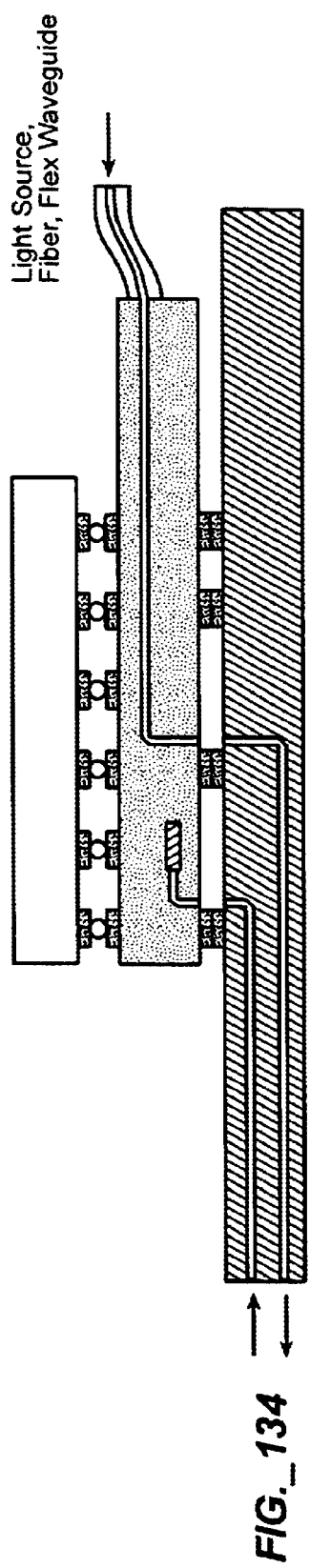
FIG.__132  FIG.__133  FIG.__134

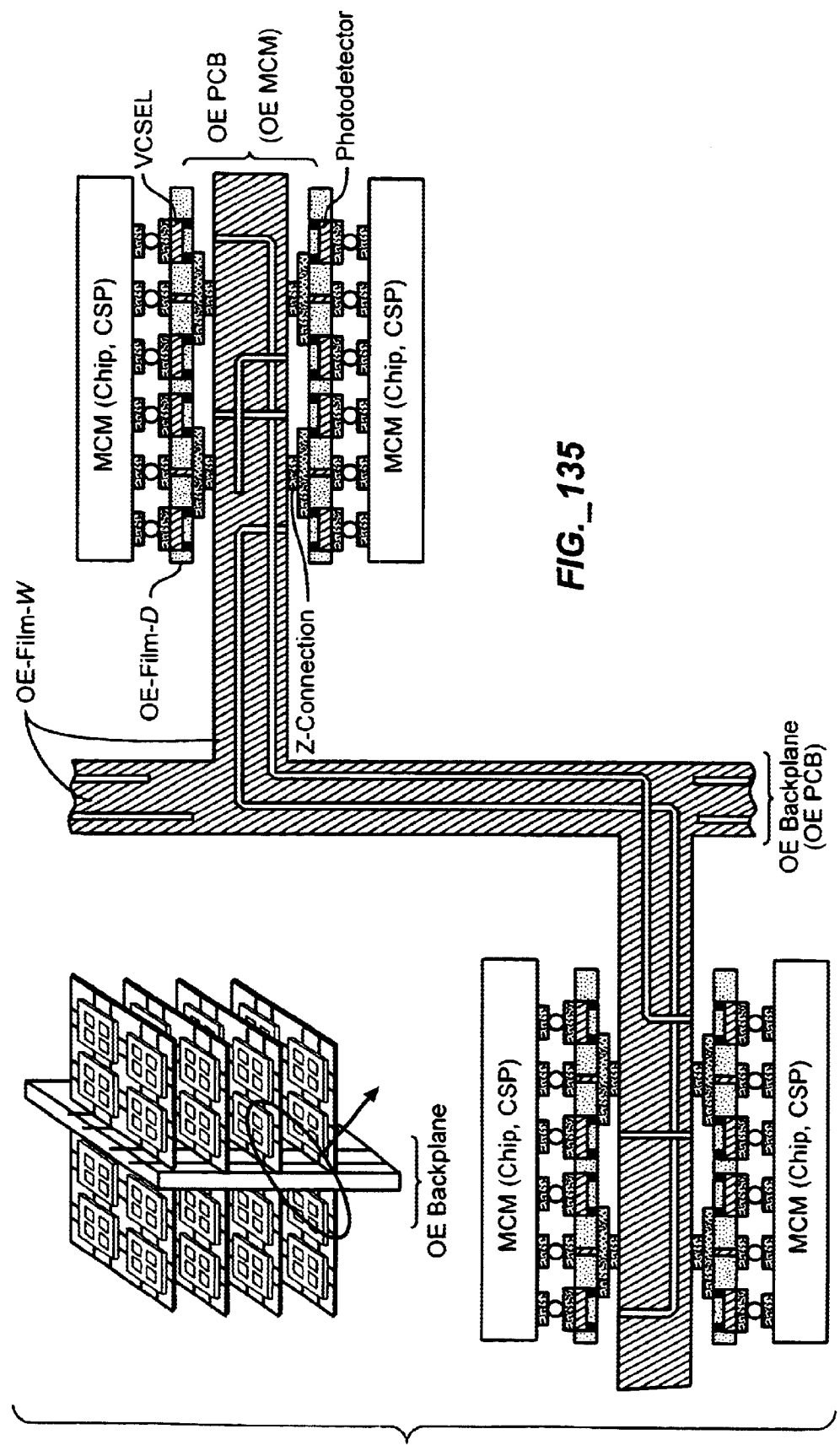
FIG._135

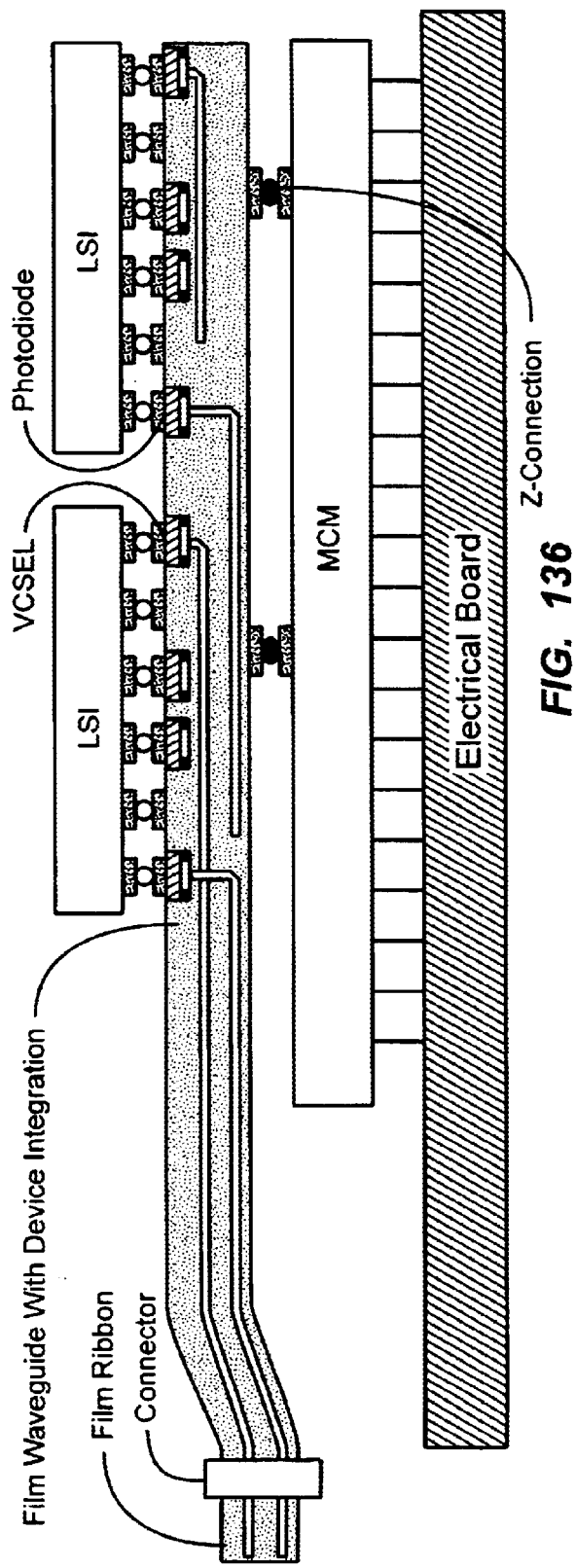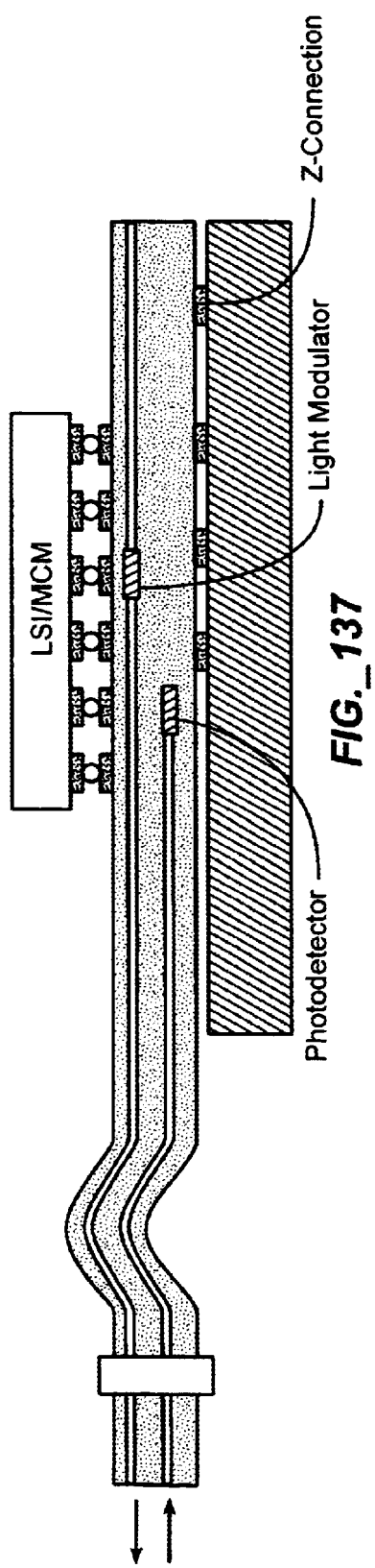
FIG._136
FIG._137

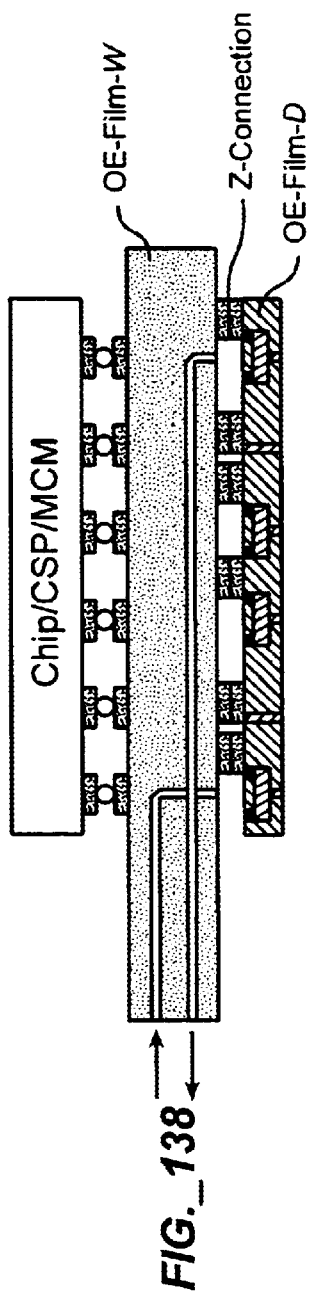
FIG._138
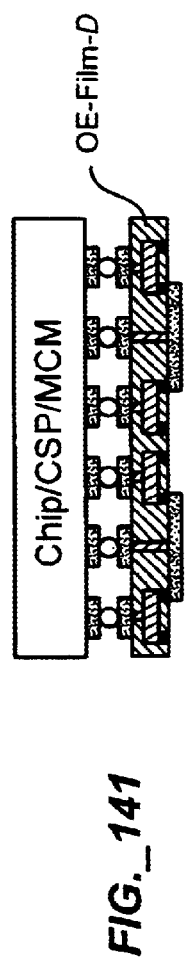
FIG._141
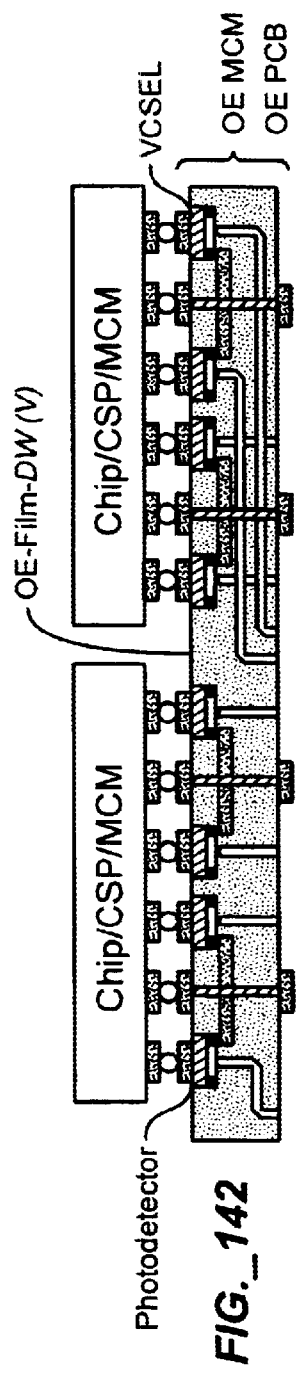
FIG._142

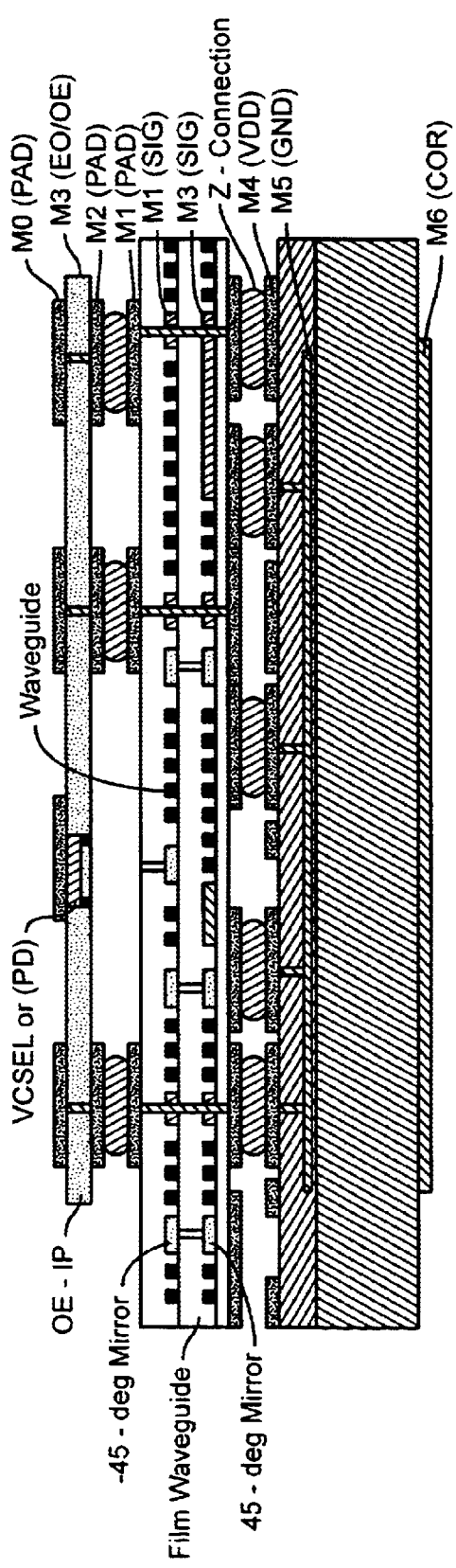
FIG._139
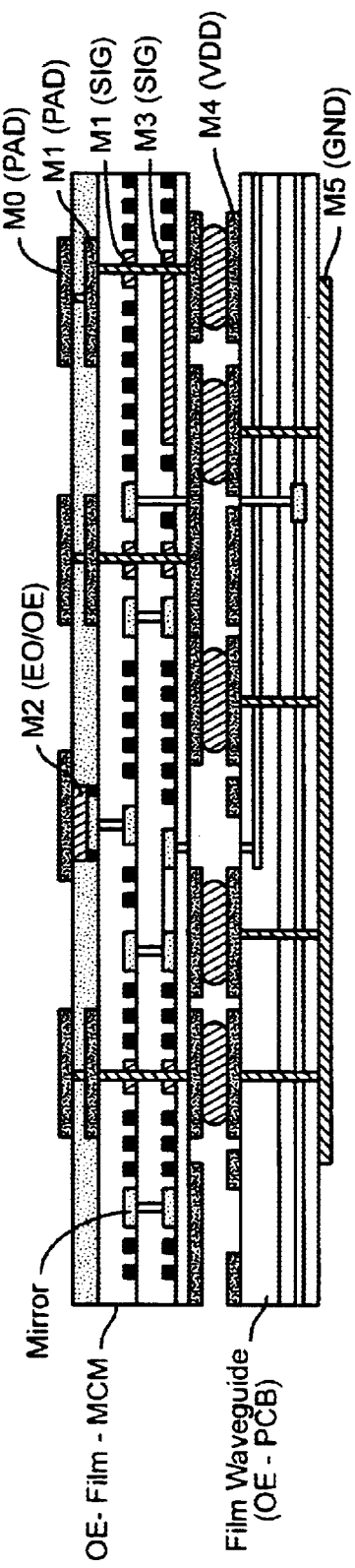
FIG._140

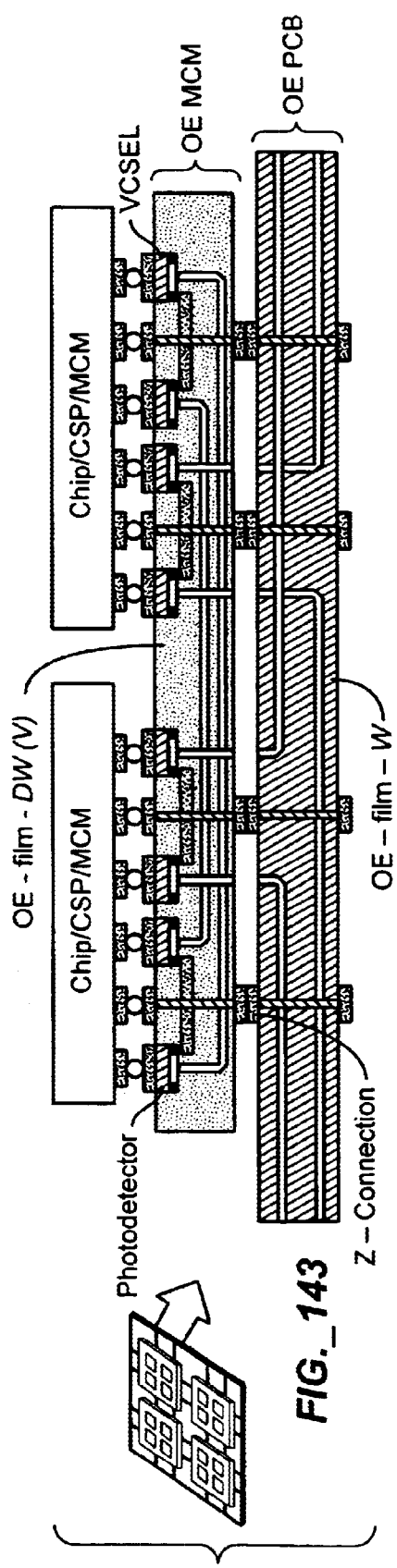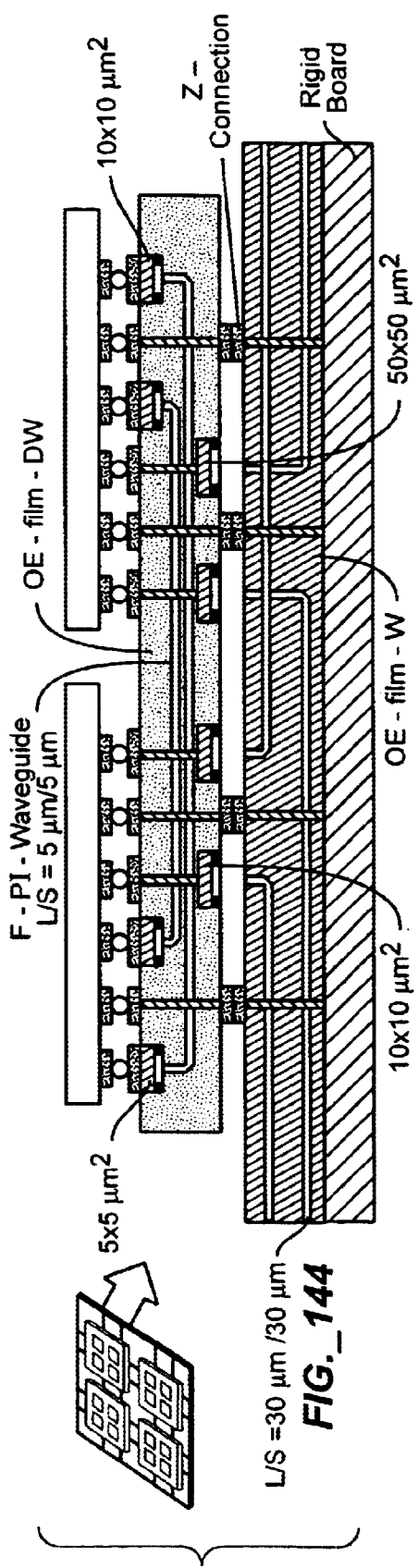
FIG._143
FIG._144

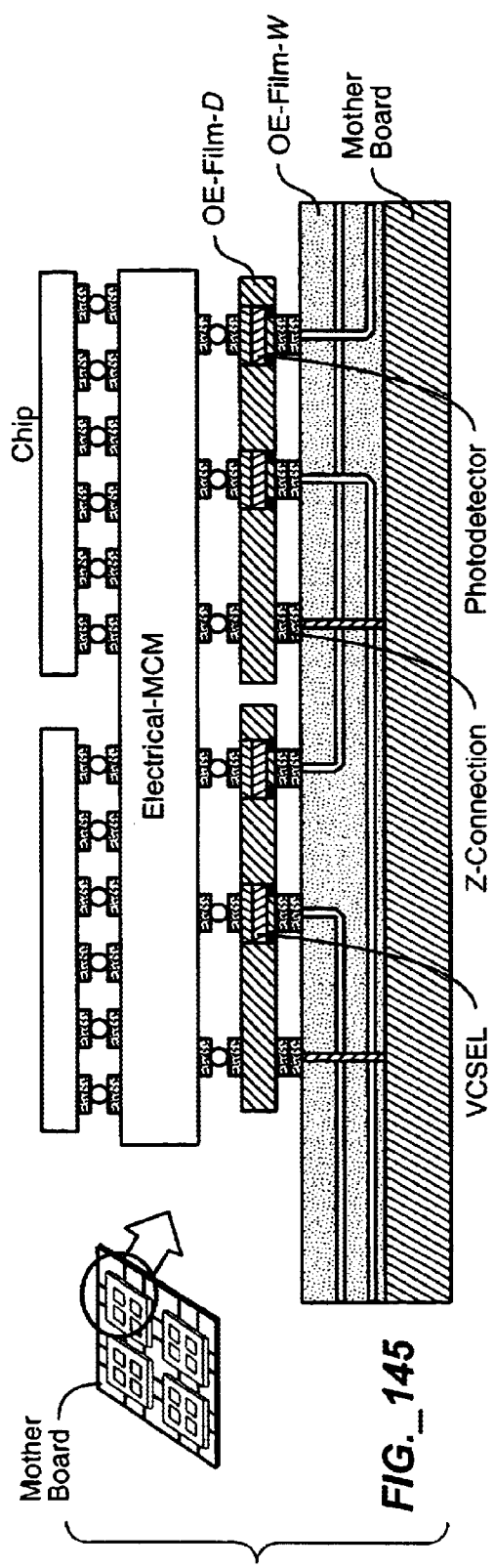
FIG._145
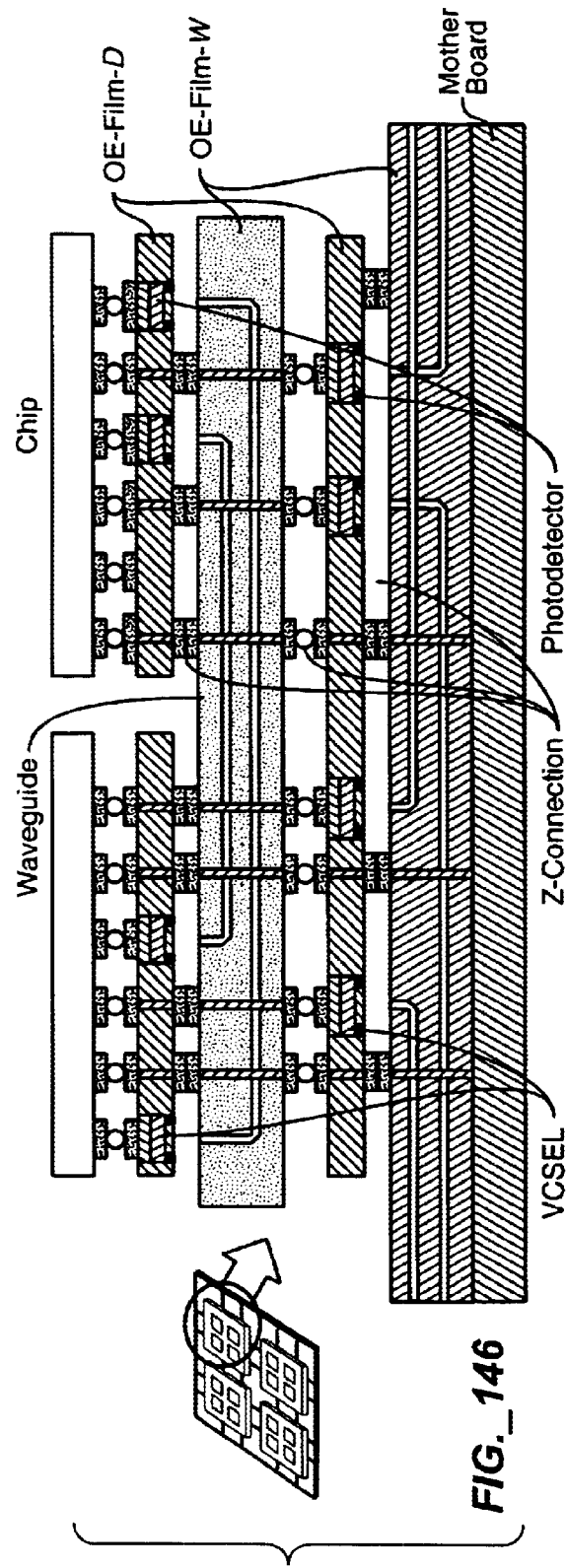
FIG._146

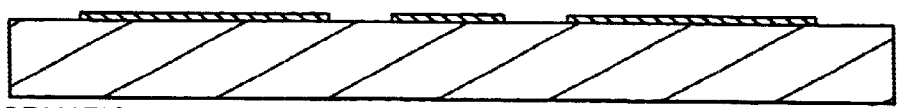
FIG._147
(PADS/LINES FORMATION)
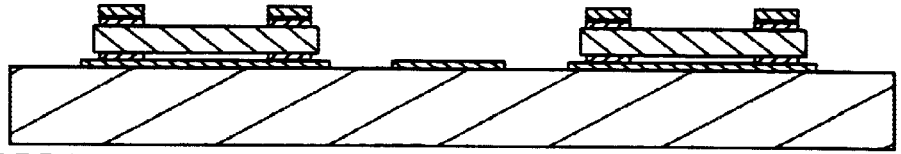
FIG._148
(PLACEMENT OF THIN-FILM DEVICES)
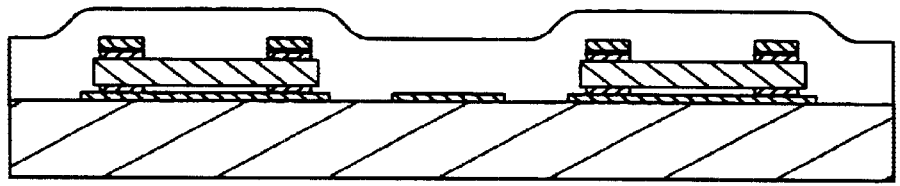
FIG._149
(POLYMER COAT)
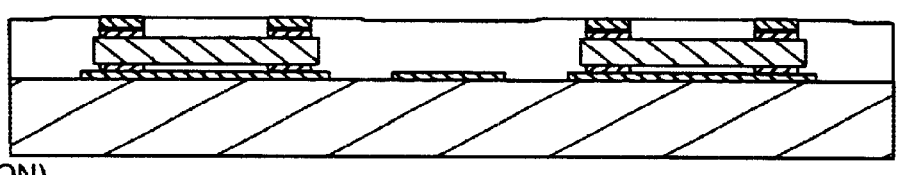
FIG._150
(PLANARIZATION)
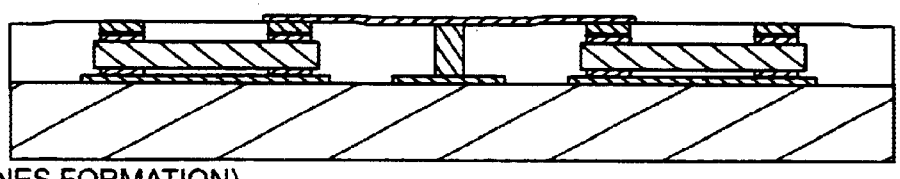
FIG._151
(VIAS/PADS/LINES FORMATION)
FIG._152
(SUBSTRATE REMOVAL)    OE - film - D
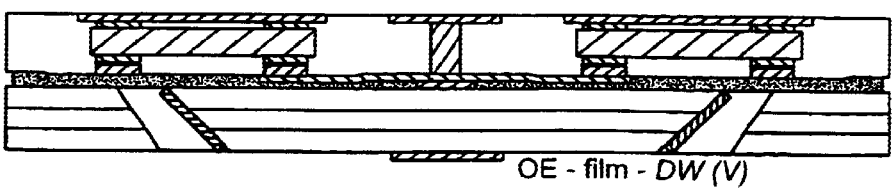
FIG._153
( WAVEGUIDE FORMATION )
OE - film - DW (V)

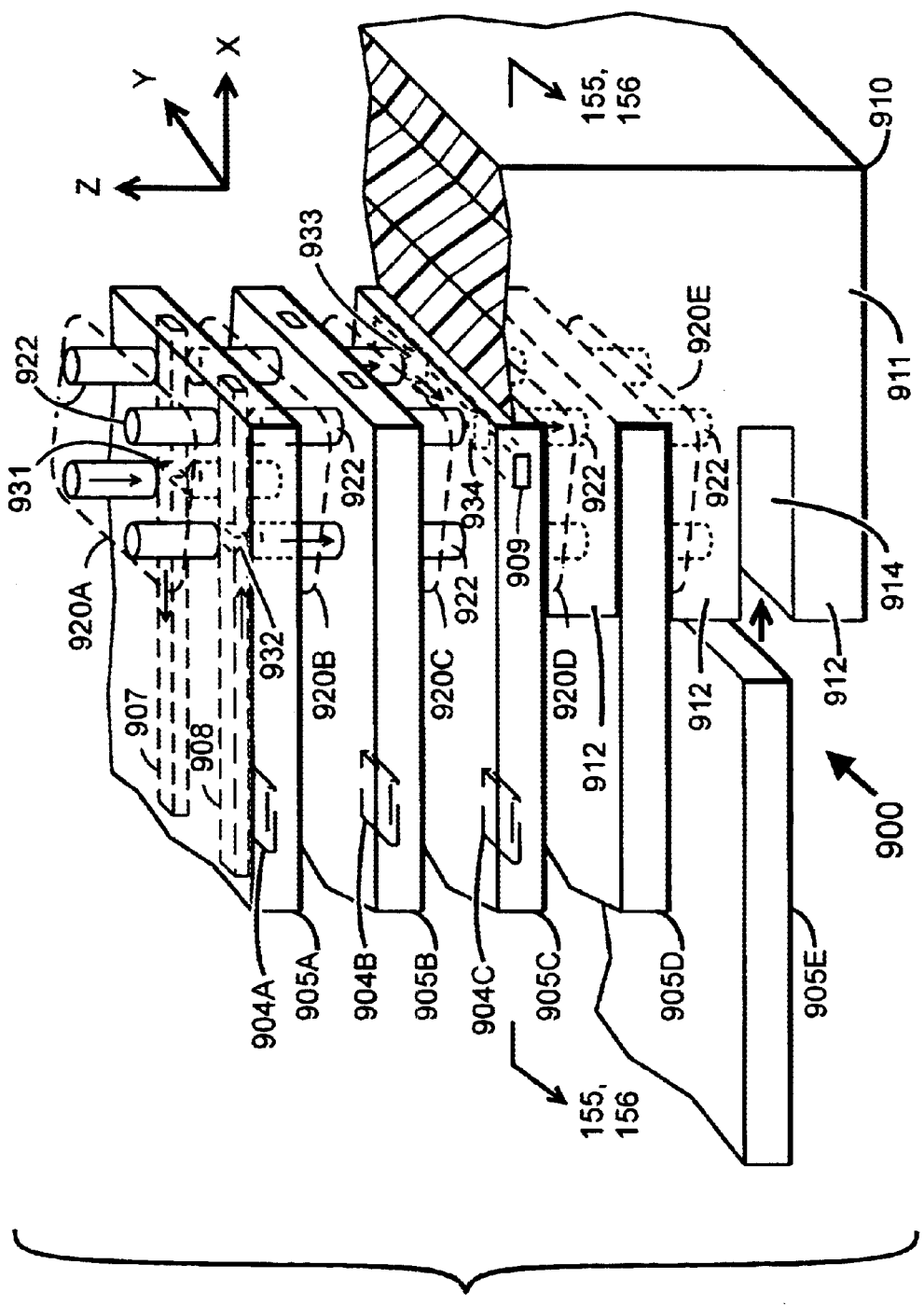
FIG._154

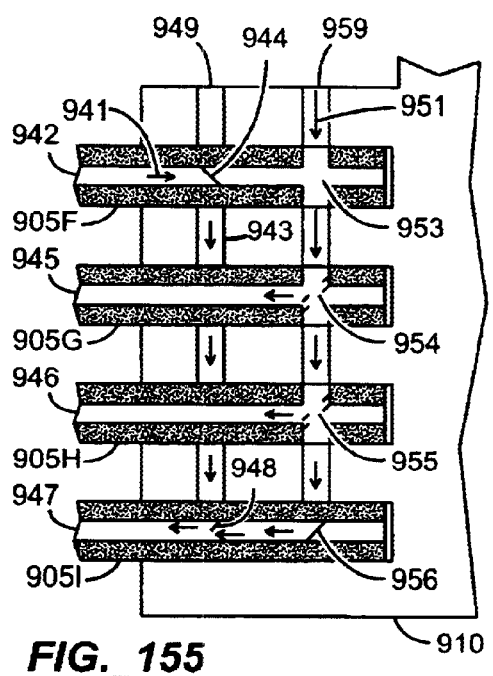
FIG._155
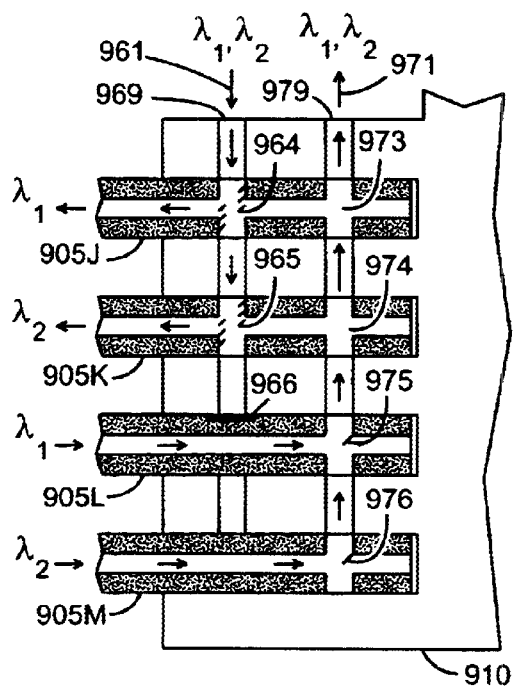
FIG._156-1
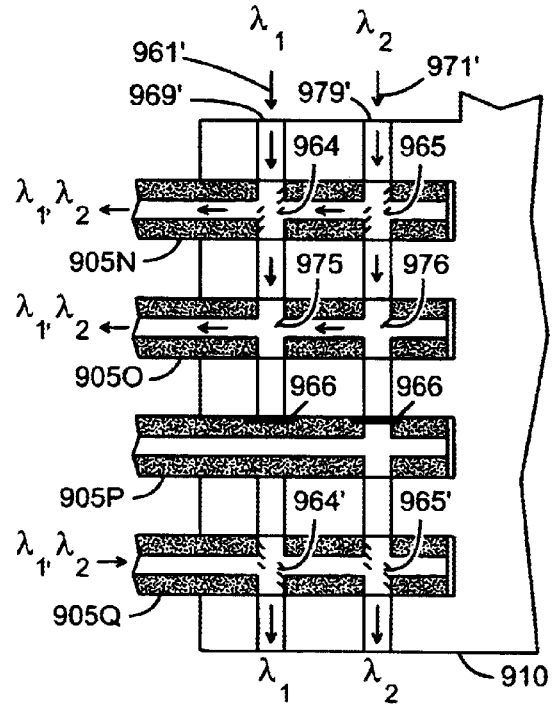
FIG._156-2

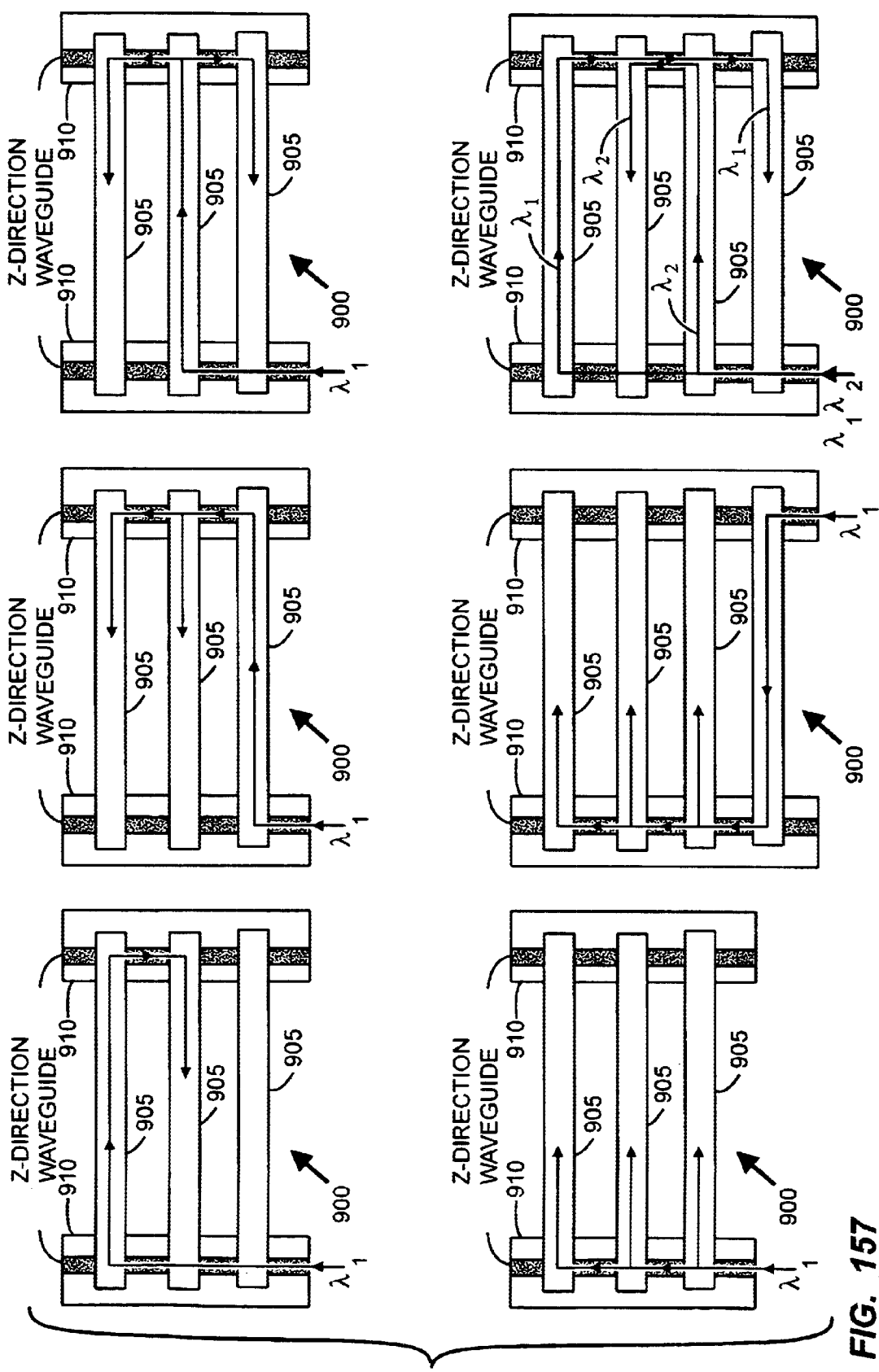
FIG._157

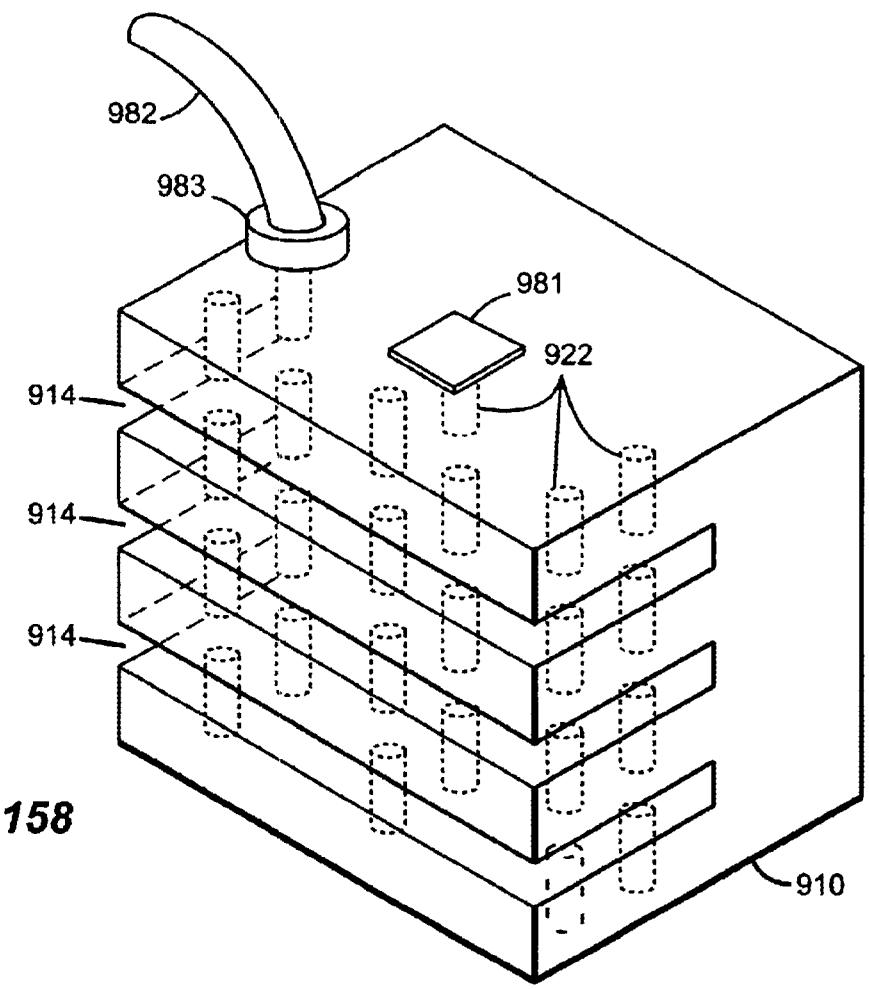
FIG._158
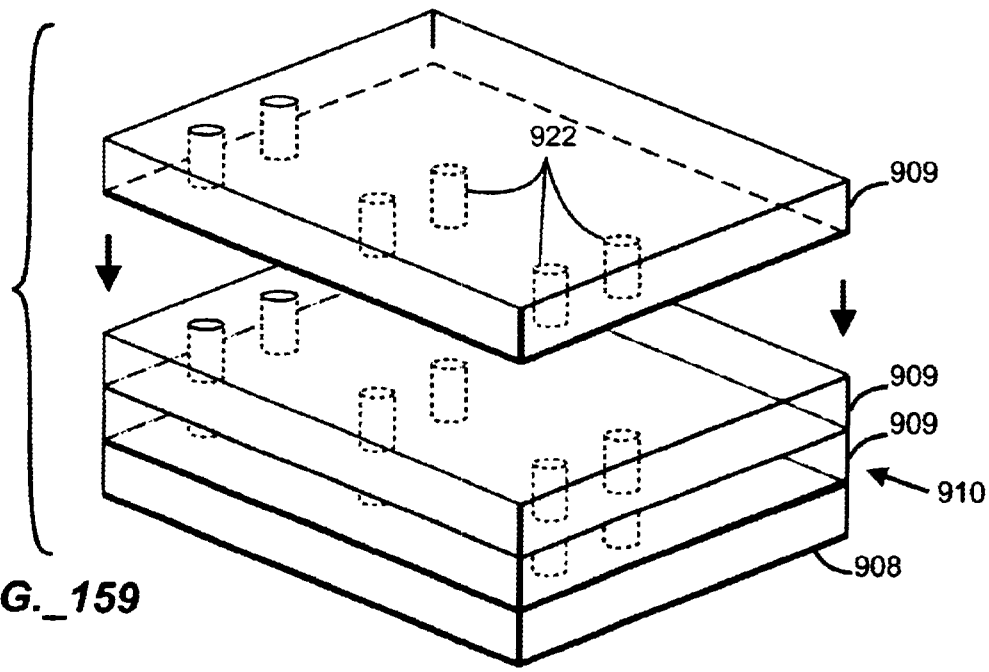
FIG._159

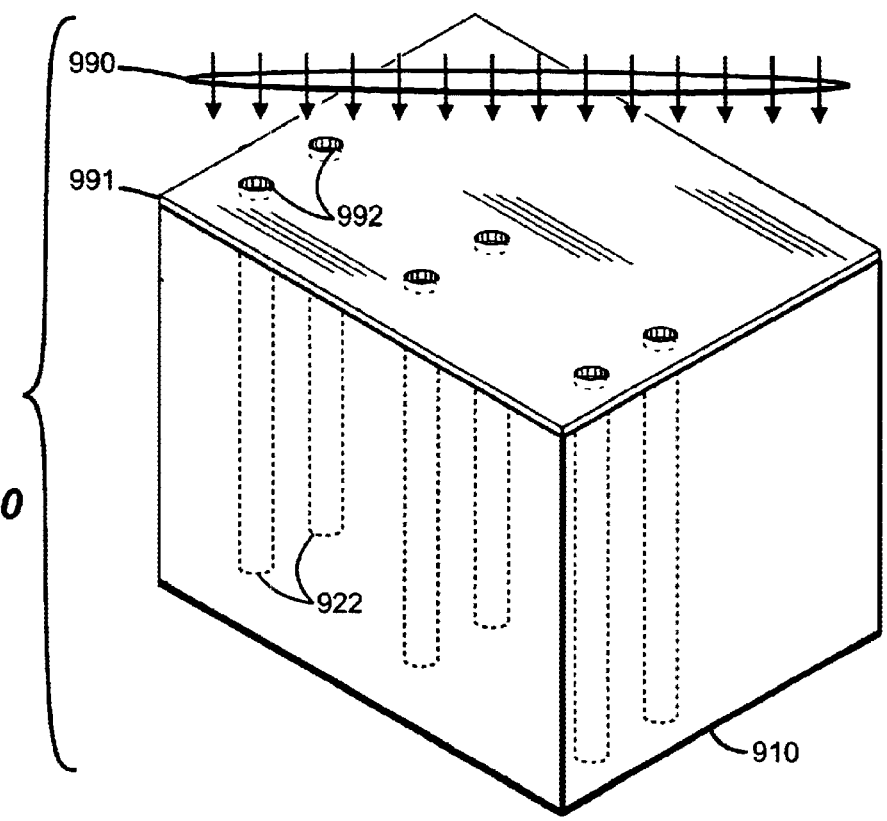
FIG._160
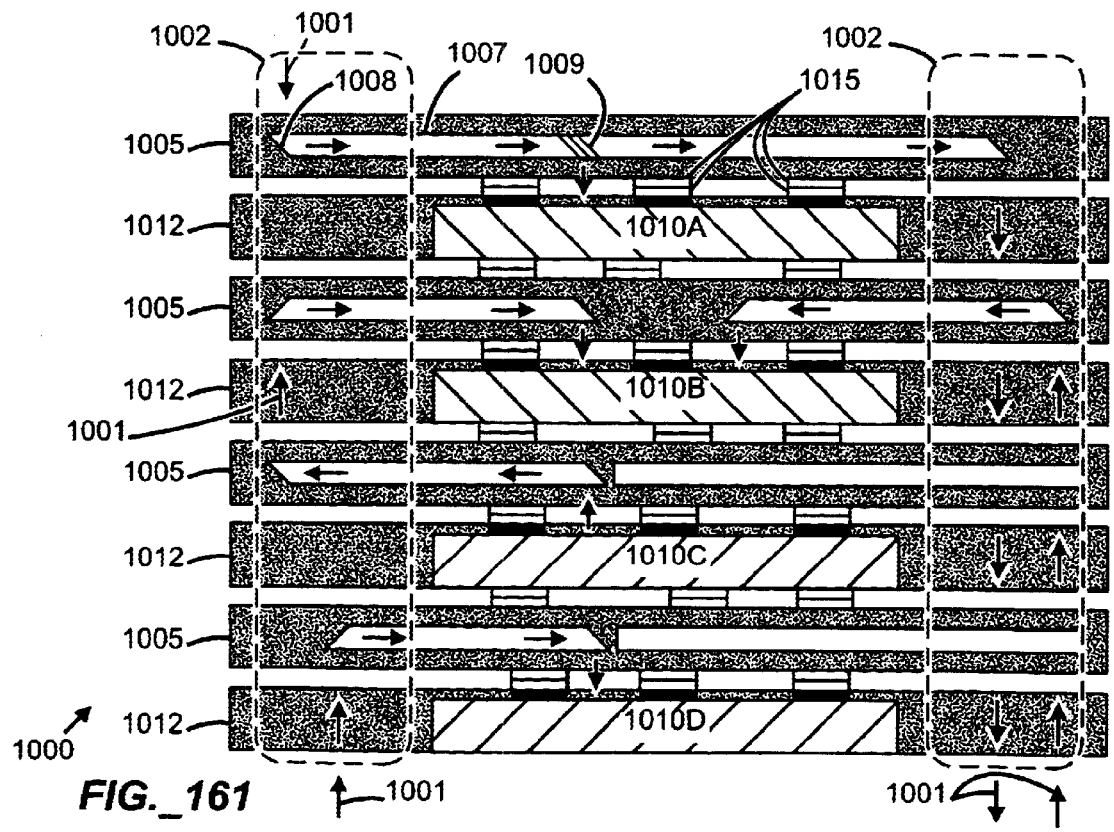
FIG._161

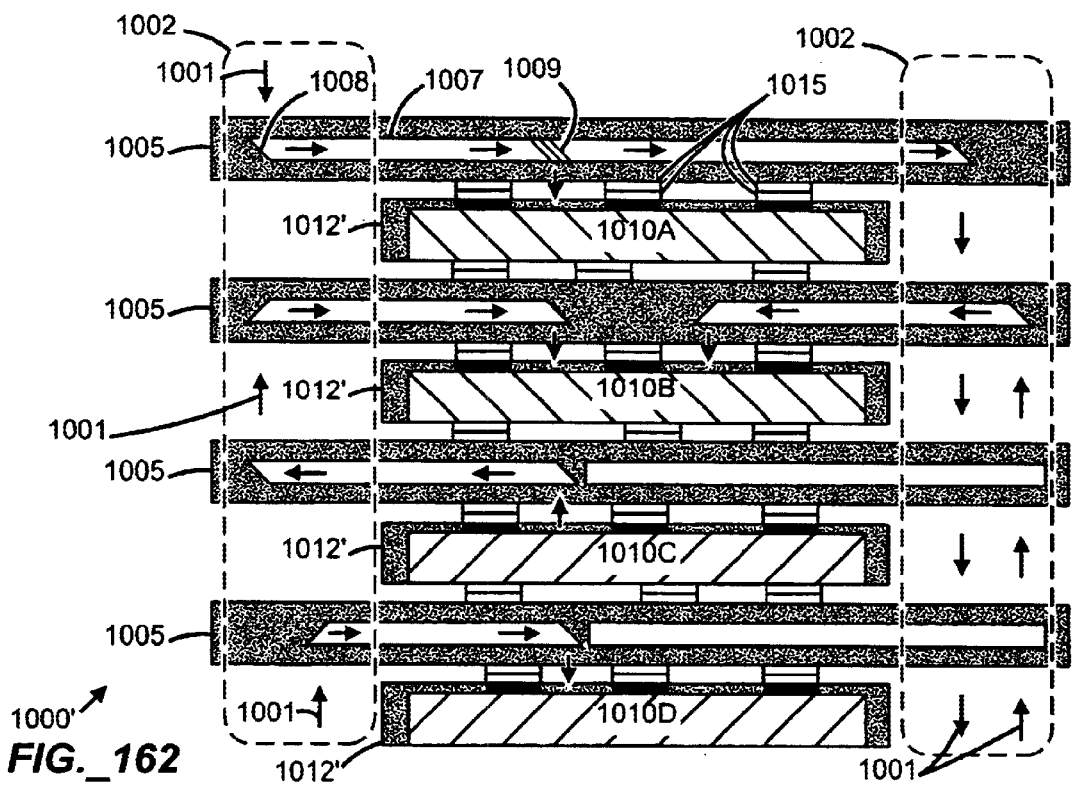
FIG._162
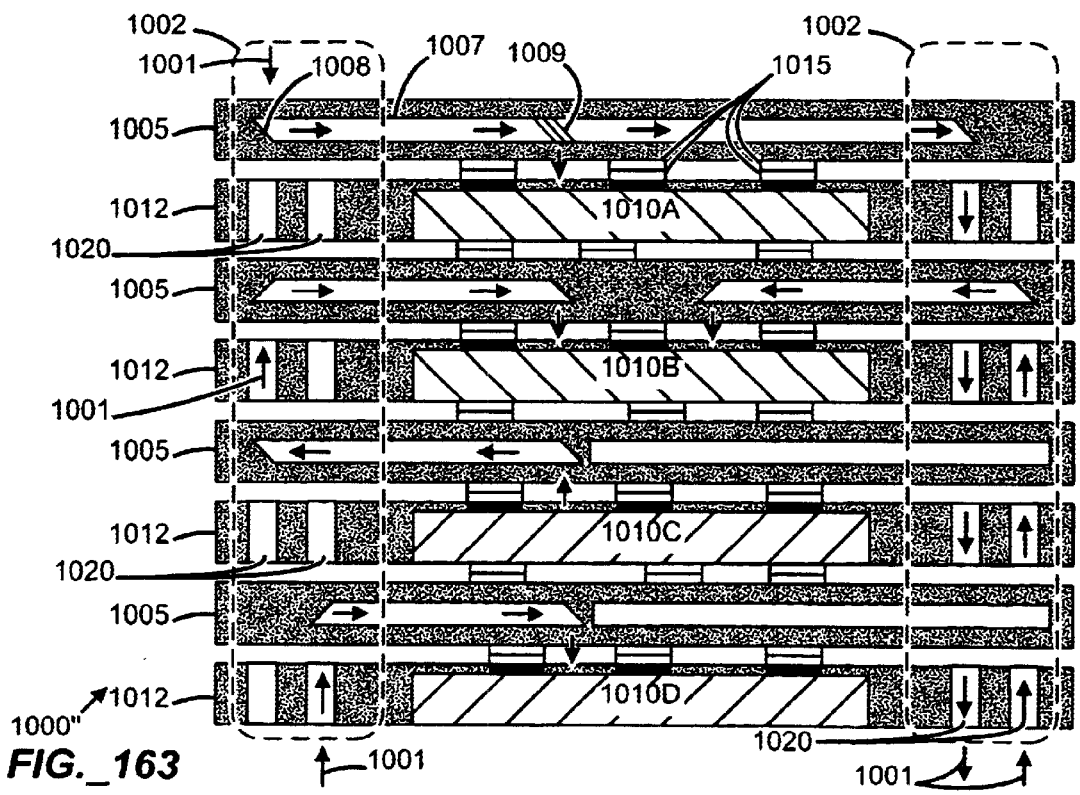
FIG._163

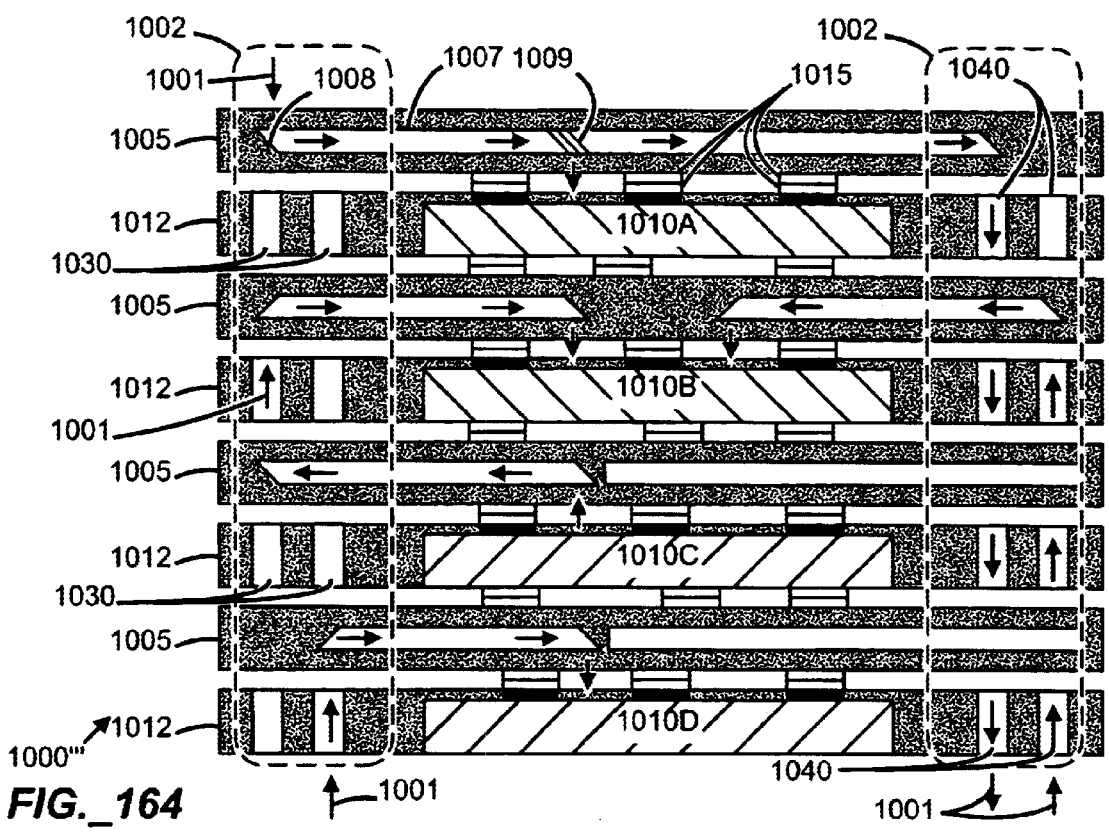
FIG._164
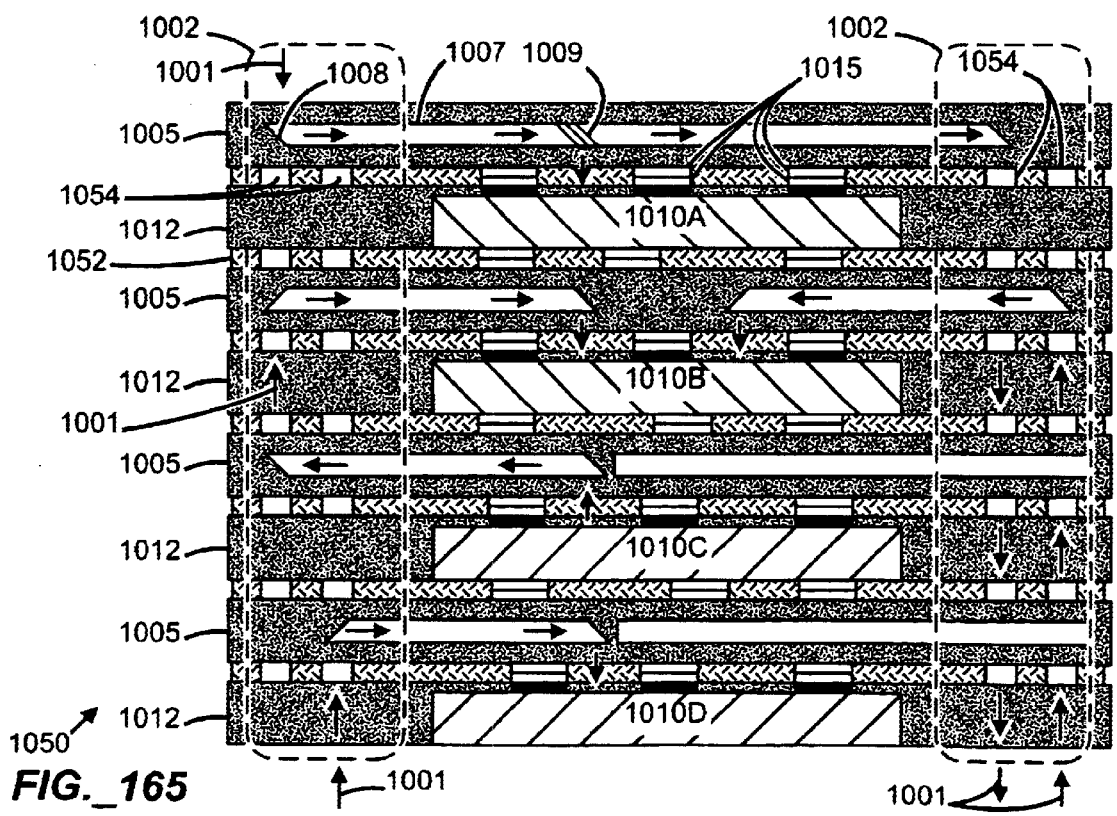
FIG._165

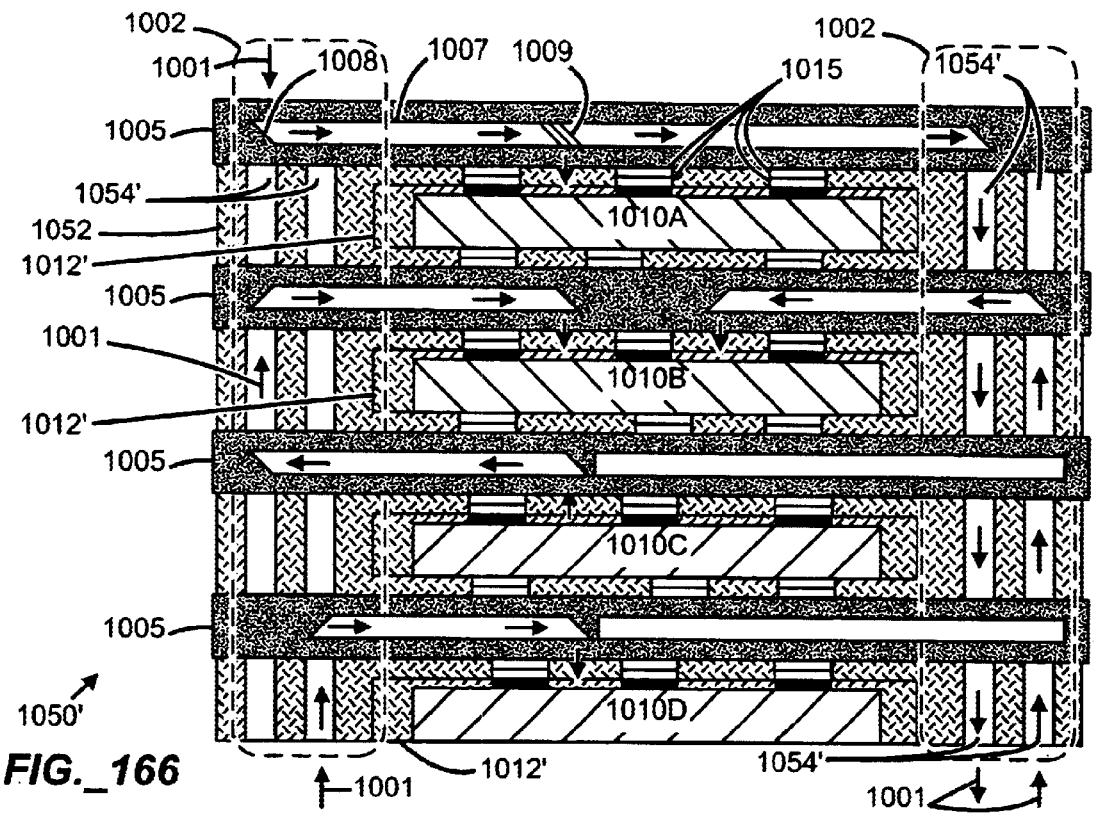
FIG._166
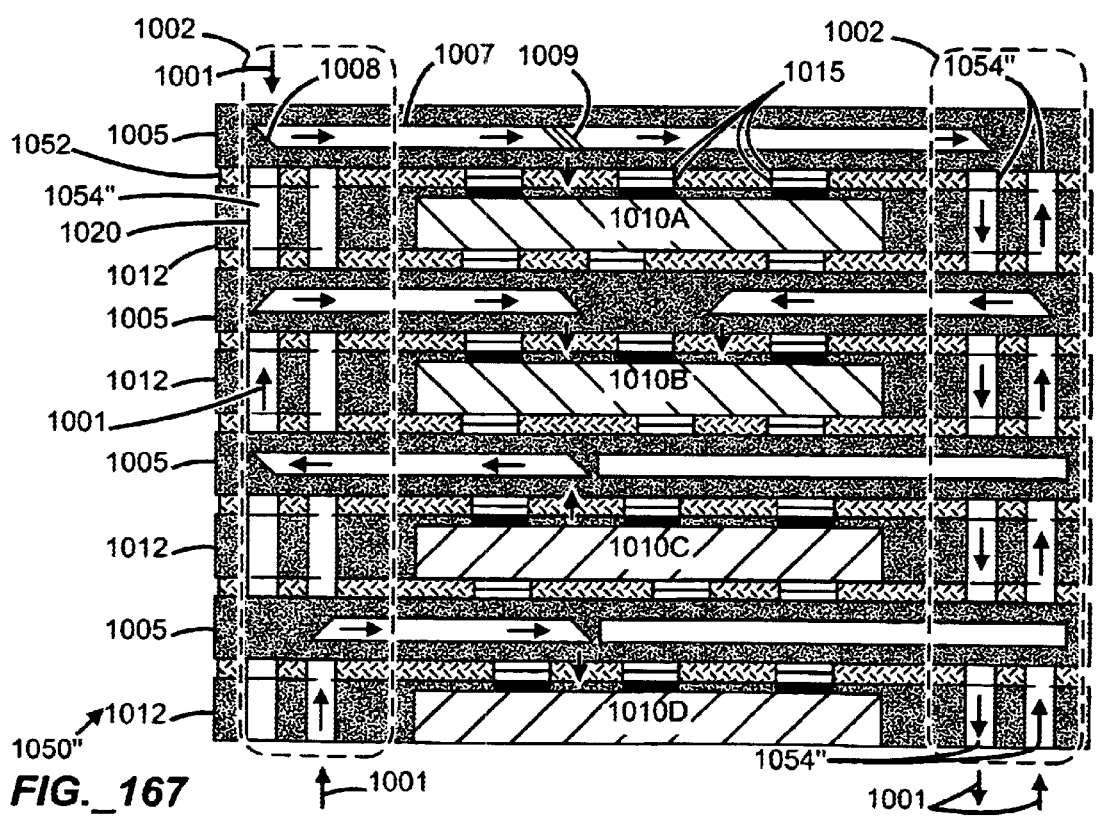
FIG._167

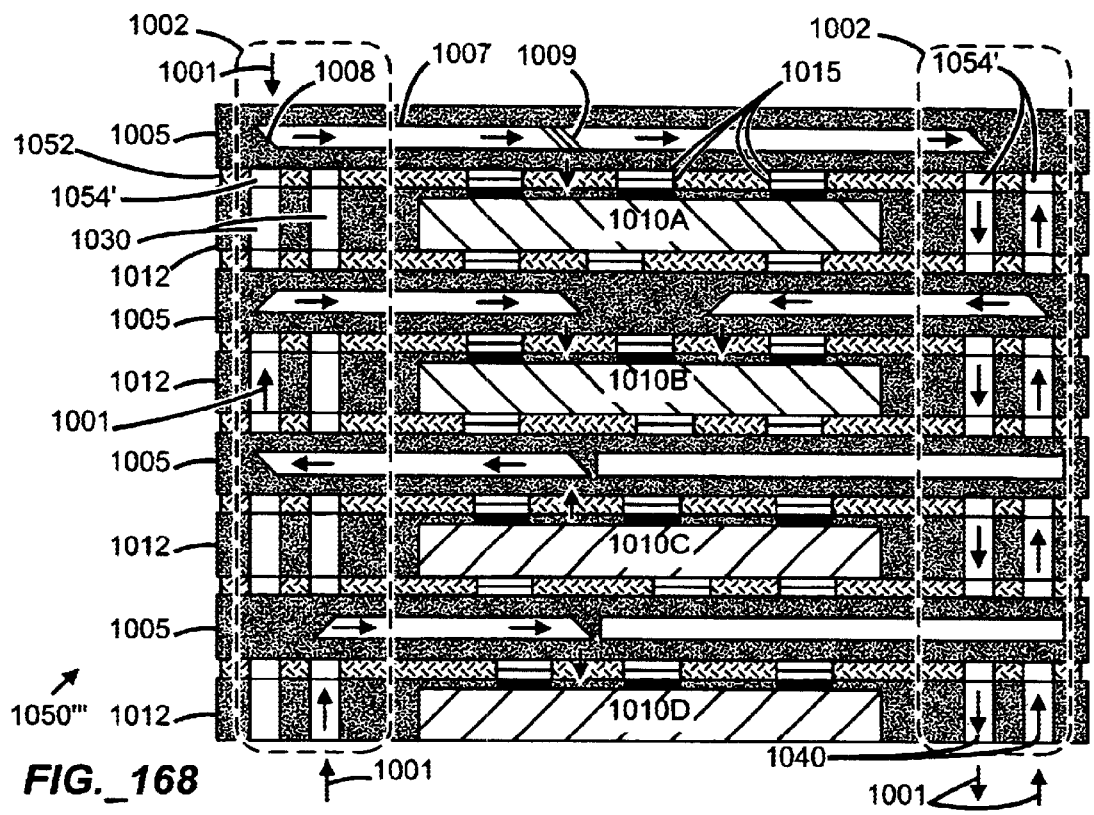
FIG._168
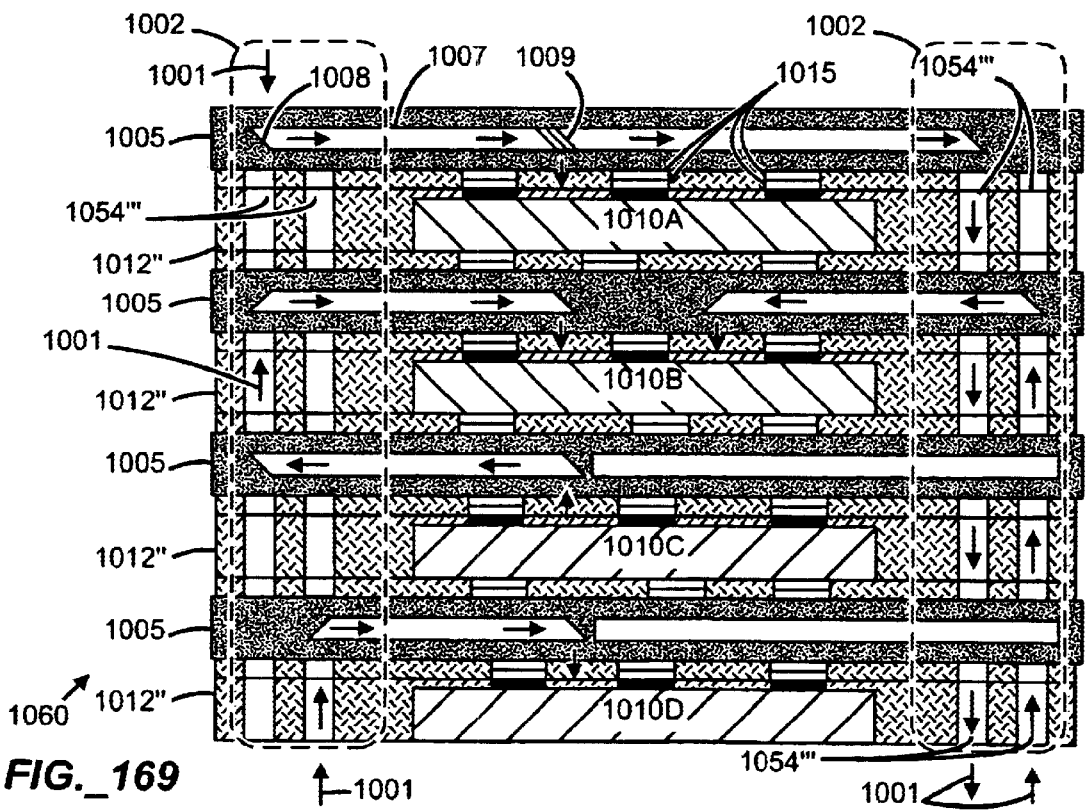
FIG._169

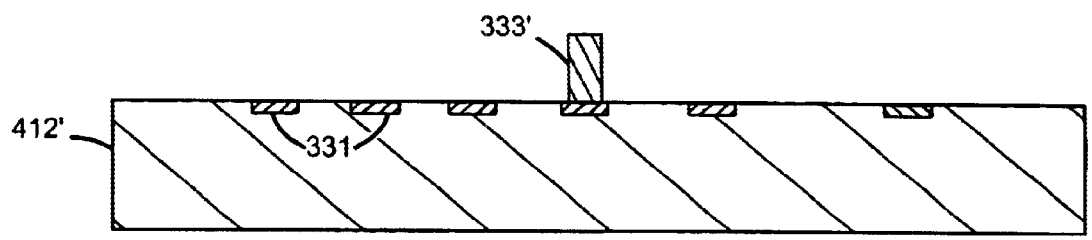
FIG._170
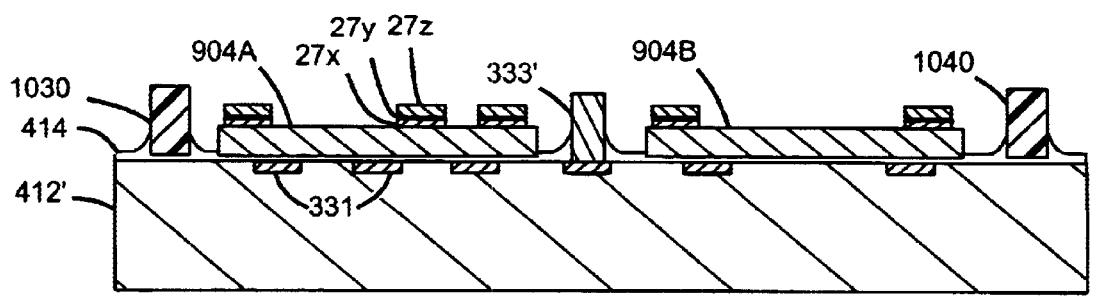
FIG._171
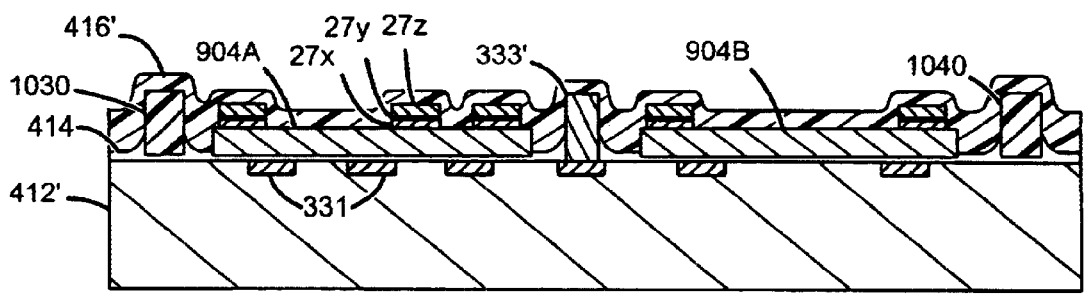
FIG._172
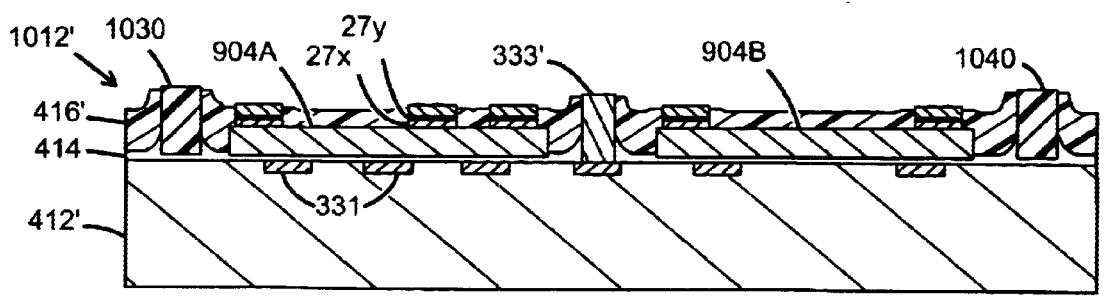
FIG._173

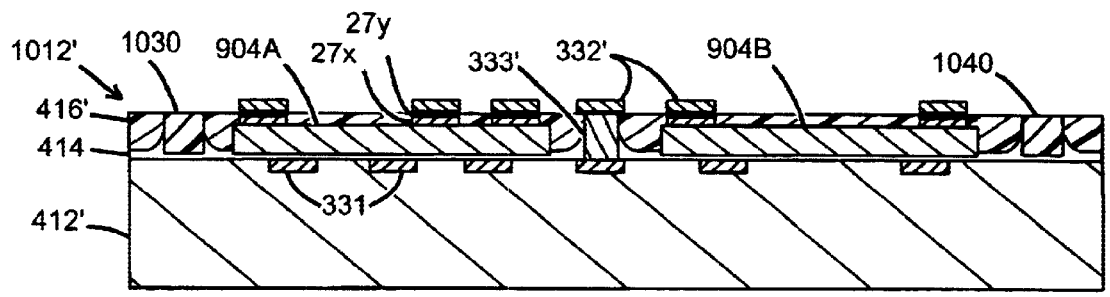
FIG._174
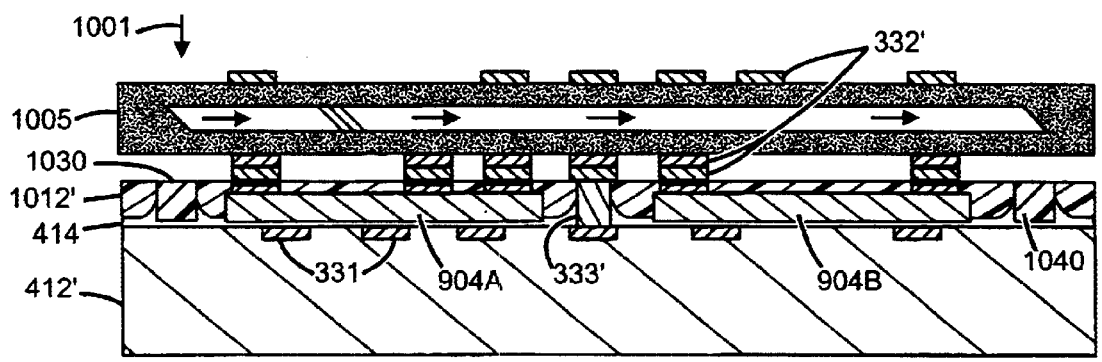
FIG._175
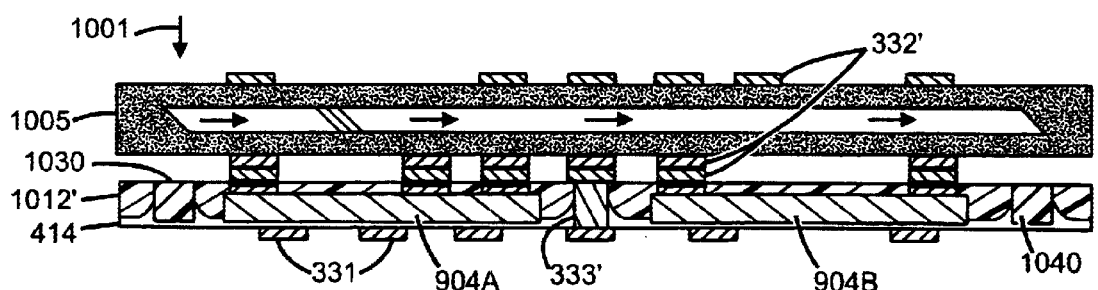
FIG._176

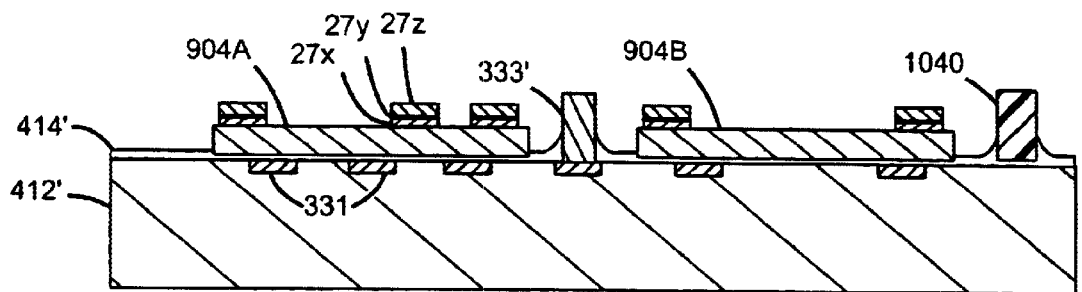
FIG._177
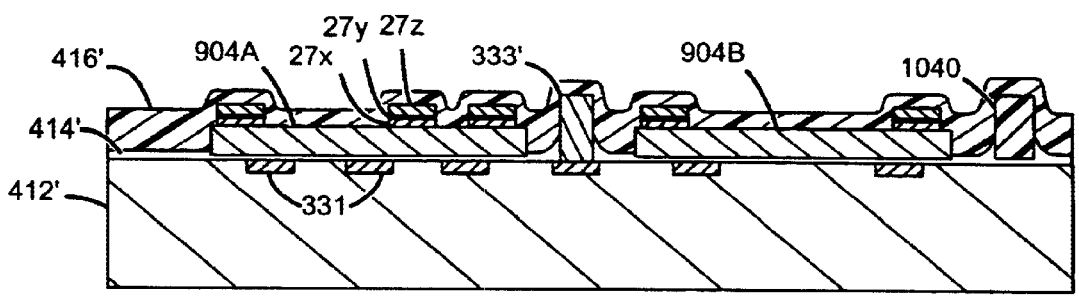
FIG._178
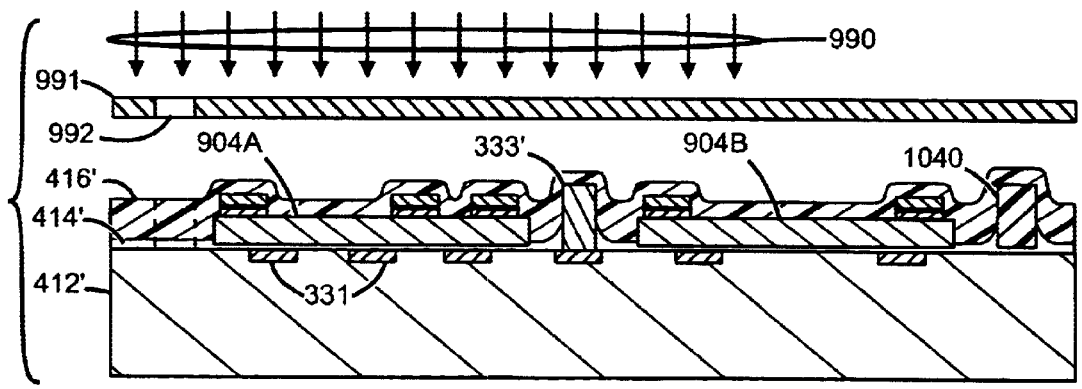
FIG._179
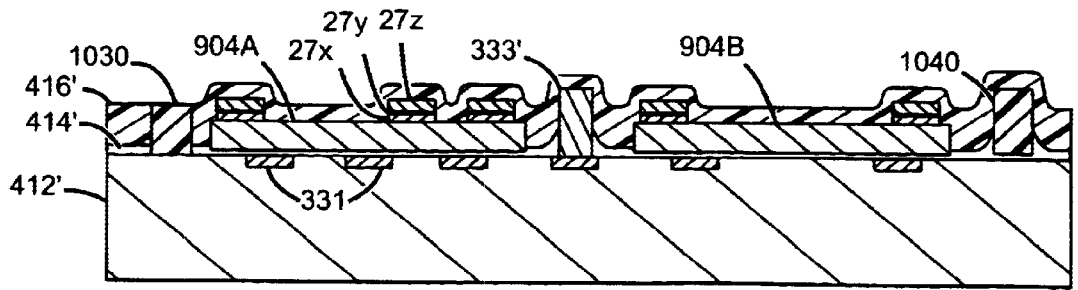
FIG._180

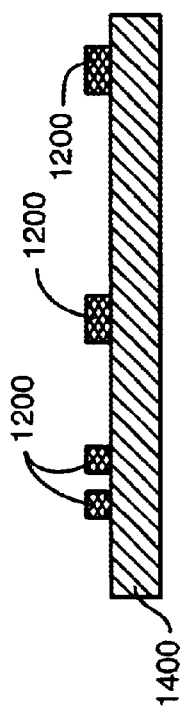
FIG._181
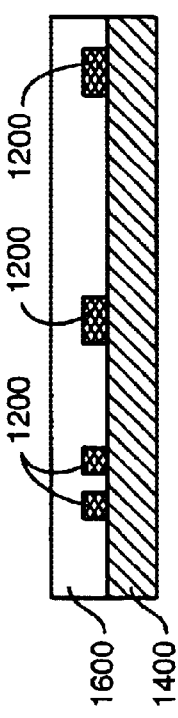
FIG._182
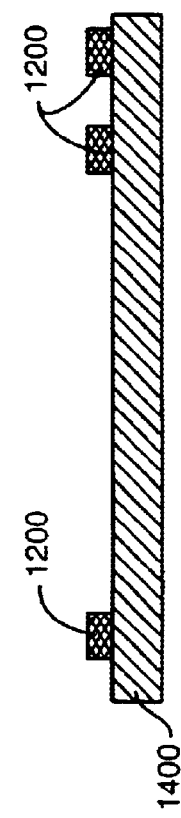
FIG._183
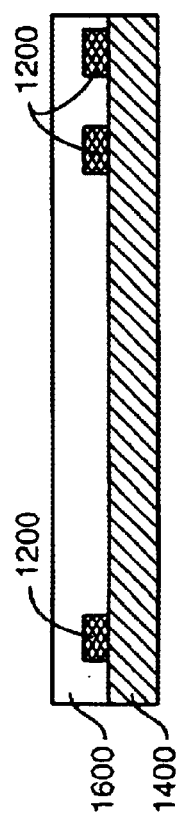
FIG._184
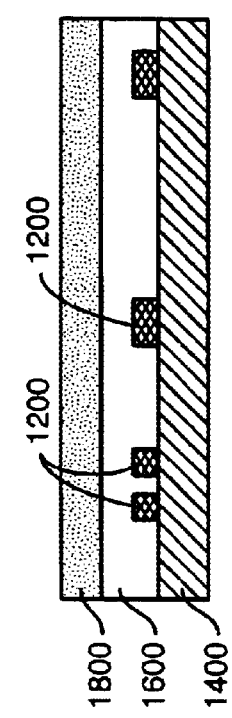
FIG._185
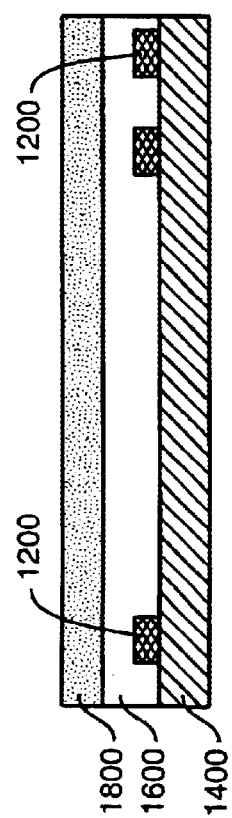
FIG._186

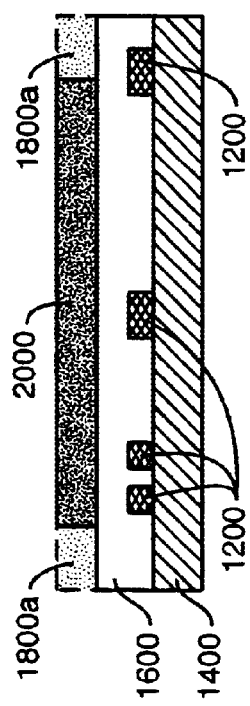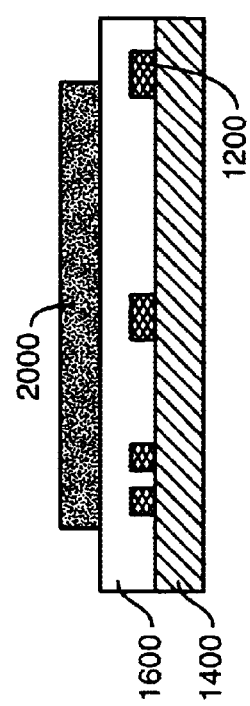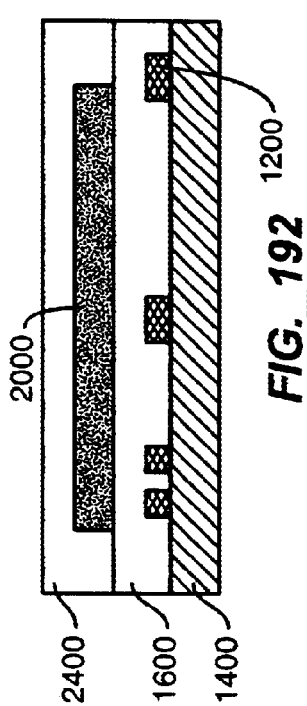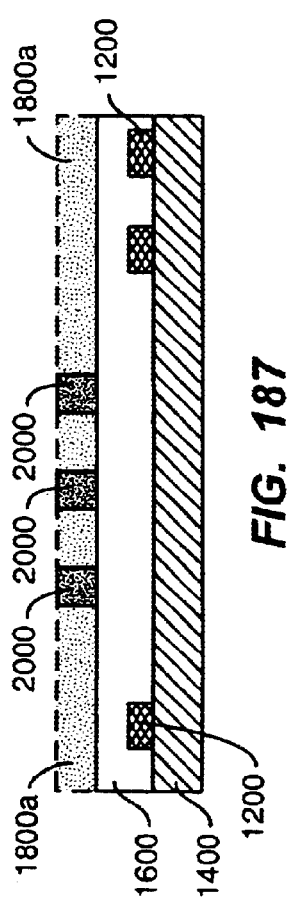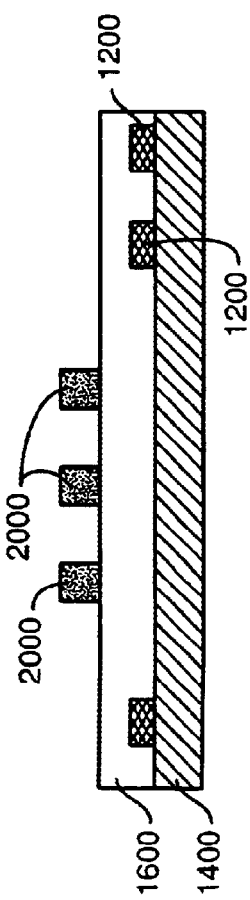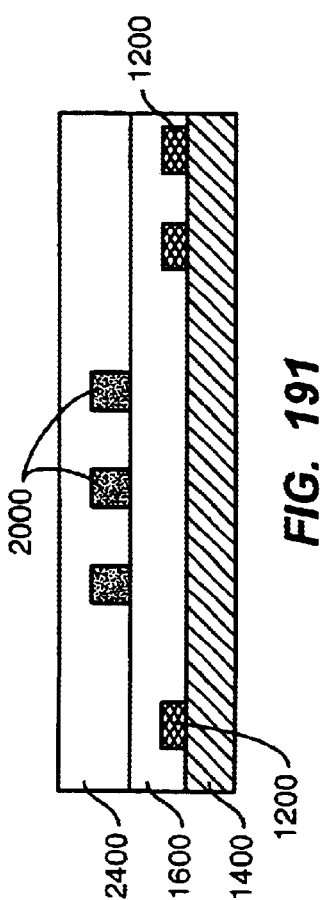

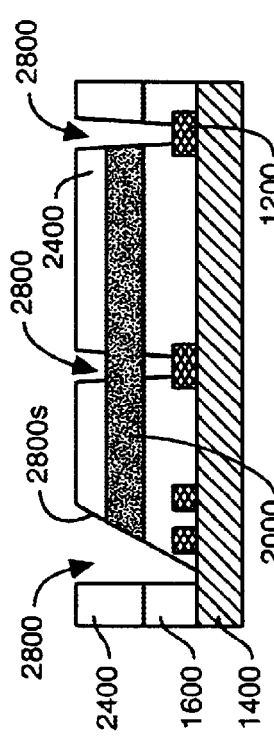
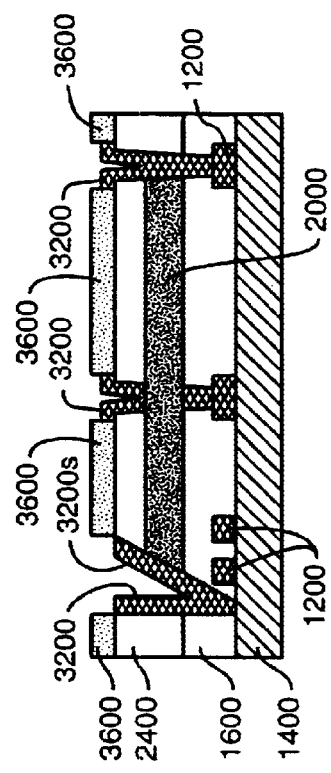
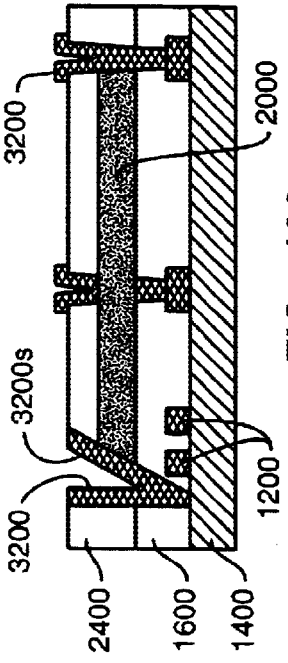
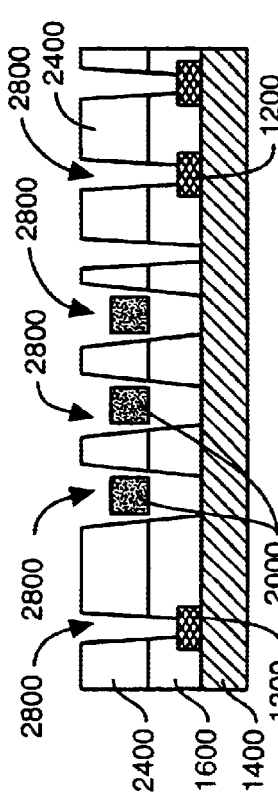
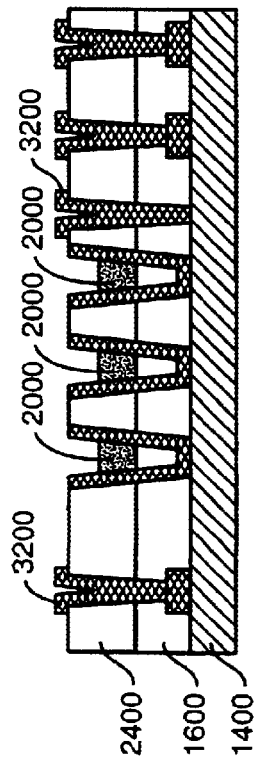

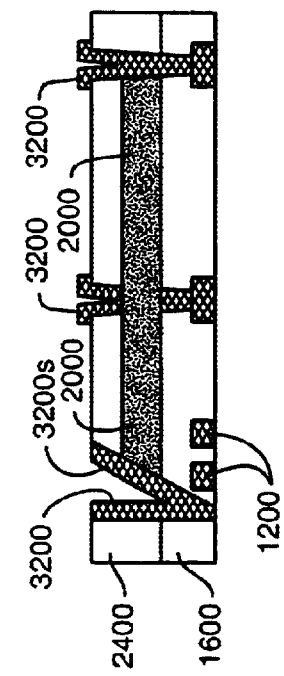
FIG._200
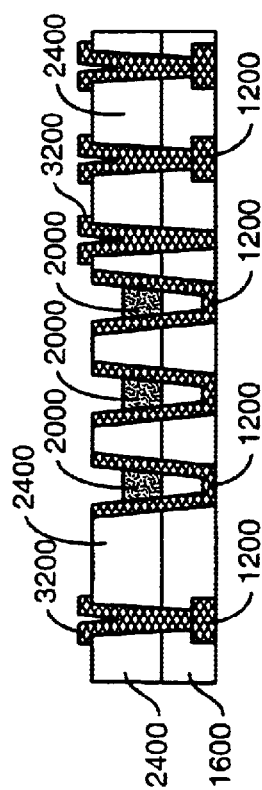
FIG._199
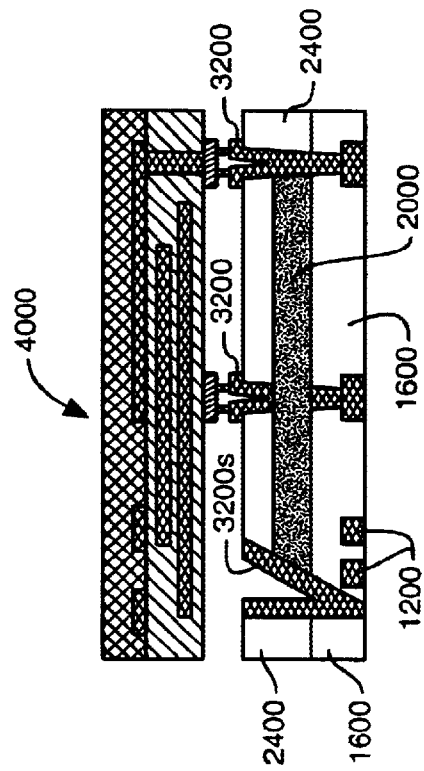
FIG._202
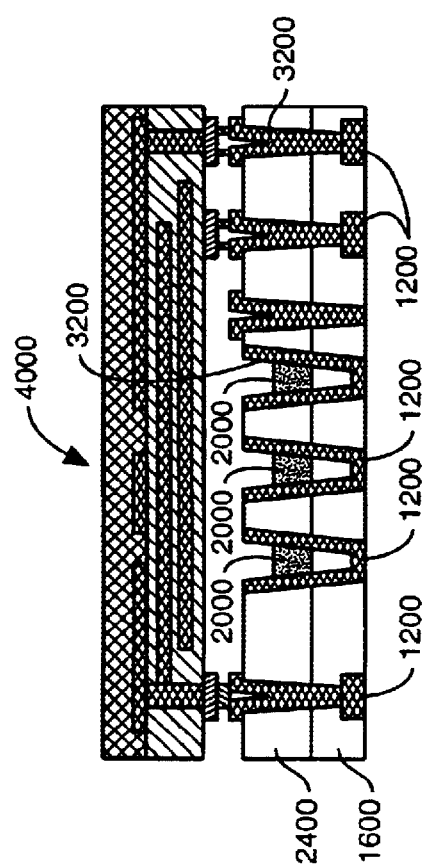
FIG._201

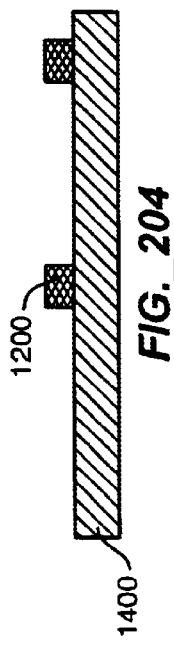
FIG._203
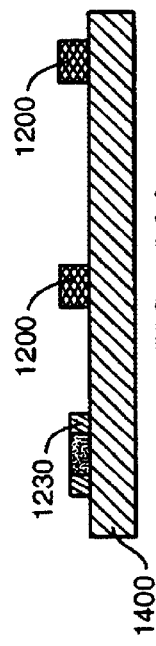
FIG._205
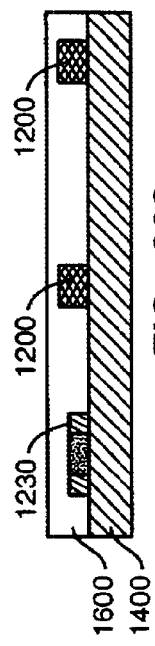
FIG._207
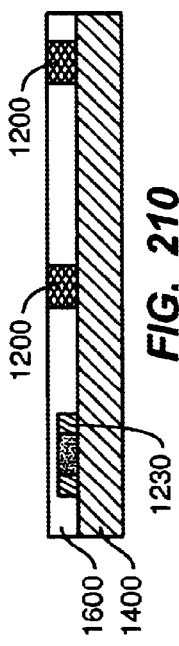
FIG._209
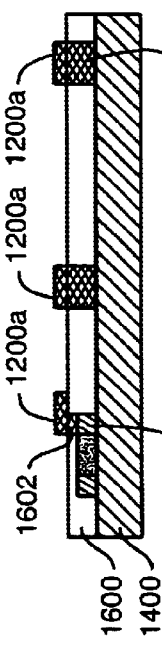
FIG._211
FIG._204
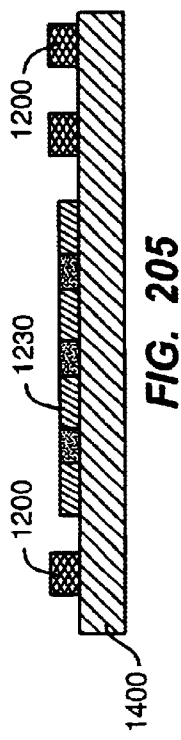
FIG._206
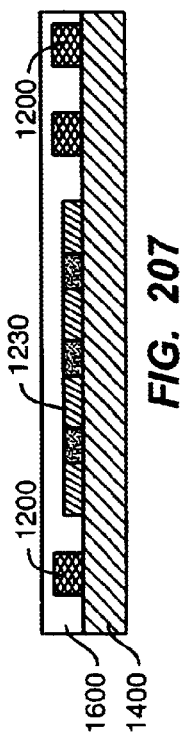
FIG._208
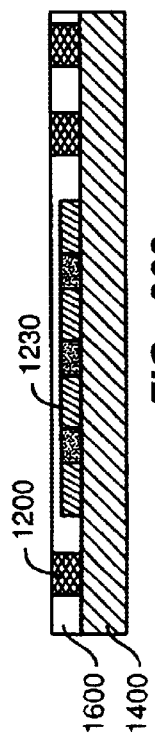
FIG._210
FIG._212

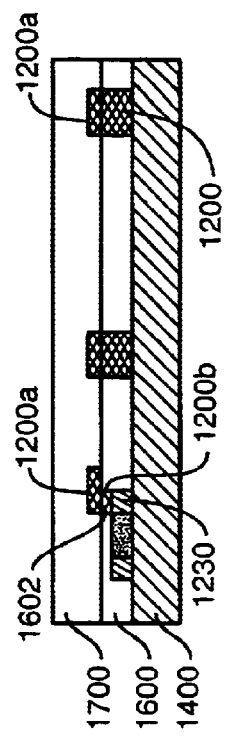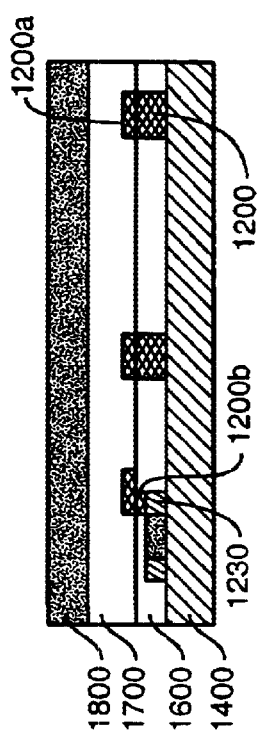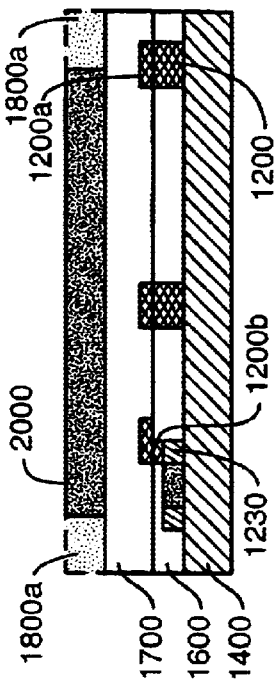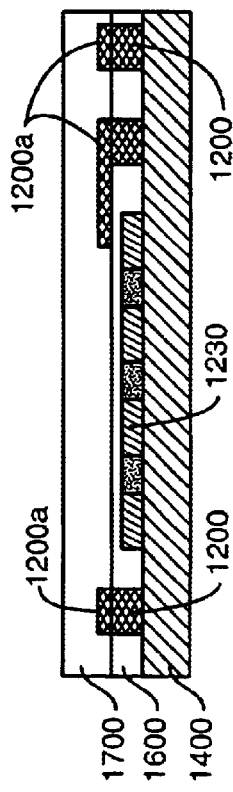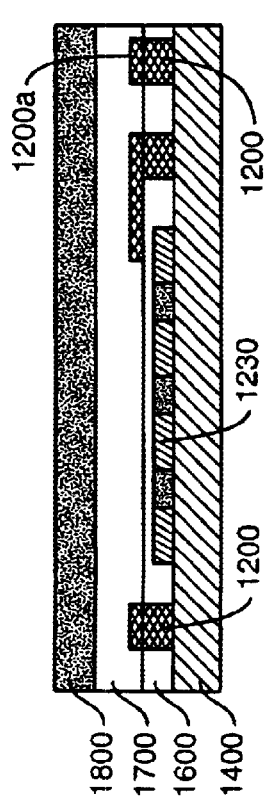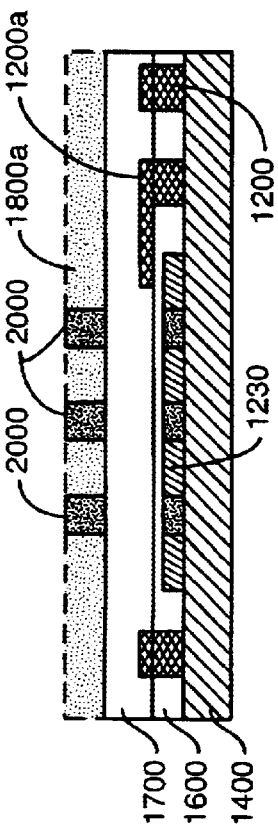

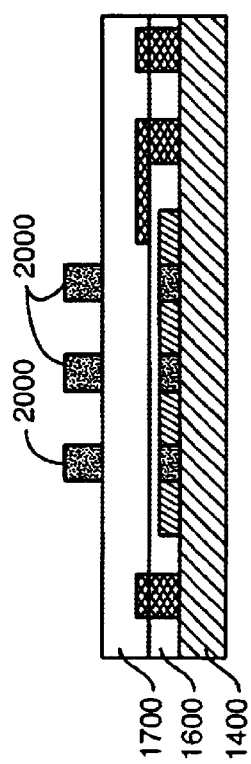
FIG._219
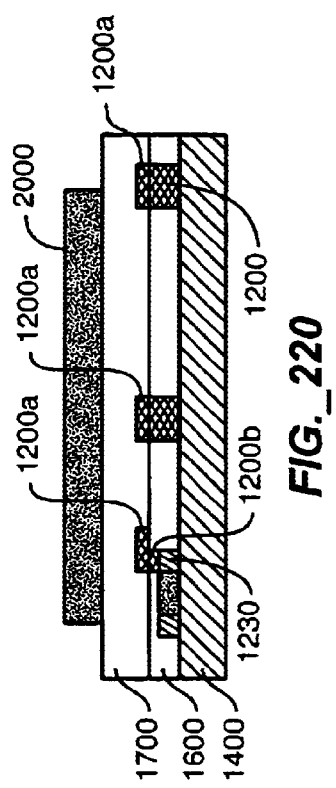
FIG._220
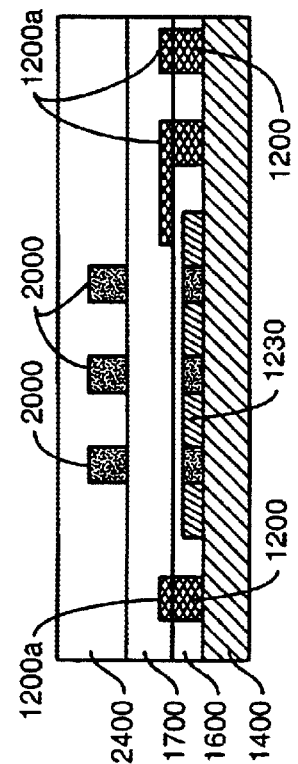
FIG._221
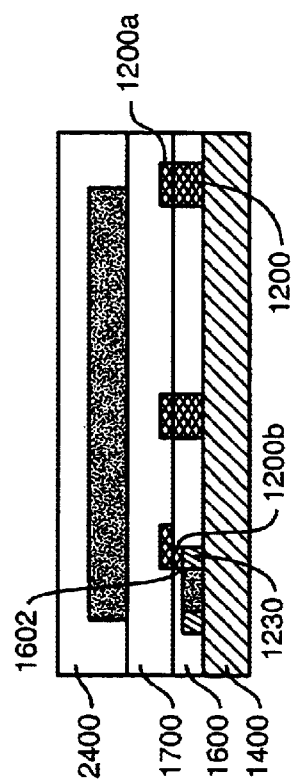
FIG._222

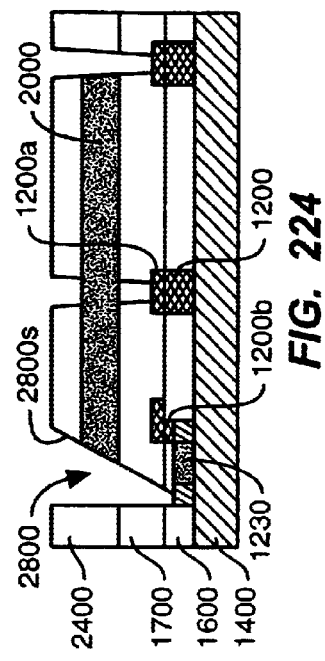
FIG._223
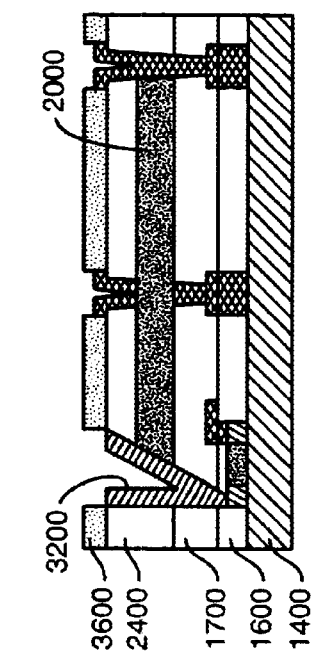
FIG._224
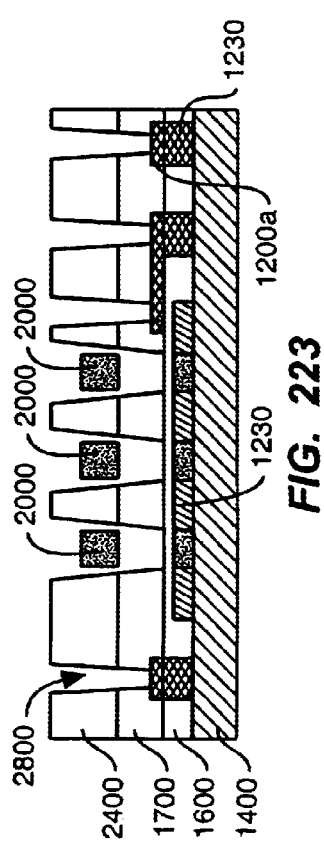
FIG._225
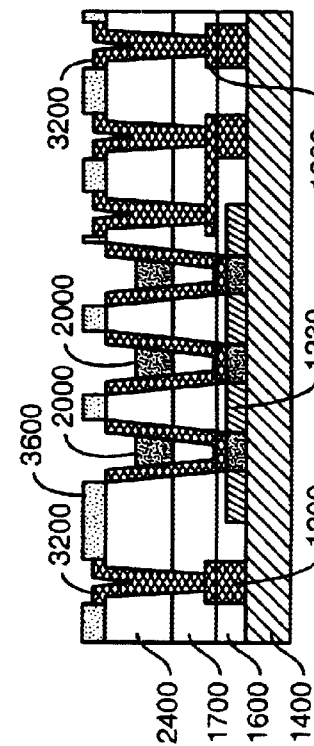
FIG._226
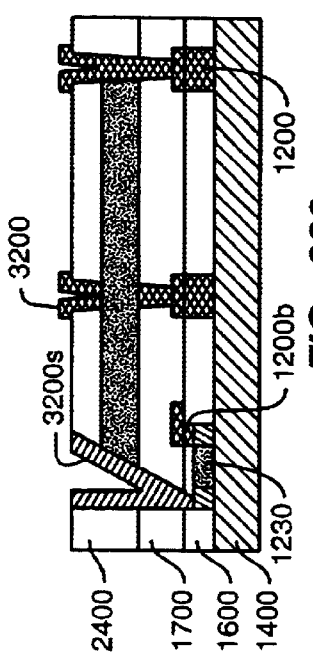
FIG._227
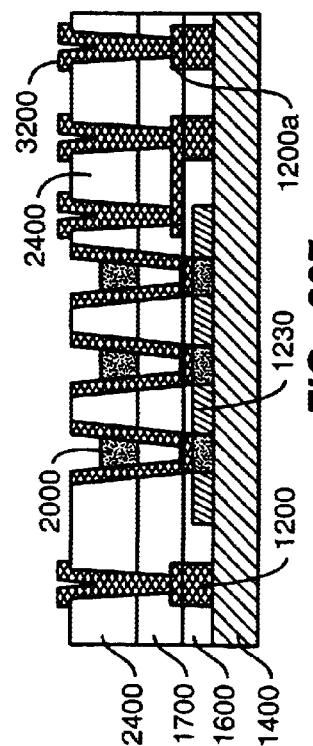
FIG._228

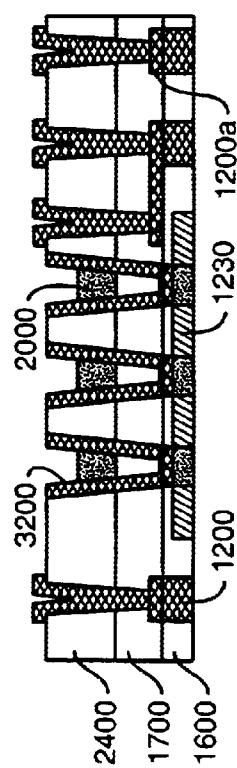
FIG._229
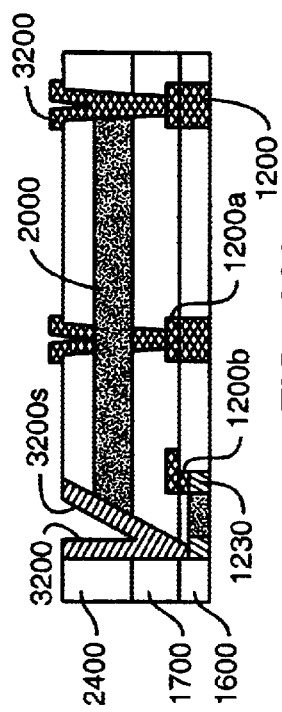
FIG._230
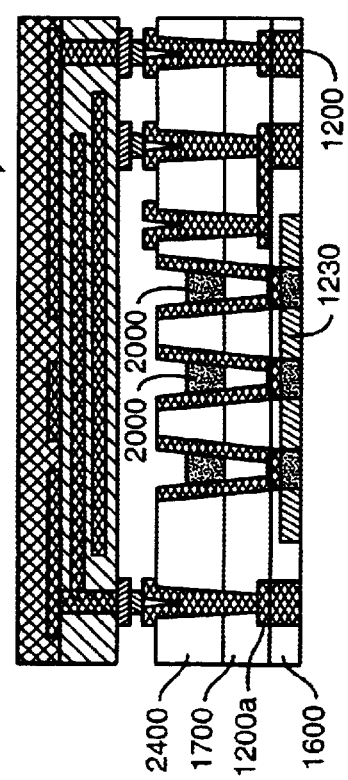
FIG._231
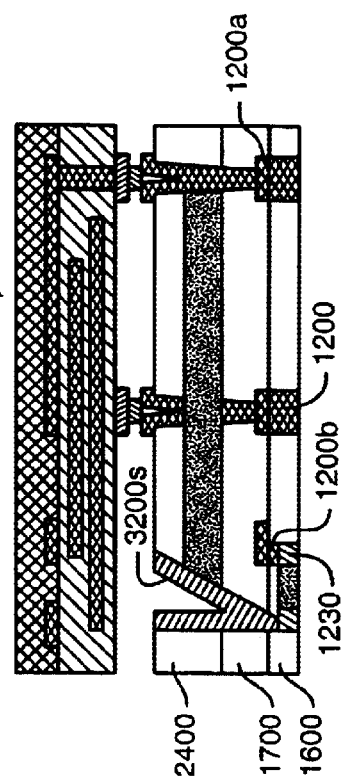
FIG._232

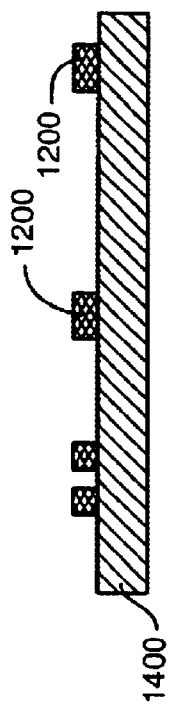
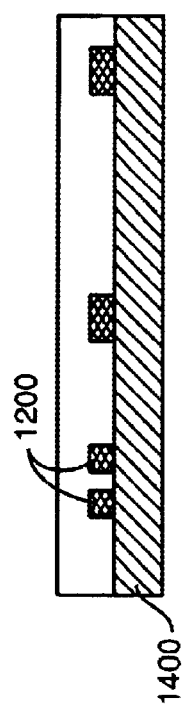
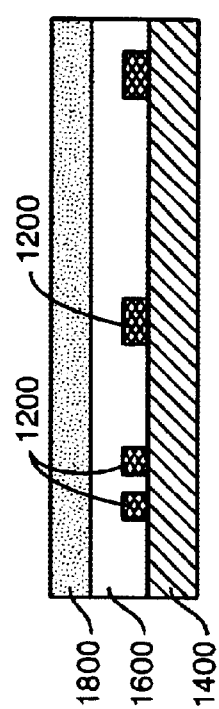
FIG._233   FIG._235   FIG._237
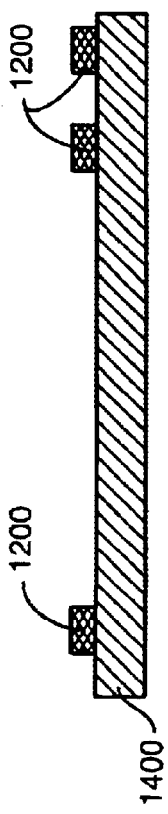
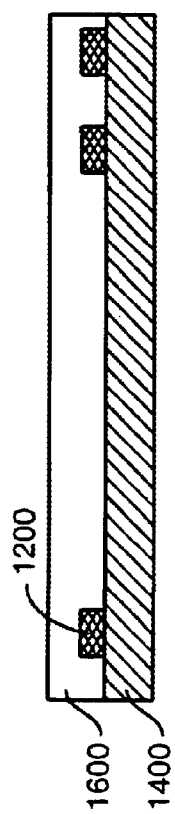
FIG._234   FIG._236   FIG._238

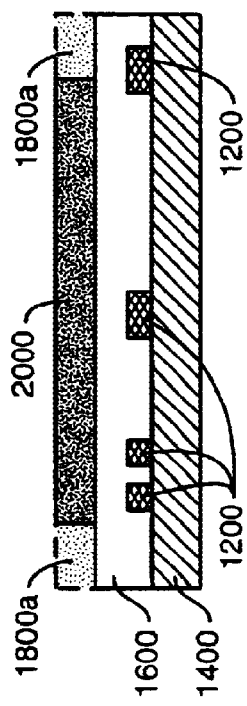
FIG._239
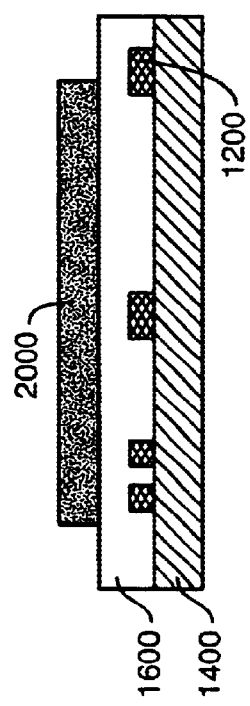
FIG._241
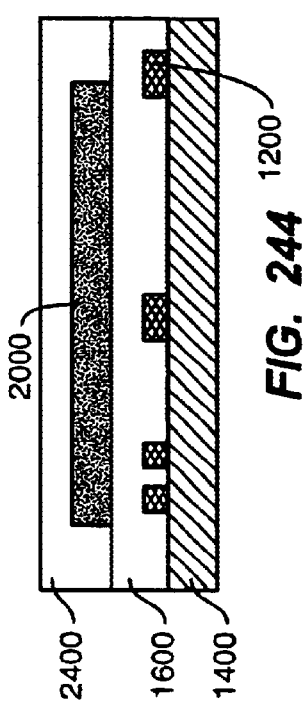
FIG._234
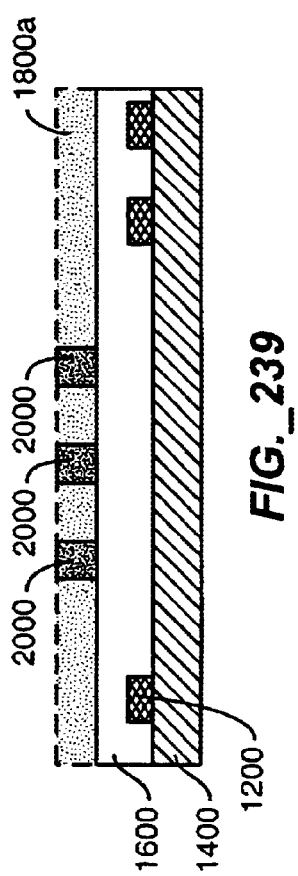
FIG._240
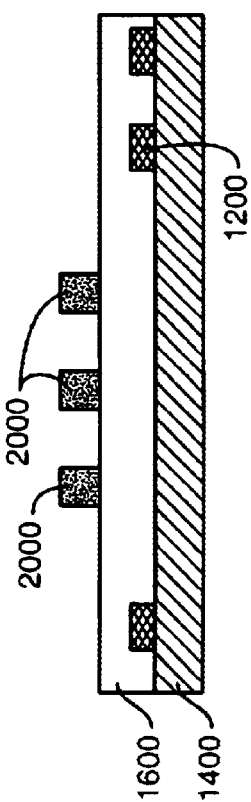
FIG._242
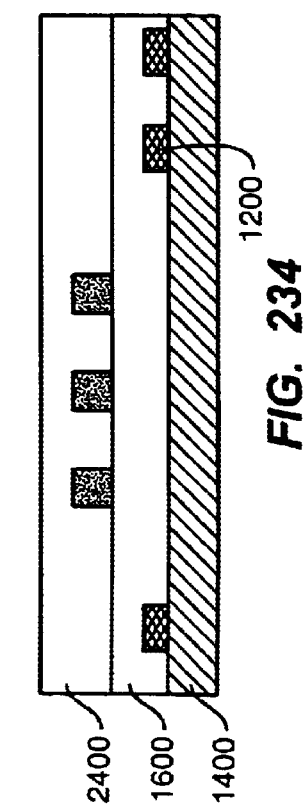
FIG._244

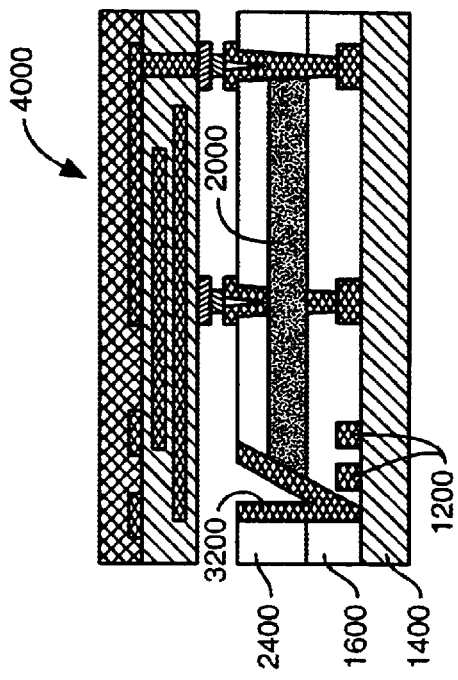
FIG._252
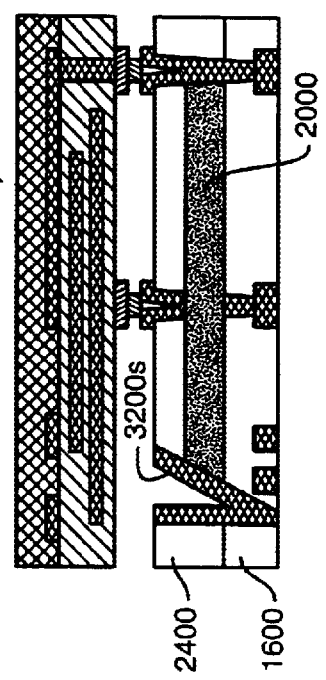
FIG._254
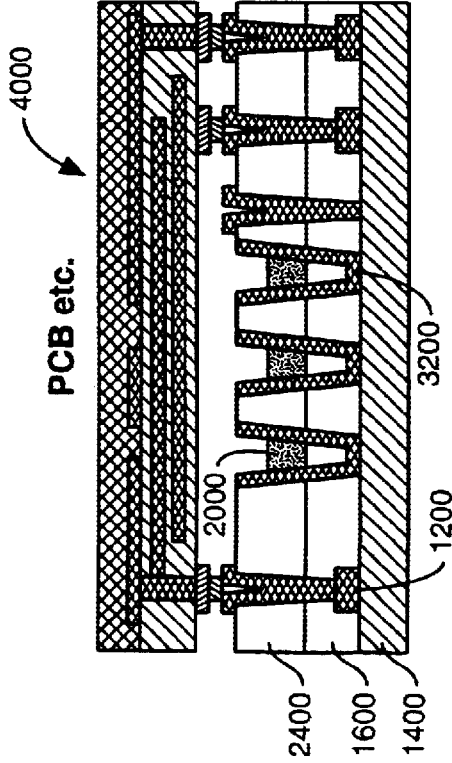
FIG._251
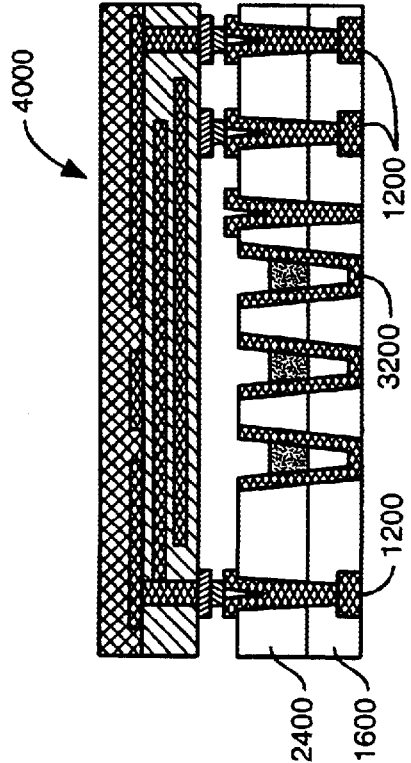
FIG._253

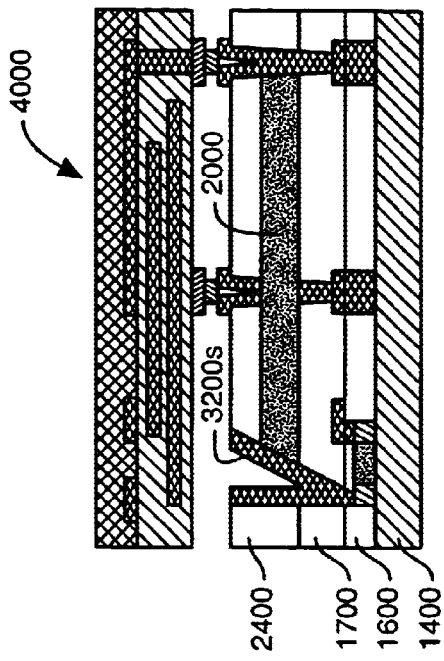
FIG._256
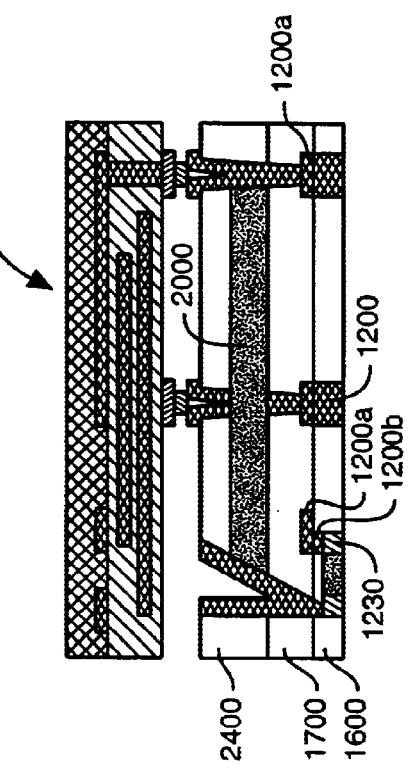
FIG._258
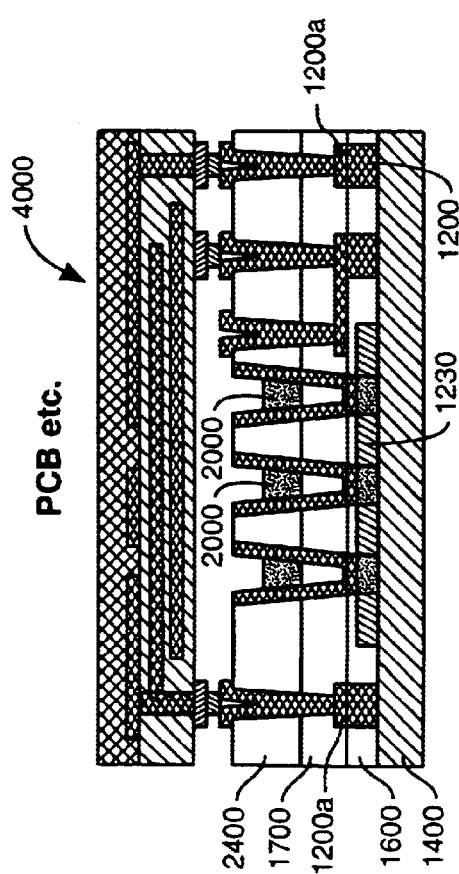
FIG._255
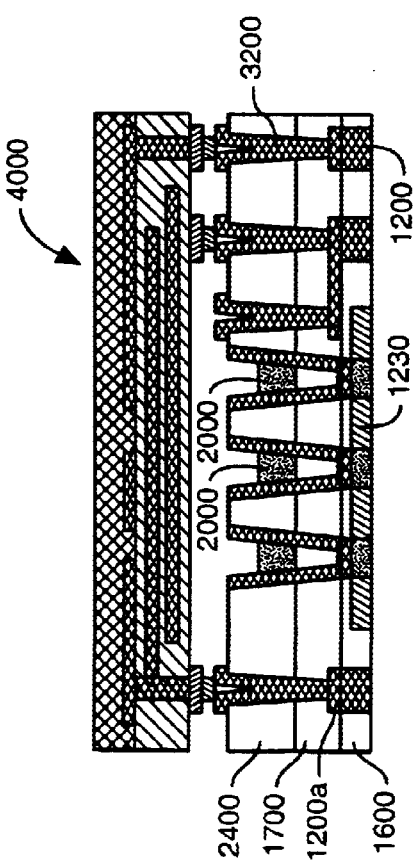
FIG._257

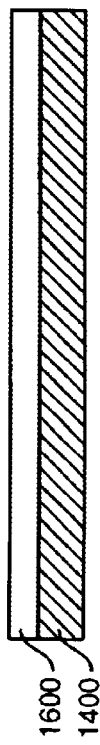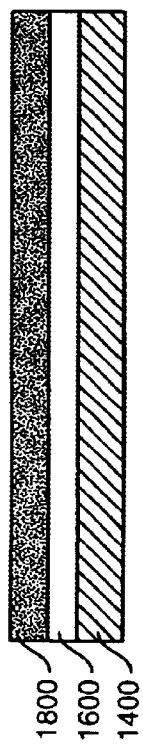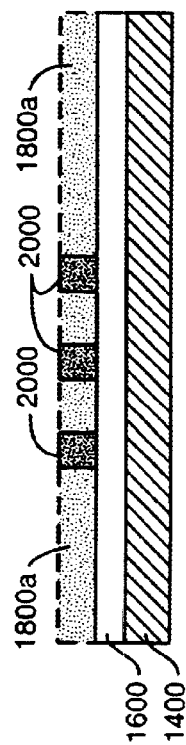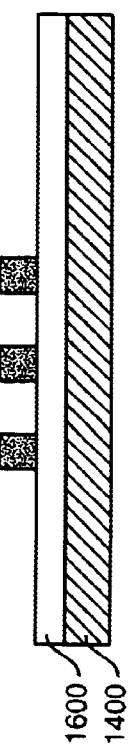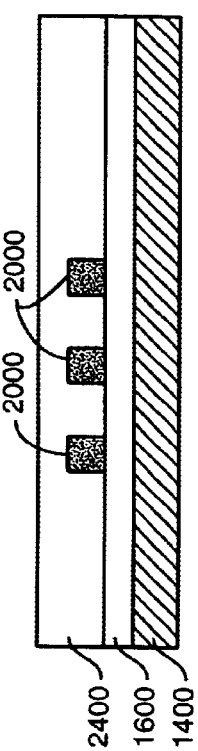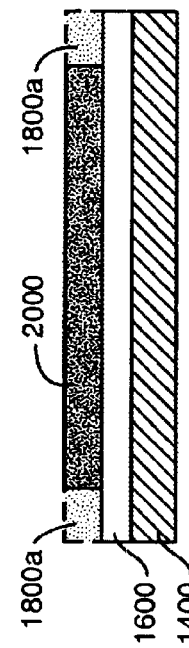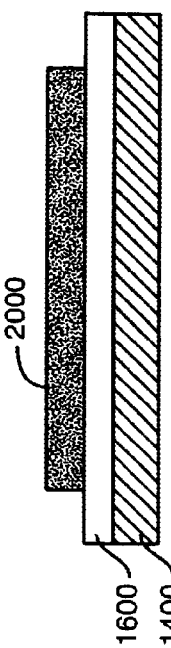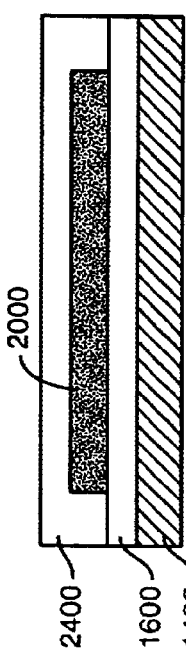

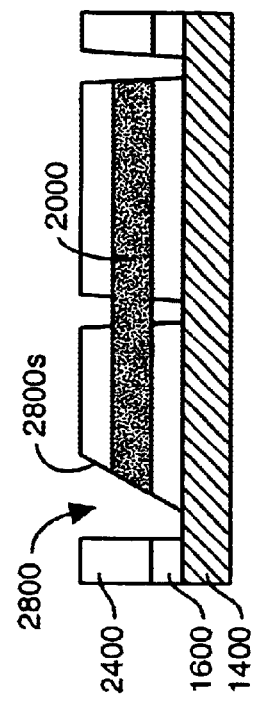
FIG._268
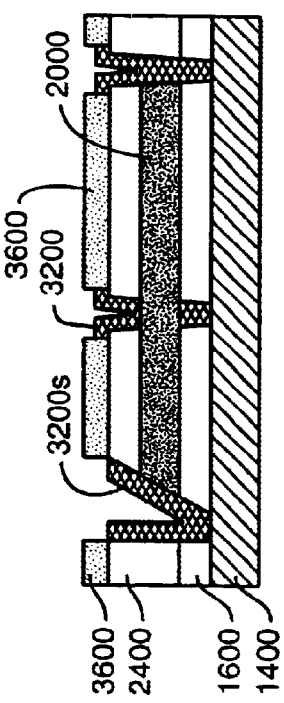
FIG._270
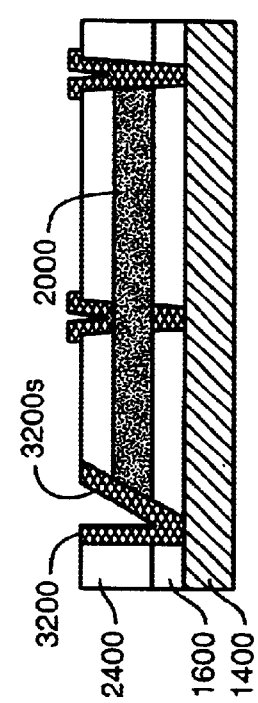
FIG._272
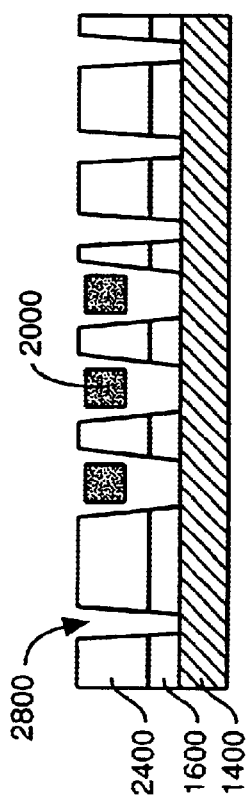
FIG._267
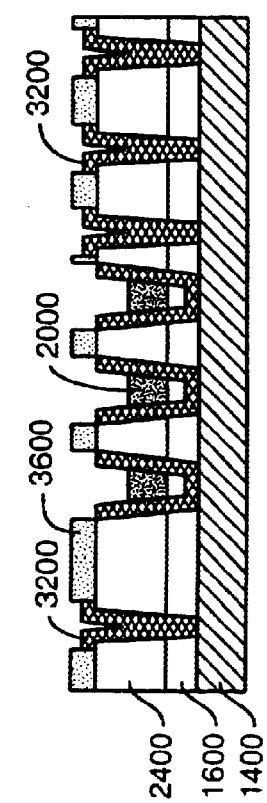
FIG._269
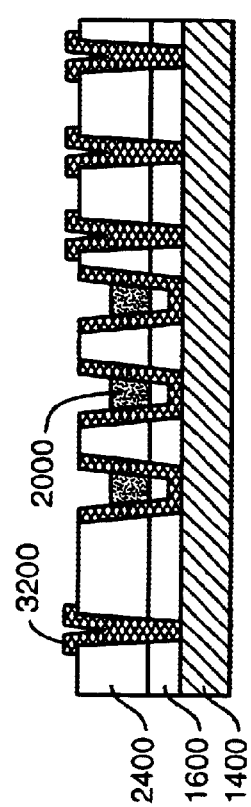
FIG._271

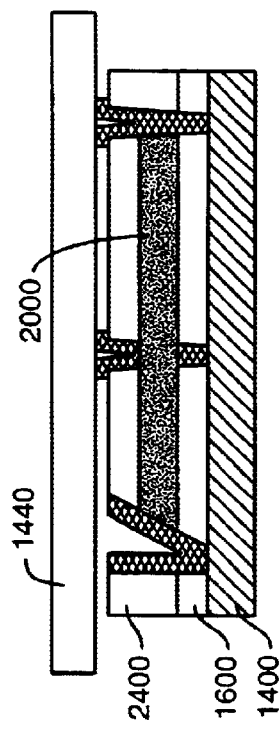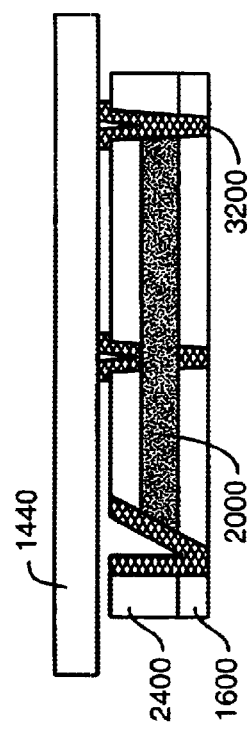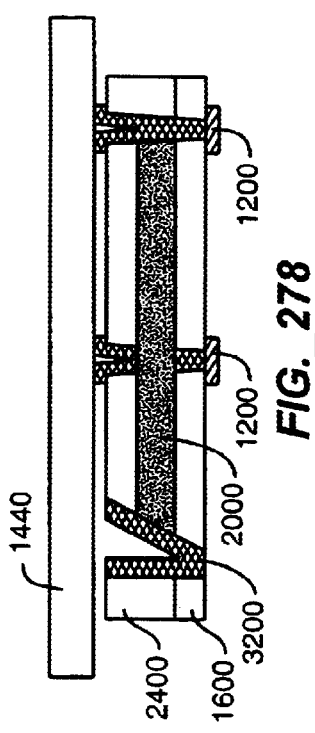
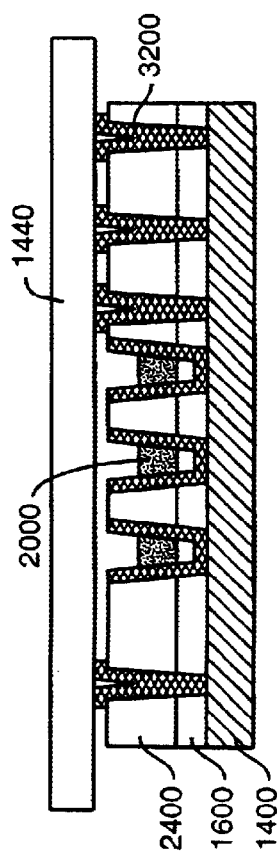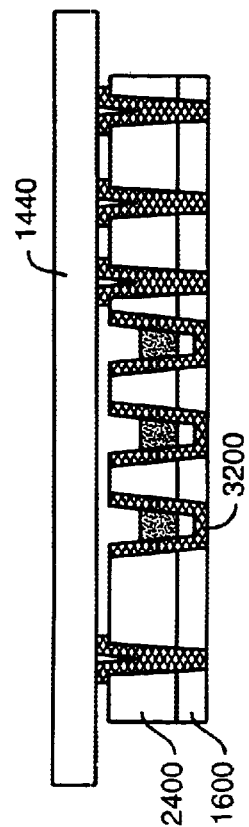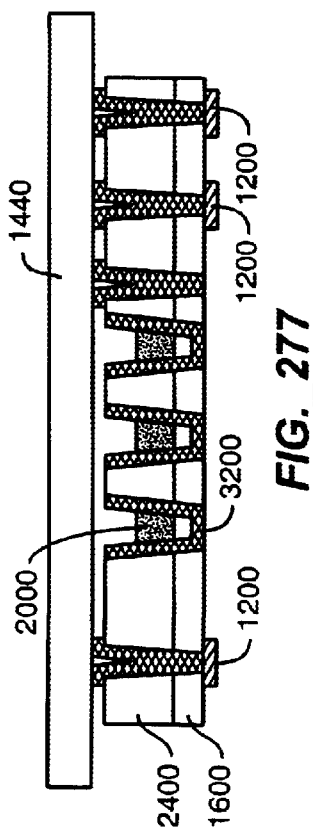
FIG._273  FIG._274  FIG._275  FIG._276  FIG._277  FIG._278

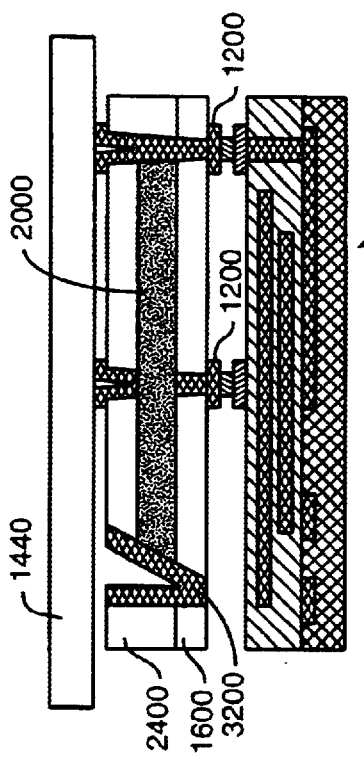
FIG._280
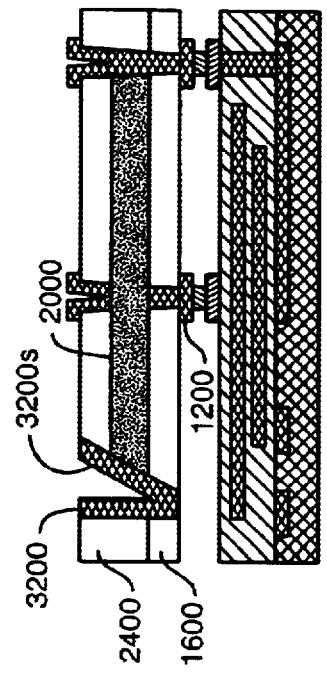
FIG._282
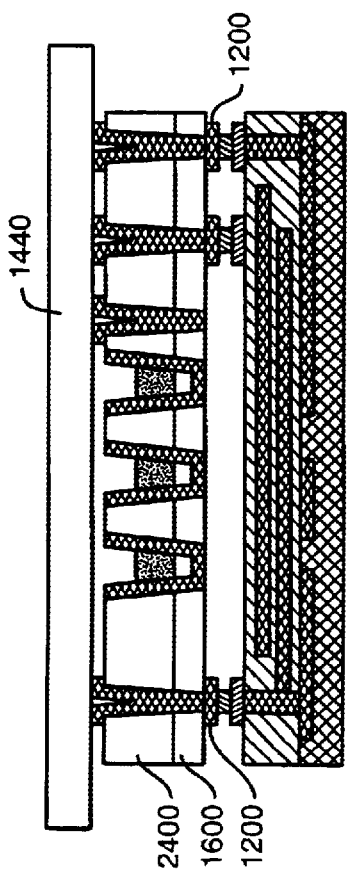
FIG._279
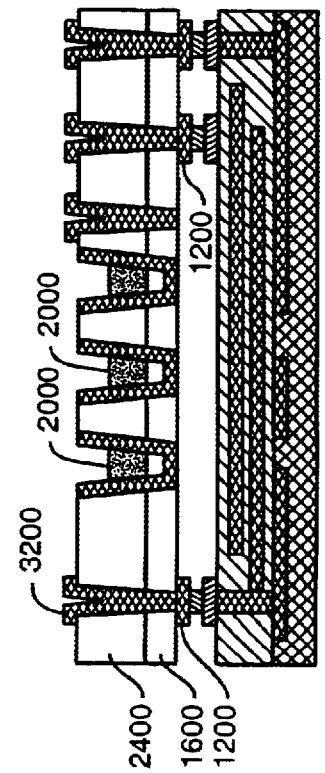
FIG._281

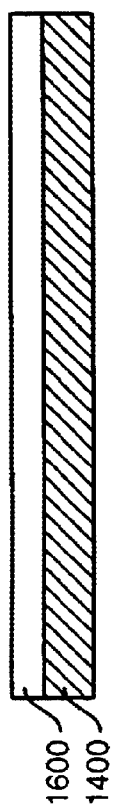
FIG._283
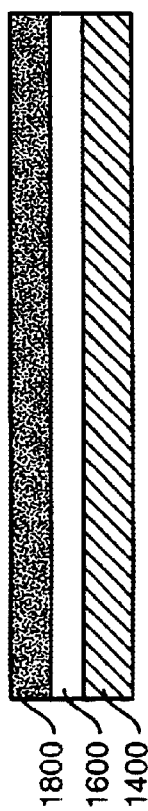
FIG._284
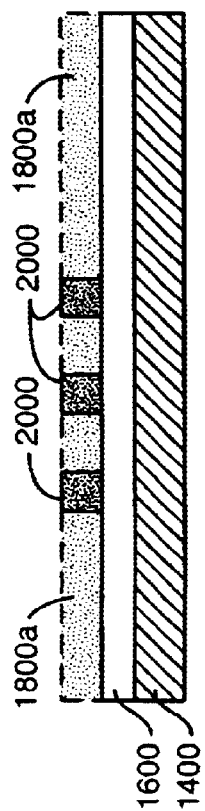
FIG._285
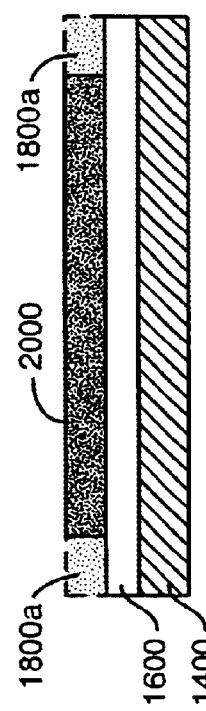
FIG._286

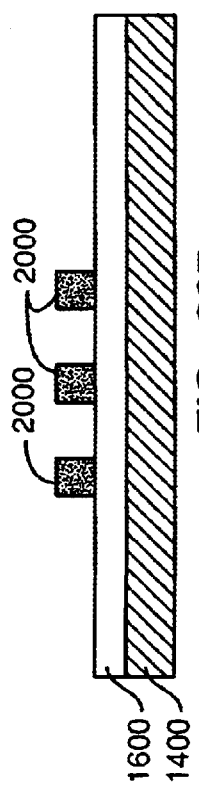
FIG._287
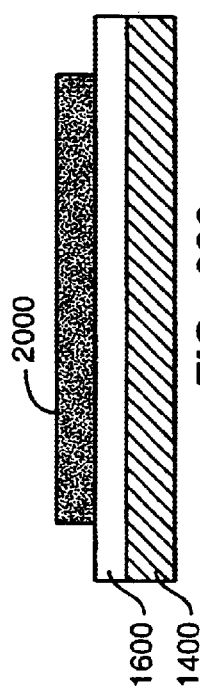
FIG._288
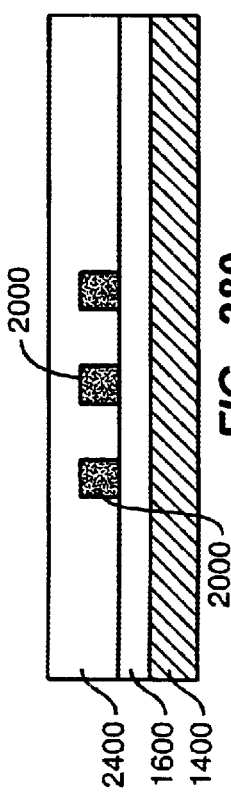
FIG._289
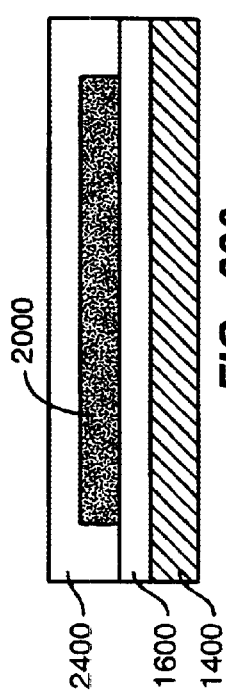
FIG._290
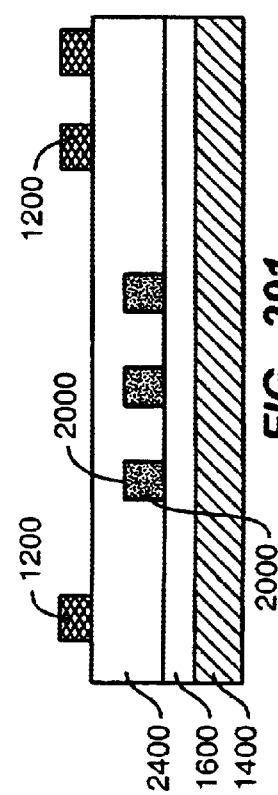
FIG._291
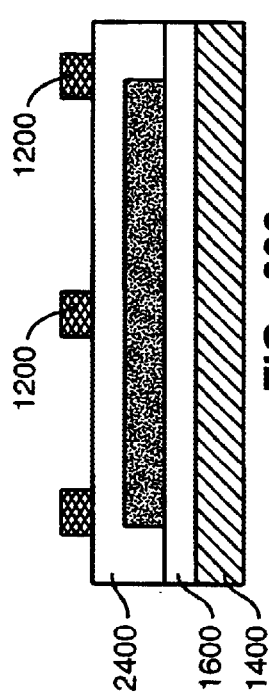
FIG._292

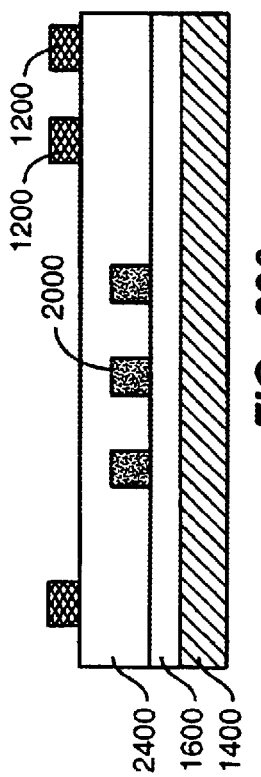
FIG._293
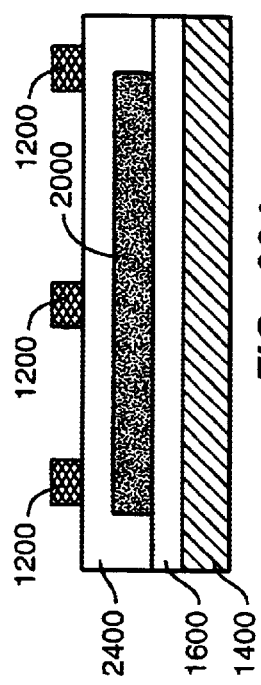
FIG._294
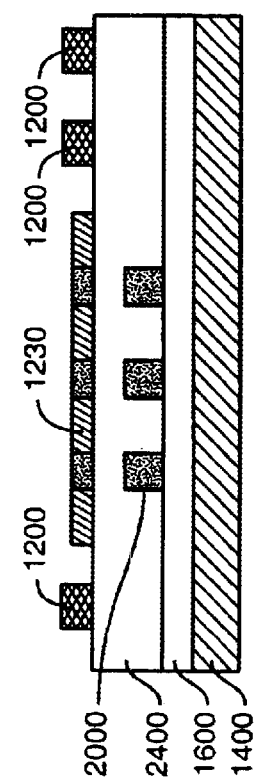
FIG._295
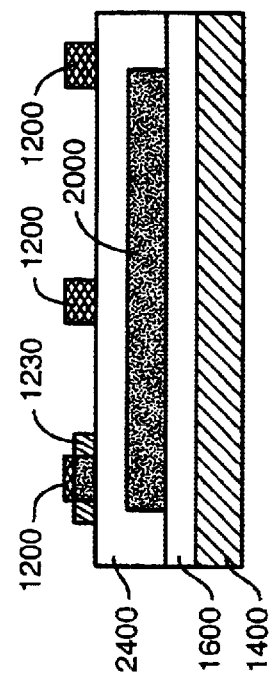
FIG._296
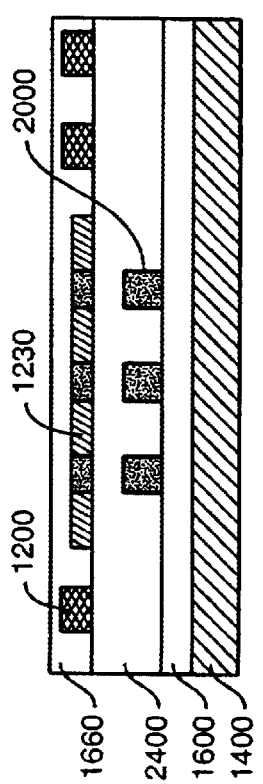
FIG._297
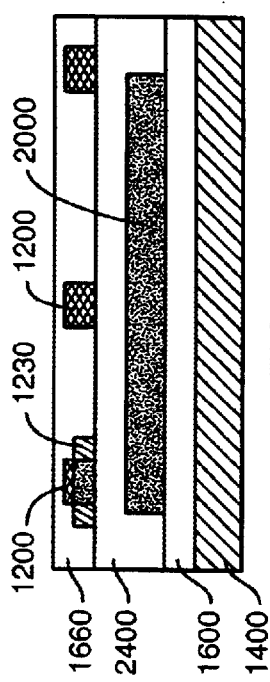
FIG._298

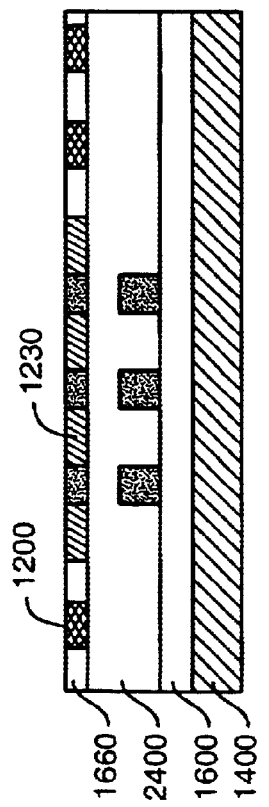
FIG._299
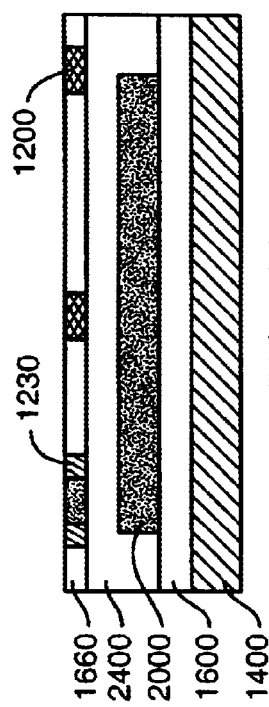
FIG._300
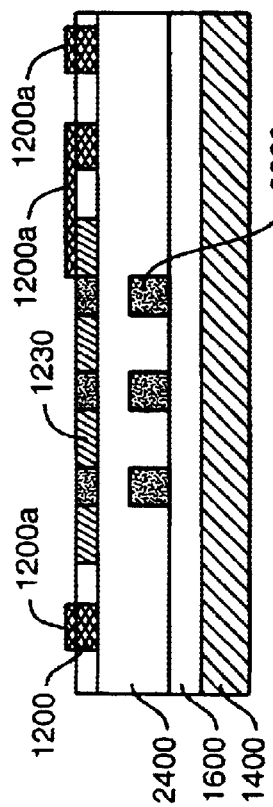
FIG._301
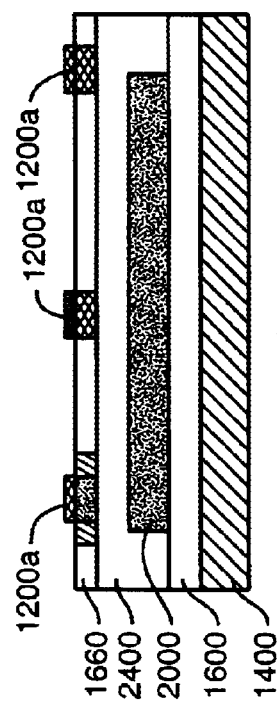
FIG._302

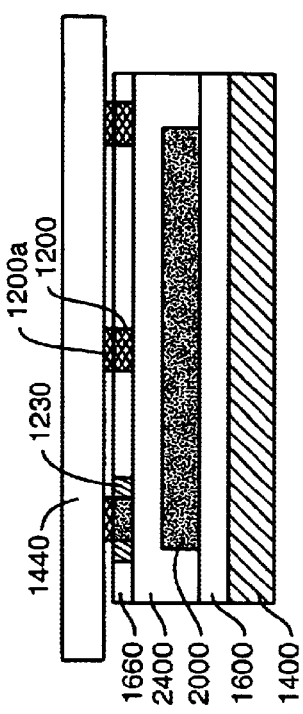
FIG._303
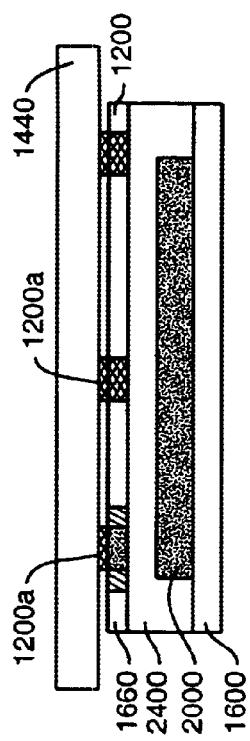
FIG._305
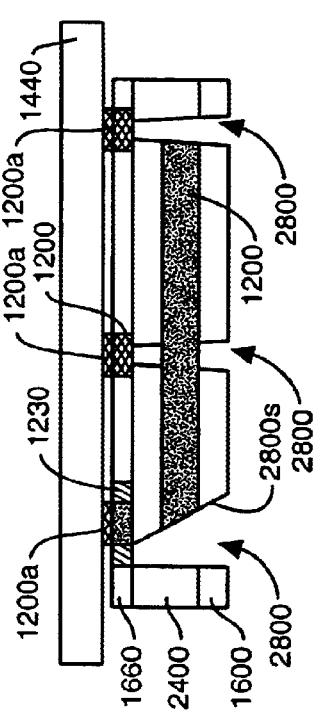
FIG._307
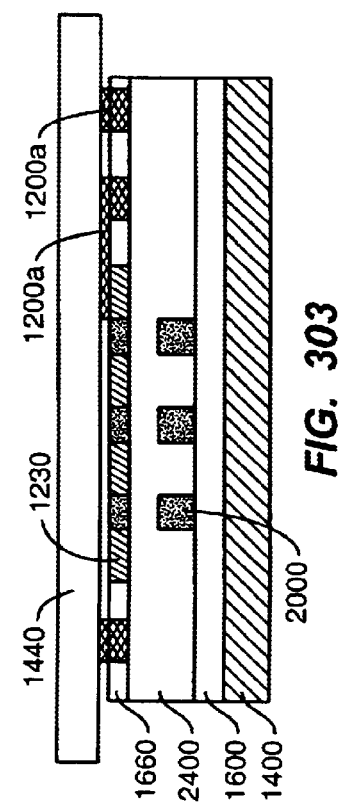
FIG._304
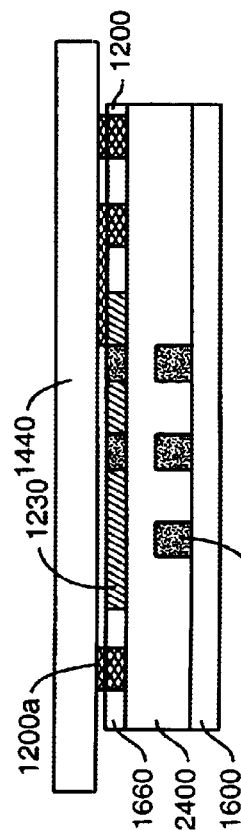
FIG._306
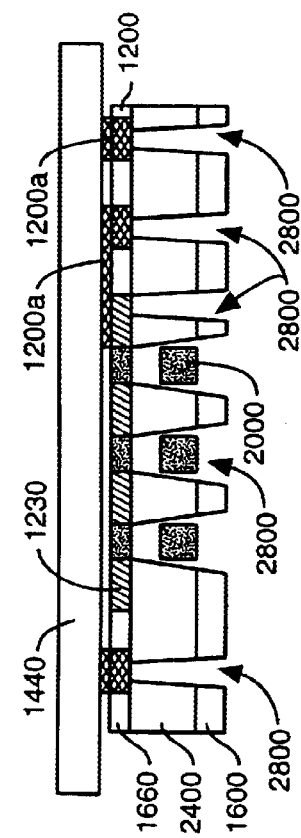
FIG._308

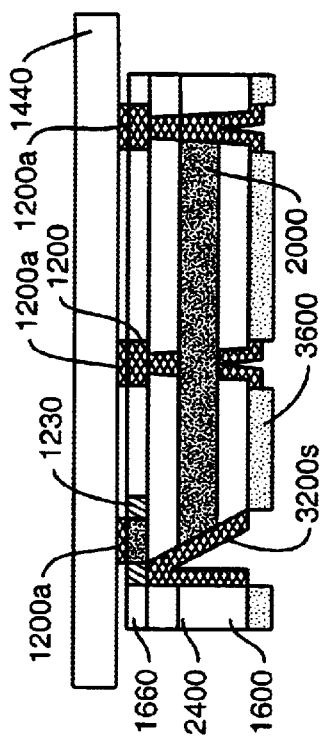
FIG._310
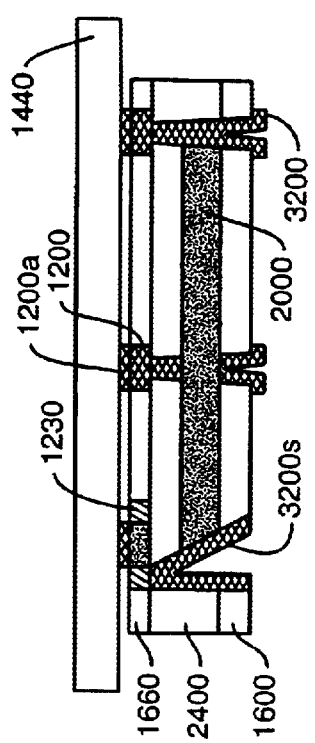
FIG._312
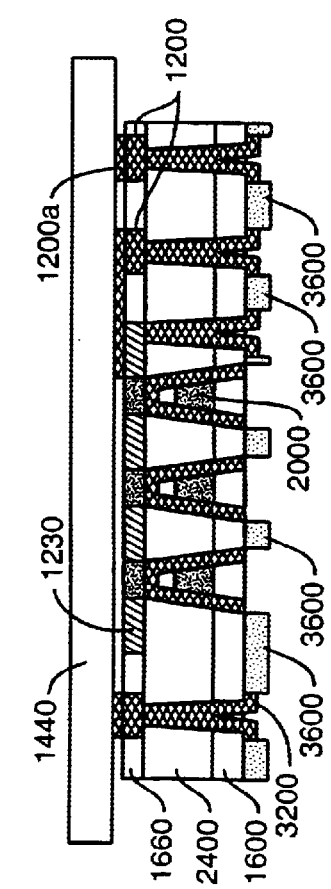
FIG._309
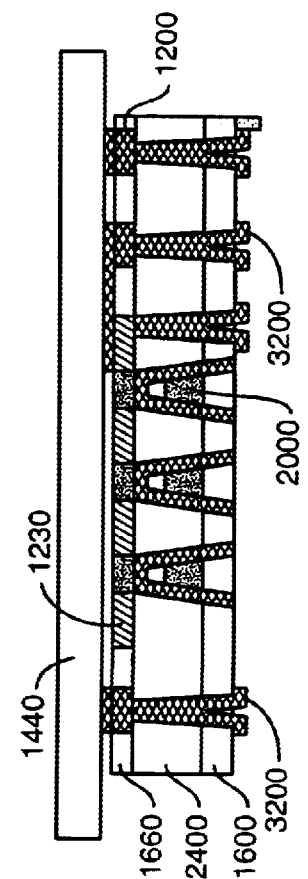
FIG._311

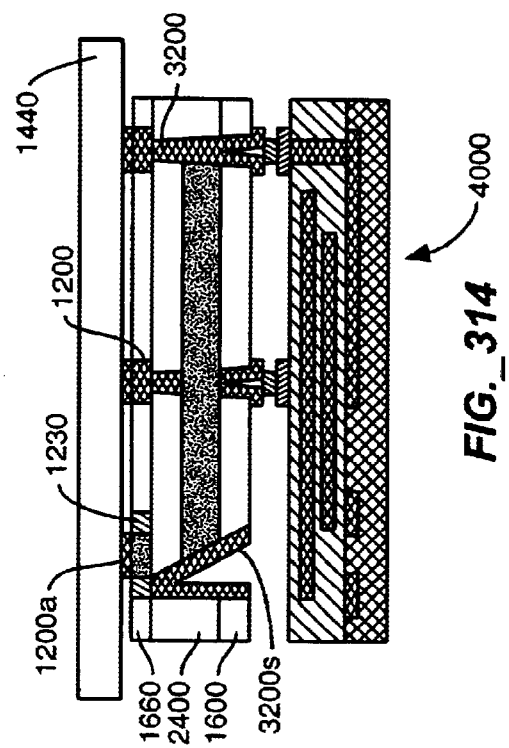
FIG._314
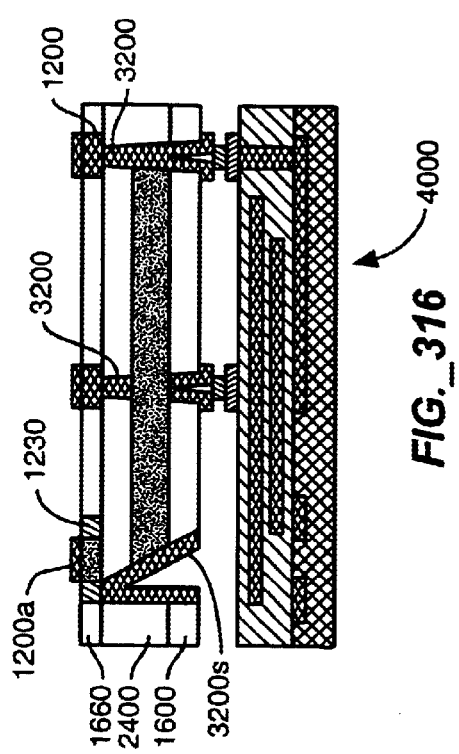
FIG._316
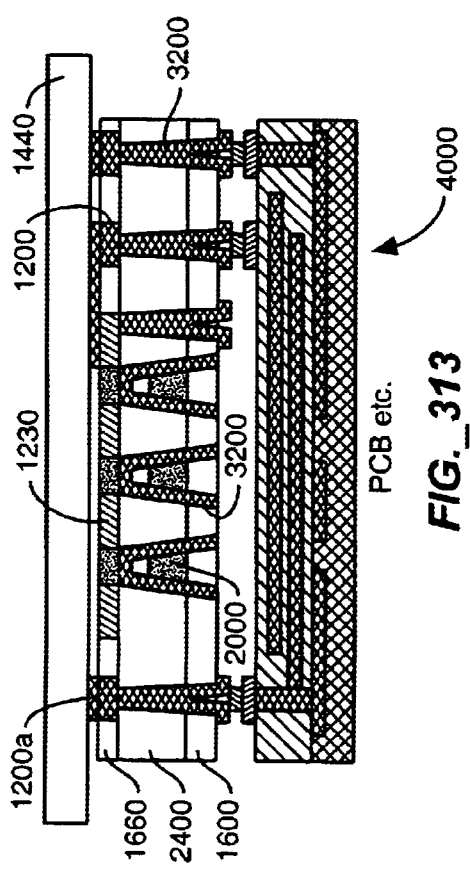
FIG._313
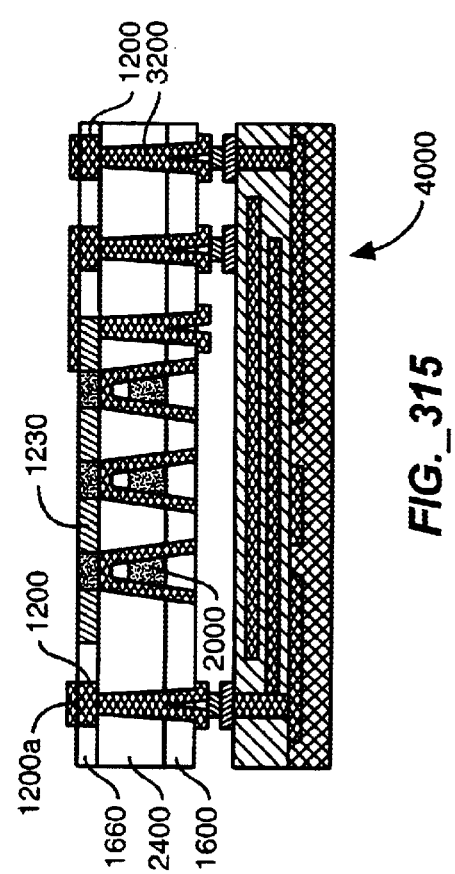
FIG._315

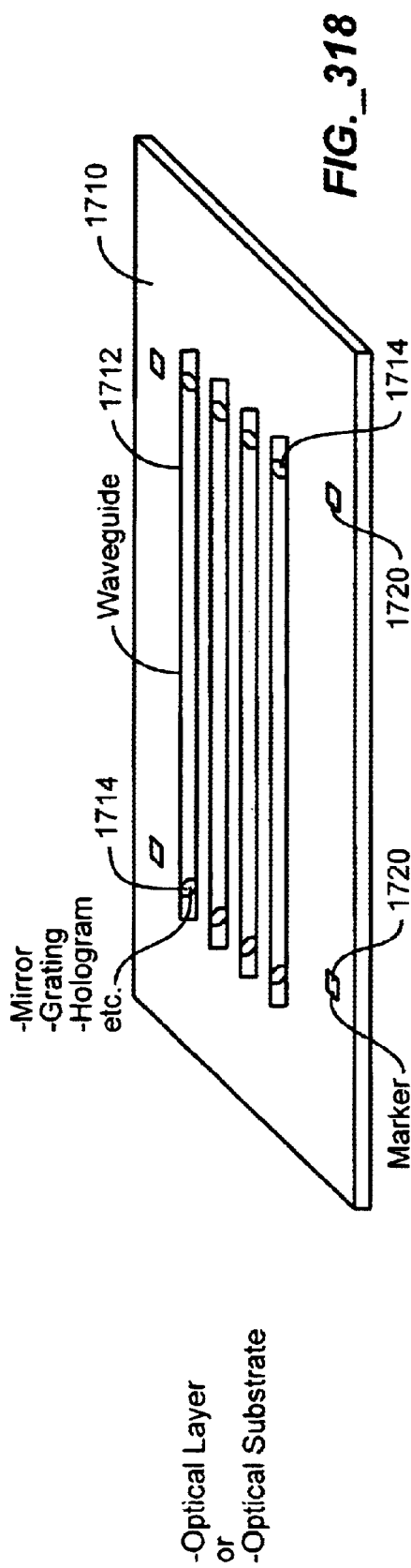
FIG._318
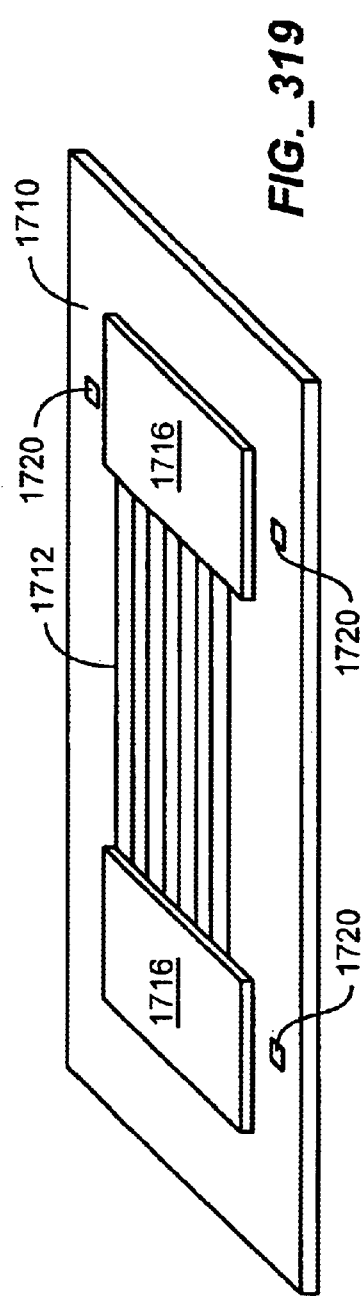
FIG._319

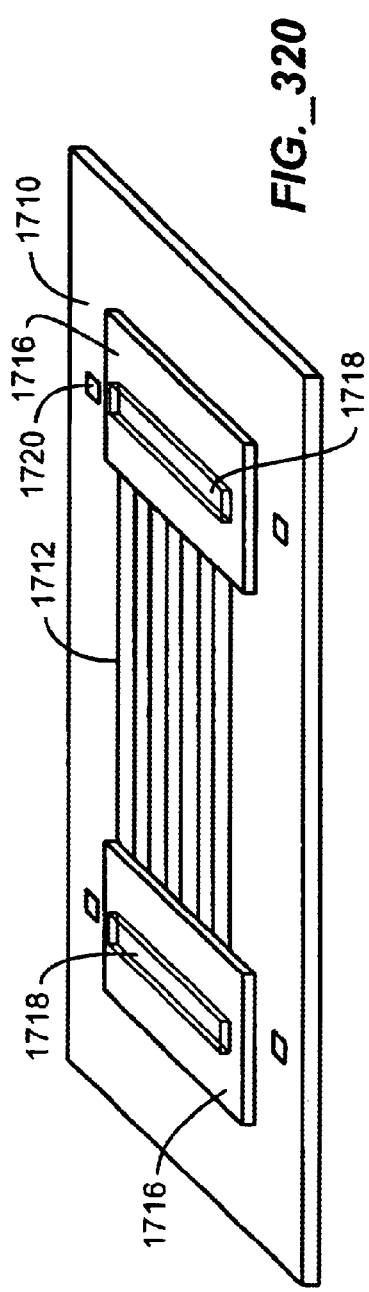
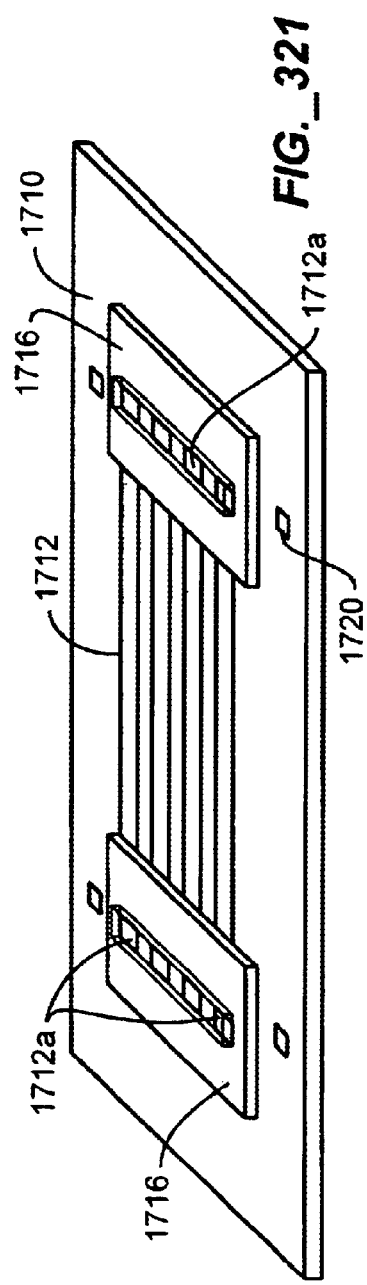
FIG._320
FIG._321
-Polymer Removal
(Ex. Laser Etching
or RIE
or photoplastic with
exposure/develop)
Metal Removal
(Ex. Wet Etching)

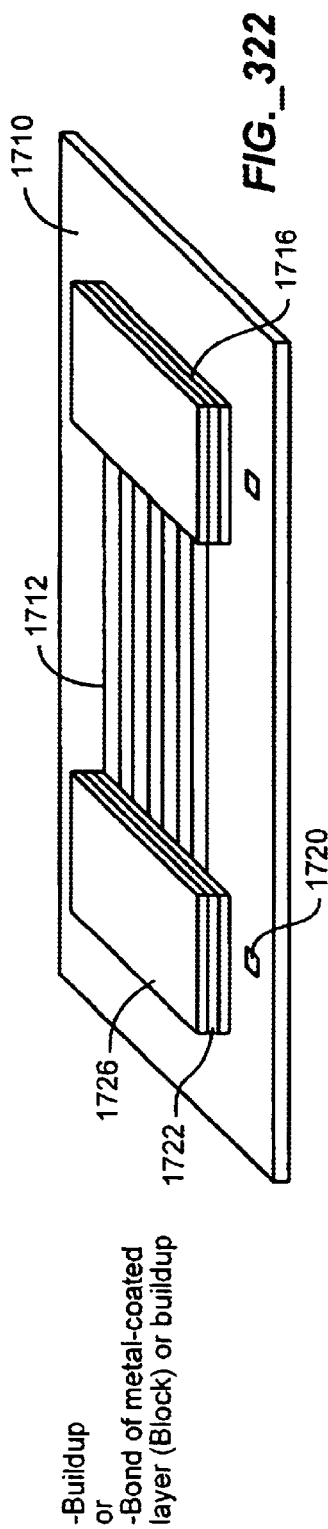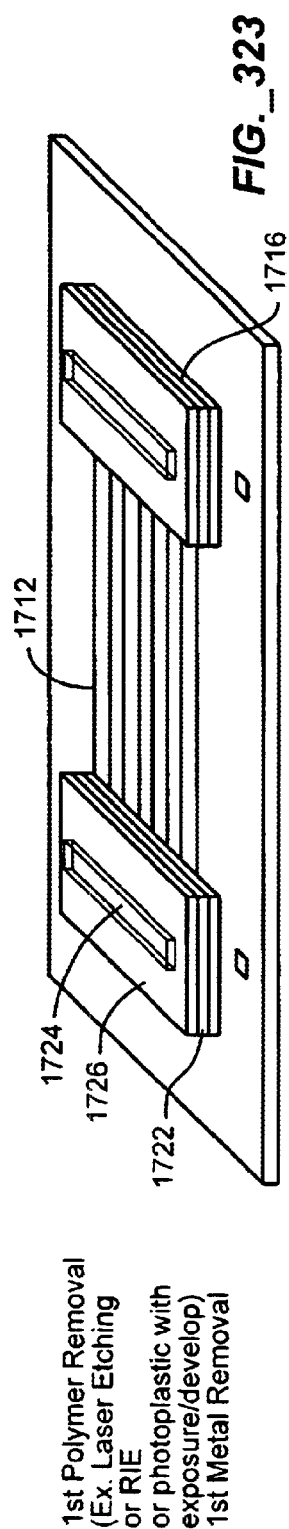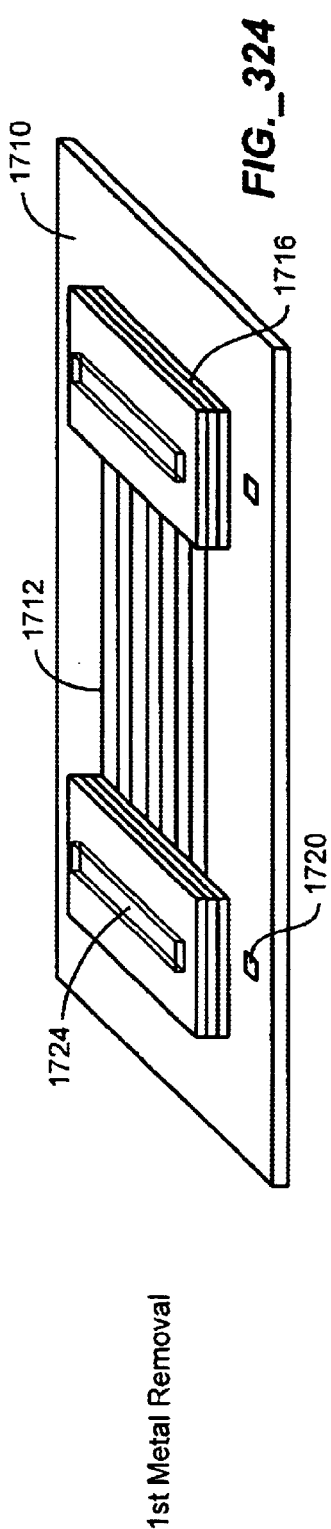

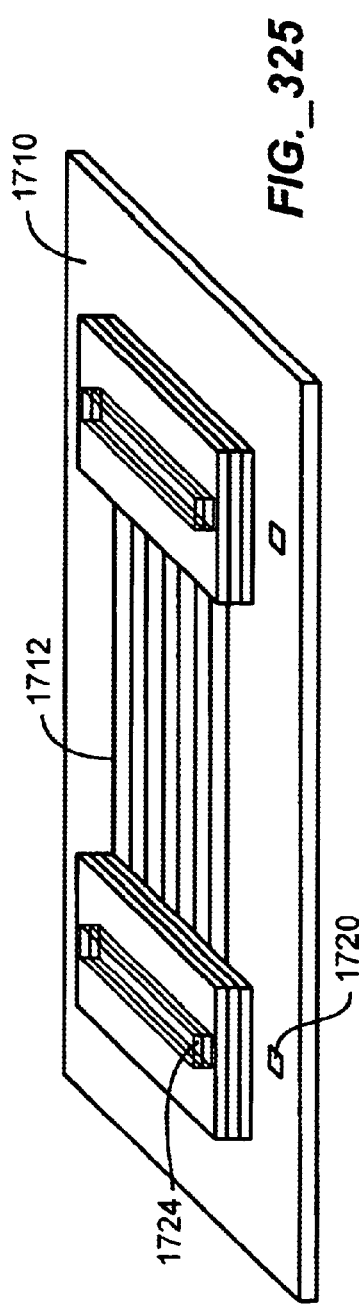
FIG._325
2nd Polymer Removal
(Ex. Laser Etching
or RIE
or photoplastic with
exposure/develop)
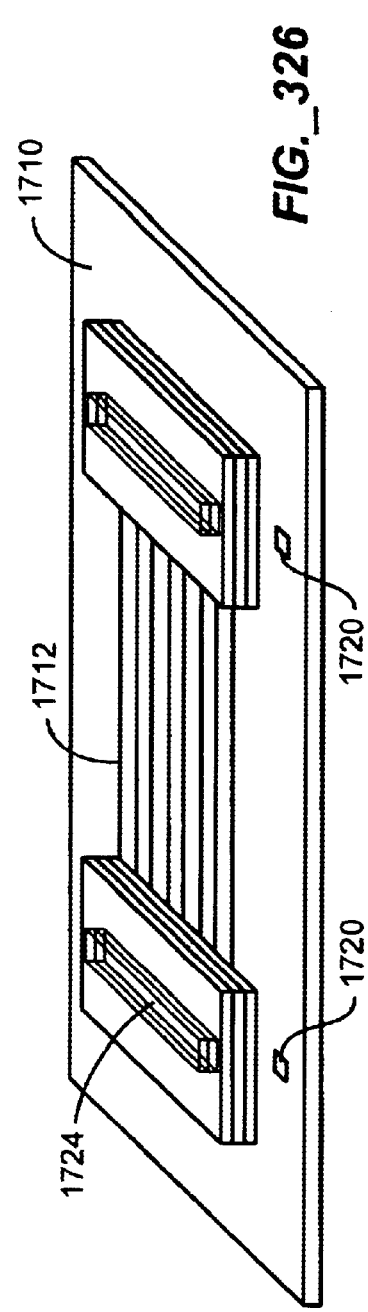
FIG._326
2nd Metal Removal

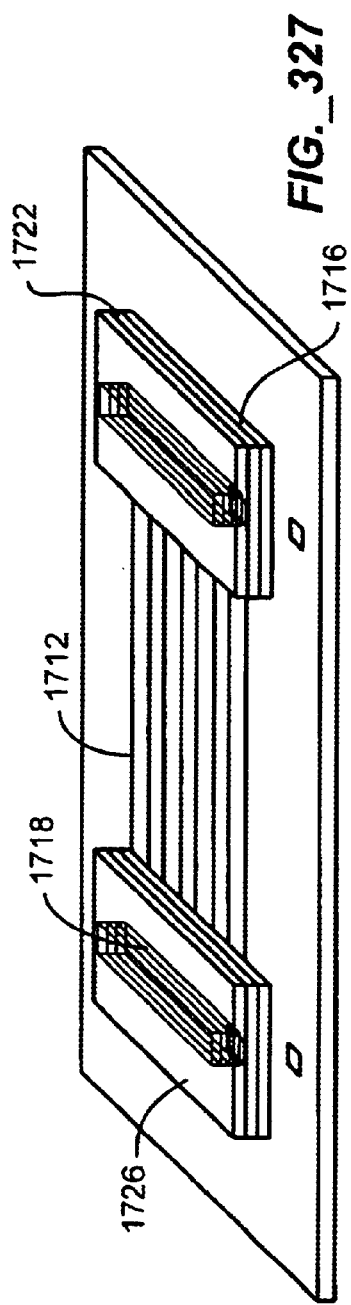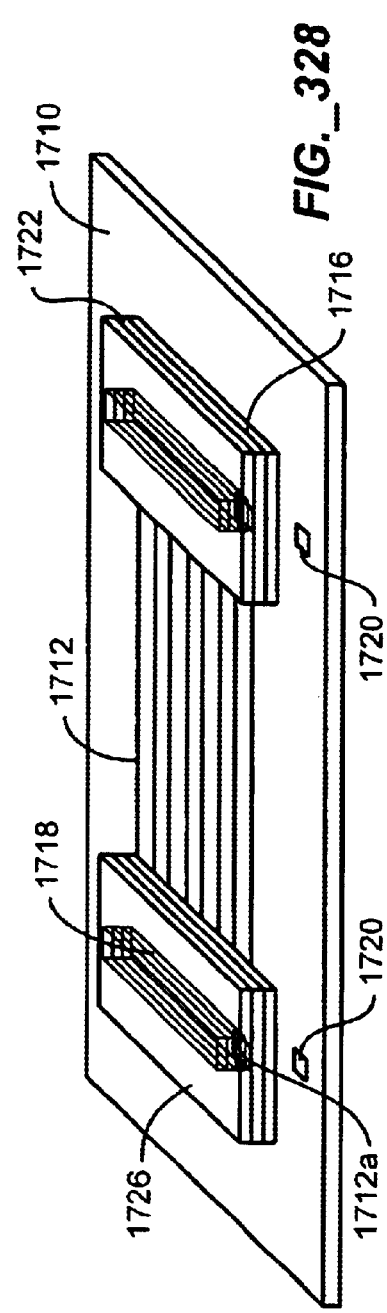

-Buildup
or
-Bond of metal-coated
layer (Block) or buildup
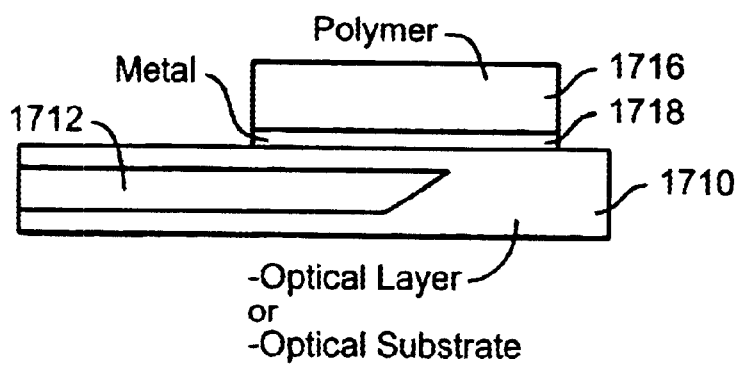
FIG._329
-Polymer Removal
(Ex. Laser Etching
or RIE
or photoplastic with
exposure/develop)
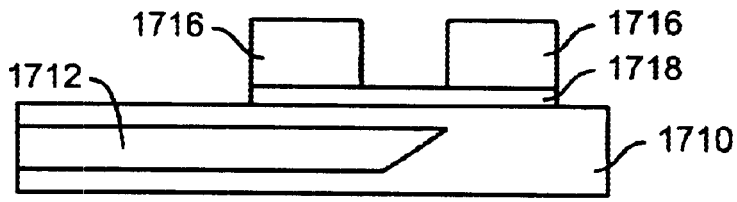
FIG._330
Metal Removal
(Ex. Wet Etching)
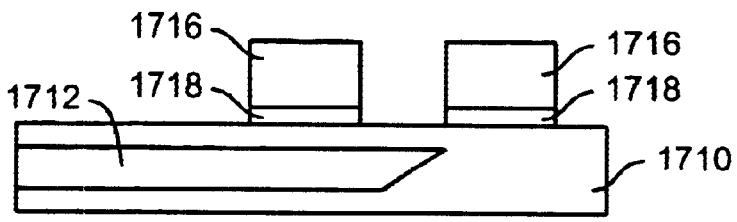
FIG._331

-Buildup or
-Bond of metal-coated layer (Block) or buildup
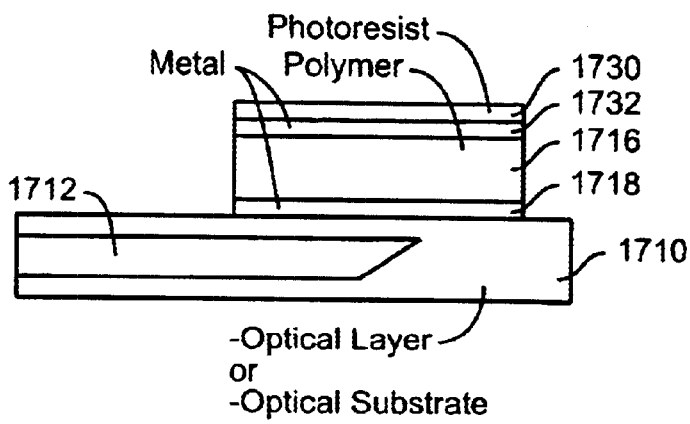
FIG._332
-Buildup or
-Bond of metal-coated layer (Block) or buildup
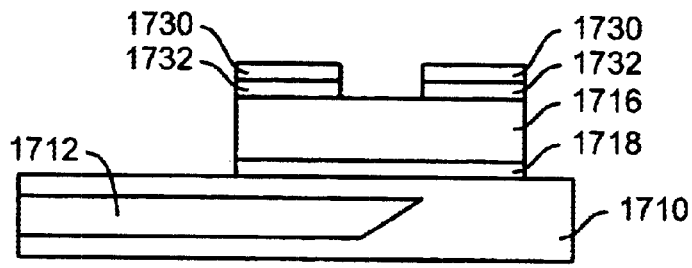
FIG._333
Polymer Removal
(Ex. Laser Etching or RIE)
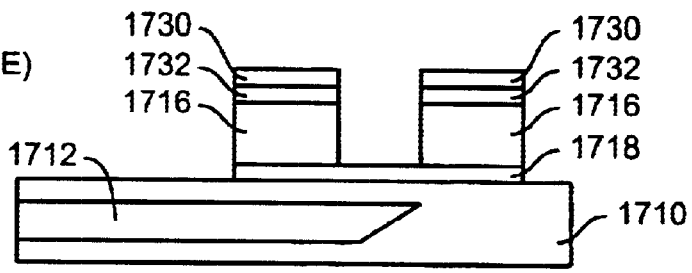
FIG._334
Metal Removal
( Ex. Wet Etching)
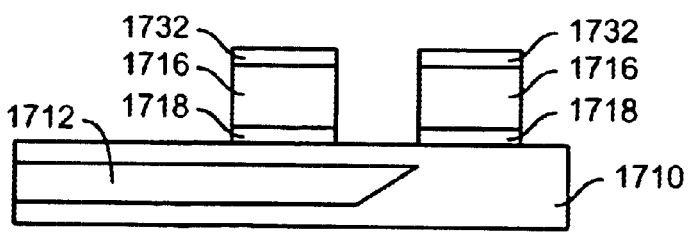
FIG._335

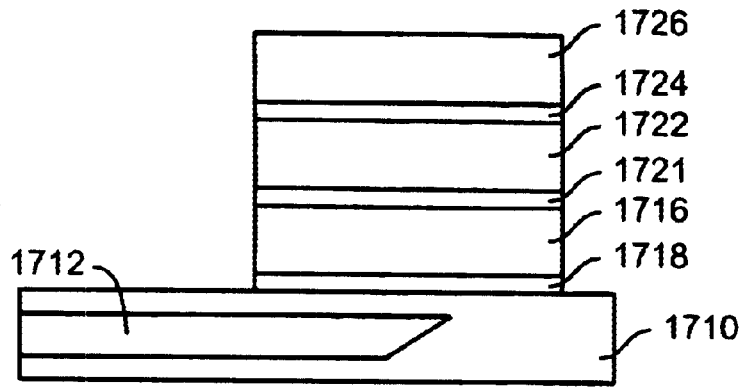
-Buildup
or
-Bond of metal-coated layer (Block) or buildup
FIG._336
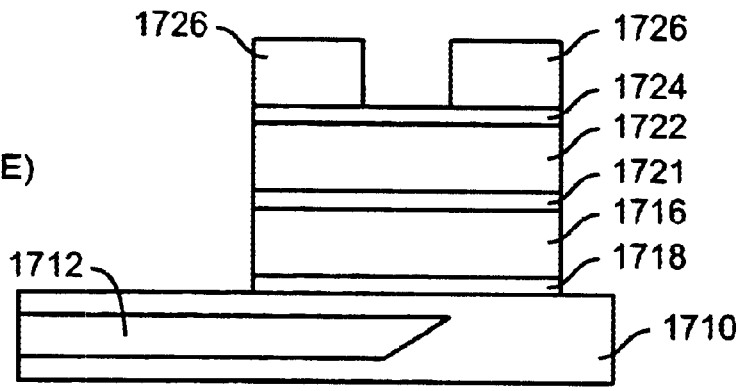
1st Polymer Removal
(Ex. Laser Etching or RIE)
FIG._337
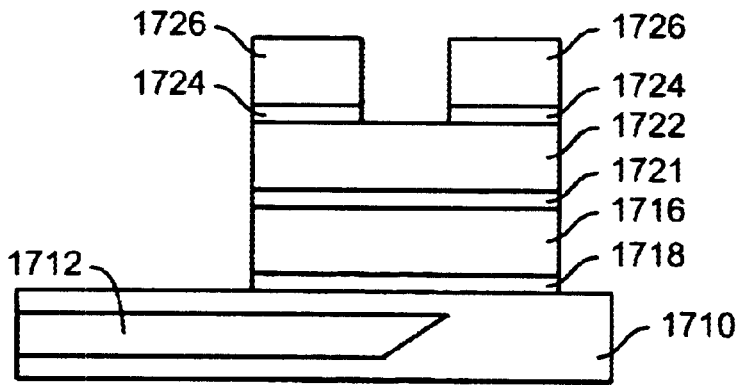
1st Metal Removal
(Ex. Wet Etching)
FIG._338

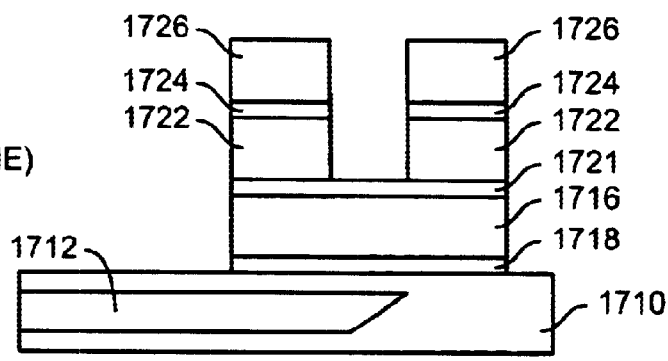
2nd Polymer Removal
(Ex. Laser Etching or RIE)
FIG._339
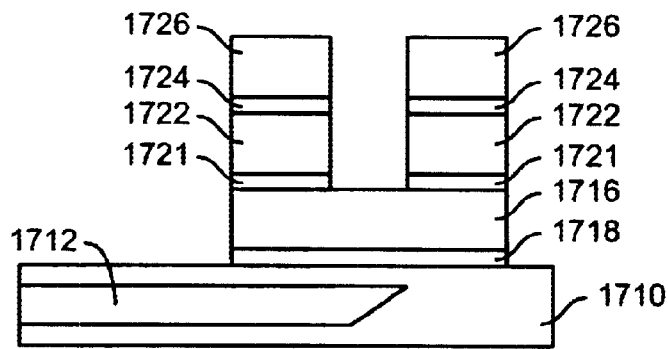
2nd Metal Removal
(Ex. Wet Etching)
FIG._340
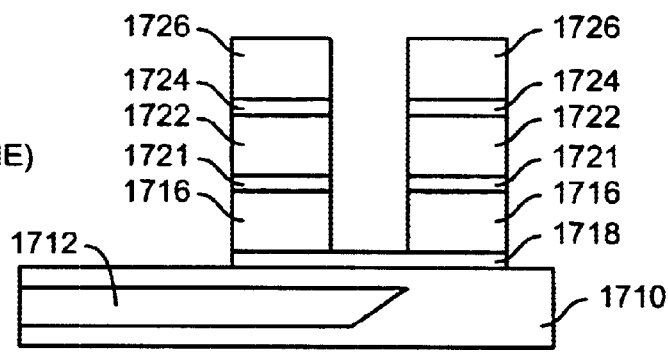
3rd Polymer Removal
(Ex. Laser Etching or RIE)
FIG._341
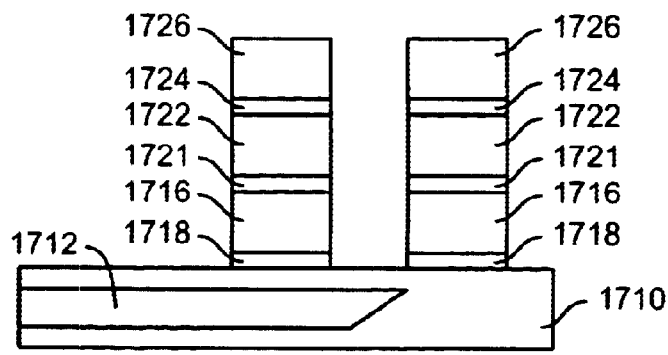
3rd Metal Removal
( Ex. Wet Etching)
FIG._342

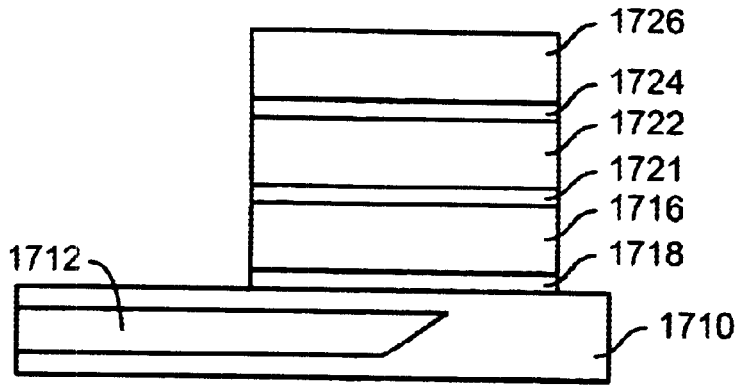
-Buildup
or
-Bond of metal-coated layer (Block) or buildup
FIG._343
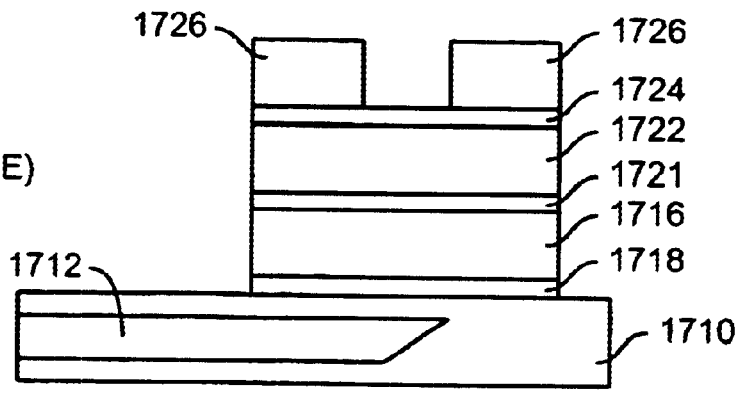
1st Polymer Removal
(Ex. Laser Etching or RIE)
FIG._344
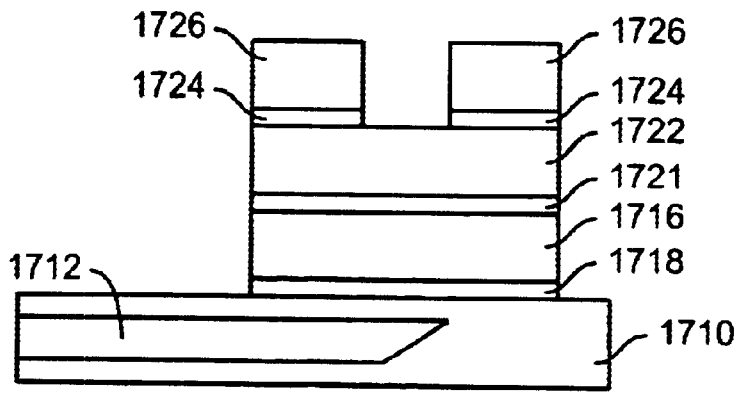
1st Metal Removal
(Ex. Wet Etching)
FIG._345

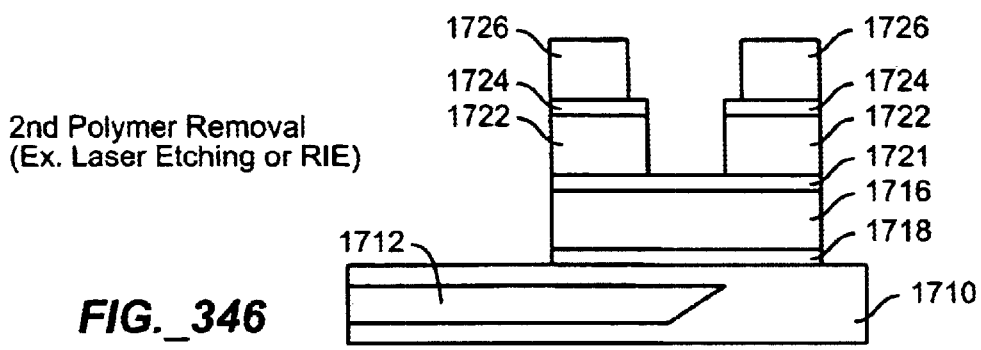
2nd Polymer Removal
(Ex. Laser Etching or RIE)
*FIG._346*
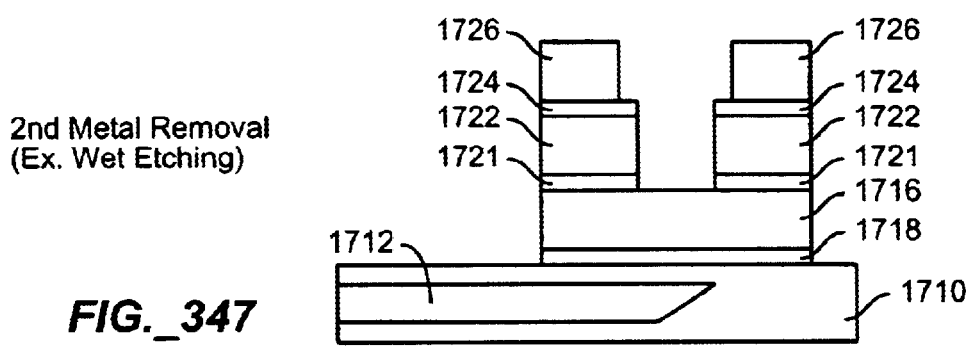
2nd Metal Removal
(Ex. Wet Etching)
*FIG._347*
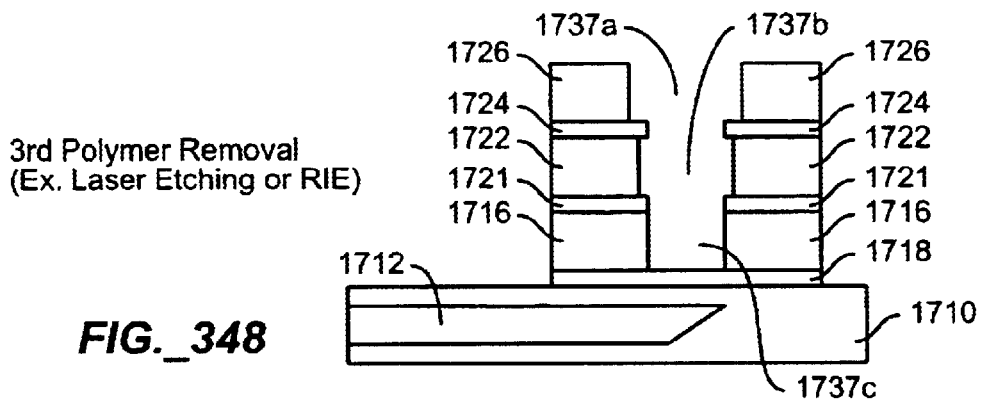
3rd Polymer Removal
(Ex. Laser Etching or RIE)
*FIG._348*
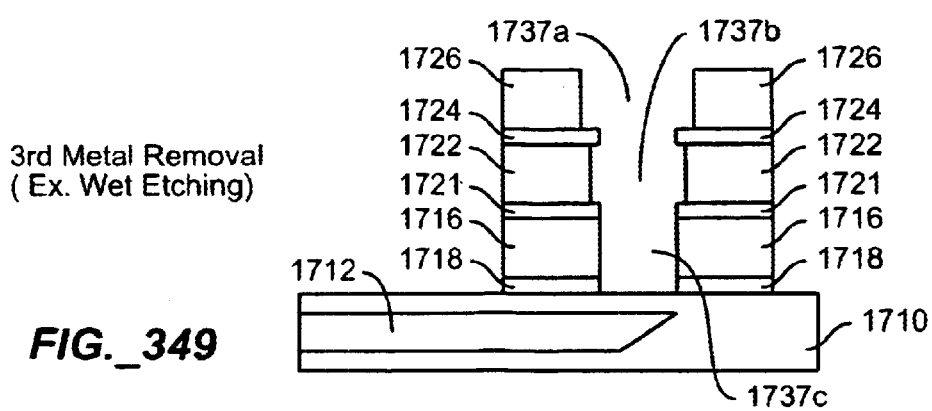
3rd Metal Removal
(Ex. Wet Etching)
*FIG._349*

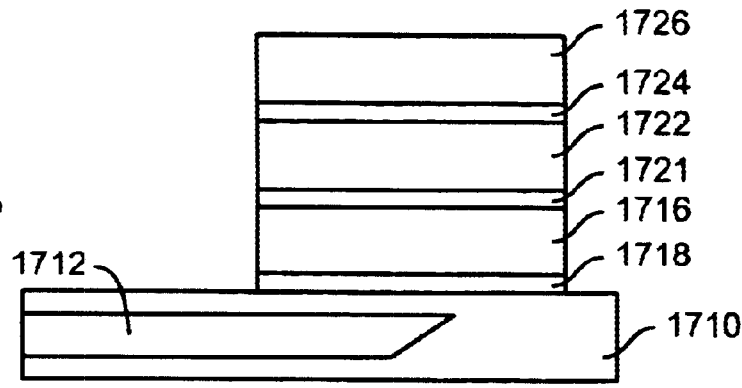
-Buildup
or
-Bond of metal-coated layer (Block) or buildup
FIG._350
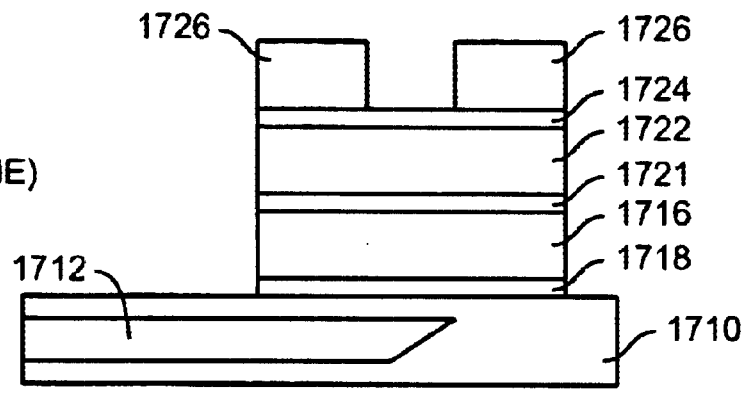
1st Polymer Removal
(Ex. Laser Etching or RIE)
FIG._351
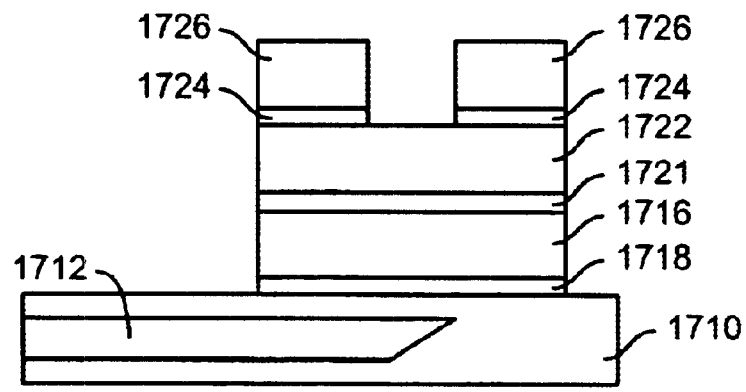
1st Metal Removal
(Ex. Wet Etching)
FIG._352

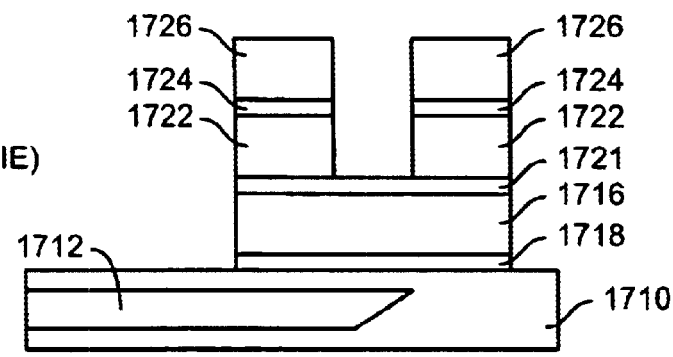
2nd Polymer Removal
(Ex. Laser Etching or RIE)
FIG._353
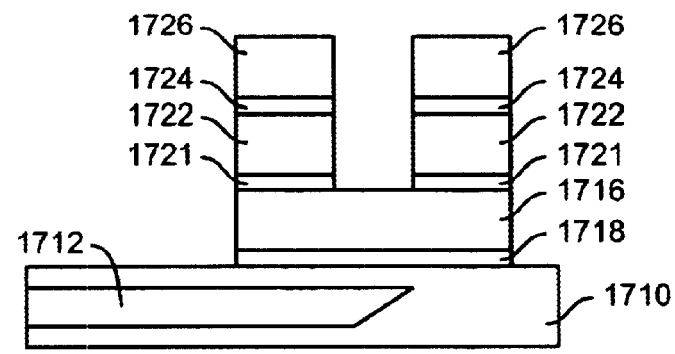
2nd Metal Removal
(Ex. Wet Etching)
FIG._354
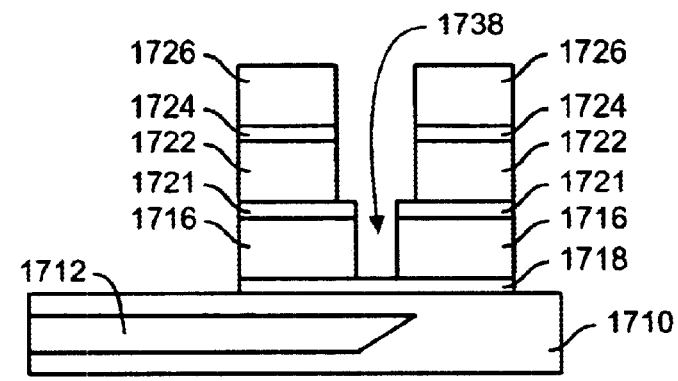
3rd Polymer Removal
(Ex. Laser Etching)
FIG._355
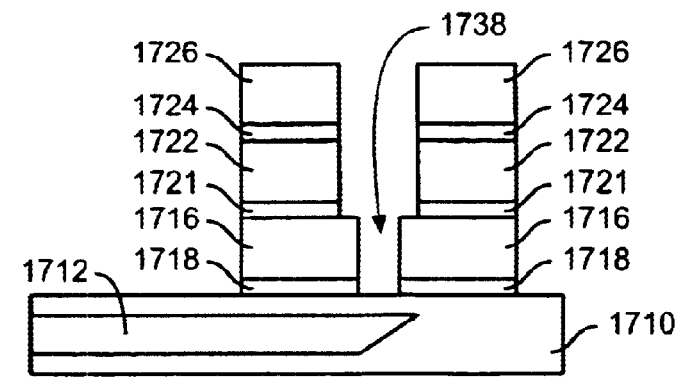
3rd Metal Removal
(Ex. Wet Etching)
FIG._356

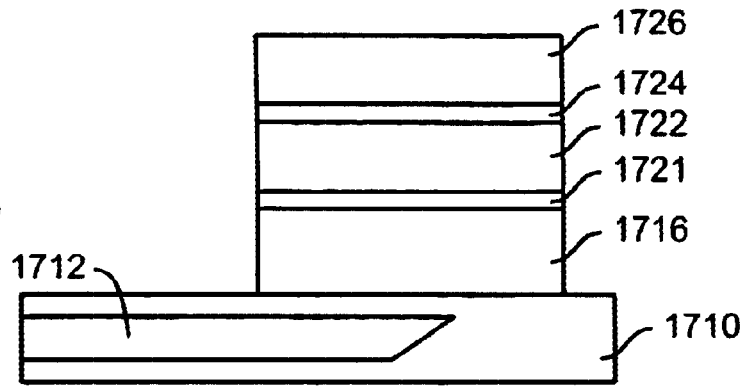
-Buildup
or
-Bond of metal-coated
layer (Block) or buildup
FIG._357
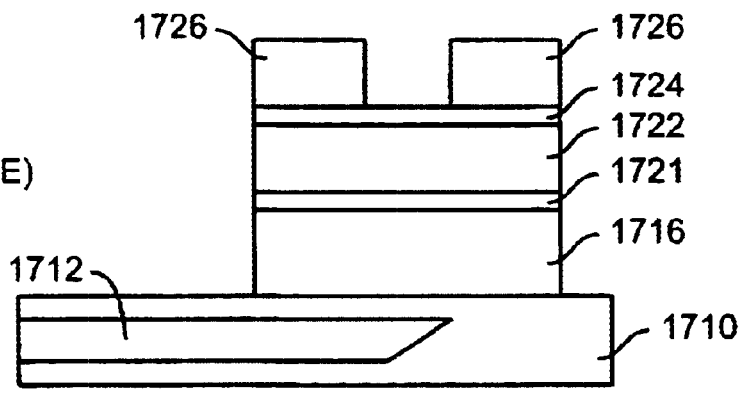
1st Polymer Removal
(Ex. Laser Etching or RIE)
FIG._358
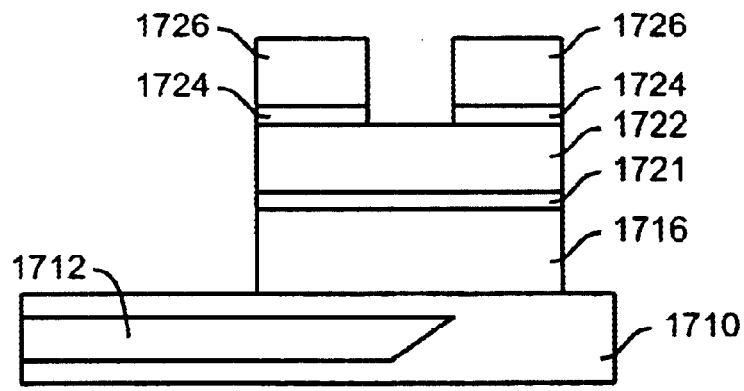
1st Metal Removal
(Ex. Wet Etching)
FIG._359

2nd Polymer Removal
(Ex. Laser Etching or RIE)
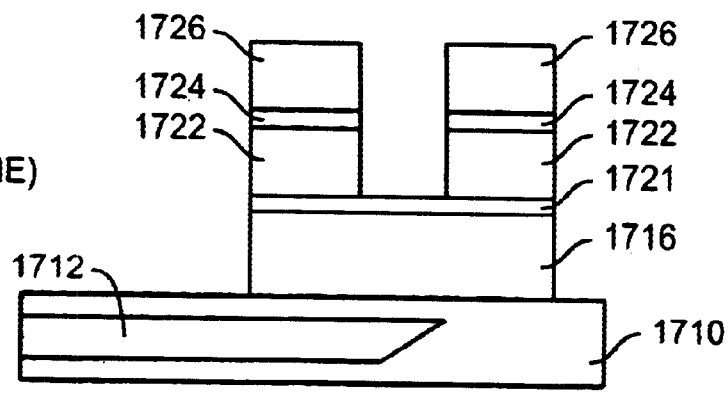
FIG._360
2nd Metal Removal
(Ex. Wet Etching)
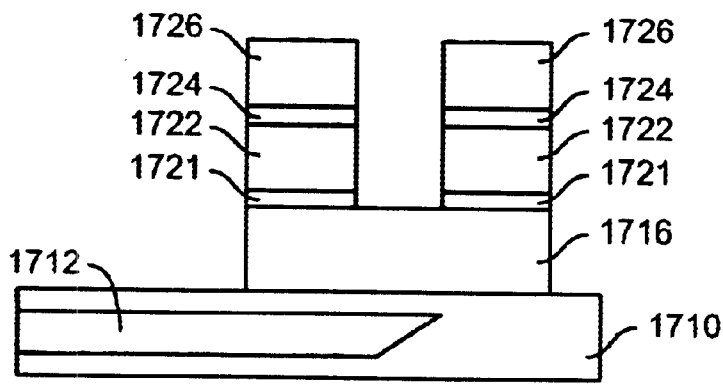
FIG._361

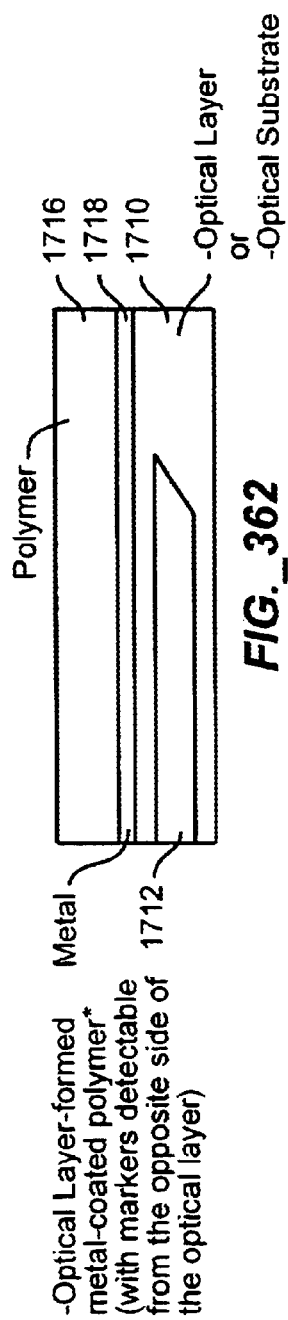
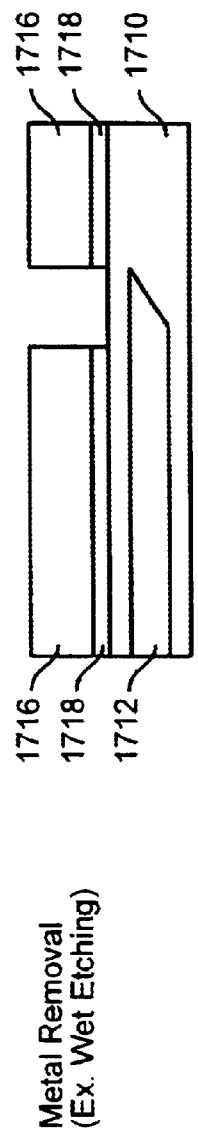

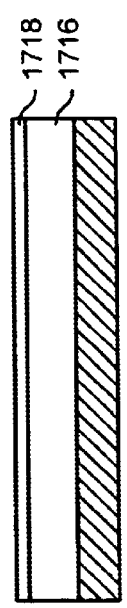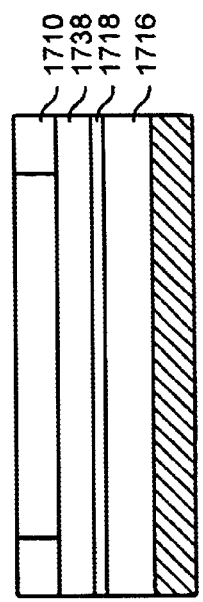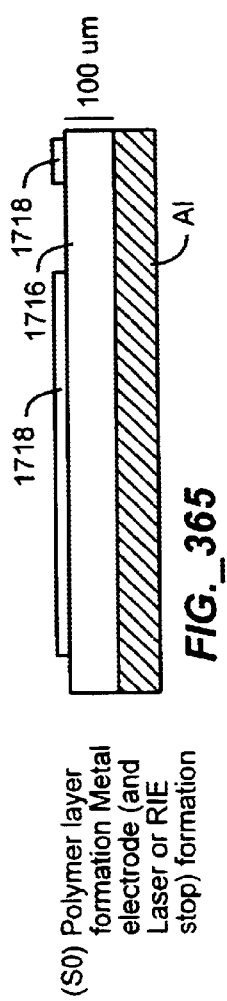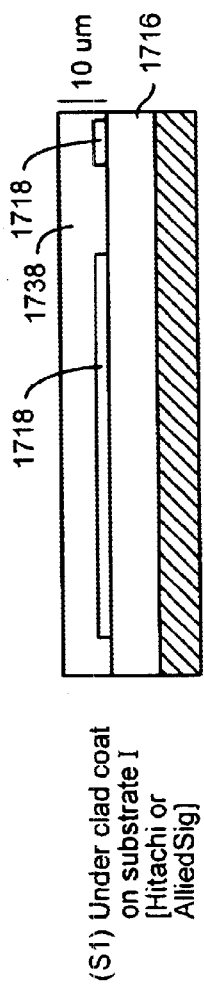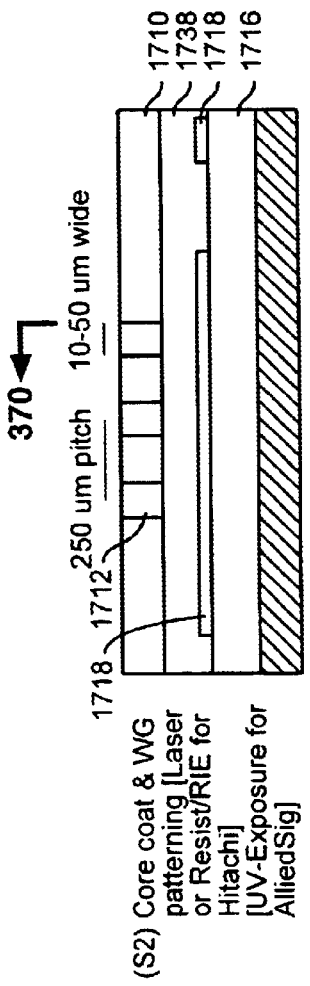

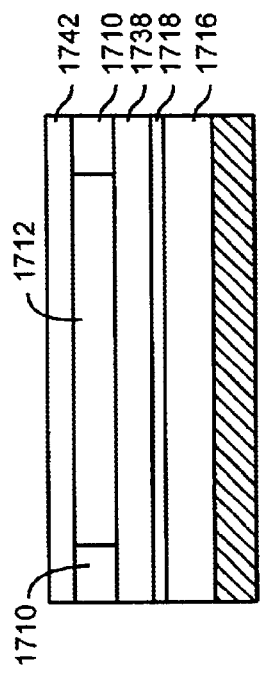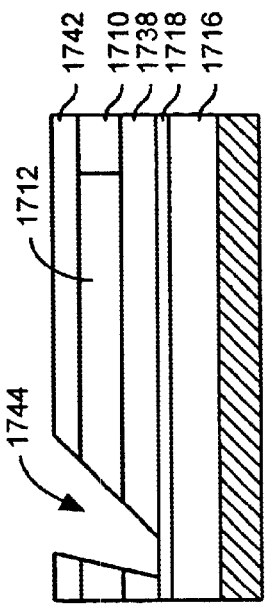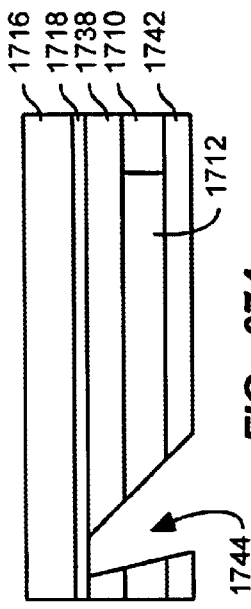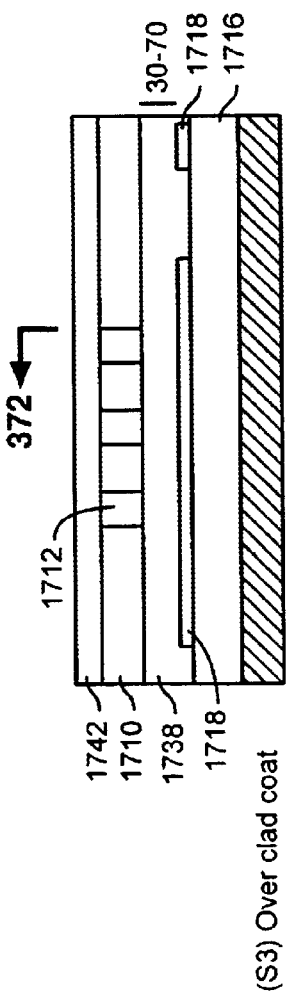

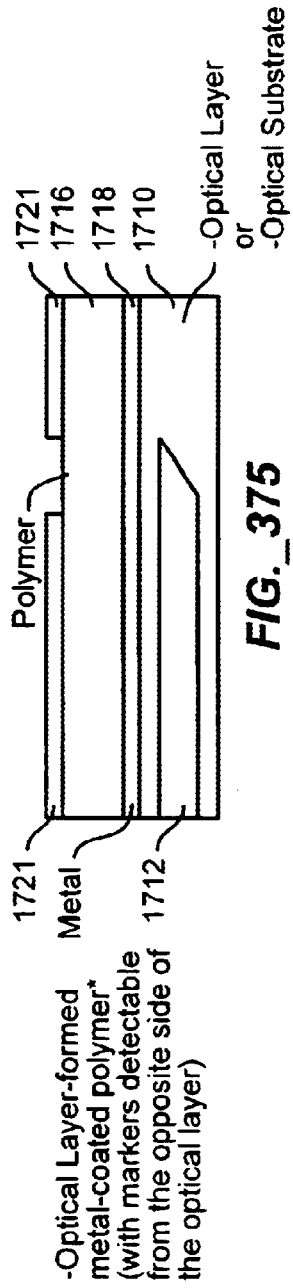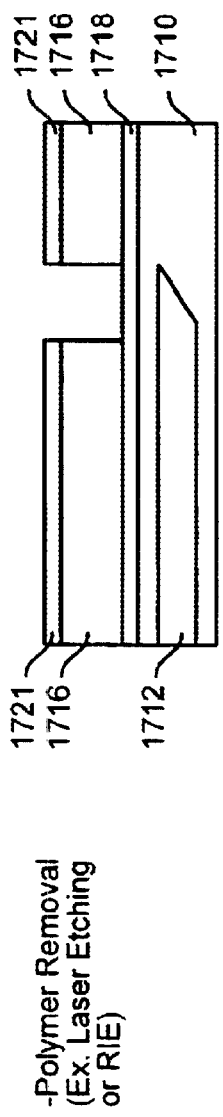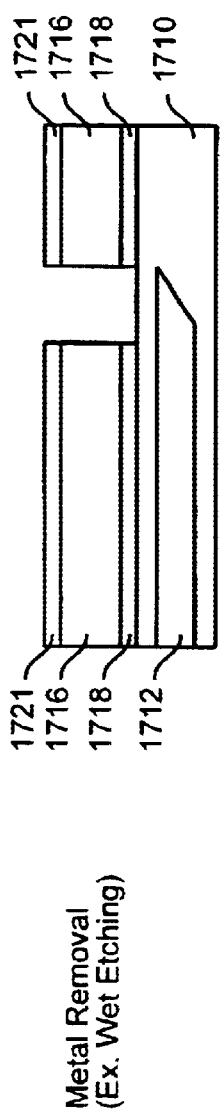

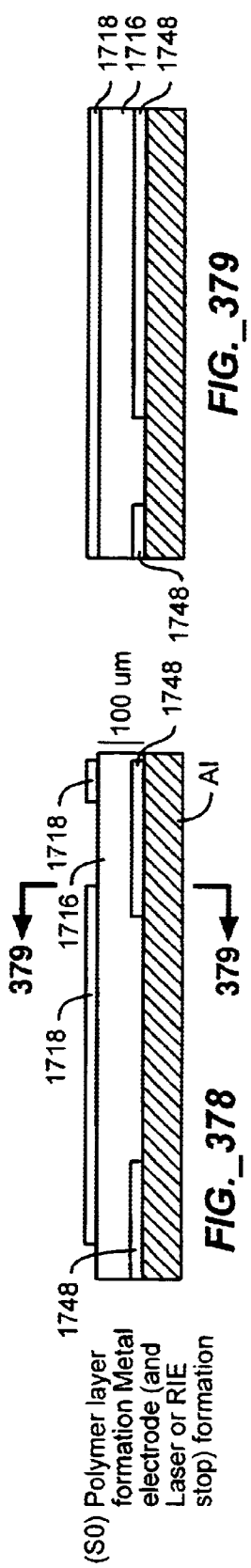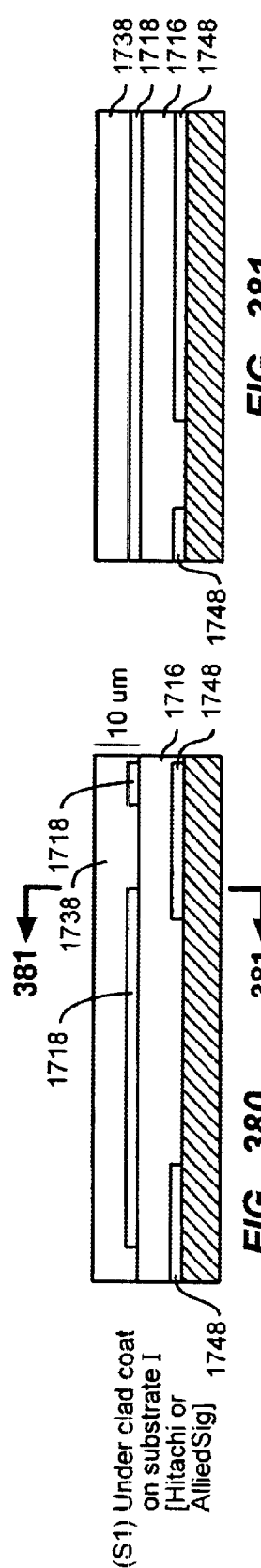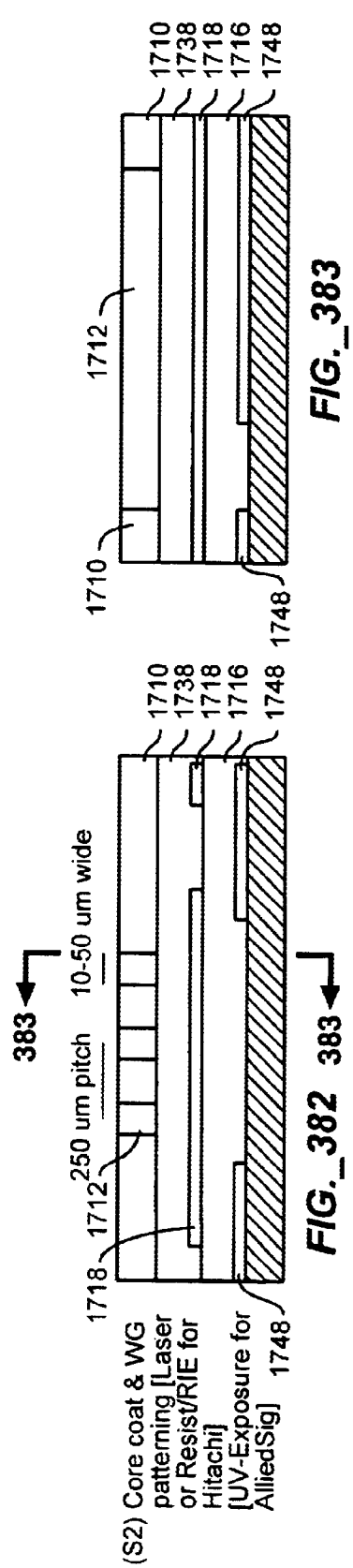

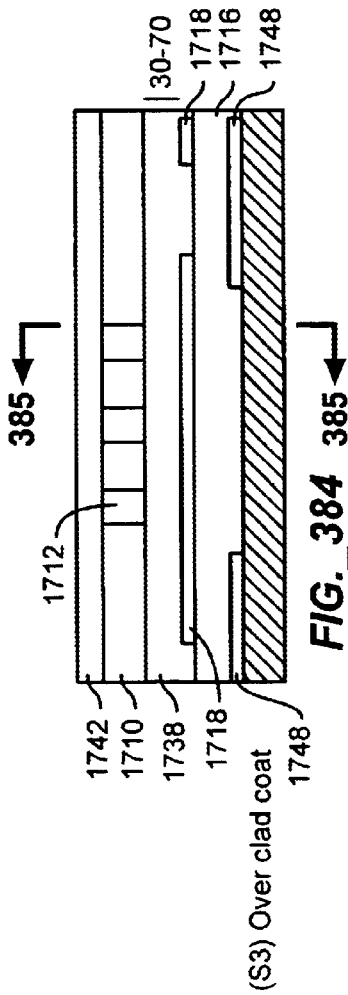
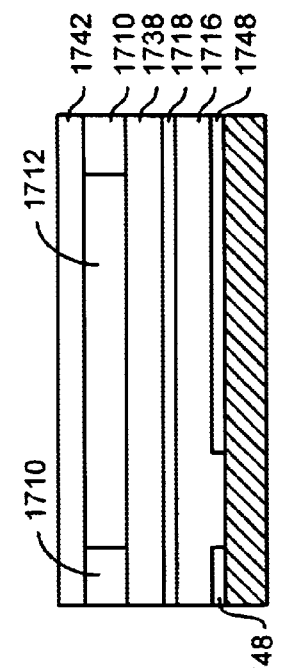
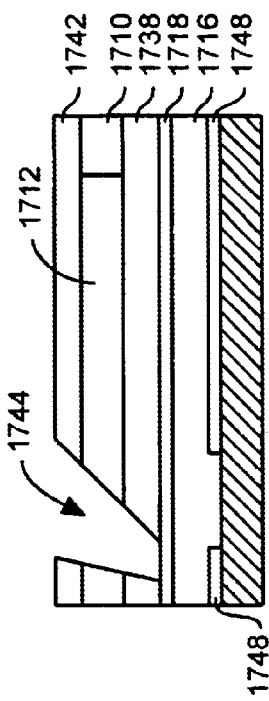
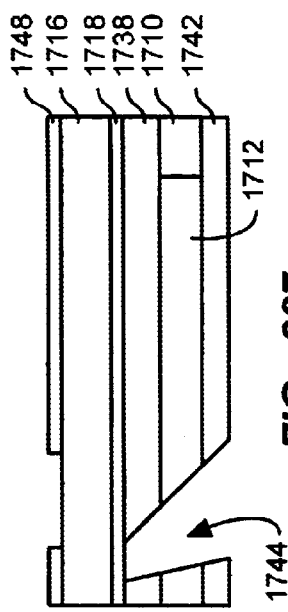

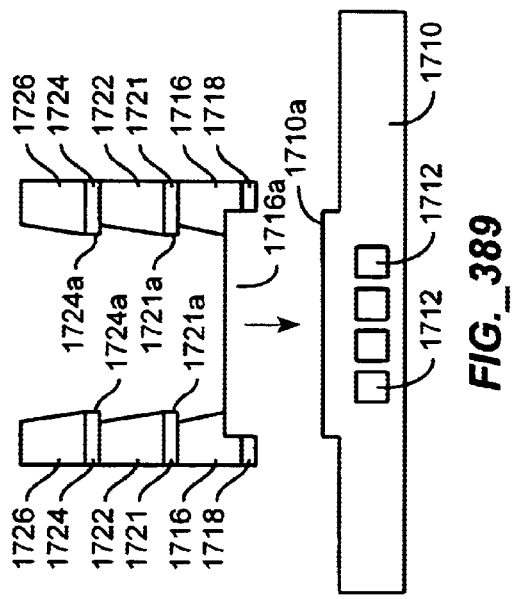
FIG._388
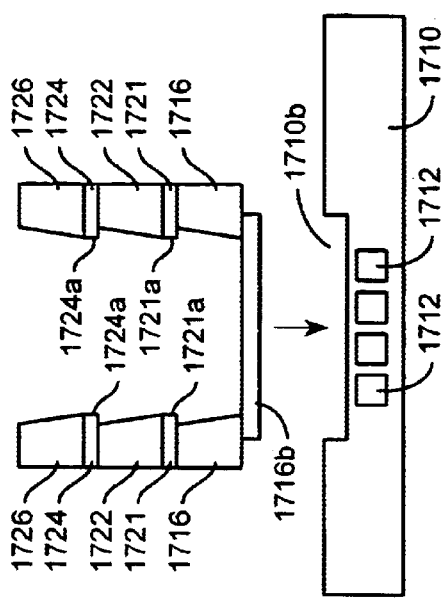
FIG._390
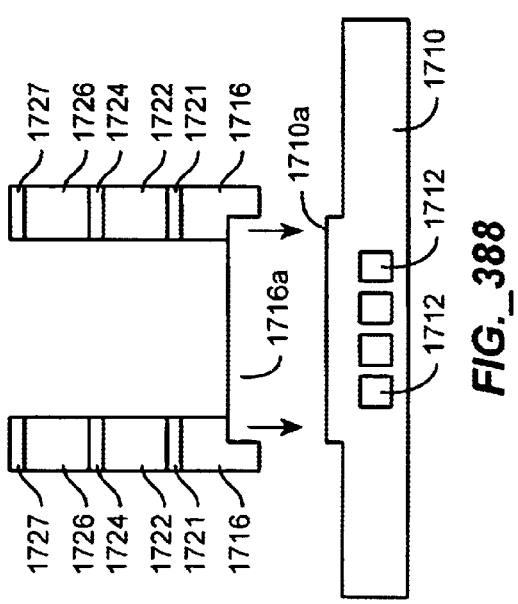
FIG._389
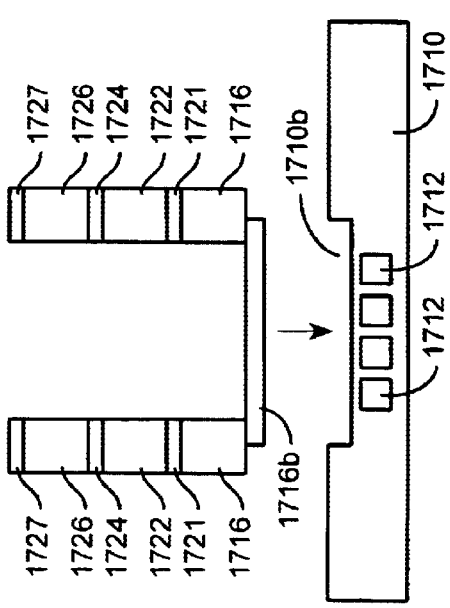
FIG._391

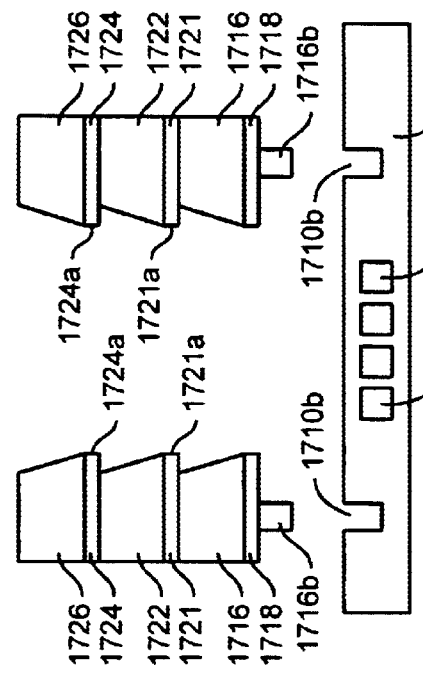
FIG._393
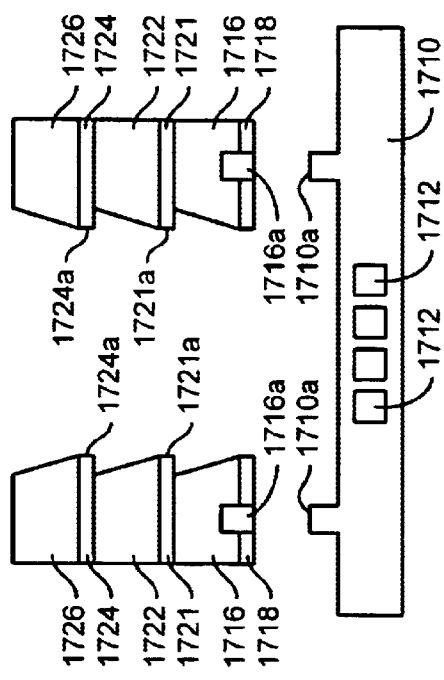
FIG._395
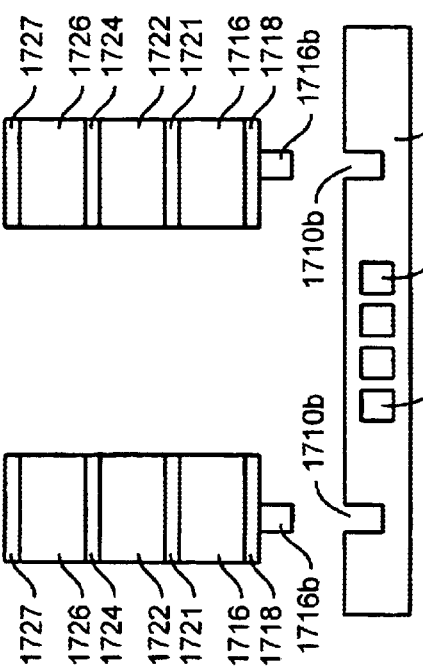
FIG._392
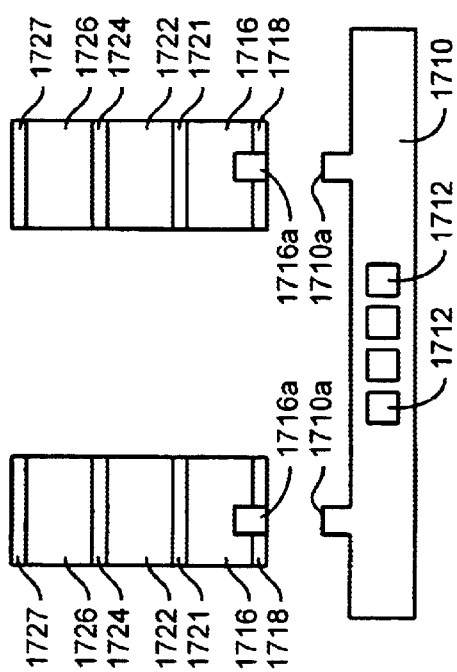
FIG._394

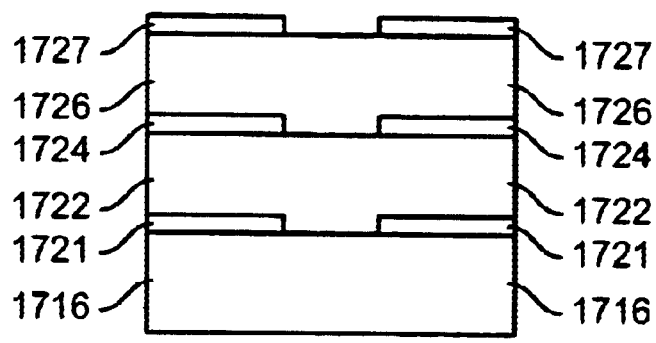
-Buildup
or
-Bond of metal-coated
layer (Block)
or buildup
FIG._396
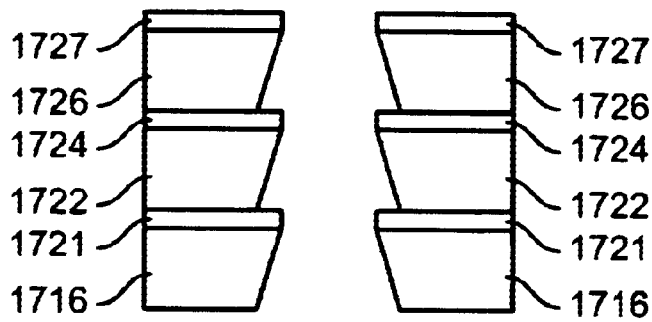
FIG._397
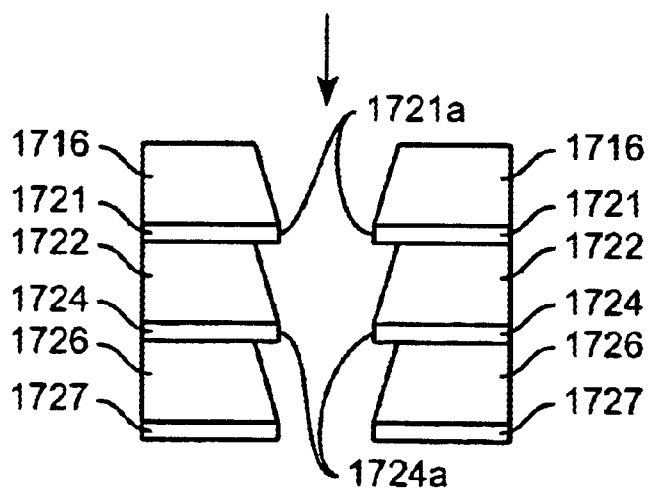
FIG._398

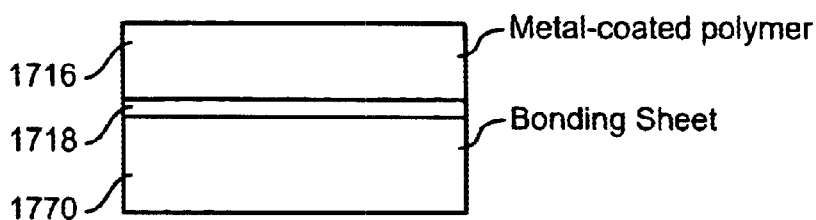
FIG._399
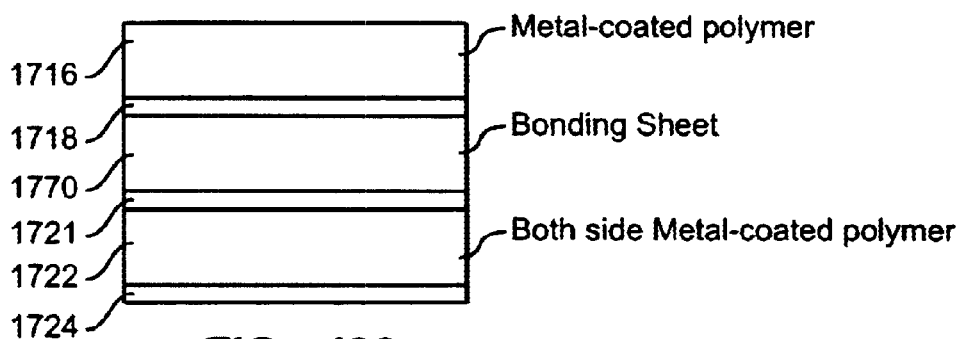
FIG._400
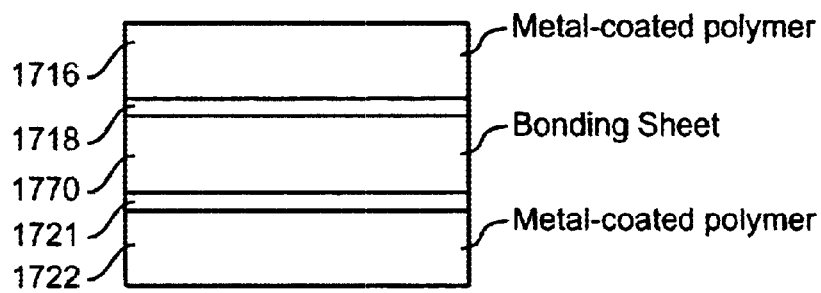
FIG._401
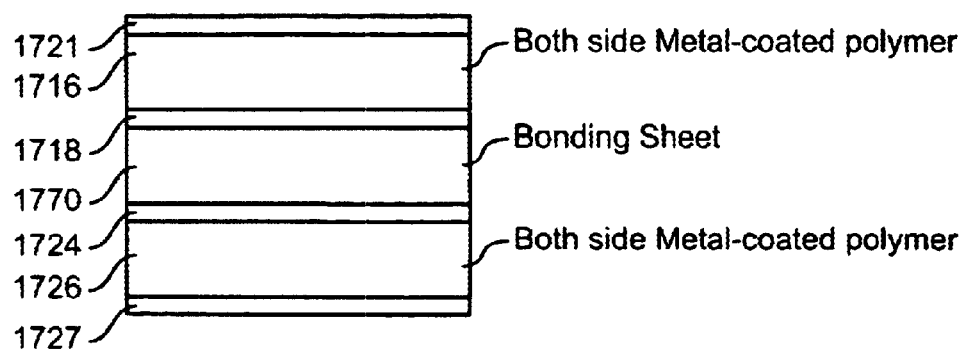
FIG._402

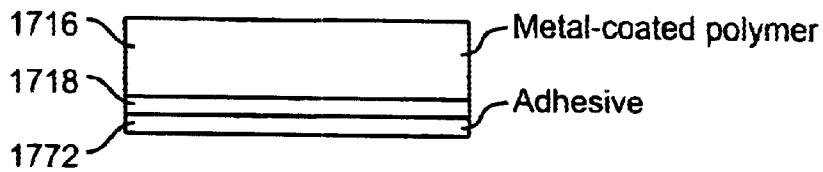
*FIG._403*
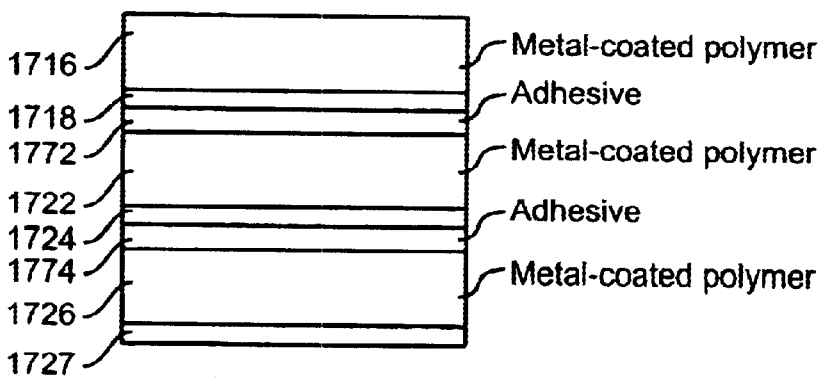
*FIG._404*
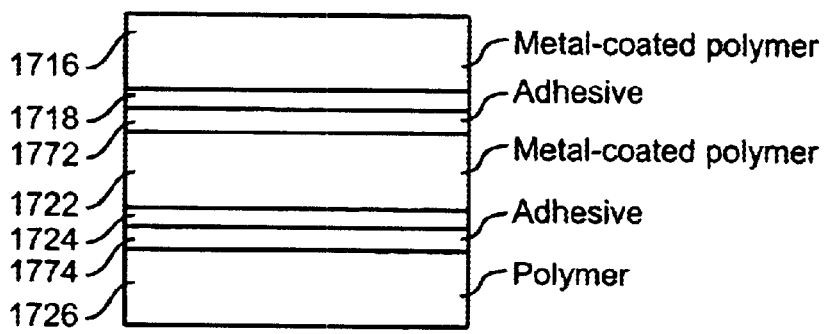
*FIG._405*
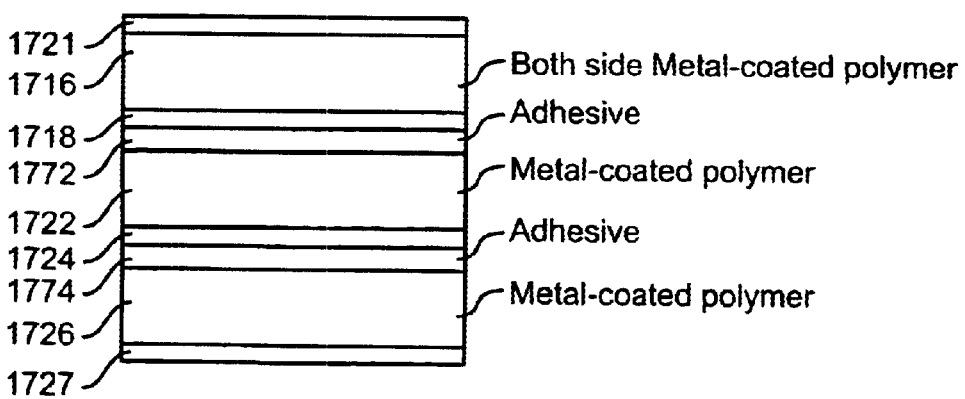
*FIG._406*

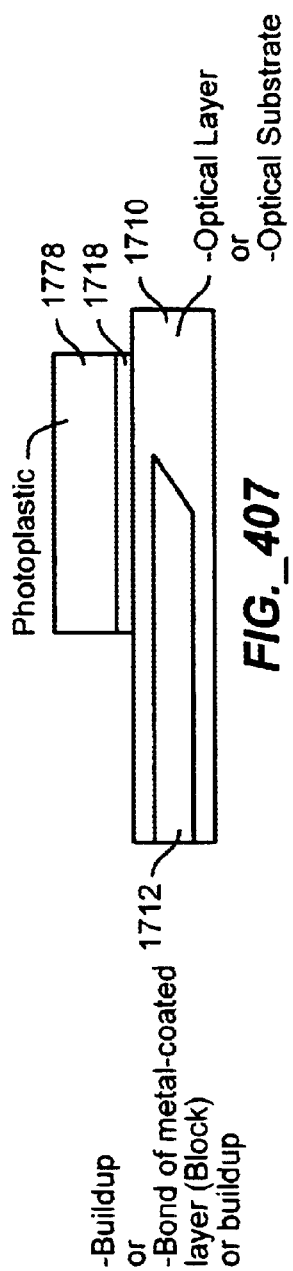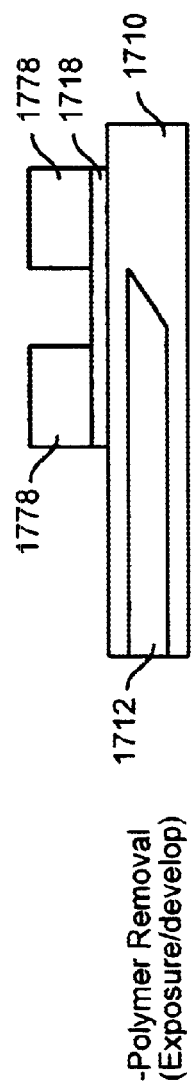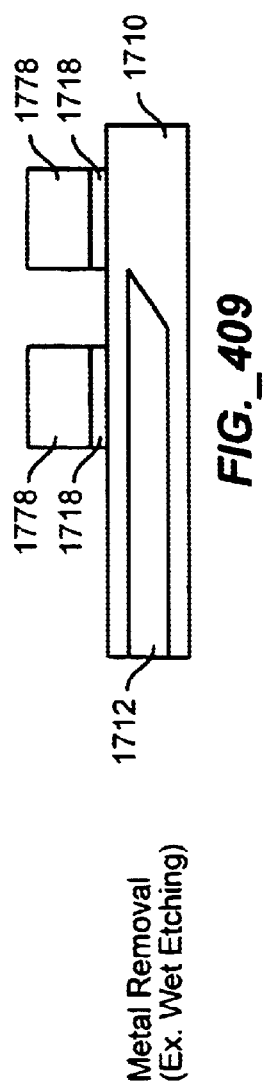

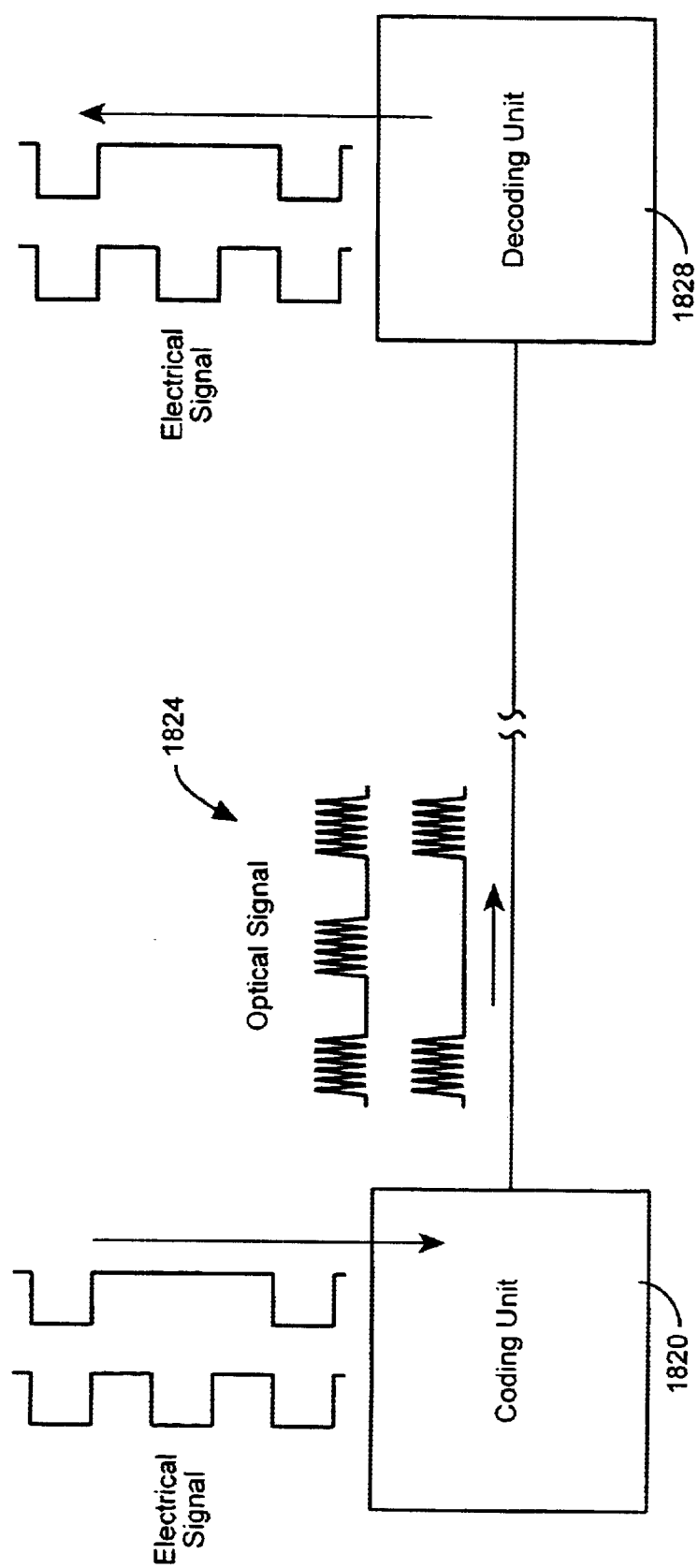
FIG._410

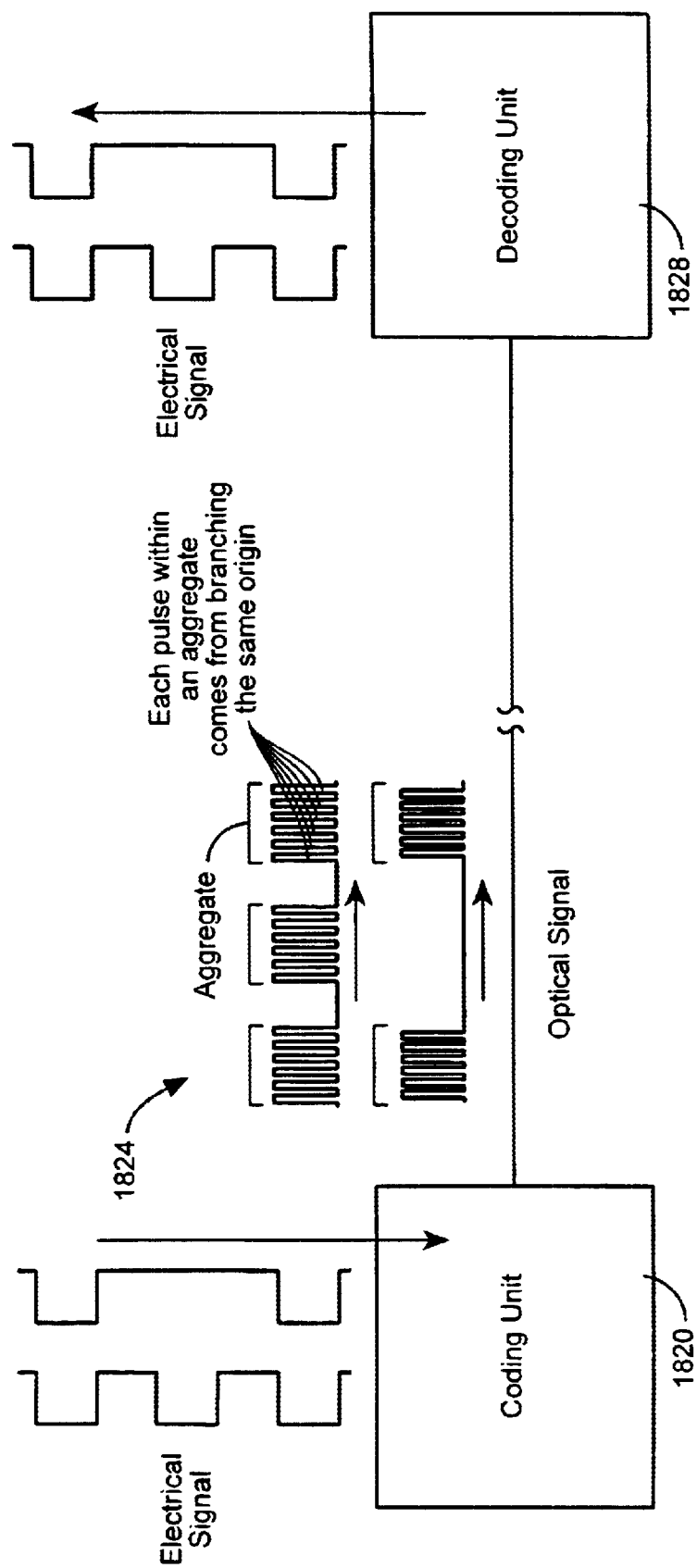
FIG._411

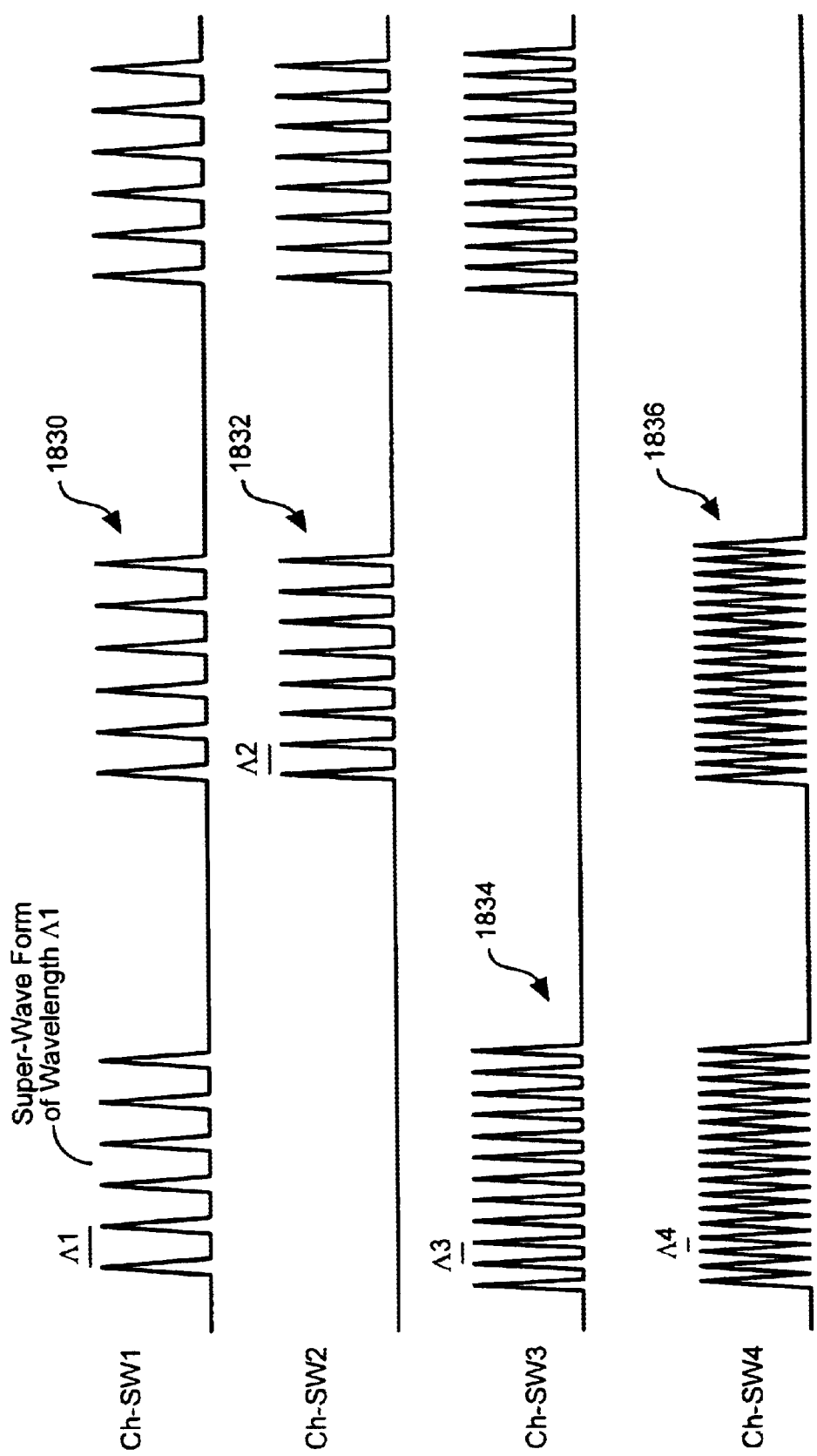
FIG._412

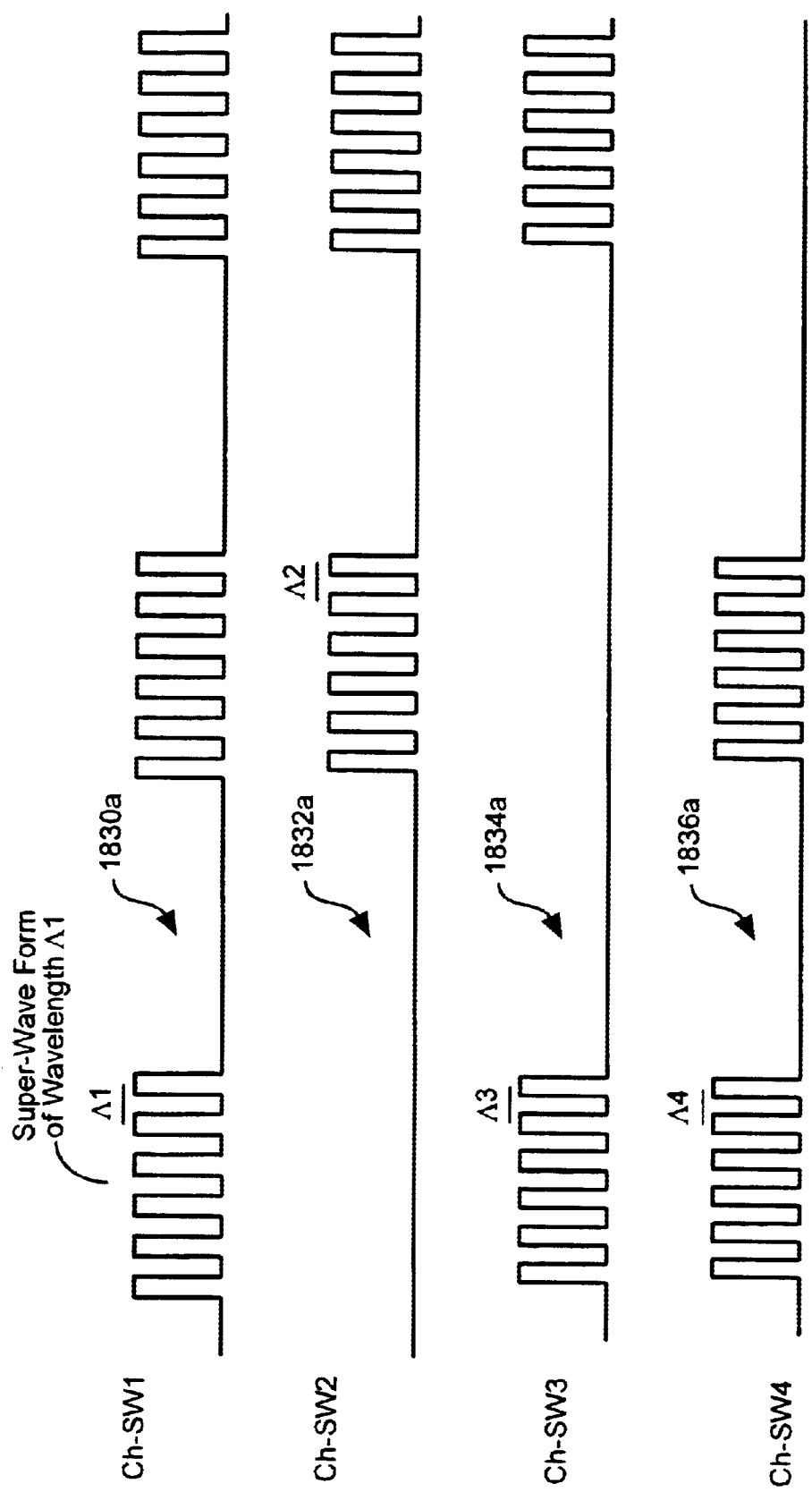
FIG._413

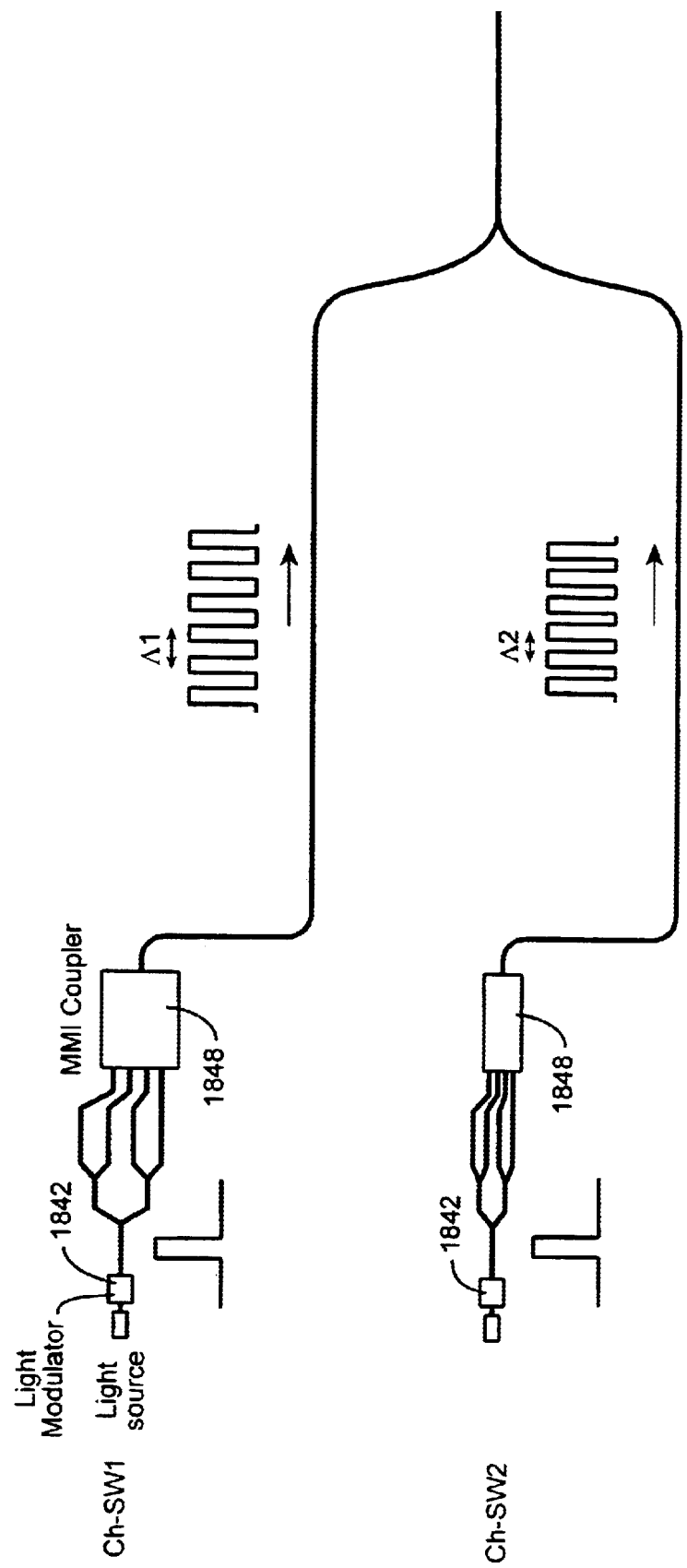
FIG._419

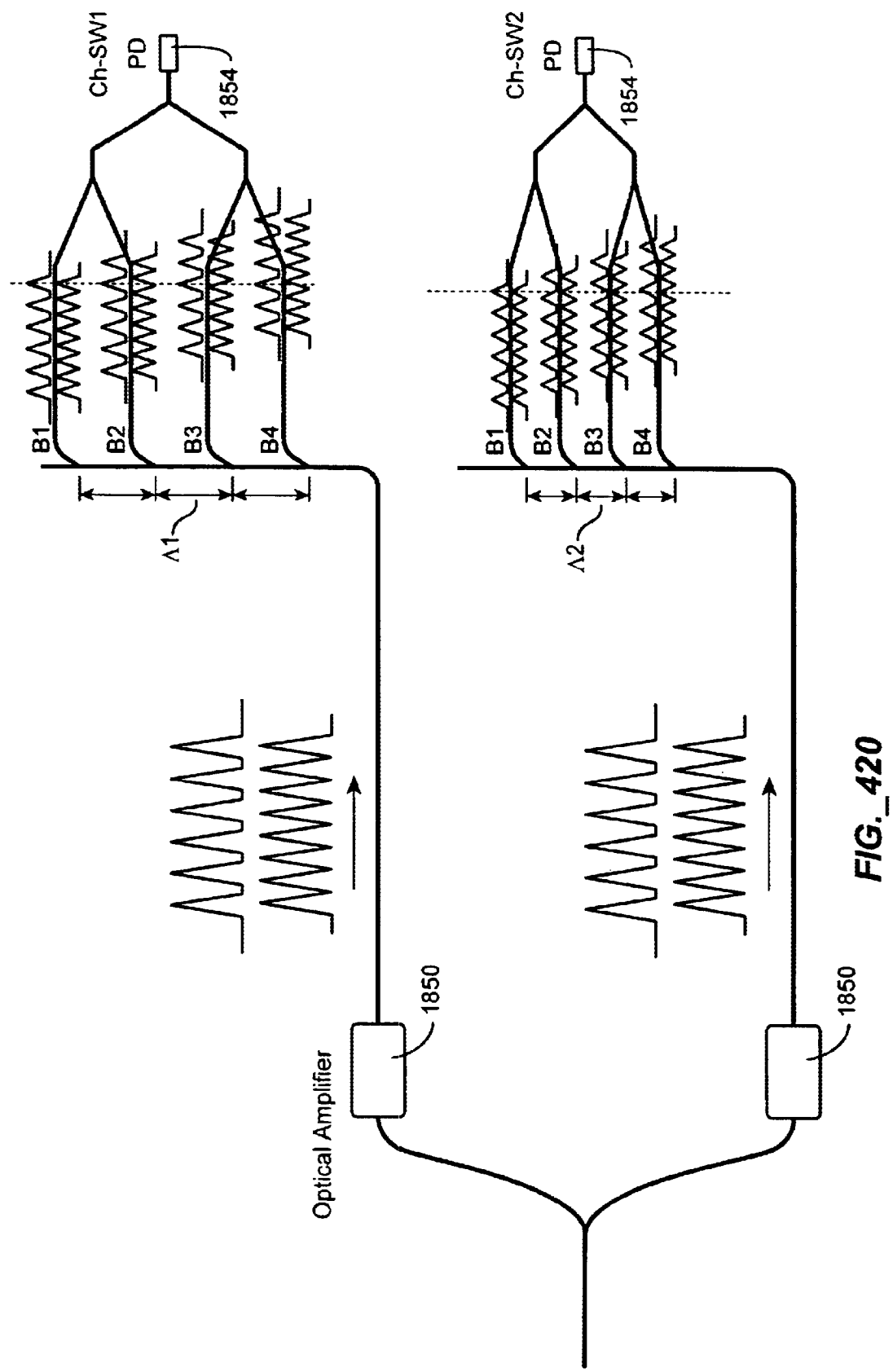
FIG._420

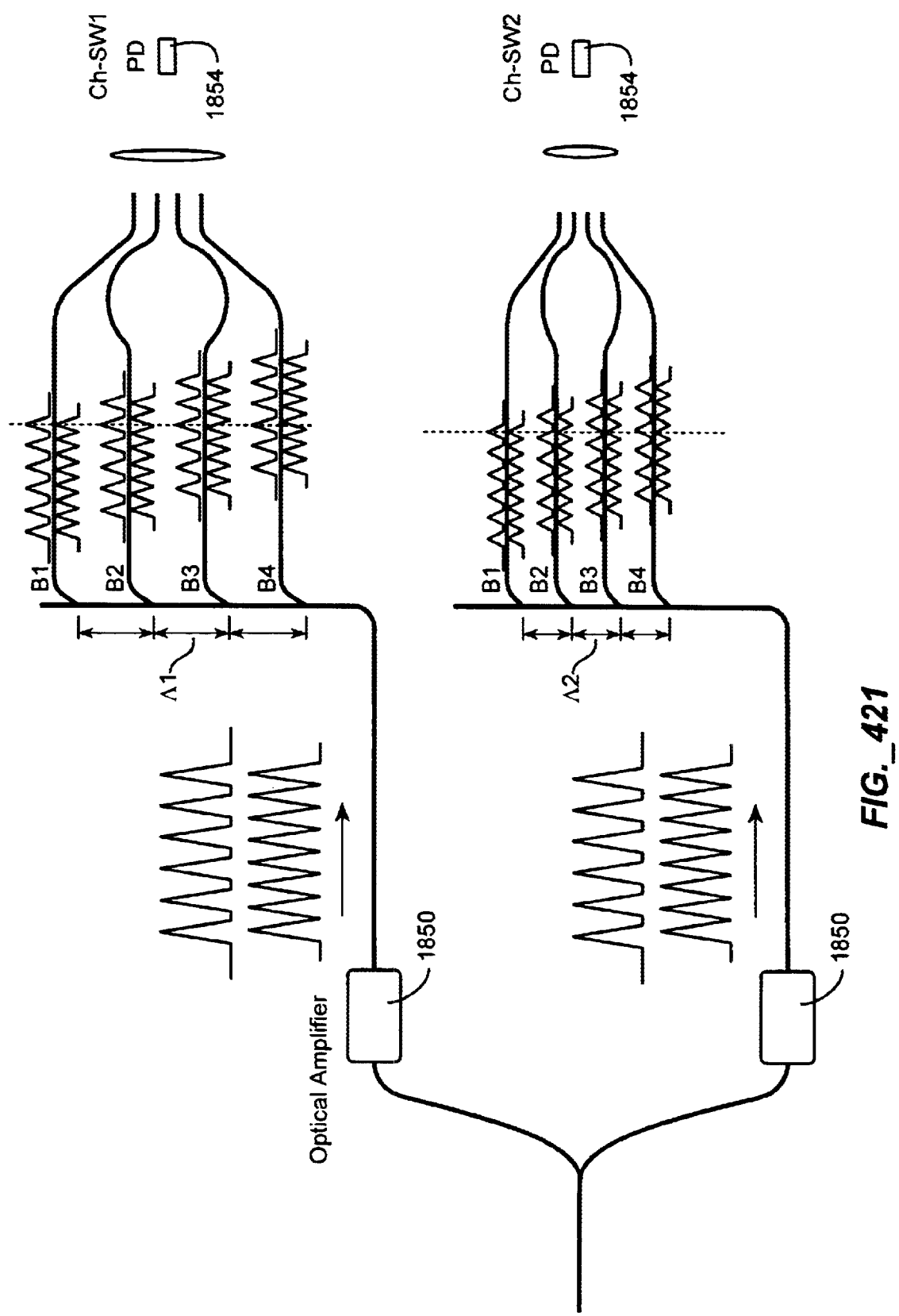
FIG._421

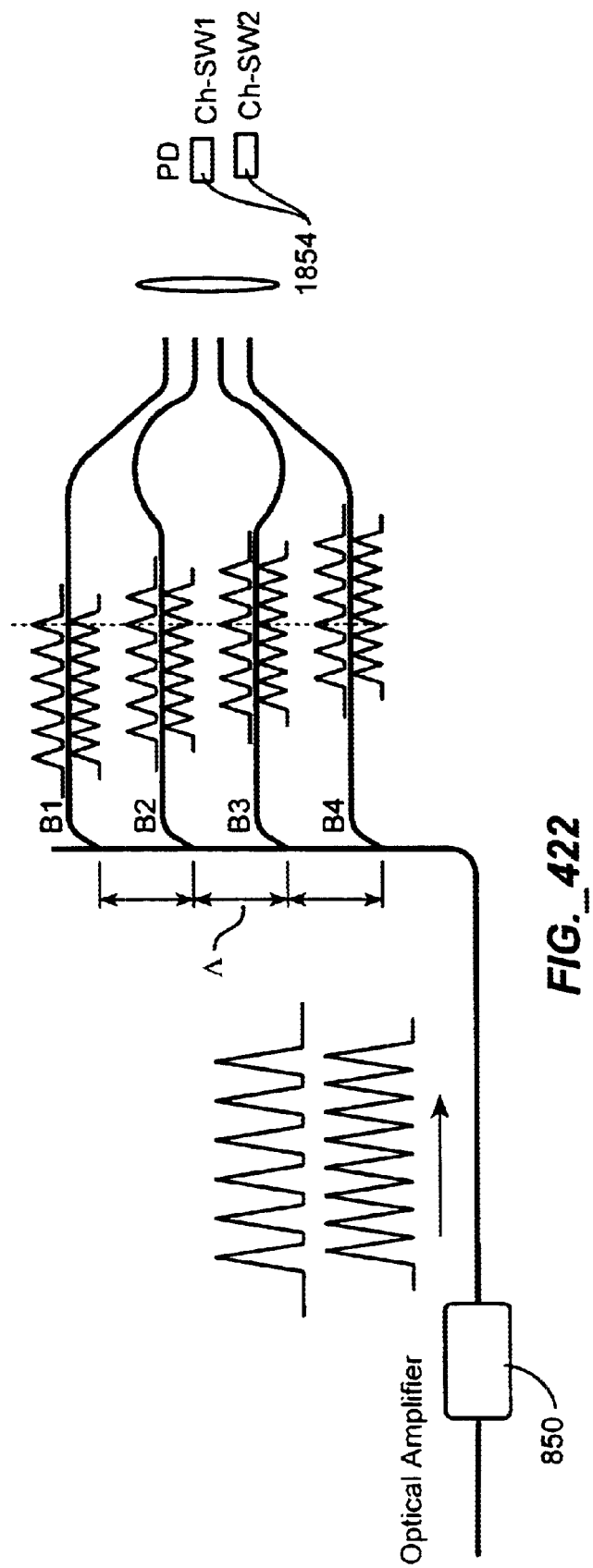
FIG._422

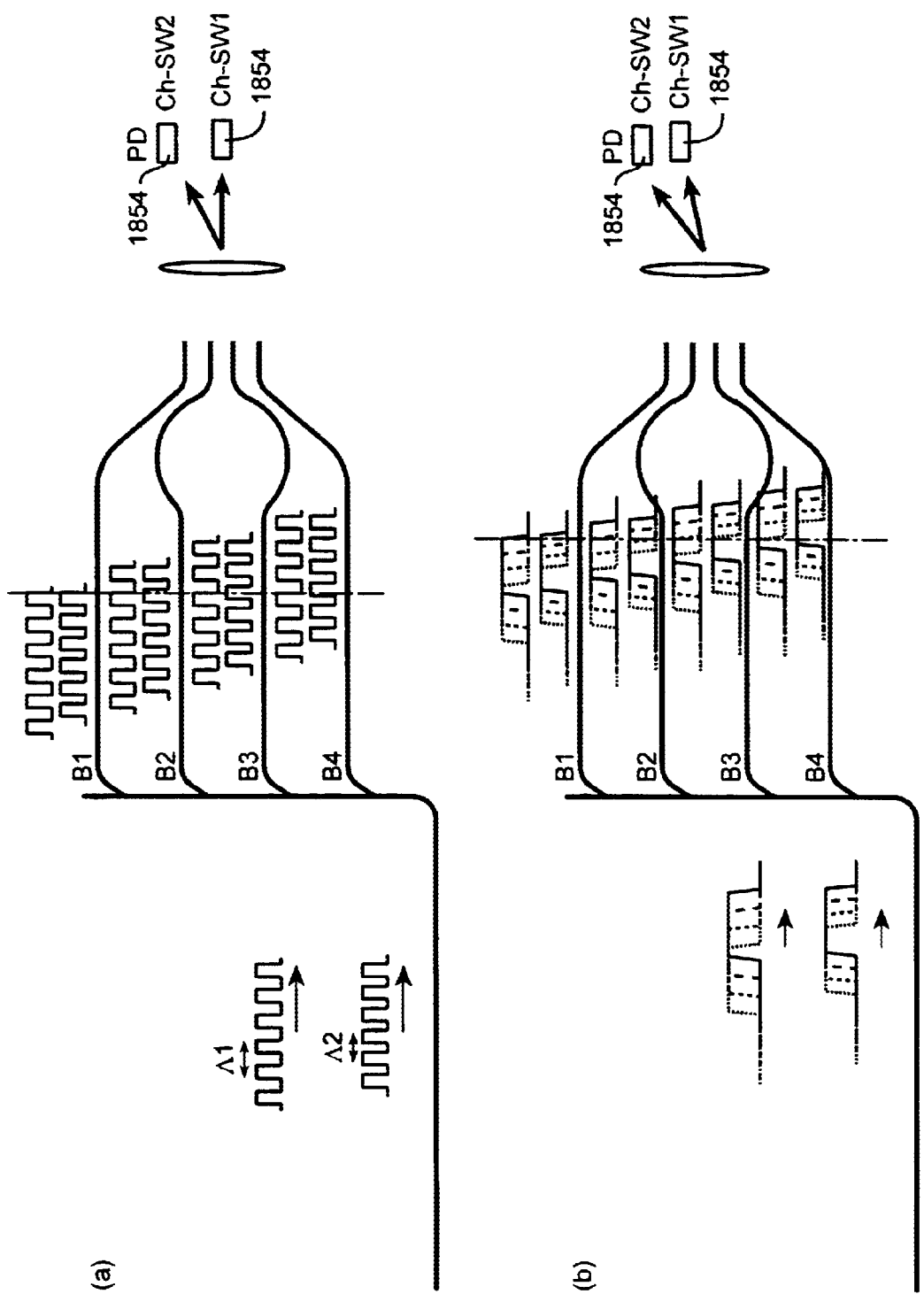
FIG._423

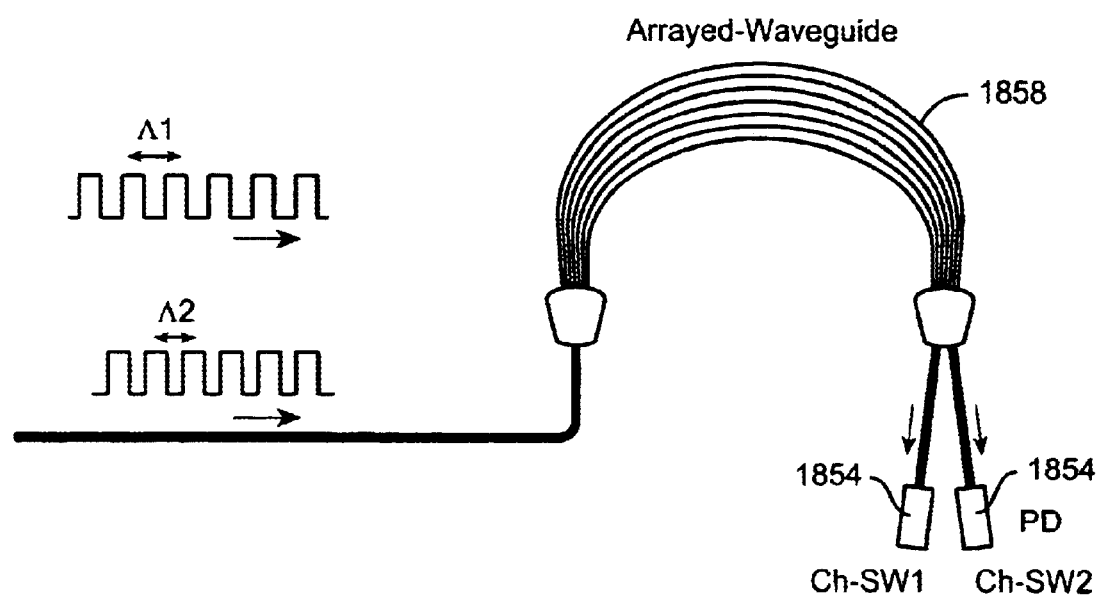
FIG._424

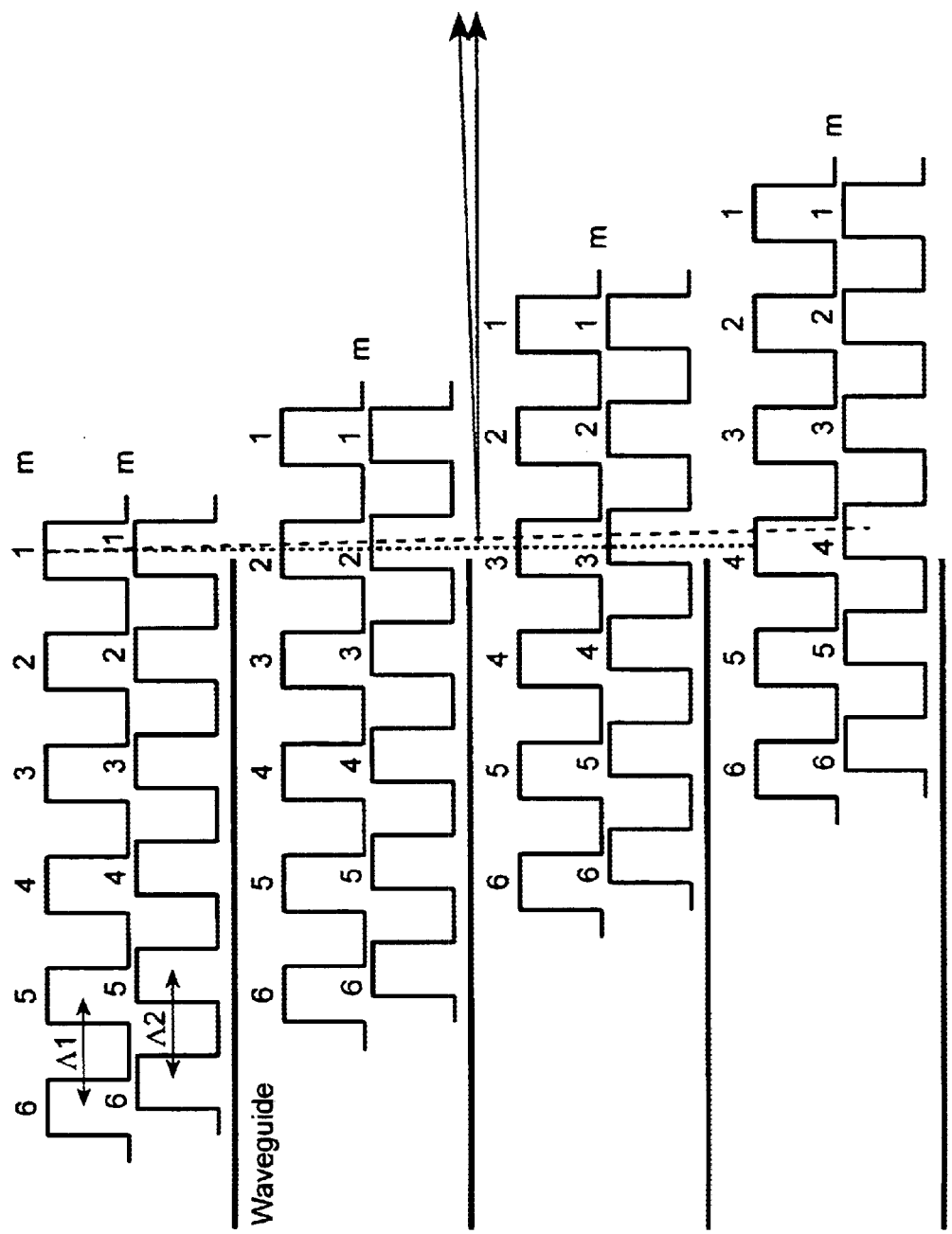
FIG._425

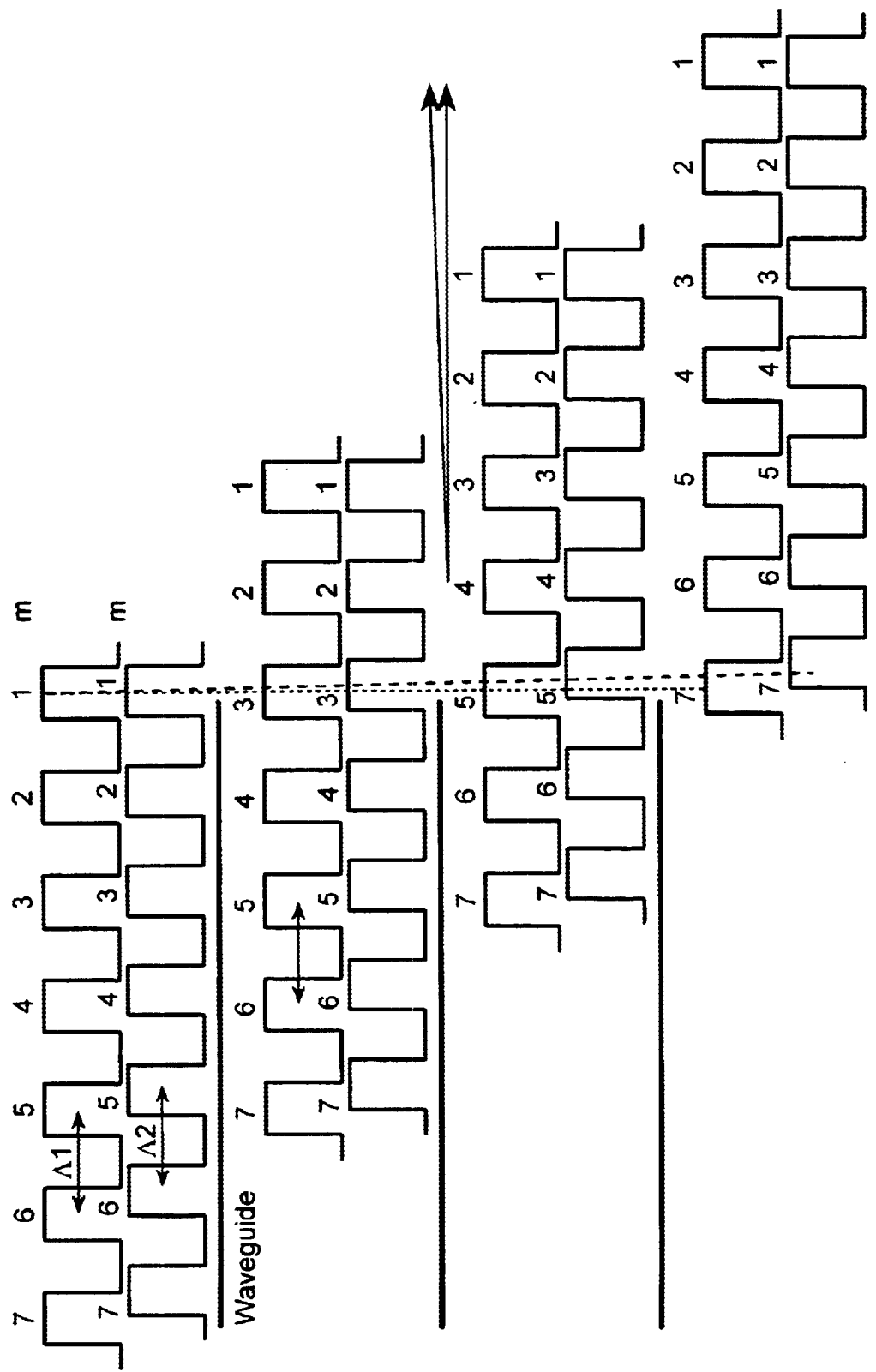
FIG._426

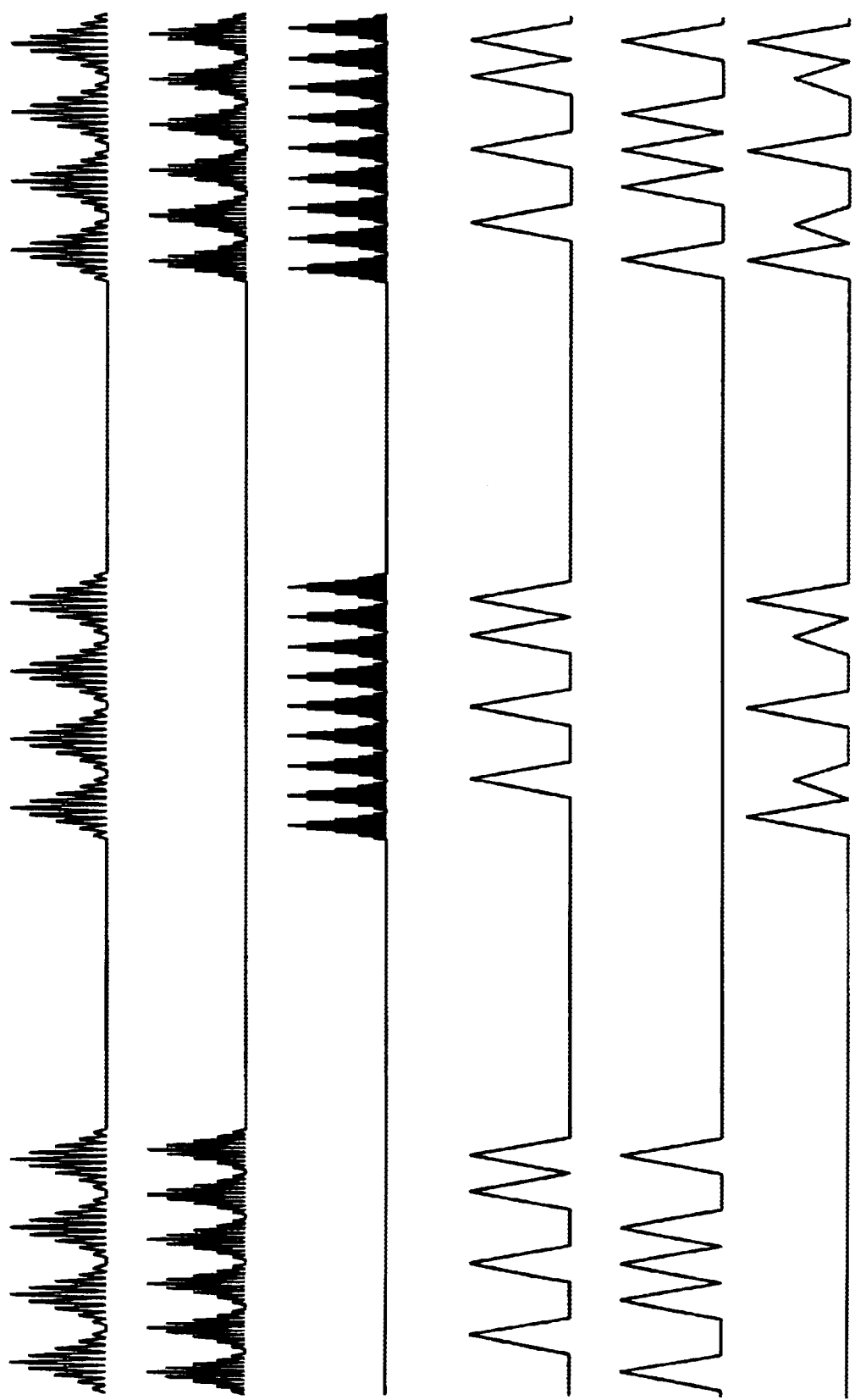
FIG._427

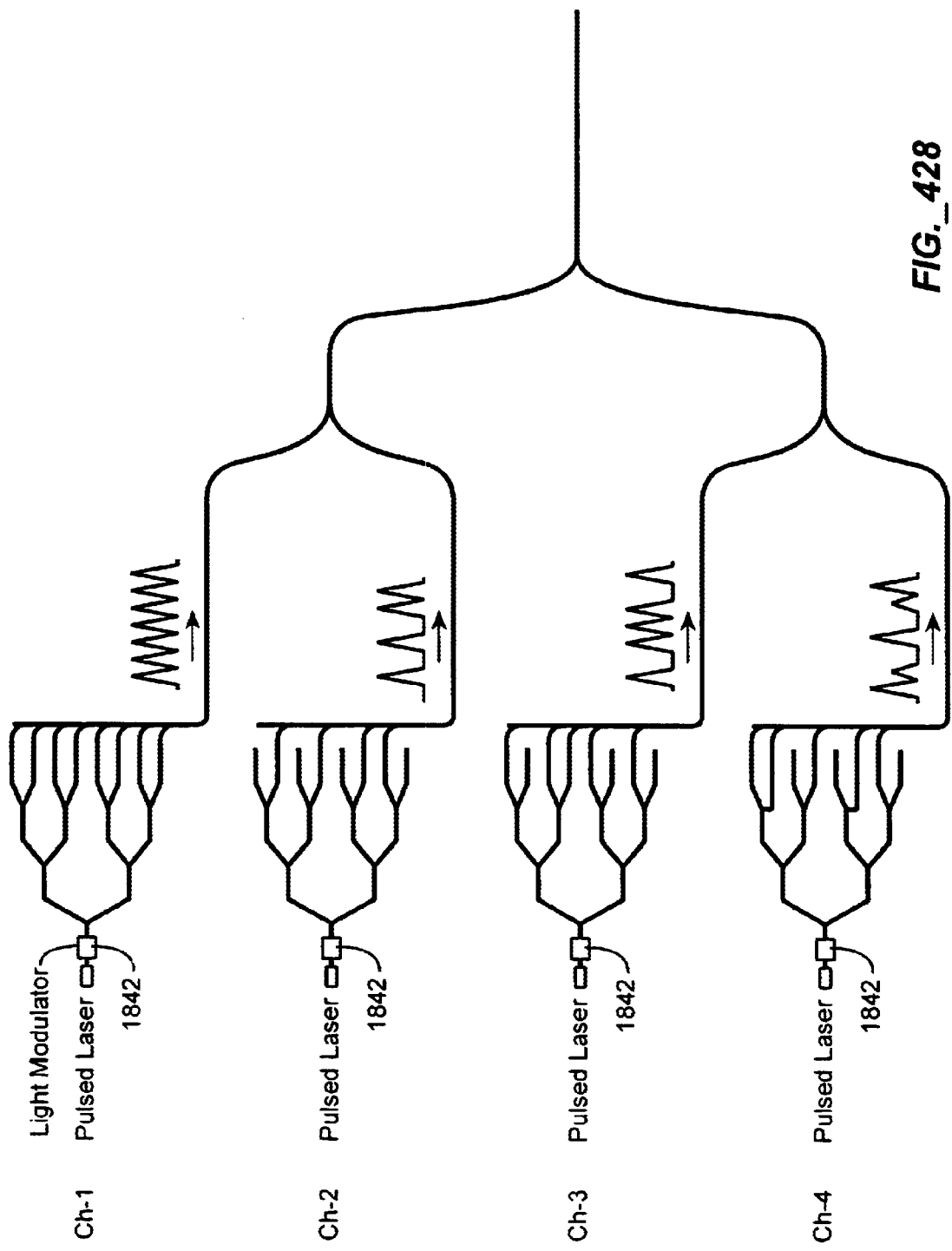
FIG._428

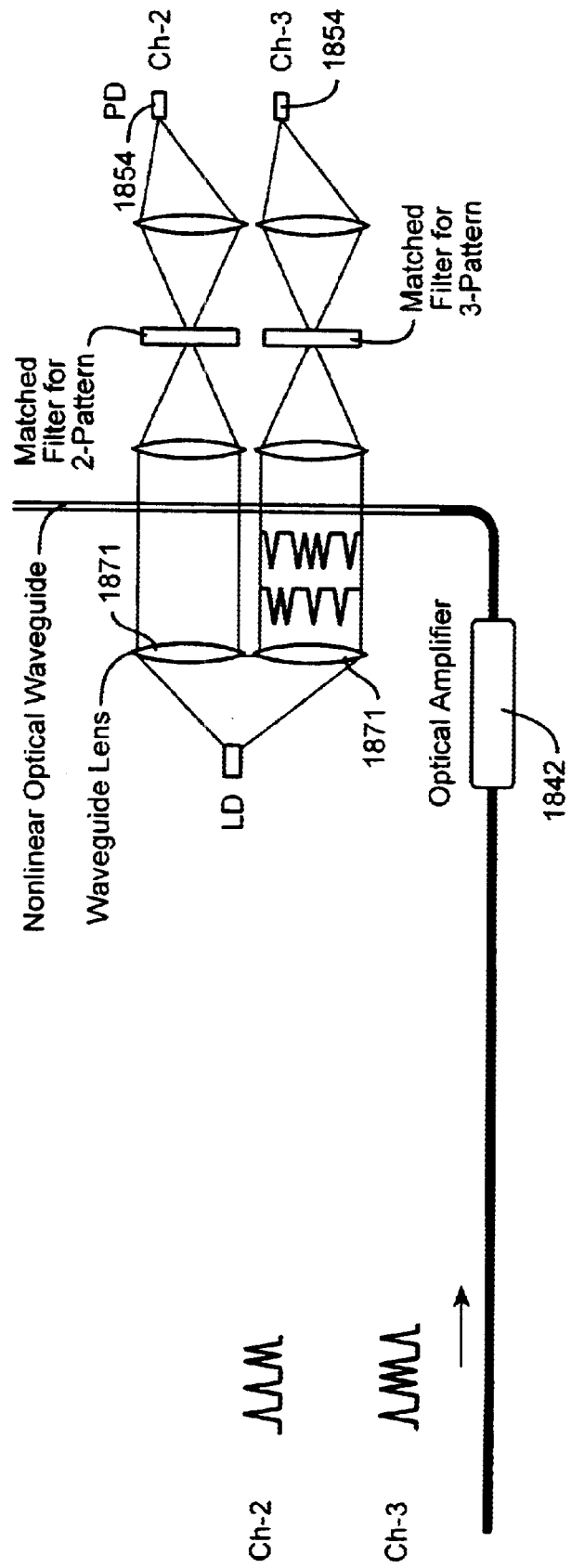
FIG._429

FIG._430 Coat the first clad layer on top of a substrate.

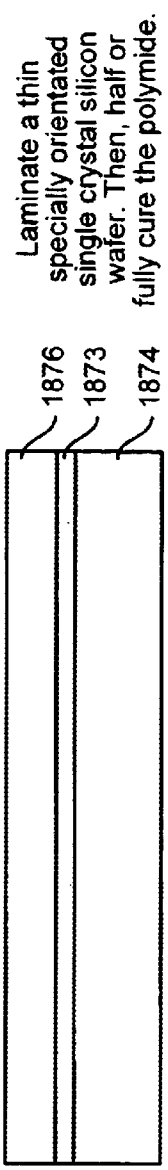

FIG._431 Laminate a thin specially orientated single crystal silicon wafer. Then, half or fully cure the polymide.

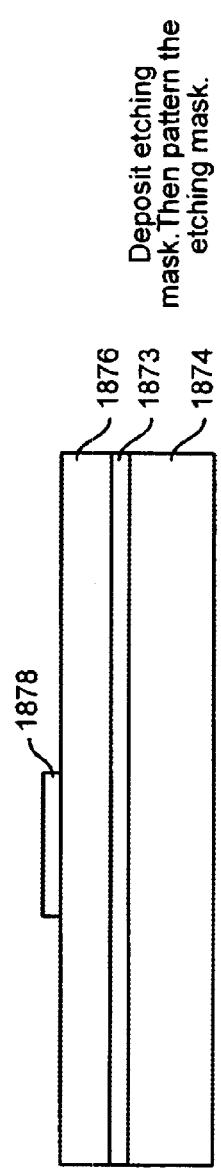

FIG._432 Deposit etching mask. Then pattern the etching mask.

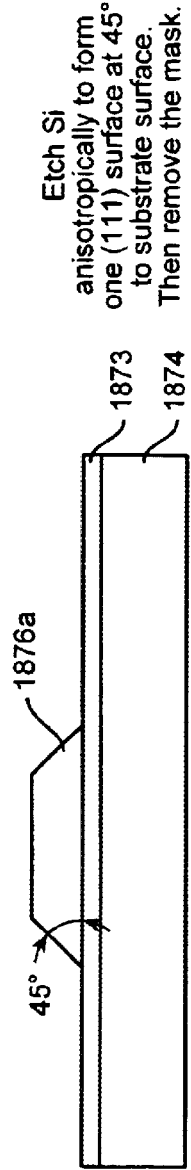

FIG._433 Etch Si anisotropically to form one (111) surface at 45° to substrate surface. Then remove the mask.

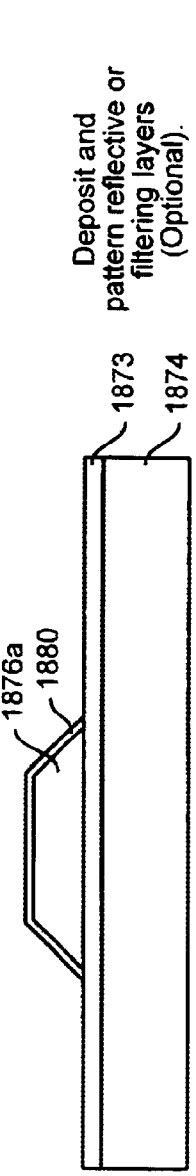

FIG._434 Deposit and pattern reflective or filtering layers (Optional).

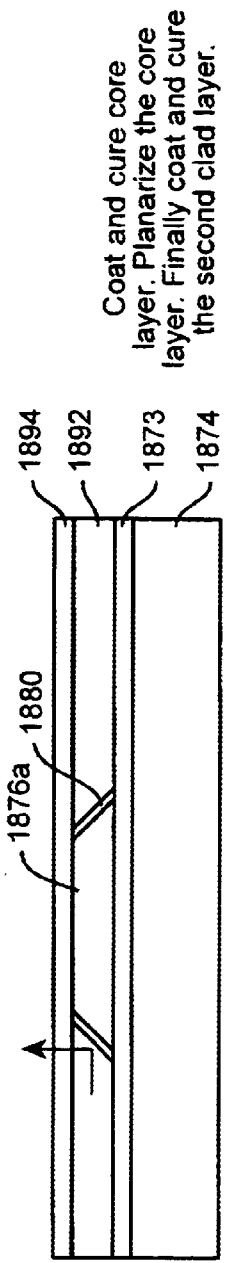
FIG._435
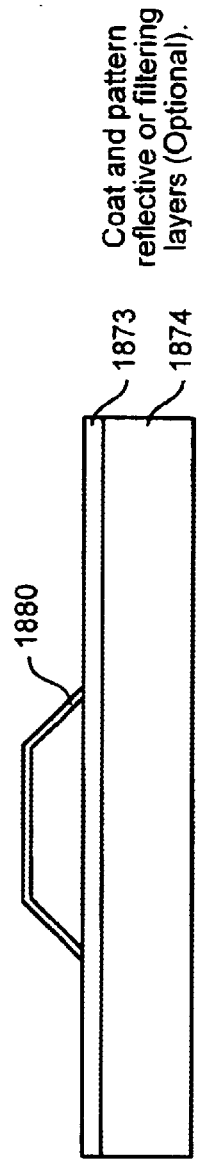
FIG._436
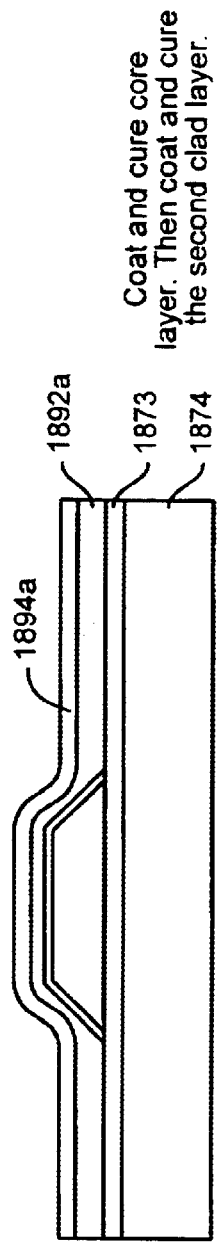
FIG._437
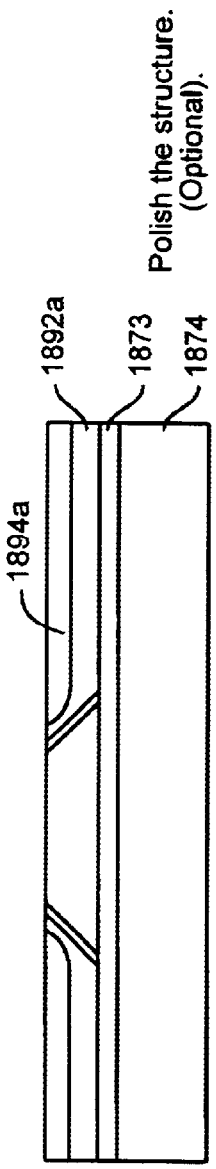
FIG._438

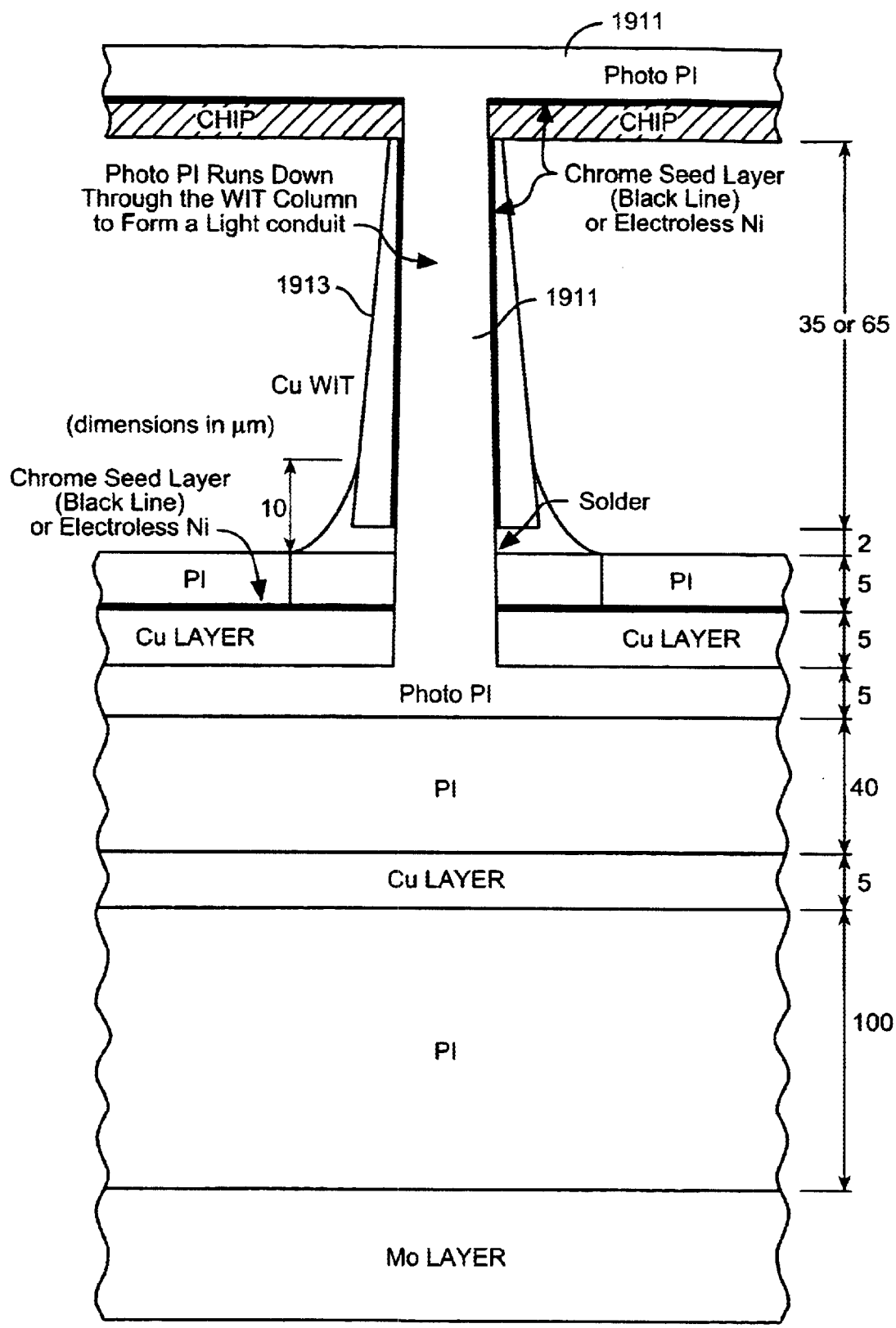
FIG._439

OPTICAL COUPLING STRUCTURES AND THE FABRICATION PROCESSES

CROSS-REFERENCE TO RELATED APPLICATIONS

This application is a continuation-in-part application of copending application having Ser. No. 09/574,422, filed May 19, 2000, and entitled "Three-Dimensional-Opto-Electronic Modules with Electrical and Optical Interconnections and Methods for Making."

Application Ser. No. 09/574,422 is a continuation-in-part of U.S. patent application Ser. No. 09/295,628 filed Apr. 20, 1999, entitled "Opto-Electronic Substrates With Electrical And Optical Interconnections And Methods For Making" and commonly assigned, and which claimed the benefit of U.S. Provisional Application No. 60/103,726 filed Oct. 9, 1998.

Application Ser. No. 09/574,422 is also a continuation-in-part of U.S. patent application Ser. No. 09/295,813 filed Apr. 20, 1999, entitled "Systems Based On Opto-Electronic Substrates With Electrical And Optical Interconnections And Methods For Making," and commonly assigned, and which claimed the benefit of U.S. Provisional Application No. 60/103,726 filed Oct. 9, 1998.

Application Ser. No. 09/574,422 is also a continuation-in-part of U.S. patent application Ser. No. 09/295,431, filed Apr. 20, 1999, entitled "Multi-Layer Opto-Electronic Substrates With Electrical And Optical Interconnections And Methods For Making," and commonly assigned, and which claimed the benefit of U.S. Provisional Application No. 60/103,726 filed Oct. 9, 1998.

Benefit of all earlier filing dates is claimed with respect to common subject matter.

FIELD OF THE INVENTION

The present invention relates to opto-electronic substrates that may be used to connection digital and/or analog electronic systems, and methods for making such systems. More specifically, the present invention relates to opto-electronic substrates that have both electrical and optical interconnections, and methods for making such substrates. The present invention may be applied to multichip modules (MCMs) and the like.

The present invention also relates to coupling structures for coupling an optical device to an optical circuit to form an optical or electro-optical assembly. More specifically, the present invention provides self-aligning surface mount type optical connectors with high dimensional stability, especially for optical substrate applications. The present invention further provides a fabrication process for making an optical assembly.

BACKGROUND OF THE INVENTION

With the increase in clock rates and I/O counts of processing systems implemented on interconnection substrates, the problems of interconnection bottlenecks, noise, signal attenuation, heat generation, and maintaining synchronizable connection lengths in the electrical connections of such systems are appearing. An optical interconnect has the advantage of low RC delay, low signal attenuation, predictable delay, low power, low noise and high tolerance to opens and shorts. However, there is a large barrier which prevent optical interconnections from being used in high-speed digital/analog systems. Thus far, bulky driver chips and amplifier chips have been required to provide the conversions between the optical signals in the optical interconnects and the electrical signals which are generated and used by the electronic chips. Each electrical signal that is to be convey optically over a long distance requires a light emitting device, a driver chip to generate the electrical power for switching the light-emitting device at one end of the optical connection. At the receiving end of the optical connection, a photo-detector device and an amplifier is required to convert the optical signal to electrical form. The amplifier is needed because the light power becomes small at the photo-detector device due to considerable loss in conventional optical paths. The driver and amplifier components require space on the circuit substrate, and therefore represent barriers to using large numbers of optical connections in a substrate, like a multichip module. In fact, the area needs of these components, as well as the area needs for the emitter devices and photo-detector devices, would increase the size of the module substrates to be larger than module substrates with pure electrical connections. These excess components and their assembling increase manufacturing costs. Furthermore, the conventional optical connections have longer delay due to EO and OE conversions, which would not provide significant speed benefits over pure electrical modules.

The present application is directed to providing optical connection configurations and methods for manufacturing the optical connections such that the above problems may be overcome. The present invention overcomes the deficiencies of the prior art by providing structures and fabrication methods of self-aligned optical couplings with surface mount configurations and with high dimensional stability. More specifically, embodiments of the present invention provide an optical apparatus and method for making optical apparatuses which include structures for coupling and stabilizing a waveguide.

SUMMARY OF THE INVENTION

One aspect of the present application eliminates the need for the bulky drivers and amplifiers, which significantly reduces area requirements. In the place of a light-emitting source, the combination of an external light-source and an optical switch device (e.g., modulator) is used. The optical switch device is responsive to an output of an IC chip, and does not required a driver chip for operation. In contrast to light emitting source cases, the power of optical signals in implementations using light modulators can be greatly increased by increasing the size and power of the external light source. The external light source can be easily increased in this manner since it does not need to be modulated. For example, it can be implemented as a simple continuous wave (CW) or pulse trains source of optical power. In addition, losses in the optical connection are reduced. Therefore, and power at the photo-detectors is increased, which enables the amplifiers to be eliminated. The losses are reduced by integrally forming polymeric waveguides with the optical switches and the photo-detectors, which increases optical coupling efficiency. Additionally, the construction methods of the present invention enable short optical connections to be made. Optical power to the photo-detector device is increased by using the external optical power. In addition, optical waveguide integration methods of the present invention enable highly efficient optical connections to be made to VCSEL and laser-diode (LD) emitter devices, which enables these devices to be used as sources of optical power in addition to external sources.

Another aspect of the present application realizes device and/or material integration into an "opto-electronic (OE)

layer", which increases room for chip-mounting, and reduces the total system cost by eliminating the difficulty of optical alignment between OE devices and optical waveguides. OE devices can be embedded into waveguide layers by using wafer processing techniques according to the present invention. Methods according to the present invention enable opto-electronic devices (e.g., modulators, VCSELs, photo-detectors, optical switches, laser-diode (LD), driver chips, amplifier chips, etc.) to be integrated with optical waveguides in ultra thin polymer layers on the order of 1 µm to 250 µm.

Another aspect of the present application provides OE substrates by stacking the above-described OE layers on top of one another and by joining them together, such as by lamination or by a build-up fabrication process. The OE layers can then be overlaid upon the surface of a conventional electrical substrate without requiring extra room for the photo-detectors, optical-switches, light-emitting components, driver chips, amplifier chips, etc. In fact, multiple OE layers can be stacked upon one another to provide all the required photo-detectors optical-switches, light-emitting devices, driver chips, amplifier chips, etc. The present application provides several construction methods for forming these OE layers, and also provides several substrate configurations.

Another aspect of the present application is a method to stack two or more OE films, permitting an increase in the functionality of the stacked structure compared to a single OE film. Each OE film may comprise a single-layer structure or be build-up-of multiple-layer structures, including electrical layers by a Z-connection method. The OE layers and electrical layers on each OE film may be optimized separately. Preferred embodiments of stacked OE films include flexible interconnections, OE Interposers, film OE-MCM, both-side packaging, back-side connection, and a Film Optical Link Module (FOLM). Additionally, stacked films permit the use of a greater variety of fabrication processes compared to a single film. In particular, a stacked film enables both-side processing by permitting processed layers to be inverted upside-down.

On embodiment of the invention provides a method of constructing an electronic circuit assembly comprising the steps of:

a) forming at least one electrode on a substrate;

b) forming a layer of undercladding material upon the substrate and over the electrode;

c) forming a wave guide core layer on the layer of cladding material;

d) patterning the wave guide layer to produce at least one optical wave guide and exposed undercladding material;

e) forming a layer of overcladding material upon the exposed undercladding material and over the optical wave guide;

f) forming at least one via aperture through the overcladding material and the undercladding material; and g) disposing a conductive material in the via aperture to produce an electronic circuit assembly.

In the immediate foregoing method, the disposing step (g) additionally comprises disposing a partial layer of the conductive material over the overcladding material. Preferably, a patterned resist is preferably formed on the overcladding material prior to the disposing step (g). The via aperture may terminate in the electrode. The forming step (f) additionally comprises removing a portion of the optical wave guide The forming step (f) further additionally comprises forming the via aperture to have opposed via walls such that a portion of the optical wave guide is generally centrically disposed in the via aperture between the via walls. Disposing step (g) may additionally comprise disposing conductive material on the opposed via walls and against the portion of the optical wave guide.

Another embodiment of the invention provides a method of constructing an electronic circuit assembly comprising the steps of:

a) forming at least one electrode on a substrate;

b) disposing an electro-optic device on the substrate;

c) forming a layer of undercladding material upon the substrate and over the electrode and the electro-optic device;

d) disposing a second electrode on the layer of undercladding material;

e) disposing an intermediate layer of cladding material over exposed portions of the layer of undercladding material and over the second electrode;

f) forming a wave guide core layer on the layer of cladding material;

g) patterning the wave guide layer to produce at least one optical wave guide and exposed undercladding material;

h) forming a layer of overcladding material upon the exposed undercladding material and over the optical wave guide;

i) forming at least one via aperture through the overcladding material and the undercladding material; and j) disposing a conductive material in the via aperture to produce an electronic circuit assembly.

The immediate foregoing method may additionally comprise polishing the layer of the cladding material prior to disposing step (d) until a top of the electrode is aligned with the cladding material; and forming, prior to disposing step (d), an opening in the layer of undercladding material to expose a portion of the electro-optic device; and disposing conductive material in the opening and in contact with the electro-optic device. The disposing step (j) may additionally comprise disposing a partial layer of the conductive material over the overcladding material. A patterned resist may be formed on the overcladding material prior to the disposing step (j). The forming step (i) may additionally comprise removing a portion of the optical wave guide and/or forming a forty-five degree sidewall in the optical wave guide for receiving an optical reflective surface. The forming step (i) may also additionally comprise forming the via aperture to have opposed via walls such that a portion of the optical wave guide is generally centrically disposed in the via aperture between the via walls. Disposing step (j) may additionally comprise disposing conductive material on the opposed via walls and against the portion of the optical wave guide.

Embodiments of the present invention also provide a method of constructing an electronic circuit assembly comprising the steps of:

a) forming a layer of undercladding material upon a first substrate;

b) forming a wave guide core layer on the layer of cladding material;

c) patterning the wave guide layer to produce at least one optical wave guide and exposed undercladding material;

d) forming a layer of overcladding material upon the exposed undercladding material;

e) forming at least one via aperture through the overcladding material and the undercladding material;

f) disposing a conductive material in the via aperture leaving a first portion of the conductive material exposed; and g) coupling the first portion of the conductive material to a second substrate to produce an electronic circuit.

The immediate foregoing method additionally comprises removing the first substrate to expose a second portion of the conductive material, and disposing at least one electrode on the exposed second portion of the conductive material, and coupling the disposed electrode to a second electronic circuit assembly. The second substrate may be removed to expose the first portion of the conductive material.

Further embodiments of the present invention provide a method of constructing an electronic circuit assembly comprising the steps of:

a) forming a layer of undercladding material upon a first substrate;

b) forming a wave guide core layer on the layer of cladding material;

c) patterning the wave guide layer to produce at least one optical wave guide and exposed undercladding material;

d) forming a layer of overcladding material upon the exposed undercladding material and over the optical wave guide;

e) disposing an electrode on the layer of overcladding material;

f) disposing an electro-optic device on the layer of overcladding material;

g) depositing an intermediate layer of cladding material over exposed overcladding material and over the electrode and the electro-optic device;

h) removing a portion of the intermediate layer of cladding material and a portion of a top of the electrode until a plane along the top of the electro-optic device registers with a residual electrode surface and a residual cladding surface respectively remaining after removal of the portion of the top of the electrode and the portion of the intermediate layer of cladding material;

i) disposing a second electrode on the residual electrode surface;

j) coupling the second electrode to a second substrate;

k) removing the first substrate to expose the undercladding material;

l) forming at least one via aperture through the overcladding material and the undercladding material; and m) disposing a conductive material in the via aperture to produce an electronic circuit assembly.

Another aspect of the present application is to provide three-dimensional opto-electrical modules, and methods for making, which provide for Z-direction waveguides formed perpendicular to the plane of a stack of OE, waveguide, and chip layers, and which interconnections between the Z-direction waveguides and waveguides in the stack of layers.

The present invention provides an optical apparatus comprising an optical substrate having a waveguide embedded therein. The waveguide has a first end and second end. The optical apparatus also comprises an optical device adapted to receive light transmitted from the first end of the waveguide; and a coupling structure for coupling the optical device to the substrate. The coupling structure comprises a thin metallic layer (e.g. a thickness ranging from about 1000 Angstroms to about 2 microns) having an aperture, and at least a portion of the optical device is disposed in the aperture. The coupling structure may further comprise a thin polymeric layer having an aperture wherein a portion of the optical device is disposed. The coupling structure may also further comprise plural polymeric layers and plural metallic layers having co-extensive apertures with the portion of the optical device being disposed in the co-extensive apertures. Thus, the coupling structure may be in the form of a laminate having one or more thin metal and/or polymeric layers, and can be disposed on an optical substrate (e.g., an optical circuit board with waveguides embedded therein). The laminate may have an aperture disposed therein to receive an optical device such as a photodiode, waveguide, etc. The coupling structure provides high dimensional stability to the formed optical apparatus.

The present invention also provides a method for making an optical apparatus comprising forming an optical substrate including an embedded waveguide having a first end and a second end; depositing a metal layer over the first end of the waveguide; and depositing a polymeric layer over the metal layer. The method for making an optical apparatus further comprises forming an aperture in the metal layer and in the polymer layer by removing a portion of the metal layer and a portion of the polymeric layer disposed over the first end of the waveguide; and inserting at least a portion of an optical device within the aperture so that the optical device is positioned to receive light from the first end of the waveguide. Thus, the coupling structure can be formed by depositing one or more polymeric and/or metallic layers over the ends of waveguides embedded in the optical substrate. Portions of the polymeric and/or metallic layers can then be removed (e.g., by etching, laser ablation, etc.) so that the light from the ends of the waveguides can pass through the space formed by the removed polymeric material and metallic material, and so that light can be received by an optical device disposed within the space.

Another embodiment of the present invention provides a method for making an optical apparatus comprising forming an optical coupling structure comprising at lease one thin metal layer and a connecting portion; and joining the coupling structure to a connecting portion on an optical substrate. The connecting portion on the optical substrate and the connecting portion on the optical coupling structure are cooperatively arranged to fit together. Therefore, another manner of forming the optical apparatus includes a mechanical attachment step, such as a coupling structure having a notch or a groove which may be formed by thin film methods. An optical substrate includes a plurality of waveguides embedded therein, and a notch or a groove can be formed separately from the coupling structure. Subsequently, the coupling structure and the optical substrate can be joined together via the grooves and notches.

These features provide the advantageous effect of enabling large-scale optical interconnections to be added to electrical substrates without increasing area requires of the substrate. These features also enable the optical coupling efficiencies of optical interconnections to be increased. These features are also applicable to optical-parallel-link modules. In the present application, examples of multichip modules are principally shown. However, the same features and aspects of the present invention are applicable to electrical backplanes, printed-circuit boards (PCBs), chip size packages (CSPs), and other substrates.

These provisions, together with the various ancillary provisions and features which will become apparent to those skilled in the art as the following description proceeds, are attained by this novel optical assembly and method, a preferred embodiment thereof shown with reference to the accompanying drawings, by way of example only, wherein:

DESCRIPTION OF DRAWINGS

FIG. 1 is a first embodiment of an optical-electrical multichip-module substrate according to the present invention.

FIGS. 2 and 3 are a first embodiment of an optical switch according to the present invention.

FIGS. 4-1 and 5-1 are a first embodiment of a photo-detector device according to the present invention.

FIGS. 4-2 and 5-2 are a second embodiment of a photo-detector device according to the present invention.

FIGS. 4-3 and 5-3 are a third embodiment of a photo-detector device according to the present invention.

FIG. 6 is a second embodiment of an optical-electrical multichip-module substrate according to the present invention.

FIGS. 7 and 8 are a first embodiment of a lateral emitter device according to the present invention.

FIGS. 9 and 10 a first embodiment of a vertical emitter device according to the present invention.

FIGS. 11–20 illustrate construction methods according to the present invention.

FIGS. 21–26 are views of a first multichip module system according to the present invention.

FIGS. 27–30 illustrate construction methods for making selected components used in the system of FIGS. 21–26 and other systems according to the present invention.

FIGS. 31, 32, and 32-1 are views of a second multichip module system according to the present invention.

FIGS. 33–36, and 37-1 through 37-4 illustrate further embodiments of the optical-electrical multichip-module substrates according to the present invention.

FIGS. 38–68 illustrate further construction methods for the optical-electrical multichip-module substrates according to the present invention.

FIGS. 69–70 illustrate a free-space MCM system according to the present invention.

FIGS. 71–73 illustrate three-dimensional MCM systems according to the present invention.

FIGS. 74–81 show schematic views of an exemplary thin film with integral devices and waveguides as being fabricated according to another process according to the present inventions.

FIGS. 82–89 show schematic views of another exemplary thin film with integral devices and waveguides as being fabricated according to another process according to the present inventions.

FIGS. 90–104 show perspective views of an exemplary waveguide layer being processed according to exemplary methods for forming vertical and horizontal optical couplers according to the present invention.

FIGS. 105 and 106 are top plan and cross-sectional views, respectively, of an exemplary corner turning mirror according to the present inventions.

FIGS. 107 and 108 are top plan and cross-sectional views, respectively, of another embodiment of a waveguide coupler with a waveguide mirror according to the present inventions.

FIGS. 109–111 show schematic side views of additional three-dimensional OE stack configurations according to the present inventions.

FIG. 112 shows schematic side views of additional exemplary stacking configurations of OE films using Z-connections according to the present inventions.

FIGS. 113–116 show schematic side views of various exemplary OE films according to the present inventions.

FIGS. 117–120 show schematic side views of exemplary film optical link modules (FOLM) embodiments according to the present invention.

FIG. 121 shows a schematic top view of an OE film of an FOLM structure according to the present inventions.

FIGS. 122 and 123 are schematic top and side views, respectively of an further embodiment of a FOLM OE film according to the present inventions.

FIG. 125 is a schematic side view of another FOLM embodiment according to the present invention.

FIG. 126 shows a schematic side view of a exemplary Film Optical Link Module (FOLM) embodiment according to the present invention.

FIG. 127 shows a top plan view of the embodiment shown in FIG. 126.

FIG. 128 shows a schematic side view of a portion of the FOLM embodiment of FIG. 126 according to the present invention.

FIG. 129 shows a top plan view of the polymer layer in the embodiment of FIG. 128 which has an opto-electronic device embedded therein according to the present invention.

FIG. 130 shows an opto-electronic interposer (OE-IP) embodiment suitable for chips, chip size packages (CSPs), and multichip modules (MCMs) according to the present inventions.

FIG. 131 shows another OE-IP embodiment suitable for multichip modules (MCMs) according to the present inventions.

FIGS. 132–134 show additional OE-IP embodiments suitable for multichip modules (MCMs) according to the present inventions.

FIG. 135 shows an another OE-IP embodiment with optical interconnections to chips/MCMs mounted to both sides of the OE-IPs according to the present inventions.

FIGS. 136–137 show OE-IP embodiments with external and flexible interconnections according to the present inventions.

FIG. 138 shows an OE-IP embodiment where the optical interconnections of the interposer are on the opposite side of the chip/CSP/MCM according to the present inventions.

FIG. 139 shown an embodiment having an OE-IP film and MCM according to the present inventions.

FIG. 140 shown an OE-film-MCM embodiment according to the present inventions.

FIGS. 141–142 show smart pixel embodiments according to the present inventions.

FIG. 143 shows an opto-electric (OE) printed circuit board/mother board embodiment according to the present inventions.

FIGS. 144–146 show respective OE film embodiments useful for both intra-MCM and inter-MCM optical connections according to the present invention.

FIGS. 147–153 show schematic side views of an exemplary structure being fabricated by an exemplary process to fabricate an OE film with embedded devices according to the present inventions.

FIGS. 154–158 illustrate an additional embodiment of the three-dimensional electro-optical systems according to the present invention.

FIGS. 159 and 160 illustrate two methods for constructing holding blocks of the three-dimensional electro-optical systems according to the present invention.

FIGS. 161–169 illustrate additional, but related, embodiments of the three-dimensional electro-optical systems according to the present invention.

FIGS. 170–176 illustrate an additional method of constructing opto-electronic/chip layers and opto-electronic waveguide layers for three-dimensional modules according to the present invention;

FIGS. 177–180 illustrate yet an additional method of constructing opto-electronic/chip layers and opto-electronic waveguide layers for three-dimensional modules according to the present invention;

FIG. 181 is a side elevational view of a substrate supporting electrodes;

FIG. 182 is a side elevational view of the structure of FIG. 181;

FIG. 183 is a side elevational view of the electrode structure of FIG. 181 after a cladding layer has been disposed thereon;

FIG. 184 is an end elevational view of the electrode structure of FIG. 183;

FIG. 185 is a side elevational view of the electrode structure of FIG. 183 after a waveguide layer has been disposed thereon;

FIG. 186 is an end elevational view of the electrode structure of FIG. 185;

FIG. 187 is the electrode structure of FIG. 185 including waveguide layer portions represented as dotted lines which are to be etched or otherwise removed and with the solid waveguide portions representing waveguides which are to remain;

FIG. 188 is an end elevational view of the electrode structure of FIG. 187;

FIG. 189 is the electrode structure of FIG. 187 after the waveguide layer portions which were represented by dotted lines were removed;

FIG. 190 is an end elevational view of the electrode structure of FIG. 189;

FIG. 191 is a side elevational view of the electrode structure of FIG. 189 after a cladding material layer has been disposed over the waveguide layer;

FIG. 192 is an end elevational view of the electrode structure of FIG. 191;

FIG. 193 is the side elevational view of the electrode structure of FIG. 191 after a resist mask has been disposed on the structure and after a plurality of vias or apertures were produced in the structure to expose the lower waveguide layer;

FIG. 194 is an end sectional view of the electrode structure of FIG. 193;

FIG. 195 is a side elevational view of the electrode structure of FIG. 193 after conductive material was deposited in the vias;

FIG. 196 is an end vertical sectional view of the electrode structure of FIG. 195;

FIG. 197 is a side elevational view of the electrode structure of FIG. 206 after the mask was removed;

FIG. 198 is an end sectional view of the electrode structure of FIG. 197;

FIG. 199 is a side elevational view of the electrode assembly of FIG. 197 after the lower substrate has been removed;

FIG. 200 is an end sectional view through the electrode assembly of FIG. 199;

FIG. 201 is a side elevational view of the electrode assembly of FIG. 199 after the upper substrate was coupled by Z-connection to the electrode assembly of FIG. 199;

FIG. 202 is an end sectional view through the electrode structure of FIG. 201;

FIGS. 203–232 represent essentially identical process steps of FIGS. 181–202 except an optical light emitter (e.g. a VCSEL) was disposed on the substrate and another layer of electrodes was disposed on the initial layer of electrodes;

FIGS. 233–258 represent another embodiment of the process steps represented by FIGS. 181–202 except the upper substrate is coupled to the electrode assembly before the lower substrate is removed;

FIGS. 259–282 represent another embodiment of the process steps represented by FIGS. 181–202;

FIGS. 283–316 represent another embodiment of process steps represented by FIGS. 181–202;

FIG. 318 is a perspective view of an optical substrate supporting or having embedded therein waveguides with each waveguide including a mirror, grading, hologram or the like;

FIG. 319 is the perspective view of the optical assembly of FIG. 318 after disposing a polymer layer and a metal layer;

FIG. 320 is a perspective view of the optical assembly of FIG. 319 after part of the polymer layer has been removed, such as by laser etching or the like;

FIG. 321 is a perspective view of the optical assembly of FIG. 320 after a portion of the metal layer has been removed by wet etching or the like;

FIG. 322 is a perspective view of the optical assembly of FIG. 319 after a lower polymer layer, a metal layer, an intermediate polymer layer, and an upper polymer layer have been disposed in the order stated on the optical assembly;

FIG. 323 is a perspective view of the optical assembly of FIG. 322 after a portion of the upper polymer layer has been removed;

FIG. 324 is a perspective view of the optical assembly of FIG. 323 after a portion of the upper metal layer has been removed;

FIG. 325 is a perspective view of the optical assembly of FIG. 324 after a portion of the intermediate polymer layer has been removed;

FIG. 326 is a perspective view of the optical assembly of FIG. 325 after a portion of the lower metal layer has been removed;

FIG. 327 is a perspective view of the optical assembly of FIG. 326 after a portion of the lower polymer layer has been removed;

FIG. 328 is a perspective view of the optical assembly of FIG. 327 after a portion of the lower metal layer has been removed;

FIG. 329 is the side sectional view of an optical assembly including a substrate having a waveguide embedded therein and supporting a metal layer and a polymeric layer;

FIG. 330 is the side view of the optical assembly of FIG. 329 after a portion of the polymeric layer has been removed down to the metal layer;

FIG. 331 is a side elevational view of the optical assembly of FIG. 329 after a portion of the metal layer has been removed down to the optical substrate;

FIG. 332 is a side elevational view of an optical assembly including a substrate having a waveguide embedded therein and supporting a lower metal layer, a polymeric layer on top of the lower metal layer, an upper metal layer on top of the polymeric layer, and a photoresist on top of the upper metal layer;

FIG. 333 is a side elevational view of the optical assembly of FIG. 332 after the photoresist was patterned and the upper metal layer was etched down to the polymeric layer;

FIG. 334 is a side elevational view of the optical assembly of FIG. 333 after the polymeric layer was etched down to the lower metal layer;

FIG. 335 is a side elevational view of the optical assembly of FIG. 334 after the lower metal layer was etched down to the optical substrate;

FIG. 336 is a side elevational view of an optical assembly comprising an optical substrate including a waveguide layer embedded therein, a lower metal layer disposed on the waveguide layer, a lower polymeric layer disposed on the lower metal layer, an intermediate metal layer, an upper metal layer disposed on the intermediate polymeric layer, and an upper polymeric layer disposed on the upper metal layer;

FIG. 337 is a side elevational view of the optical assembly of FIG. 336 after a portion of the upper polymeric layer was etched down to the upper metal layer;

FIG. 338 is a side elevational view of the optical assembly of FIG. 337 after a portion of the upper metal layer was etched down to the intermediate polymeric layer;

FIG. 339 is a side elevational view of the optical layer of FIG. 338 after the intermediate polymeric layer was etched down to the intermediate metal layer;

FIG. 340 is a side elevational view of the optical assembly of FIG. 339 after the intermediate metal layer was etched down to the lower polymeric layer;

FIG. 341 is a side elevational view of the optical assembly of FIG. 340 after a portion of the lower polymeric layer was etched down to the lower metal layer;

FIG. 342 is a side elevational view of the optical assembly of FIG. 341 after a portion of the lower metal layer was removed down to the optical substrate;

FIG. 343 is the side elevational view of the optical assembly of FIG. 336;

FIG. 344 is a side elevational view of the optical assembly of FIG. 343 after a portion of the upper polymeric layer was etched down to the upper metal layer;

FIG. 345 is a side elevational view of the optical assembly of FIG. 344 after a portion of the upper metal layer was etched down to the intermediate layer;

FIG. 346 is a side elevational view of the optical assembly of FIG. 345 after a portion of the intermediate polymeric layer was etched down to the intermediate metal layer, which also etched another portion of the upper polymeric layer down to the upper metal layer;

FIG. 347 is a side elevational view of the optical assembly of FIG. 346 after a portion of the intermediate layer was etched down to the lower polymeric layer;

FIG. 348 is a side elevational view of the optical assembly of FIG. 347 after a portion of the lower polymeric layer was etched down to the lower metal layer, which also removed additional portions of the upper polymeric layer and additional portions of the intermediate polymeric layer down to the intermediate metal layer;

FIG. 349 is a side elevational view of the optical assembly of FIG. 348 after a portion of the lower metal layer was etched down to the optical substrate;

FIG. 350 is a side elevational view of an optical assembly comprising an optical substrate having embedded therein a waveguide, a lower metal layer disposed on the optical substrate, a lower polymeric layer disposed on the lower metal layer, an intermediate metal layer disposed on the lower polymeric layer, an intermediate polymer layer disposed on the intermediate metal layer, an upper metal layer disposed on the intermediate polymer layer, an upper polymeric layer disposed on the upper metal layer;

FIG. 351 is a side elevational view of the optical assembly of FIG. 350 after a portion of the upper polymeric layer was etched down to the upper metal layer;

FIG. 352 is a another side elevational view of the optical assembly of FIG. 345 where the upper metal layer was etched down to the intermediate polymeric layer;

FIG. 353 is a side elevational view of the optical assembly of FIG. 352 after a portion of the intermediate polymeric layer was etched down to the intermediate metal layer;

FIG. 354 is a side elevational view of the optical assembly of FIG. 353 after a portion of the intermediate metal layer was etched down to the lower polymeric layer;

FIG. 355 is a side elevational view of the optical layer of FIG. 354 after a portion of the lower polymeric layer was etched down to the lower metal layer;

FIG. 356 is a side elevational view of the optical assembly of FIG. 355 after the lower metallic layer was etched down to the optical substrate;

FIG. 357 is a side elevational view of an optical an assembly including an optical substrate having an embedded waveguide layer, a lower polymeric layer supported by the optical substrate, a lower metallic layer supported by the lower polymeric layer, an intermediate polymeric layer supported by the lower metallic layer, an upper metallic layer supported by the intermediate polymeric layer, and an upper polymeric layer supported by the upper metallic layer;

FIG. 358 is a side elevational view of the optical assembly of FIG. 357 after a portion of the upper polymeric layer was etched down to the upper metallic layer;

FIG. 359 is a side elevational view of the optical assembly of FIG. 358 after a portion of the upper metallic layer was etched down to the intermediate polymeric layer;

FIG. 360 is a side elevational view of the optical assembly of FIG. 359 after a portion of the intermediate polymeric layer was etched down to the lower metal layer;

FIG. 361 is a side elevational view of the optical assembly of FIG. 360 after a portion of the lower metal layer was etched down to the lower polymeric layer;

FIG. 362 is a side elevational view of an optical assembly comprising an optical substrate including a waveguide embedded therein, a metallic layer disposed on the optical substrate, and a polymeric layer disposed on the metallic layer;

FIG. 363 is a side elevational view of the optical assembly of FIG. 362 after a portion of the polymeric layer was etched down to the metallic layer;

FIG. 364 is a side elevational view of the optical assembly of FIG. 363 after a portion of the metallic layer has been etched down to the optical layer;

FIG. 365 is a side elevational view illustrating an optical substrate supporting a polymeric layer having on top thereof a pattern metal electrode;

FIG. 366 is a side elevational view of the optical assembly of FIG. 365;

FIG. 367 is a side elevational view of the optical assembly of FIG. 365 after a layer of cladding material has been disposed over the pattern metal electrodes to produce an underclad layer;

FIG. 368 is an end elevational view of the optical assembly of FIG. 367;

FIG. 369 is a side elevational view of the optical assembly of FIG. 367 after a core material has been disposed on the underclad layer;

FIG. 370 is a end sectional view of the optical assembly of FIG. 369;

FIG. 371 is a side elevational view of the optical assembly of FIG. 369 after a portion of the core material has been removed to produce patterned waveguide layers and after a coat of overcladding material has been disposed over the patterned waveguide layers;

Figure 32:
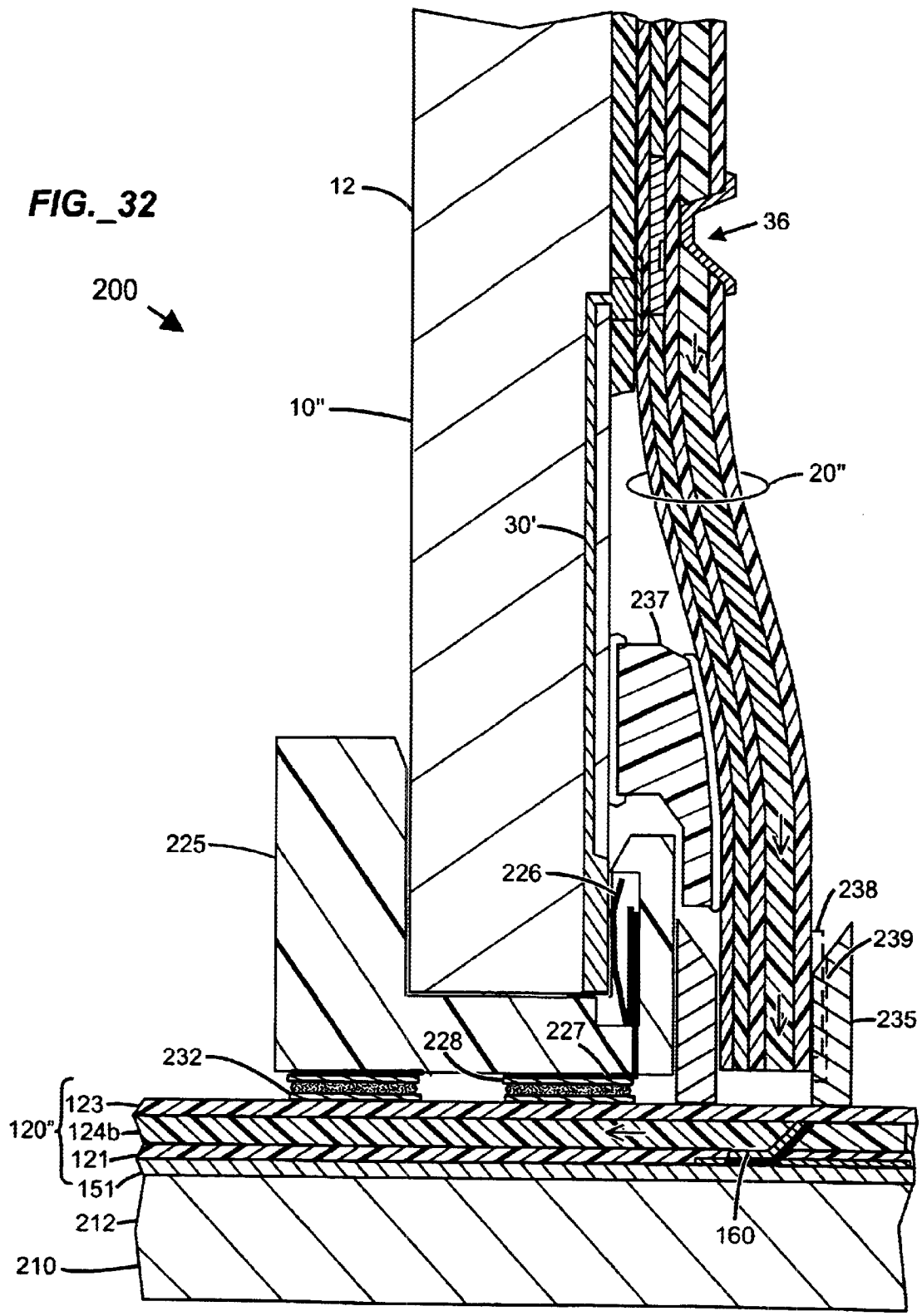
Figure 414:
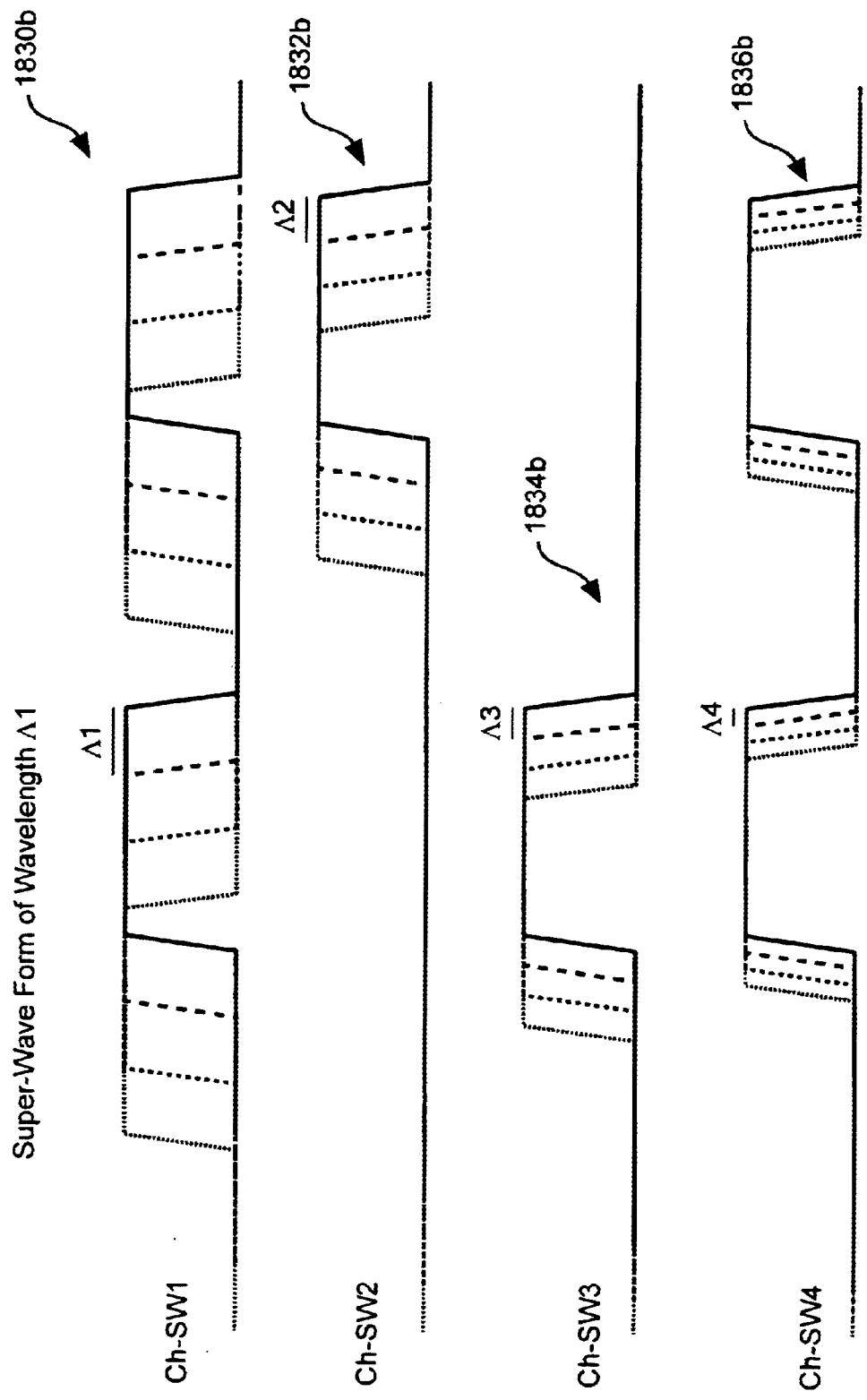
Figure 415:
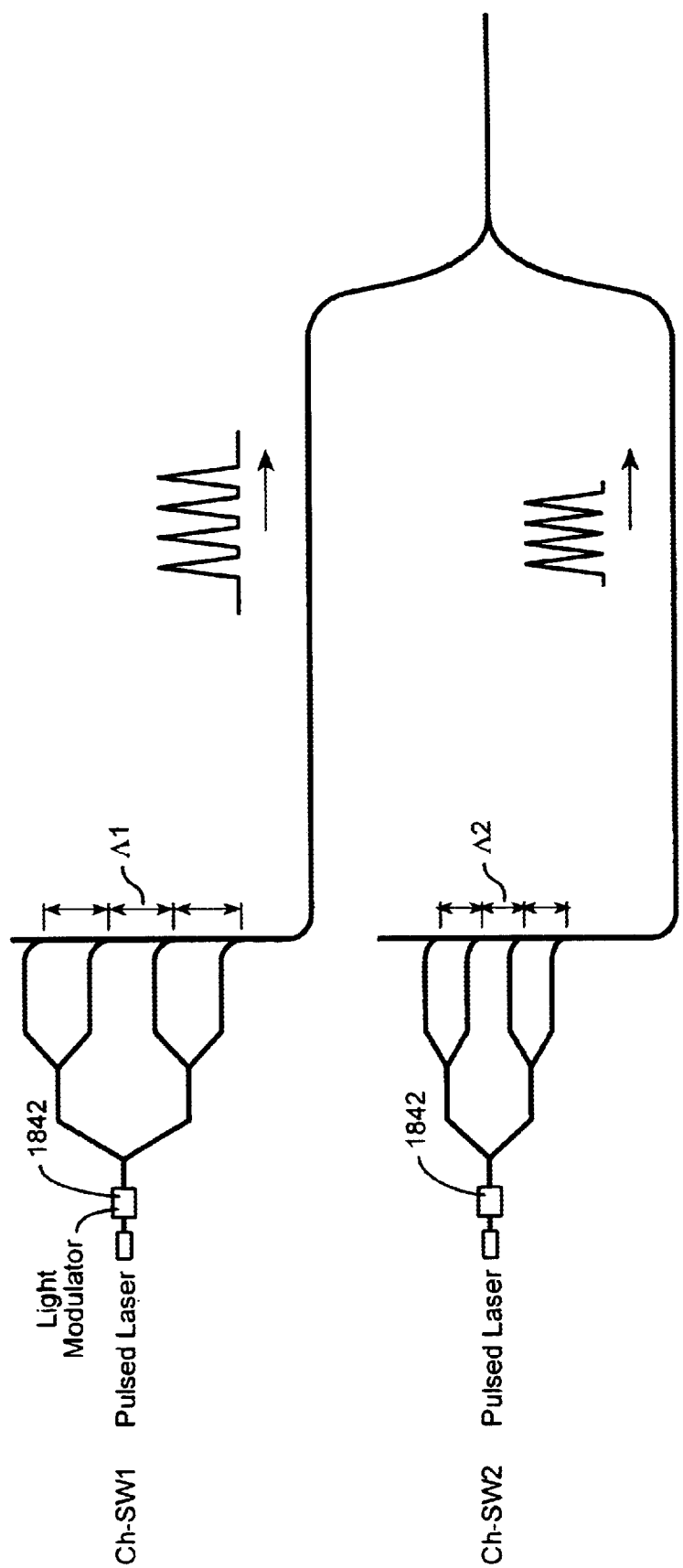
Figure 416:
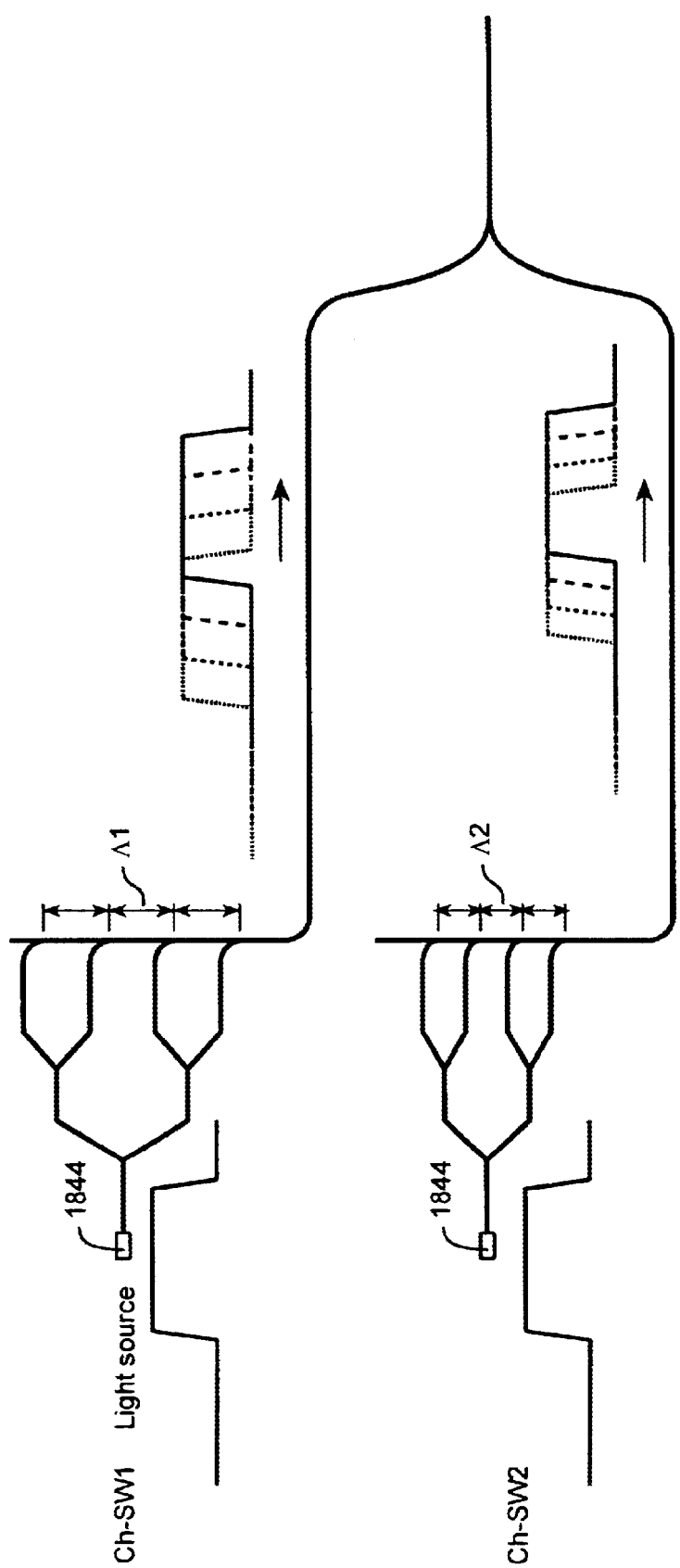
Figure 417:
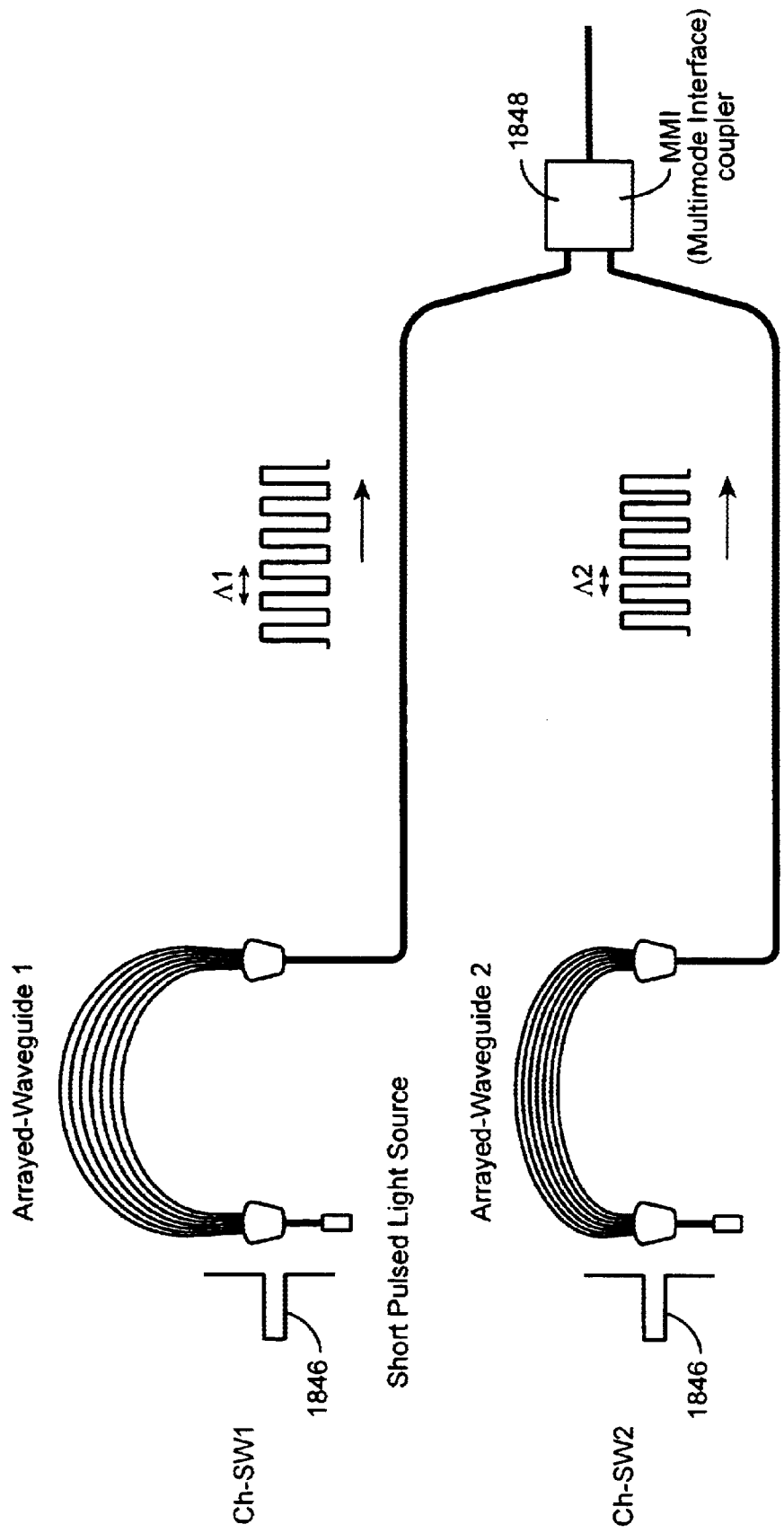
Figure 418:
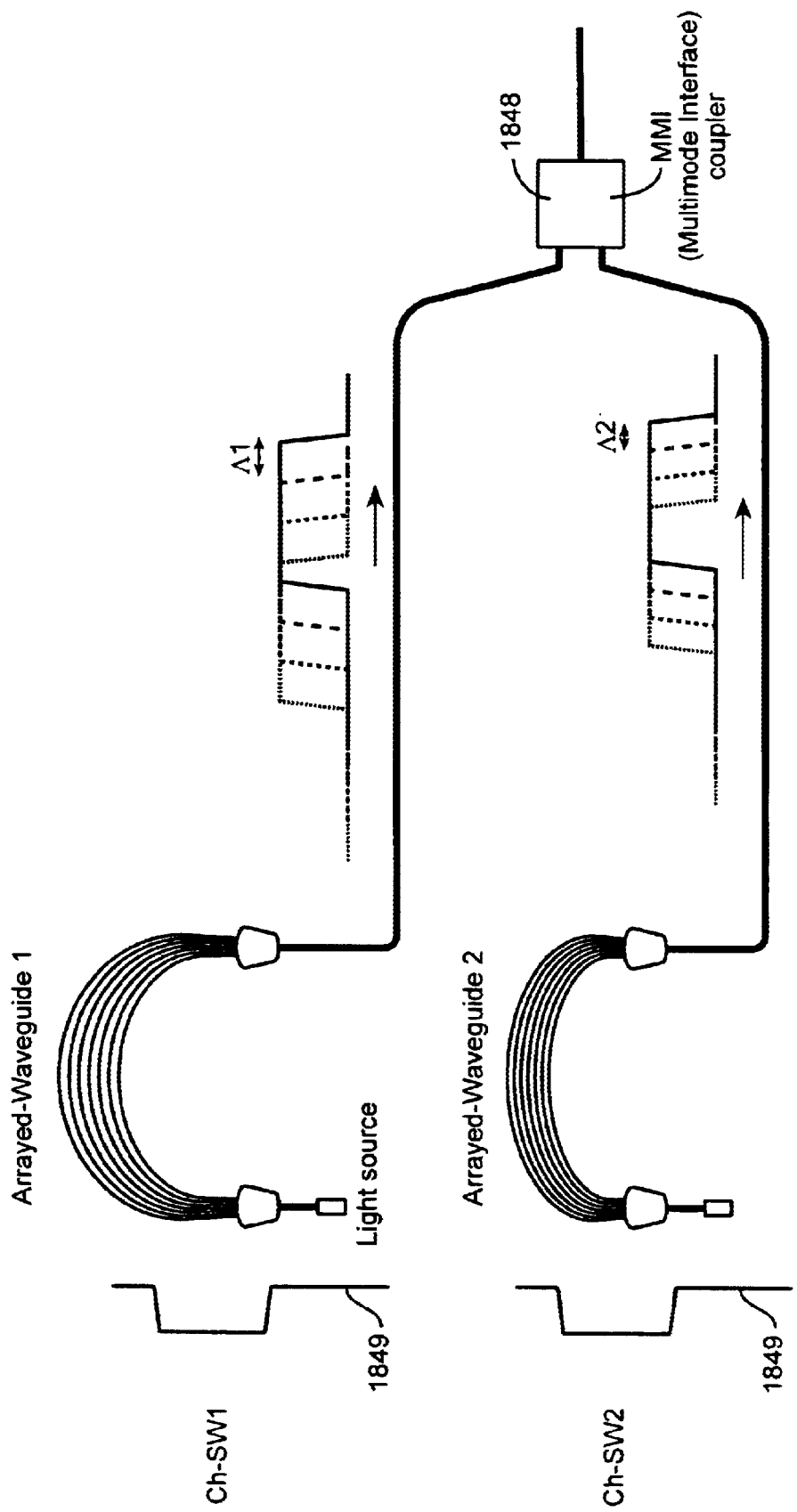

FIG. 372 is an end sectional view through the optical assembly of FIG. 371;

FIG. 373 is a side elevational view of the optical assembly of FIG. 372 after a portion of the overclad layer, and the patterned waveguides, and the underclad layer were etched to expose the patterned electrode layer;

FIG. 374 is a side elevational view of the optical assembly of FIG. 373 after the optical substrate has been removed and after the assembly has been rotated 180°;

FIG. 375 is a side elevational view of an optical assembly having an optical substrate including an embedded waveguide layer, a metal layer disposed on the optical substrate, a polymeric layer disposed on the metal layer, and a patterned upper metal layer disposed on the polymeric layer;

FIG. 376 is a side elevational view of the optical assembly of FIG. 375 after the exposed portion of the polymeric layer has been etched down to the lower metal layer;

FIG. 377 is a side elevational view of the optical assembly of FIG. 376 after the exposed lower metal layer has been etched down to the optical substrate;

FIG. 378 is a side elevational view of the optical assembly of FIG. 365, but additionally including a patterned electrode disposed on the substrate between the substrate and the polymeric layer;

FIG. 379 is an end sectional view through the optical assembly of FIG. 378;

FIG. 380 is a side elevational view of the optical assembly of FIG. 378 after a layer of underclad has been disposed on the patterned electrode and on the exposed polymeric material;

FIG. 381 is an end sectional view through the optical assembly of FIG. 380;

FIG. 382 is a side elevational view of the optical assembly of FIG. 380 after a layer of core material has been disposed on the underclad layer;

FIG. 383 is an end sectional view through the optical assembly of FIG. 382;

FIG. 384 is a side elevational view of the optical assembly of FIG. 382 after residual core material has been removed to produce patterned waveguide layers and after a coat of overclad material has been disposed over the patterned waveguide layers and on the exposed underclad layer;

FIG. 385 is an end sectional view of the optical assembly of FIG. 384;

FIG. 386 is the side elevational view of FIG. 385 after a portion of the overclad layer and the patterned waveguides and a portion of the underclad layer has been etched down to the patterned upper electrode layer;

FIG. 387 is the side elevational view of FIG. 386 after the substrate has been removed and after the optical assembly of FIG. 386 has been rotated 180°;

FIG. 388 is a segmented side elevational view of a plurality of metal and polymeric layers de-coupled from a substrate which includes a plurality of waveguide members;

FIG. 389 is another embodiment of the segmented optical assembly of FIG. 388;

FIG. 390 is yet another embodiment of the optical segmented assembly of FIG. 388;

FIG. 391 is yet another embodiment of the segmented optical segmented assembly of FIG. 388;

FIG. 392 is a side elevational view of a segmented optical assembly having a substrate including a plurality of waveguide members, with the substrate including a pair of openings with a pair of plural metal/polymer layers aligned with each opening in the substrate;

FIG. 393 is a side elevational view of another embodiment of the optical assembly of FIG. 392;

FIG. 394 is a segmented optical assembly comprising a substrate with a pair of notches including a plurality of waveguide members embedded herein, with each notch aligned with an opening in a plural metal/polymer layer assembly;

FIG. 395 is another embodiment of the optical assembly of FIG. 394;

FIG. 396 is a side elevational view of a buildup assembly comprising a lower polymer layer supporting a patterned metal layer with an intermediate polymer layer disposed over the patterned metal layer and exposed portion of the lower polymeric layer, an intermediate patterned metal layer supported by the intermediate polymeric layer, an upper polymeric layer disposed over the intermediate patterned metal layer and over the exposed portion of the intermediate polymeric layer, and a patterned metal layer disposed on the upper polymeric layer;

FIG. 397 is a side elevational view of the plural metal/polymeric assembly of FIG. 396 after portions of the polymeric layer between the respective patterned metal layers have been etched and tapered;

FIG. 398 is a side elevational view of the etched metal/polymeric assembly of FIG. 397 after being rotated 180°;

FIG. 399 is a side elevational view of a bonding layer supporting a metal layer, with the metal layer supporting a polymeric layer;

FIG. 400 is a side elevational view of the assembly of FIG. 399 after a double-sided metal-coated polymer layer has been connected to the bonding sheet of the assembly in FIG. 399;

FIG. 401 is a side elevational view of the assembly of FIG. 400 after a metal coating has been removed from the double-sided metal-coated polymer;

FIG. 402 is a side elevational view of a bonding sheet having connected thereto and on opposed sides thereof a double-side metal-coated polymer;

FIG. 403 is a side elevational view of a metal-coated polymer layer having an adhesive layer connected thereto;

FIG. 404 is an assembly having a plurality of metal-coated polymers interconnected by adhesive layers;

FIG. 405 is a side elevational view of the assembly of FIG. 404 after a metal layer has been removed from the lower metal-coated polymer;

FIG. 406 is a side elevational view of the assembly of FIG. 405 after a pair of metal layers were connected to opposed surfaces of the assembly;

FIG. 407 is a side elevational view of an optical substrate including an embedded waveguide member, and a photoplastic layer disposed on a metal layer supported by the optical substrate;

FIG. 408 is a side elevational view of the optical assembly of FIG. 407 after a portion of the photoplastic layer was removed from the metal layer by etching down to the metal layer;

FIG. 409 is a side elevational view of the optical assembly of FIG. 408 after the exposed portion of the metal layer was removed by etching same down to the optical substrate;

FIG. 410 is a schematic diagram of a whole system image for super-wave multiplexing;

FIG. 411 is a schematic diagram of another embodiment of the whole system image for super-wave multiplexing;

FIG. 412 is a schematic diagram of a super-wave multiplexing wave pattern;

FIG. 413 is a schematic diagram of another embodiment of a super-wave multiplexing wave pattern;

FIG. 414 is a schematic diagram of yet another embodiment of a super-wave multiplexing wave pattern;

FIG. 415 is a schematic diagram of a light pattern for a coding unit for a super-wave multiplexing wave pattern wherein pulsed laser light is subdivided into branches which are then coupled to a main waveguide;

FIG. 416 is a schematic diagram of another embodiment of a light pattern for a coding unit for a super-wave multiplexing wave pattern wherein pulsed laser light is subdivided into branches which are then coupled to a main waveguide;

FIG. 417 is a schematic diagram of electrical (E) to optical (O) conversion of input electrical signals which are performed by a short-pulsed light source;

FIG. 418 is a schematic diagram of electrical (E) to optical (O) conversion of input electrical signals which are performed by a direct modulation of a light source;

FIG. 419 is a schematic diagram of electrical (E) to optical (O) conversion of input electrical signals which are performed by a light modulator;

FIG. 420 is a schematic diagram of a light pattern for a decoding unit for a super-wave multiplexing wave pattern wherein optically amplified light is subdivided into branches which are then combined and coupled to a photodetector;

FIG. 421 is a schematic diagram of a light pattern for a decoding unit for a super-wave multiplexing wave pattern wherein optically amplified light is subdivided into branches which are then coupled to a photodetector;

FIG. 422 is a schematic diagram of light pattern for another embodiment of a decoding unit for a super-wave multiplexing wave pattern wherein optically amplified light is subdivided into branches which are then coupled to photodetectors;

FIG. 423 is a schematic diagram of a light pattern for another embodiment of a decoding unit for a super-wave multiplexing wave pattern wherein laser light is subdivided into branches which are then coupled to photodetectors;

FIG. 424 is a schematic diagram of an input optical signal coupled to an arrayed waveguide;

FIG. 425 is a schematic diagram of a relationship between phase pulses and the propagation direction of radiated light in a free space region;

FIG. 426 is another embodiment of the relationship in FIG. 425;

FIG. 427 is a schematic illustration of one embodiment of a coded wave pattern;

FIG. 428 is a schematic illustration of light pattern for an all-optical coding unit;

FIG. 429 is a schematic diagram of an all-optical coding unit;

FIG. 430 is a side elevational view of a substrate supporting a clad layer;

FIG. 431 is a side elevational view of the substrate assembly of FIG. 430 after a silicon layer was disposed on the clad layer;

FIG. 432 is a side elevational view of the substrate assembly of FIG. 431 after an etching mask was disposed on the silicon layer and then patterned;

FIG. 433 is a side elevational view of the substrate assembly of FIG. 432 after the silicon layer was anisotropically etched;

FIG. 434 is a side elevational view of the substrate assembly of FIG. 433 after reflective or filtering layers were disposed on exposed surfaces of the etched silicon layer;

FIG. 435 is a side elevational view of the substrate assembly of FIG. 434 after depositing a core layer layer over the substrate assembly and after curing, and planarizing the core layer, and after depositing and curing a clad layer on the core layer;

FIG. 436 is a side elevational view of the substrate assembly of FIG. 434;

FIG. 437 is a side elevational view of the substrate assembly of FIG. 436 after depositing and curing thereon a core layer and after depositing and curing a cladding layer on the cured core layer;

FIG. 438 is a side elevational view of the substrate assembly of FIG. 437 after polishing the same; and FIG. 439 is a vertical sectional view of an optical conduit circumscribed by a copper sleeve.

DETAILED DESCRIPTION OF THE PRESENT INVENTION

Figures 1, 32:
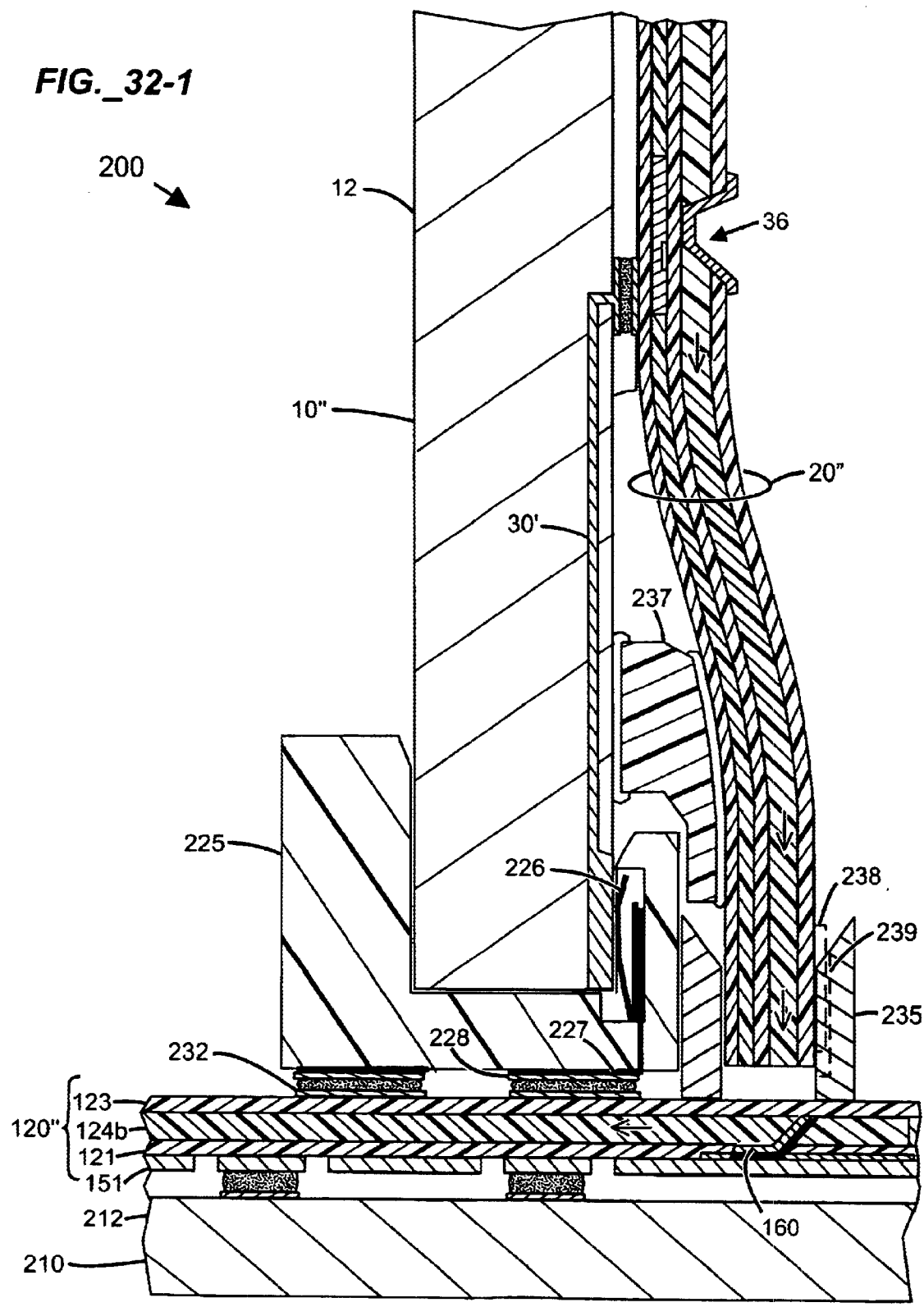

FIG. 1 shows an expanded perspective view of a first embodiment of an opto-electronic (optical-electronic) interconnect substrate according to the present invention at reference number 10. The interconnect substrate 10 takes the form of an opto-electronic multichip module (OE-MCM) substrate that interconnects signal from one or a plurality of I.C. chips 1a–1d, including both inter-chip and intra-chip connections, by both optical links and electrical traces. Substrate 10 comprises a base substrate 12 and an active layer 20. The active layer comprises optical waveguides 24a–24h, opto-electronic switching devices 26a–26c, photodetector devices 28a–28c, electrical traces 30, and electrical connection pads 32 for the I.C. chips 1. The I.C. chips are flip-chip assembled to active layer 20 and are electrically coupled to the connection pads 32 of layer 20 by a plurality of any type of conventional connectors 2. For the example, as shown in FIG. 1, connectors 2 may comprise solder bumps. The optical waveguides 24 and the opto-electronic devices 26 and 28 are incorporated into active layer 20, and are preferably embedded therein such that the top surface of layer 20 is substantially flat (e.g., having a surface uniformity that is within ±10 μm over a 1 cm square area, except for small holes, grooves, bumps, etc.).

Signals between the chips may be conveyed electrically by traces 30 or optically by waveguides 24. When the signals are conveyed by light (i.e., optically) on waveguides 24, the opto-electronic devices 26 and 28 provide the conversions between light and electrical representations of the signals. As one example of how light may be used to convey a signal, a light power source is brought to OE-MCM substrate 10 by optical fiber 4 and is coupled to optical waveguide 24a. (A light power source may provide a continuous source of light energy during the operation of the circuit or system formed by chips 1, or it may provide a pulse train of light pulses.) The coupling between fiber 4 and waveguide 24a may be accomplished by a standard V-groove connector 14, whose construction is well known to the optical-fiber communication art. It is also possible to connect optical fibers to the waveguides at the layer's surface by incorporating 45° mirrors, gratings, etc., within the core material of the layer and by positioning each fiber so that its core is aligned to a mirror or grating. The light source propagates along waveguide 24a and is divided among two waveguides 24b and 24c by a conventional Y-branch divider in a pre-selected ratio (such as 50%–50% if the light is not divided in further stages, or if the light in each branch is divided again in further stages, or such as 33%–67% if the light in one branch is divided again in a further stage). The light in waveguide 24b is routed to an opto-electronic switch 26a, which selectively routes the light onto waveguide 24d depending upon the electrical signal provided to the switch. The electrical signal is provided to switch 26a by two connection pads 32, which in turn are coupled to circuitry on chip 1a through solder-bump connectors 2. In this manner, an electrical output signal from circuitry on chip 1a is converted to an optical representation on waveguide 24d by switch 26a.

From switch 26a, waveguide 24d is routed to a second electrical-optical switch 26b, which has an electrical input which is coupled to circuitry in chip 1d by similar pads 32 and connectors 2. Switch 26b has one optical input, which is coupled to waveguide 24d, and one electrical input, which is coupled to circuitry on chip 1d. Switch 26b also has two optical outputs, which are coupled to waveguides 24e and 24f, respectively. Depending upon the electrical input to switch 26b, switch 26b will either route the light at its optical input to one of its optical outputs or the other. An exemplary construction for switch 26b is described below with reference to FIGS. 2 and 3. The optical signals on waveguides 24e and 24f are provided to two photo-detector devices 28b and 28c, respectively. Photo-detector devices 28b and 28c convert their respective light signals to corresponding electrical representations, and provide their representations to input circuits on I.C. chips 1c and 1d, respectively, through corresponding connection pads 32 and connectors 2. Switch 26b is not always used or necessary in this situation. In such a case, the substrate does not contain the routing switch and the output of waveguide 24d may be directly connected to receiver 28b or 28c, or to both receivers.

In a similar manner, the light power source on waveguide 24c is routed to an opto-electronic switch 26c, which is controlled by an electrical output signal from I.C. chip 1b. From the optical output of switch 26c, the modulated light output is routed onto waveguide 24h, which terminates in an optical fiber 5, to be transported off of OE-MCM substrate 10. A conventional V-groove connector 15 is used to coupled fiber 5 to waveguide 24h. As indicated above, it is also possible to connect optical fibers to the waveguides at the layer's surface by incorporating 45° mirrors, gratings, etc., within the core area (where the waveguide mode propagates) of the layer and by positioning each fiber so that its core is aligned to a mirror or grating. Referring back to waveguide 24c, which provides the input to switch 26c, it will be noticed that it crosses at a near right angle with waveguide 24d. The crossing is a conventional optical waveguide intersection, and results is a minimal amount of light crossing over from waveguide 24c to waveguide 24d, and vice versa.

Photo-detector devices may also be used to receive optical signals from outside of OE-MCM substrate 10. An example is shown with photo-detector 28a, which receives a light signal from an optical fiber 3 through waveguide 24g. A conventional V-groove connector 13 is used to couple fiber 3 to waveguide 24g. As indicated above, a 45° mirror, grating, etc., may also be used. The electrical output of photo-detector device 28a is provided to input circuitry on I.C. chip 1c through connection pads 32 and connectors 2.

Although it is not shown in the figure, the optical waveguides can be routed from one terminal of a chip to another terminal of the same chip, thereby providing intra-chip optical interconnection.

The number of waveguides 24, devices 26 and 28, electrical traces 30, interconnection pads 32, fibers 3–5, and chips 1 shown in FIG. 1 have been kept to a low number for the sake of visual simplicity. With the possible exception of chips and fibers, a typical OE-MCM substrate 10 has many more of these components than shown. Also, the size of the components has been exaggerated for the sake of visual clarity. Typical widths of waveguides 24 can be on the order of 1 $\mu$m to 50 $\mu$m, and typical dimensions of I.C. chips are 1 cm to 4 cm on a side. Typical widths of devices 26 and 28 can be on the order of 1 $\mu$m to 50 $\mu$m (the width is the shorter of the two horizontal surface dimensions). Typical lengths of devices 26 and 28 can be on the order of 1 $\mu$m to 5,000 $\mu$m (the length is the longer of the two horizontal surface dimensions). Typical thickness' (the vertical dimension) of devices 26 and 28 are less than 30 $\mu$m, and can be in the range of 1 $\mu$m to 20 $\mu$m. Typically, the larger sized devices are used in free-space optical connection applications. Although FIG. 1 shows that each device 26 and 28 is provided with two electrical connections from a corresponding I.C. chip, it may be appreciated that active layer 20 may comprises a ground plane (or power plane) within it, and that a device 26 or 28 may have one of its electrical terminals connected to this plane and its other electrical terminal coupled to an output or an input of a corresponding I.C. Instead of fibers 3–5, array fibers, film waveguides, or imaging guides can be used.

FIG. 2 shows a partial cross-sectional view of active layer 20 in the vicinity of opto-electronic switch 26c, and FIG. 3 shows a top plan view of switch 26c in relation to waveguides 24c and 24h. Referring to FIG. 2, active layer 20 comprises a patterned layer 24 of core material approximately 5 um thick, from which the individual waveguides 24a–24g are formed, such as waveguides 24c and 24h. The waveguide layer is formed above an optional cladding layer 21 (if base substrate 12 is not suitable as a cladding layer), and is covered over by a second cladding layer 23. Cladding layer 23 extends over the sides of waveguides 24 as well as the tops of waveguides. As is known in the art, optical waveguides can be made from two types of materials having two different indices of refraction ($n_1$ and $n_2$), which are called the core material and the cladding material. The core material has the higher index of refraction. Cladding layers 21 and 23 may have different indices of refraction, as long as they are both less than the index of refraction of core layer 24. The cladding layer may comprise, for example, Hitachi's fluorinated polyimide OPI-N1005 (Hitachi Chemical Co.) and the core layer may comprise, for example, Hitachi's fluorinated polyimide OPI-N3405 (Hitachi Chemical Co.).

If base layer can function as a suitable cladding layer, then cladding layer 21 may be omitted.

Switch 26c is embedded in active layer 20, with its bottom surface against the top surface of base substrate 12. There are a number of different types of opto-electronic switch devices that can be used. Such examples are an internal total-reflection switch, a Mach-Zehnder modular, a digital switch, grating-type switch, electro-absorption (EA) light modulator, semiconductor optical gate switch, etc. The exemplary switch device shown in FIG. 2 is an internal total-reflection switch, and it comprises a body of electro-optical (EO) material 626 which changes its refractive index when an electric field is applied across it. Referring to FIG. 3, the body of EO material 626 is formed in a Y-shaped body having a through section between waveguide 24c and a second output waveguide 24i, and a branch section from this through section to output waveguide 24h. Material 626 is placed in the path between input waveguide 24c and output waveguides 24h and 24i, and is positioned between cladding layers 21 and 23. The field is applied by two opposing electrodes 27, which also serve as the electrical terminals of the device. Short electrical traces, which are not present in the cross-sectional plane of FIG. 2, connect electrodes 27 to respective connection pads 32, which are not present in the cross-sectional plane of FIG. 2 but whose locations in back of the plane are shown by dashed lines. When no potential is applied across electrodes 27, light travels along the through section from waveguide 24c to waveguide 24i. When an electrical potential difference is applied between electrodes 27, a portion of the EO material 626 undergoes a change in its index of refraction, which in turn changes the propagation direction of the light so a major portion of the light goes into the output waveguide 24h. More specifically, the light encounters a lower index of refraction at the section of EO material 626 located between electrodes 27, and is reflected to the branch section. EO material 626 may comprise organic materials, including electro-optic polymers, such as those disclosed in U.S. Pat. No. 5,444,811, assigned to the assignee of the present application and incorporated herein by reference. EO material 626 may also comprise multiple quantum well devices and quantum dots made from exemplary III–V compounds, such as $Al_xGa_{1-x}As/Al_yGa_{1-y}As$. When applying a reverse voltage bias, these devices are able to change their indices of refraction as a function of the applied bias.

In general, active layer 20 is formed by a built up technology. As used in this application, a build-up technology refers to any combination of film layer deposition steps, waveguide patterning steps, embedding of EO devices, and formation of vias and contact layers to form a film with embedded waveguides and/or embedded EO devices. As one example, cladding layer 21 is first formed over base substrate 12, followed by the formation and patterning of optical core layer 24, followed by the formation of cladding layer 23, and then followed by the formation of electrical traces 30 and interconnect pads 32. The opto-electronic devices 26 and 28 may be formed individually and then incorporated into active layer 20 after or while cladding layer 21 is formed, and before core layer 24 is formed. In some cases, the devices can be formed while the layers 21–24 are being formed. For example, the bottom electrode of switch 26c (see FIG. 2) may be formed before cladding layer 21 is formed. After cladding layer 21 is formed, a square of EO material is formed where switch 26c is to be located. Thereafter, the surface may be over-coated with core material for layer 24 and cured. The surface is then planarized to expose the top of the square of EO material 626. Both the core layer and the square of EO material 626 are then patterned (such as by conventional patterning of a photoresist layer, or a mask layer, followed by etching) to formed the pattern of the waveguides 24c and 24h and the final Y-branch shape of EO material 626. Cladding layer 23 and a metal layer for top electrode 27 and pads 32 are then formed.

Referring now to FIGS. 4-1, 5-1, 4-2, 5-2, 4-3 and 5-3, FIG. 4-1 shows a partial cross-sectional view of active layer 20 in the vicinity of photo-detector device 28c, and FIG. 5-1 shows a top plan view of device 28c in relation to waveguide 24f. Like switch 26c, photo-detector device 28c is embedded in active layer 20, with its bottom surface against the top surface of base substrate 12. There are a number of different types of photo-detector devices that can be used. The exemplary detector device shown in FIGS. 4-1 and 5-1 comprises a body 628, or mini-chip, of semiconductor material and two electrodes 27 formed at the top surface of body. For visual simplicity, two simple straight electrodes are shown in the figures. Typical MSM photo-detector devices used by the present application have interdigitated electrodes for increasing hole-electron collection efficiency. The exemplary device 28c is independently constructed and then placed on top of cladding layer 21 and adhered thereto prior to forming waveguides 24a–24i. The material of body 628 is capable of generating a voltage across its electrodes 27, and/or a current across its electrodes 27, and/or a change in conductivity across its electrodes 27. For example, body 628 may comprise a semiconductor material with a p-n junction formed in the material, with the p-type doped region electrically coupled to one electrode 27 and the n-type doped region electrically coupled to the other electrode 27. The p-n junction generates a current when exposed to light, and this current may be detected by conventional detection circuitry known to the photo-detection art. As another example, body 228 may comprise a semiconductor material that has a p-i-n junction or an n-i-p junction formed in the material, with the doped regions electrically coupled to respective electrodes 27. When the intrinsic (i) semiconductor region is exposed to light, the concentration of electrons and holes is increased, and the conductivity of the region is increased. This changes the conductivity between electrodes 27, which can be detected by conventional detection circuitry known to the photo-detection art. Also, a simple body of intrinsic (i) semiconductor, with two ohmic contacts to it, may be used. More complex devices, such as bipolar photo-transistors and field-effect photo-transistors, may be used. The construction of these devices are well known to the art, and can be adapted in view of the present application to position the photon-collection areas to one or more sides of the mini-chip of semiconductor material. In FIG. 4-1, the thickness of the photo-detector layer is shown as being almost the same as that of the core layer thickness of the waveguide. However, more generally it is preferably to make the thickness of the photo-detector larger than that of the core layer thickness in order to achieve efficient light absorption in the photo-detector.

As previously indicated, the exemplary device 28c is independently constructed and then placed on top of cladding layer 21 and adhered thereto prior to forming waveguides 24a–24i. In the case that cladding layer 21 comprises a polymeric material that is initially dispensed in liquid form and then cured, device 28c may be set into layer 21 while layer 21 is in a liquid or tacky state, and then may be firmly adhered to layer 21 during the curing process. If cladding layer 21 comprises a laminated layer, or otherwise cured or non-adhesive layer, a body of polymeric adhesive may be applied to the back of device 28c before placement, and then cured to adhere device 28c to layer 21. After being set in place, the waveguides 24a–24i and top cladding layer 23 are formed in sequence, with vias being formed to electrodes 27 of device 28c. A top metalization layer is formed for providing traces 30 and pads 32, as shown in solid lines in FIG. 5-1.

The device of FIG. 4-1 can have fingered electrodes, such as those found in interdigitated electrodes. One of the fingered electrodes may be formed on the bottom surface of the device's chip. In this case, a contact to the bottom electrode is made by diffusion bonding a portion of the electrode to an electrical trace formed on the surface of the base substrate (or formed on a cured layer 21). AuSn bonding, AuSnIn bonding, AuIn bonding, and Pd bonding can also be used. High temperature underfill material is then preferably dispensed to fill the air pockets underneath the component that has been diffusion bonded. Cure material can also be used to fill the air pockets.

The photodetectors used in the present application are not restricted to being interdigitated types. For example, a sandwich-type electrode configuration is possible. Also, the detector's bottom surface (the surface in which light enters the detector) may have an electrode with a window to receive light, and may have a second electrode located at the detector's top surface.

FIGS. 4-2, 5-2, 4-3, and 5-3 show two additional preferred photo-detector embodiments at reference numbers 28c' and 28c", respectively. Although these examples are for vertical-type photodetectors, the arrangements and considerations apply to lateral-type photodetectors as well. As is well-known, a load resistor is required to output voltage signals from a photo-detector. As shown in FIGS. 4-2 and 5-2, a load resistor 29 is integrated into the ELO photodetector 628. Alternately, a preamplifier may be integrated into the ELO detector 628, such as at the location of resistor 29. FIGS. 4-3 and 5-3 show an alternate load resistor 29' comprised of a serpentine NiCr film with, for example, a thickness of 300 nm, a width of 3 microns, and a total length of 500 microns. While photo-detectors are one example where an appropriate impedance matching electrical circuit such as an amplifier or load resistor is required for proper device operation, more generally an appropriate resistor, capacitor, driver, or other circuit may be required to couple other electrical or opto-electronic devices, such as a laser diode, to the power supply (or to ground or other electrical and/or opto-electronic devices). In the illustrations of the present invention shown in the figures, only two electrodes per device are shown. However, more generally, each device may have a plurality of power and/or signal electrodes in a similar manner to non-embedded devices.

FIG. 6 shows an expanded perspective view of a second embodiment of an opto-electronic interconnect substrate according to the present invention at reference number 10'. The interconnect substrate 10' is similar to substrate 10 shown in FIG. 1, and takes the form of an opto-electronic multichip module (OE-MCM) substrate that interconnects signal from one or a plurality of I.C. chips 1a–1d by both optical links and electrical traces. Common reference numbers have been used to designate common elements of substrates 10' and 10. As one difference, substrate 10' uses light emitting devices 36a and 36b in place of the opto-electronic switch devices 26a and 26b of substrate 10. The light emitting devices 36 do not need an outside source of light, such as provided by optical fiber 4 of substrate 10, and thus substrate 10' does not require optical fiber 4. Device 36 may comprise a light-emitting diode (LED), a laser diode (LD), a vertical cavity surface emitting laser (VCSEL), quantum-well or quantum-dot devices (under forward bias), or other light-emitting devices.

FIG. 7 shows a partial cross-sectional view of an exemplary light-emitter device 36b, and FIG. 8 shows a top plan view of device 36b in relation to waveguide 24h. Like switch 26c, light-emitter device 28c is embedded in active layer 20, with its bottom surface against the top surface of base substrate 12. Light emitter device 36c comprises a body 636, or mini-chip, of light-emitting material, such as semiconductor, and two electrodes 27 formed at the top and bottom surfaces of body 636. Device 36b emits light from one or more of its sides, and may comprise a light-emitting diode or laser diode formed in semiconductor material. The exemplary device 36b is independently constructed and then placed on top of an electrode disposed on or in cladding layer 21 and adhered thereto prior to forming waveguides 24a–24i, such as by the adhesion steps described above, including solder or metal-diffusion processes. The construction of these devices are well known to the art, and can be adapted in view of the present application to position the photon-emission areas to one side of the mini-chip of semiconductor material.

During construction, the placement of device 36b on cladding layer 21 and the patterning of waveguide 24h are performed with the use of alignment marks on base substrate 12. During fabrication, there may be some misalignment of device 36b or the pattern for optical waveguide 24h with respect to these marks, and consequently there may be some misalignment between the optical output of device 36b and the optical input of waveguide 24h. To account for any such misalignment, the optical input of waveguide 24h may be flared, or tapered outward, as shown in FIG. 8. If there is misalignment, the taper ensures that the light form device 36b directed into the optical waveguide.

This potential for misalignment is also of concern for making the via contacts from traces 30 to electrodes 27. This may be addressed by designing additional tolerances into the via dimensions (e.g., using larger dimensions than the minimum dimensions imposed by the lithography and etching steps employed). One may also elongate the shapes of traces 30 and electrodes 27 in the via area, and arrange the elongated shapes to intersect at 90° angle.

FIG. 9 shows a partial cross-sectional view of a second exemplary light-emitter device 36b', and FIG. 10 shows a top plan view of device 36b' in relation to waveguide 24h. Device 36b' comprises a vertical cavity surface emitting laser (VCSEL) 638 formed on a semiconductor mini-chip (or die) 636. The VCSEL element 638 generates light which is directed perpendicular to the top surface of mini-chip 636, which is different from the previous example where the light was generated at a side of the mini-chip. Substrate 636 lies below core layer 24, and a mirror 639 is positioned in front of VCSEL element 638 to reflect the vertical light beam of element 638 into waveguide 24h, and thereby along a horizontal direction. The surface of mirror 639 is preferably at a 45° angle to the element's light beam. One end of optical waveguide 24h is located over VCSEL element 638 and is beveled at an angle (preferably at a 45° angle) with respect to the normal vector of the substrate surface. (The normal vector is the vector which is perpendicular to the top surface of base substrate 12). The beveling may be accomplished by laser abrasion using a laser that is tilted at a 45° angle with respect to the normal vector of the substrate surface. Reactive ion etching (RIE) methods may also be used. If photosensitive materials are used, tilted lithographic exposures may be used. Mirror 639 is built upon the beveled surface, such as by depositing a reflective metal or reflective material over this area. Exemplary reflective metals include silver (Ag), aluminum (Al), gold (Au), copper (Cu), chromium (Cr), tungsten (W), titanium (Ti), etc., and exemplary reflective materials include multilayer dielectric coatings comprising such materials as titanium dioxide ($TiO_2$), silicon dioxide ($SiO_2$), alumina (aluminum oxide $Al_2O_3$), zinc oxide (ZnO), chromium oxide ($Cr_2O_3$). The angle of mirror 639 may vary from a value of 45° by small amounts, depending upon the difference in the index of refraction of the core and cladding layers. If the difference in the indices of refraction is $\Delta n=0.02$, then a maximum angle deviation of ±3° can be tolerated. Given the value of $\Delta n$, it is well within the skill of the art to compute the maximum angle deviation. As used herein, a 45° angle or an angle of approximately 45° compasses all angles within the angle tolerance for the corresponding value of $\Delta n$; thus angles from 42° to 48° are encompassed for a $\Delta n$ of 0.02, which has the above angle tolerance of ±3°. Instead of mirror 639, an optical grating may be used. An optical grating may comprise a sequence of material layers having alternating indices of refraction $n_1$ and $n_2$ and being formed at a 45° angle to the substrate normal vector. Such an optical grating may be constructed by forming a set of spaced cuts in the end of waveguide 24h, and then filling the cuts with an optical material having a different index of refraction. The set of 45° angle cuts is most readily obtained by using a photosensitive optical material and passing the exposure radiation through a optical device which generates an interference pattern which has closely spaced, alternating regions of high and low intensity light. The interference pattern is tilted at an approximate 45° angle to the normal vector of the substrate and focused on the region where the grating is to be formed. As in the mirror case, small angle deviations can be tolerated, and the tolerance can be computed from the indices of refraction by those of ordinary skill in the optics art. The gratings may also be formed by anisotropic etching methods which are described in greater detail below with reference to the devices illustrated in FIGS. 22–25.

As shown in FIG. 9, device 36b' is embedded in a material layer 25b, which underlies cladding layer 21. To ensure that device 36b' is attached to base substrate 12, an adhesive layer 25a may be formed over base substrate 12 prior to forming material layer 25b. Layers 25a and 25b may comprises any suitable polymeric material, include the material of cladding layer 21 or core layer 24, as well as conventional polyimide materials. The preferably comprises the same material, but the can be different. The electrodes 27 of device 36b', as well as other component devices, may be located on the bottom surface of the device, or on both surfaces (so called opposing electrodes). In this case, the bottom electrodes can be diffusion bonded to electrical traces formed on the surface of the base substrate (or formed on a cured layer 25a). High temperature underfill material is then preferably dispensed to fill the air pockets underneath the component that has been diffusion bonded. Also, the material of layer 25b can fill the air gap. When a VCSEL is used, a vertical-type photodetector may be embedded using a similar process and having a configuration similar to that shown in FIGS. 9–10.

Referring now to FIGS. 11–20, exemplary methods for constructing active substrate 20 for substrates 10 and 10' are described with respect to FIGS. 11–18, which show cross-sections of the layers of active substrate 20 during construction. In the cross-sections shown, a opto-electronic switch device 26 and a photo-detector device 28 will be formed adjacent to one another with an optical waveguide being routed from an optical output of device 26 to an optical input of device 28, as finally shown in FIG. 18.

Referring to FIG. 11, a bottom electrode 27 of switch device 26 is formed on the top surface of base substrate 12 by conventional deposition and photo-lithographic steps that are well known to the art. In addition to forming electrode 27, alignment marks for further processing steps may be formed, or these alignment marks may be etched in the surface of base substrate 12 prior to forming electrode 27. As the next step, cladding layer 21 is formed, such as by spin-coating a fluidized polymer over base substrate 12. In order to attach components 28, a material for layer 21 is selected which has adhesive capabilities, such as Hitachi's fluorinated polyimide OPI-N1005 or a solvent-free (non-gaseous) epoxy materials. The thickness of layer 21 may range between 1 μm and 20 μm, after any shrinkage from a subsequent curing step.

Individual optical-electric components, such as device 28, are placed on top of layer 21 and adhered thereto, preferably before the fluidizing solvent of layer 21 is completely evaporated away from layer 21. Non-solvent based materials may also be used for layer 21, such as epoxy materials. (In general, epoxy materials decompose as a lower temperature than polyimide materials, which should be taken into account when choosing the material for subsequent layers). Layer 21 is then soft-baked to remove the fluidizing solvent (if it present) and to perform some optional partial cross-linking of the polymeric material. Layer 21 is then cured by steps that are appropriate for its material composition, such as by exposure to heat, radiation, time, or a combination thereof. The evaporation of the solvent is performed gradually to accommodate the lateral diffusion of the solvent which underlies the individual components (28). With some cladding materials, one can perform a partial soft-bake step to make the surface of layer 21 tacky before the individual components are placed. The partial soft-bake reduced the time required to laterally diffuse out the fluidizing solvent that is under the set components (e.g., 28).

The back side of each placed component (e.g., 28) may be coated with chromium prior to the adhesion step in order to improve adhesion of the components to the polymeric material of layer 21. In some cases, the chromium film may be patterned to for bottom electrodes of the component. Commercially available surface mounting equipment, flip-chip bonding equipment, or a custom purpose aligner may be used to position the components. Alignment marks may be included on the individual components (e.g., 28) and/or base substrate 12 for this purpose. Instead of making alignment marks on individual components, it is also possible to make marks on several components or on several points of the substrate portion on which the components are disposed. Surface mount equipment, flip chip equipment or a custom purpose aligner can place components to within ±2 μm to ±5 μm.

As indicated above, the thickness of the individual components (e.g., 28) is preferably relatively thin, such as on the order of 1 μm to 20 μm. Such thin O/E components can be manufactured using the vapor phase epitaxial liftoff process described by Yablonovitch, "Vapor Phase Epitaxial Liftoff Process of GaAs", the Fall 1997 Materials Research Symposium. Other processes, such as liquid phase epitaxial liftoff or polishing may also be used as well. The epitaxial lift-off (ELO) process takes advantage of the very large difference in etch rate between GaAs (Gallium Arsenide) and AlAs (Aluminum Arsenide), or between GaAs and $Al_xGa_{1-x}As$ (Aluminum Gallium Arsenide) with large x, in hydrofluoric acid. Starting with a GaAs substrate, a layer of AlAs is formed over the top surface by epitaxial growth (e.g., MBE, OMVPE, etc.). Layers of GaAs and $Al_xGa_{1-x}As$ are then formed over the AlAs layer, also by epitaxial growth. Opto-electronic devices are then formed in the top GaAs layer, including electrodes and a top passivation layer. (For the present invention, a polish-stop layer is formed on top of the passivation layer and electrodes, as described below). Deep trenches are then formed in the top GaAs layer to separate the devices into individual components or individual array chips (which are chips containing multiple devices). (Such array chips are usefully in implementing optical buses where multiple signals are grouped together and routed from a bank of optical switch devices (or emitters) to a bank of photo-detectors.) As a supporting substrate, a polymer film, such as Mylar, or glass, quartz, is then laminated to the top surface of the GaAs components, including the array chips. The entire substrate is the exposed to a hydrofluoric acid etch, which etches the AlAs layer laterally and results in the release of the GaAs and $Al_xGa_{1-x}As$ components (e.g., mini-chips) from the GaAs substrate while still being attached to the polymer film (when a polymer is used for the supporting substrate). The components may then be cut from the polymer film, or they may be held by the film until used. In the latter case, layer 21 is soft-baked to a point where it has more tacky adhesion force than the laminated polymer film; when the component is pressed in the tacky layer 21, it is retained on layer 21 when the laminated polymer film is pulled away, and it separates from the polymer film. As another option, one may deposit metal on the exposed bottom surfaces of the epitaxial devices while they are still attached to the carrier film. Corresponding metal pads may be formed on a cured layer 21, and the epitaxial devices may then be attached to the corresponding metal pads by diffusion bonding, AuSn bonding, AuInSn bonding, AuIn bonding, Pd bonding, or other similar bonding processes. Dimensional stability is improved if rigid substrates, like glass, are used for the supporting substrate.

It is believed by the authors that a similar epitaxial lift-off process may be developed for a silicon (Si) substrate using an intermediate SiGe (Silicon Germanium) layer in place of the AlAs layer, and by using an etchant which differentiates between SiGe and silicon (Si). This would enable a high-yield ELO process to be performed for silicon chips.

In subsequent processing steps, a layer of core material will be formed over the individual components (e.g., 28), and the resulting surface will be exposed to a polishing step to make the surface more planar. In preferred construction implementations, the polishing step will remove parts of the core material which overlay the electrodes 27 of the individual components (e.g., 28) and expose the top surfaces of the electrodes 27. For this purpose, the electrodes 27 preferably have an initial height which is greater than normally required, and they are then ground down by the polishing step. In addition, the electrodes 27 preferably have a composite structure of two or more metal sub-layers, with one of the sub-layers comprising a polish-stop material, such as tungsten. An example is shown in FIG. 11, where electrodes 27 comprise a bottom sub-layer 27x of copper, a middle sub-layer 27y of tungsten, and a top sub-layer 27z of copper. The tungsten sub-layer 27y may have a thickness in the range of 0.1 µm to 1 µm, and copper layer 27x and 27z may have thicknesses of 2 µm to 20 µm. To reduce copper diffusion during polymer curing, the top surface of the copper can be capped by a diffusion barrier layer (e.g., titanium or nickel layer). Other metals, such as Au, may be used instead of Cu. In a slurry having alumina particles as the abrasive, copper polishes at a faster rate than tungsten.

After layer 21 is cured, or between the time layer 21 is soft-baked and cured, layer 21 may be patterned to form vias to bottom electrode 27. This is most easily accomplished by laser drilling the via apertures and then filling the apertures with conductive materials, such as for example copper. The location of the via is indicated in FIG. 11 by the term "via". In place of laser drilling, the via apertures may be formed by etching through a thick photoresist layer which has been photo-lithographically patterned with apertures which correspond to those to be formed in layer 21. If layer 21 has been cured, then dry etching is preferred; wet etching is usually best used with a soft-baked and uncured layer 21. As indicated below, the via in layer 21 may also be formed at a later step.

The via apertures in layer 21 may be filled with conductive material by a number of conventional deposition methods, including sputtering conductive material (e.g., copper), chemical vapor deposition (CVD), and plating conductive material. Electroless plating, direct plating (electroplating), and CVD may be used to fill the via apertures without depositing material over the entire substrate. Electroless plating is, however, relatively slow. Other methods deposit conductive material over then entire surface and then etch away the material in those areas where it is not wanted. Before performing such a blanket deposition of material, it is advisable to cover the placed components (e.g., 28) with a protective patch of photoresist material so that the subsequent etching operation does not harm these components, particularly their metal electrodes. If electroplating is used, a conductive seed layer is first sputtered over layer 21 to provide a conductive path for the plating current. The seed layer usually comprises a thin chromium adhesion layer (e.g., 200 A) followed by a thicker copper layer (e.g., 2 µm). The excess conductive material is removed by conventional chemical etching using masking caps over the filled via apertures. The masking caps can be easily formed by coating a layer of photoresist over the newly deposited copper layer, and thereafter pattern exposing and developing the photoresist layer. After the excess copper (and any seed layer) is etched away, the masking caps are removed by a suitable stripper or solvent. The above described via formation steps may be used to form vias in other dielectric and polymeric layers described herein.

Referring to FIG. 12, a layer EO material 626 for switch device 26 is formed over layer 21 and the individual components (e.g., 28). The layer of EO material 626 is then patterned to leave a portion (or body) of the material in the location where switch device 26 is being formed. The portion left is typically a course portion of the material and is not in the final pattern of the body of EO material 626 which will be used for device 26. For example, it may be a generally rectangular portion (as viewed from the top surface of base substrate 12) which encompasses the body of EO material 626 that will actually be used for switch 26 (see FIG. 19). A subsequent step will typically do the final patterning of this portion of EO material 626 (see FIG. 20). This course patterning of the layer of EO material 626 may be done by any number of conventional patterning techniques. If EO material 626 is photo-imageable, it may be patterned exposed to actinic radiation and thereafter developed. If it is not, a photoresist layer may be formed over the layer of EO material 626, and the photoresist may be patterned to leave an etch mask which covers the course portion of EO material 626 which is to be retained. Both wet and dry etching steps may be used to remove the unwanted portions, with dry etching being preferred as these etching processes are anisotropic and provide sharper vertical walls.

Plasma dry etching techniques may be used, and the photoresist layer may be sacrificed during the dry etching process as long as a portion of its thickness remains by the end of the etching process.

In FIG. 12, a further embodiment of these possible patterning methods is preferably used. Specifically, a tungsten layer having a thickness of 0.1 $\mu$m to 1 $\mu$m is formed over the layer of EO material 626, and this tungsten layer is patterned to leave tungsten etch masks 627 for portions of EO material 626 that are to be retained. The patterning may be done by forming a photoresist layer over tungsten layer 627, patterning and developing the photoresist to expose the unwanted tungsten, and then etching the unwanted tungsten, such as by a hydrogen peroxide solution. FIG. 13 shows the result of the pattern etching of the layer of EO material 626. The tungsten etch mask 627 will be used in a subsequent polishing step as a polish-stop layer for protecting the retained portions of EO material 626, and thus it will serve two purposes. It may be appreciated that other materials may be used in place of tungsten, and that the construction methods of the present invention are not limited to using tungsten. For example, other metals, deposited silicon dioxide, and deposited silicon nitride may be used. The etch mask can, if necessary, be used as a poling electrode to enhance the electro-optic coefficient of the EO material.

Instead of forming the portions of EO material 626 by spin-coating, CVD, or MLD, one can place chips of semiconductor material which have electrical-optic properties or electro-absorption properties. For example, multiple quantum-well devices comprising alternating layers AlGaAs and GaAs (or InGaAlAs (Indium-Gallium-Aluminum-Arsenide) or InGaAsP (Indium-Gallium-Arsenide-Phosphorus), etc.), change their index of refraction (or electro-absorption properties) as a function of applied potential difference. These chips may be made by the epitaxial liftoff process described above, and they may be placed down onto layer 21 at the same time that components 28 are placed down onto layer 21 (either with simultaneous placement or sequential placement). This possibility is shown by the dashed chip of material 626' in FIG. 11. In this case, the step of coating the layer of polymeric EO material 626 exemplified by FIG. 12 may be omitted, as well as the steps of defining and curing the coated material 626 (unless of course one wants to use both materials 626 and 626' in the same active substrate 10). A polish-stop layer 627 is preferably formed over the chip 626', preferably before placement. Layer 627 may then be patterned to define the final shape of chip 626', and the semiconductor chip can then be etched to removed those portions of semiconductor which are not underneath the patterned layer 627, before the core layer is formed. The processing of chip 626' is thereafter the same for those steps exemplified in FIGS. 13–20.

Referring to FIG. 14, the next step is to form a layer 24 of optical core material over cladding layer 21, the individual components (e.g., 28), and the portions of EO (or EA) material 626. For this purpose, a spin coat step may be used, where the core material comprises a polymer material which has been fluidized (i.e., made into a viscous fluid) with a solvent. In this regard, and as mentioned above, the fluidized core material may comprise, for example, Hitachi's fluorinated polyimide OPI-N3405 (Hitachi Chemical Co.). Layer 24 is then exposed to a softbaking step to remove the fluidizing solvent, and then to a curing step which is appropriate for its material composition, such as by exposure to heat, radiation, time, or a combination thereof. Guidelines for the softbaking and curing of core materials, cladding materials, and electro-optical materials are provided by the manufacturers. The thickness of layer 24 is preferably greater than 90% of the thickness of the component mini-chips (e.g., 628) or the thickness of the portions of EO material 626, whichever is less, and is more preferably thicker than the mini-chips and the portions of EO material 626. Typical thicknesses of the initially-formed and cured layer 24 are less than 30 $\mu$m, and more typically in the range of 3 $\mu$m to 20 $\mu$m.

Referring to FIG. 15, the surface of the substrate is polished to make it more planar. The polishing step removes the portions of layer 24 that overlie the opto-electronic components 26 and 28, but maintains the material in the low-lying regions where the optical waveguides will be defined. The polishing step often reduces the thickness of layer 24 in the low lying areas, particular when the thickness of the initially-formed and cured layer is greater than the thicknesses of the opto-electronic devices.

Planarity is defined with respect a flat (or sometimes gradually bowed) geometrical plane which spans a localized area and which goes through the median height, or average height, of the surface topology in that area. Planarity is a measurement of variance of the surface topology from the geometric plane. The measurement may be mathematically defined in a number of ways, the most typical (and easiest) measurement is the maximum height variation from the geometric plane within the localized area. Sometimes the underlying base substrate 12 may have a slightly bowed surface, and therefore will not be perfectly flat. In this case, the notion of planarity may still be applied by using a geometric plane which has a bowed surface which follows the contour of the underlying substrate in the localized area of interest. In the present invention, one generally seeks to achieve a maximum height variation of not more than 0.5 $\mu$m from the geometric plane over a surface area of 2 cm on a side (i.e., 4 cm$^2$).

To achieve good local planarity, one may use a soft polishing pad, or a dual pad structure comprising a hard outer pad and a softer underlying pad. The selection of polishing pads is well within the ordinary skill in the art. As mentioned above, tungsten polish-stop layers are used over various components to protect them. In this regard, the effectiveness of tungsten as a polish-stop layer may be increased by adding phosphoric acid to the slurry, which will not significantly affecting the polishing rates of copper and most polymeric materials. To use phosphoric acid for this purpose, it is added in an amount which lowers the pH of the slurry to a value which is between 2 and 4. As a final note on the polishing step, several "dummy" portions of EO material 626, with the overlying polish-stop layer 627, may be distributed over the surface of base substrate 12 in areas where there are no optical waveguides or opto-electronic devices located. (Such a dummy portion is shown in the lower left corner of FIG. 20). The dummy portions are never used as active components, but serve to reduce the "dishing" phenomenon of the polishing step by increasing the aggregate surface area of polish-stop layer 627. ("Dishing" is where localized hollows are formed in the surface by the polishing action due to the lack of nearby polish-stop regions or high spots, the dishing effect is greater for soft pads than for hard pads.)

As the next fabrication step, and as shown in FIG. 15, vias are formed through layer 24 to the vias previously made to the bottom electrodes 27 through layer 21. The via may be formed by etching a via aperture, such as by laser or by plasma etch, and thereafter filling the aperture with conductive material using any of the filling steps described above with respect to the formation of the vias in layer 21. It may be appreciated that the previous formation of the vias in layer 21 may be delayed until the vias in layer 24 are formed, and that the vias in layers 21 and 24 may be formed at the same time by a single via-formation process. It is also possible to form the vias in layer 24 before layer 24 is polished, or before layer 24 is cured.

Referring to FIG. 16, the next step is optional and comprises a second polishing step which remove excess conductive material from the top of the vias formed in layer 24. This polishing step is relatively brief, and need not remove all of the excess. As the next step, the polish-stop layer 627, and optionally polish-stop layer 27y, are removed by exposing the layers to a suitable etchant. Tungsten polish-stop layers may be readily removed by hydrogen peroxide, which does not damage copper vias or most polymeric layers. As the next step, the optical waveguides are defined in layer 24. This may be done by removing portions 624 of layer 24 which run along each side of each waveguide, and which border on sides of the opto-electronic devices which are not used as optical inputs. FIG. 19 shows a top plan view of the active substrate 20 before portions 624 of core layer 24 are removed, and FIG. 20 shows a top plan view after the portions 624 are removed to define three optical waveguides 24j–24l shown in the FIG. 20. Portions of layer 21 which underlie the removed portions of layer 24 are seen in FIG. 20. As part of this step, the sections of EO material 626 are patterned a second time to provide the final Y-branch shape for switch device 26. The patterning of layer 24 and the portions of EO material 626 may be done simultaneously with a dry etch process which uses a patterned etch mask disposed over the portions of layer 24 and EO material 626 which are to be retained. Wet etching may also be used. In general, the widths of the EO waveguide section 626 and those of the waveguide 24j–24l are not always the same. If the index of refraction of the EO waveguide section 626 is greater than that of core layer 24 by a substantial amount, as can be the case when a chip of III–V compound, such as gallium-arsenide (GaAs) material, is used for section 626, then it is advisable to make the width of the EO waveguide section larger, or smaller, and to taper its dimensions at those locations where it meets waveguides 24i–24l. This action keeps the beam width of the propagating light properly dimensioned in the two materials of different refractive index, and thereby reduces reflections at the boundaries between the two different materials.

As the next step, layer 23 of cladding material is formed over layer 24 and the exposed regions of bottom cladding layer 21. This causes the sides of the optical waveguides 24j–24l to be covered with cladding material. The result of this operation is shown in FIG. 17. The cladding material filled the removed portions 624 substantially all of the way to the top, but not completely. There will be small depressions in the surface of layer 23 which overlie the removed portions 624 of layer 24. These depressions are usually gradual and smooth enough that metal lines may be formed across them without breakage. If one wishes to reduce the size of the depressions or eliminate them, the following steps may be undertaken. Referring back to FIGS. 15 and 16, the polish-stop layers are kept in place during the removal of portions 624, and are kept in place when a first layer 23 of cladding material is formed over the surface. This first layer is then polished to planarize it and to expose the polish-stop layers. The polish-stop layers are then removed and a second layer 23 of cladding material is formed over the substrate.

It may be appreciated that the following further variations in the steps of defining the optical waveguides may be practiced. As a first variation, one may dispense with performing the second patterning step of the portions of EO material 626 if the first patterning of EO material 626 uses the final patterned image for the material. The dimensions of the Y-branch shape may be enlarged to account for the possibility of misalignment. The advantage of using the two steps of patterning is that one may achieve perfect alignment between the Y-branch shape of switch device 26 and the optical waveguides 24j–24l by using the second etch step to pattern both EO material 626 and layer 24.

As a second variation, which may be used with the first variation, one may use a core material that is photo-definable (also called "photo-refractive"). Such materials have an initial index of refraction which may be changed upon exposure actinic radiation, which is usually light having a wavelength in the range of 365 nm to 400 nm. Such materials usually increase their indices of refraction when exposed to the actinic radiation. In this case, the material is initially deposited with a low index of refraction, and thereby initially acts as a cladding layer. The layer is then pattern exposed to the radiation to define the optical waveguides by raising the index of refraction in those areas where the waveguides are to be located. The pattern exposure automatically results in the sides of the waveguides being surrounded by cladding material. When active substrate 20 is completed and is in use as an interconnection device, the optical waveguides usually carry light having a lower wavelength (generally in the range of 600 nm to 1.6 $\mu$m) than that used to define them. The use of a photo-definable core material for layer 24 is easily implemented when EO material 626 has been patterned in its final shape before layer 24 is formed. However, extra processing steps may be added to pattern EO material 626 after the waveguides have been photo-defined. It is also possible that some EO materials may have their compositions modified to provide them with photo-definable characteristics. Examples of photo-definable EO materials are disclosed in U.S. Pat. No. 5,541,039 to McFarland, et al., entitled "Method for Forming Optically Active Waveguides". In general, making a material photo-definable can be accomplished by finding a way to change its index of refraction in response to exposure to actinic radiation. The changes may be accomplished by causing chemical changes and/or density changes in the material in response to being exposed to the actinic radiation.

In the core layer coating step shown in FIG. 14, an optional clad layer can be coated on the core layer. After the core layer is cured (partially or fully), the optional cladding layer is coated followed by soft and full curing. If the core layer thickness is a little bit thinner than OE device height (including top electrode), the polished surface can be in the cladding layer. In this case, the optional cladding layer is formed over core layer 24 before the polishing step is preformed. This two-layer approach may improve the interface flatness between core and clad layers, resulting in reduced optical losses. Also, the optical field intensity is slightly lower in the cladding layer, further reducing any interface scattering losses compared to forming a CMP surface at the core/cladding interface. The thickness of the core layer may be selected to be close to or less than the OE device/material height excluding the top metal. In this case, by adjusting the top metal thickness, the optional clad layer thickness can be adjusted. Another approach is to not perform CMP processing on either the core layer or the top cladding layer. This results in a non-planar surface, which can be planarized, if needed, by forming a planarizing layer over the top cladding layer and then performing CMP processing on the planarizing layer. The planarity of the core layer may also be improved using CVD, MLD, evaporation polymerization, or other vapor phase deposition methods for the polymer layer formation.

When using a photo-sensitive material, which is hardened by light exposure, CMP is not always necessary. After the step shown in FIG. 14, waveguide patterning can simply be carried out by patterned light exposure if the core layer was coated in an appropriate thickness, that is, close to or less than the OE device/material height excluding the top metal. Further planarization layers and processing steps may be applied after the overcladding layer is formed, if necessary.

Referring to FIG. 18, the last steps are to form vias through cladding layer 23, and to form the top electrodes 27 for switches 26, electrical traces 30, and interconnection pads 32. Via apertures may be formed in layer 23 in any number of conventional ways, either before or after layer 23 is cured (if it requires curing). Such methods includes laser drilling and wet or dry etching using a photo-lithographical defined etch mask. Once the via apertures are formed, the vias may be filled with conductive material by any of the convention filling methods described above. Metals are preferred for the conductive materials, with copper being one of the more preferred metals. In order to reduce processing steps, it is preferred to use sputter deposition or blanket electroplating (with a sputtered seed layer) so as to cover the whole surface of layer 23 with conductive material. By performing a blanket coating, one can then use a subsequent etching step to define the electrical traces 30 and pads 32 by an etching step using a photo-lithographically defined etch mask. The etch mask covers the vias to protect them during the etching step. As an alternative, one can sputter a seed layer over the entire surface of layer 23 and the via apertures. By conventional photo-lithographic steps, one can then form a plating mask over those area where vias, traces, and pads are not to be formed. As a result, the exposed portion of the seed layer overlies the locations of the vias, traces, and pads, and these exposed portions may them be plated to form the vias, traces, and pads. After plating, the plating mask is removed and a brief blanket etch is performed to remove the portions of the seed layer which were previously covered by the plating mask. As is known in the art, whenever one forms a metal layer over a polymeric layer, it is advisable to first sputter an adhesion layer over the polymeric layer before forming the metal layer. A 200 A to 400 A thick layer of chromium may be used for this purpose. The adhesion layer bonds well to both the metal and the polymeric material.

With a few additional processing steps, one may incorporate a VCSEL device 36b' shown in FIG. 9 in the above fabrication step. First, before cladding layer 21 is formed, adhesion layer 25a is formed over base substrate 12, and the VCSEL device is adhere to layer 25a. Before being adhered to layer 25a, the top surface of the VCSEL device with ELO is coated with a polish-stop layer, such as $0.1\mu$ to $1\ \mu$m of tungsten. Layer 25a is soft-baked, and then cured. (Instead of adhering the device to layer 25a, and as previously described, a metal layer may be deposited on the bottom surface of the VCSEL device and the device may be adhered to a metal pad formed on the surface of substrate 12 by various metal bonding processes.) Material layer 25b is then formed over layer 25a. If material layer 25b comprises a fluidized polymeric material, it is soft-baked and then cured. The process substrate is then polished to remove the portion of layer 25b that overlies the VCSEL device. The (tungsten) polish-stop layer protects the VCSEL device during this polishing step. After the polishing step, the polish-stop layer is removed. The manufacturing steps then proceed as indicated above, starting with the formation of cladding layer 21. Mirror 639 (FIG. 9) may be formed any time after layer 24 is formed, and is usually formed after layer 23 is formed. As indicated above in greater detail, the mirror is formed by making a 45° angle cut through layer 24 in region overlying the emitting element 638, and then forming a layer of reflective metal or reflective material. Since the same basic processing steps used to integrate VCSELs and mirrors may also be used to fabricate vertical-type photodetectors, it is preferably to also fabricated vertical-type photodetectors in the above-described example.

In the above construction examples, the individual components have been adhered to cladding layer 21 (or layer 25a for a VCSEL device) in the face up-position. However, these individual components may be placed in the face down position with the following modifications. In the case of component 28, layer 27 may be patterned to include connection pads form component 28, and component 28 may have its electrode connected to these pads by metal diffusion bonding. Prior to this, cladding layer 21 would be patterned to expose these contacts in bottom layer 27. Once component 28 has been so joined, a high-temperature underfill material may be dispensed under it to prevent air pockets. Vias are then made to the traces in layer 27 to complete the electrical connection of component 28. The formation of such vias was previously described above.

Placing the component 28 face down onto the substrate has the following advantage when component 28 has been formed by the above described epitaxial lift-off process: that is the AlGaAs etch step used to removed the components from the GaAs wafer may be delayed until the components are placed faced down on cladding layer 21. After placement on substrate 412, the AlAs etch step is performed to separate the bulk GaAs substrate from the epitaxial layer which contains the components. Thus, one does not need a polymer film, glass substrate, or other substrates to support the opto-electronic components during the placement steps since the GaAs bulk substrate provides this function. It may be appreciated that a whole GaAs wafer may be placed face down on cladding layer 21, or that the GaAs substrate may be first diced to separate the individual components from one another. For VCSEL devices, these steps are performed with layer 25a and a metal layer formed underneath layer 25b.

Another process for the integration of thin film device integration with waveguides is shown in FIGS. 74–81. As shown in FIG. 74, an epitaxial waveguide OE layer is grown on a GaAs substrate, metallized, and patterned to define a plurality of OE devices 620. The GaAs waveguide core layer may comprise a p-i-n waveguide core layer with abrupt index changes but preferably has a tapered refractive index (e.g., core shaped along the light propagation direction) such as that used for a spot-size conversion laser diode. The epitaxial films can be electro-absorption (EA) light modulator, Electro-Optic (EO) light modulator, photodetector, optical gate device, optical switching wavelength filter, tunable filter, wavelength filter, wavelength converter, etc., by using multiple quantum well or quantum dot structures. A metal contact layer is deposited on the surface, along with a Au contact film and, if necessary, a surface film of tungsten to stop CMP in later processing steps). The top electrodes and epitaxial layer are then patterned using conventional patterning techniques.

As shown in FIG. 75, the epitaxial thin-films with devices 620 are transferred to a supporting transfer substrate (glass, quartz, mylar, or any other substrates) by epitaxial liftoff (ELO). The adhesion between the ELO films and the supporting substrate can be made by, for example, Vaseline or black wax or an adhesive such as epoxy, polyimide, bonding sheet, thermo-plastics, underfill material, or conductive adhesive.

As shown in FIG. 76, after the semiconductor substrate is lifted off, the ELO devices 620 are transferred onto an under-clad layer 21 disposed on a substrate 12 which may comprise glass, quartz, Si, Al, AlN, or a variety of other substrate materials. The ELO devices 620 can be attached to the underclad layer 21 by several well-known mechanisms, including Van der Waals forces and adhesives bonding. If metal pads are formed on the cladding layer, diffusion bonding, solder bonding, transient liquid bonding (TLB), wire interconnect technology (WIT) can be used for attaching the ELO devices 620. In this case, the ELO device surfaces may also be coated by metal also, such as shown in an example described below with respect to FIGS. 82–89.

In order to form a three-dimensional waveguide that is optically coupled to the p-i-n waveguide of the ELO segments, core layer 24 and clad layer 23 are successively formed using the above-described liquid polymer coating steps, as shown in FIG. 77. It is desirable to adjust the core thickness be close to or less than the p-i-n semiconductor film thickness so that there is strong optical coupling to the p-i-n core layer. However, slight non-uniformities and/or perturbation in core thickness near the edge of the ELO segments will not significantly degrade the efficiency of light propagation. By using vapor phase deposition such as CVD, MLD, evaporation polymerization, the perturbation strength (i.e., non-uniformities) can also be reduced. If necessary, the surface of the deposited core layer 24 is planarized by CMP to improve its smoothness and uniformity. The CMP can be automatically stopped by a tungsten (W) film on the top of the ELO devices 620.

As indicated in FIG. 77, an upper cladding layer 23 can also be coated on the core layer 24. This has several benefits. One benefit is that it permits the core layer to be equal to or even slightly thinner than the OE device height, permitting greater design freedom and/or design freedom. Additionally, it may result in lower waveguide losses because the cladding layer 23 can be polished to a surface that has a more uniform interface with reduced optical scattering losses (e.g., a comparatively thick cladding layer deposited over a core layer 24 may be readily polished back to an optically smooth surface. Moreover, since the optical field strength is typically lower in the cladding layer 23 than in the core layer 24, optical losses at a polished surface in the cladding layer may be reduced compared to the case that the CMP polish surface is at the core/cladding interface). After the core layer 24 is cured, the optional upper cladding layer 23 is coated followed by soft and full curing. A partial cure of the core layer 24 is desirable because it can increase the adhesion strength between the core and clad layer.

As shown in FIG. 78, the core layer 24 is patterned into longitudinal waveguides and then another cladding layer 23 is formed around the longitudinal waveguides, as shown in FIG. 79. Vias and electrodes 27 are formed to the EO devices 620, as shown in FIG. 80, followed by removal of the undercladding substrate 12 and back-side processing is applied to make bottom electrodes 27 and vias, as shown in FIG. 81. However, if metallization of the substrate and under clad layer 21 is done before the thin-film device attachment, the substrate removal and back-side processing is not necessary. The active layer can be attached to another layer or substrate before removing the substrate. This is preferably for dimensional stability. If necessary, a buffer polymer layer 613 can be inserted between the substrate and cladding layer, and the metallization can be applied onto the buffer layer 613 and to the cladding layer, as is done in the embodiment shown by FIGS. 82–89 below. Device dividing is performed after ELO and metal coating.

FIGS. 82–89 show another variation in which the core layer thickness is thinner than the device thickness to reduce light scattering by the electrodes of the device. The ELO devices 620' are attached on pads formed on substrate 12, as shown in FIG. 84, which in turn are formed on a buffer layer 613 and dielectric spacing layer 614. Then, the cladding layer 21 is formed with the devices 620' in place, and then the core layer 24 is formed. The resulting structure is shown in FIG. 85). Some distortion may result in the core layer 24 in a short region disposed around the edge of each ELO device 620'. However, while this may cause some optical losses, the total optical losses will be small because of the short scattering length. To address this, CVD, MLD, evaporation polymerization, or other vapor phase deposition methods may be used in the embodiment of FIGS. 82–89 prior to forming the core to improve the smoothness of the core layer.

Next, as shown in FIG. 86, the core layer 24 is patterned using any of the methods described above, followed by the over-coating of clad layer 23, as shown in FIG. 87. Vias and electrodes are formed as described above, which are shown in FIG. 88. The device is removed from substrate 12 and attached to an appropriate component, as shown in FIG. 89.

As indicated in the discussion of FIGS. 74–81 and 82–89, the core thickness of the active device ELO segment is preferably thinner than that of other portions. This permits a high electric field strength to be obtained at a low operating voltage. Furthermore, be reducing the ELO optical core width, as shown in FIG. 67, the capacitance is reduced. This facilitates high-speed device operation.

While FIGS. 81 and 89 show vias connected to ELO electrodes, other connection methods may also be used. In particular, direct formation of electrodes connected to the E/O electrodes is another possibility.

There are many potential variations of the above described process. Referring back to FIGS. 77–79, when photo-sensitive material, which is hardened by light exposure, is used, CMP is not always necessary. Consequently, after coating the core layer, waveguide patterning can simply be carried out by light pattern exposure if the core layer was coated in an appropriate thickness. Planarization may be applied after overcladding layer is formed, if necessary. The metallization sequence may also be varied. For example, by depositing a ~3000 A thick W film on the clad surface before CMP, CMP can be performed using the W film as a CMP stop layer. In this case, the W film on the Au is unnecessary.

While one ELO technique has been discussed in detail, the present invention may be applied to any optical material or device which may be selectively lifted off from the substrate upon which it was deposited or formed. ELO can be done by GaAs substrate etching with $Al_{1-x}Ga_xAs$ etch-stop, or using AlAs etchable layer. However, the Semiconductor substrate is not restricted to GaAs. InGaAsP-related epitaxial films can also be used for wavelength of ~1.3 um and ~1.5 um applications. Other materials may also be lifted off. For example, a large refractive index film, like $TiO_2$, $WO_3$, $SiN_x$, Si etc. film can be deposited on substrates, such as Si, metal, or polymer, which may be selectively etched away, permitting these film to be embedded in the manner of the present invention. Thus, the teachings of the present invention may be applied to a wide variety of thin-film materials and devices. As one example, if a rare-metal-doped glass film is embedded, then it may act as an optical amplifier. Organic or inorganic functional films such as luminescent films, photo-refractive films, or nonlinear optical films may also be embedded. Optical delay lines comprised of high refractive index materials may similarly be embedded. The present invention thus provides a versatile way to optically integrate a variety of optical components. For example, resistors, capacitors, amplifier chips, driver chips may also be embedded. In the case of electronic elements fabricated on a silicon chip, polishing may be effective to reduce the thickness of the chip instead of ELO. The attachment of the ELO film may also include a variety of materials and processes, such as metal diffusion, AuSn bonding, Pd bonding, or solder process, WIT, TLB etc. as well as adhesive process.

All the processes and structures mentioned in the present disclosure can be applied to matrix optical switches, including wavelength switching, for XBAR switching by connecting a plurality of switch parts of transferred thin-films by polymer waveguides in a network configuration. The switching elements may comprise: internal total reflection switches, Mach-Zehnder switches, digital switches, directional couplers, and optical gate devices based on semiconductor optical amplifier, wavelength filter, or tunable filter. The method of the present invention may thus be used to realize an active substrate with a matrix optical switch function.

Referring now to FIGS. 21–30, the above active-substrate construction may be extended in many ways to construct more complex optical-electrical interconnect systems. For example, as shown in FIG. 21, the active substrates 20 described above may be horizontally attached to a backplane (or motherboard) 100, which comprises its own optical substrate 120, which is similar in construction to active substrate 20, and which may be constructed by the previously described steps. As another example, the active substrates 20 described above may be vertically attached to a backplane (or motherboard) 210, as shown in FIGS. 31–32. As yet another approach, the active substrates may be stack upon on another with interleaving "layer" of integrated circuit chips between them, as shown in FIGS. 34–36, 71, and 109–111.

Referring to FIG. 21, the horizontal attachment of the active substrates 20 to a backplane (or motherboard) 100 is first described. Backplane (motherboard) 100 comprises an active substrate layer 120 having a plurality of optical waveguides 124a–124h formed therein using a bottom cladding layer 121, a patterned defined core layer 124, and a top cladding layer 123, which can be seen in FIG. 22. For the purposes of illustration, and without loss of generality, backplane (motherboard) 100 houses four identical MCM-type active substrates 20, each of which houses four IC chips. In order to show the routing of the optical waveguides 124, two of the four active substrates 20 shown in FIG. 21 have been detached and are not shown in the figure. Backplane (motherboard) 100 comprises a plurality of vertical optical couplers (154, 156, 160) for transmitting and receiving optical signals to the MCM active substrates 20, and each of the MCM active substrates 20 previously described have been modified to replace their V-groove optical connectors 13–15 with corresponding vertical optical couplers 44 and 48. These modifications are described below after a general description of backplane (or motherboard) 100 has been given.

The positions of the waveguides and vertical couplers underneath the upper-left and upper-right MCM substrates 20 are the same as those underneath the lower-left and lower right MCM substrates 20. This is done to give the reader a view of backplane (motherboard) 100 in the cases when the substrates 20 are mounted (upper-left and upper-right positions) and when they are not mounted (lower-left and lower-right positions).

A source of light for backplane (motherboard) 100 is generated by an emitter device 136, which may be any of the light emitting devices 136 described above and illustrated in FIGS. 6–10. The output of emitter device 136 is coupled to waveguide 124a, which is routed to up to a location which adjacent to the upper-left MCM substrate 20. From this point, waveguide 124a is gradually bent in a 90° angle and is routed underneath the upper-left MCM substrate 20, and extended to pass underneath the upper right MCM substrate 20. Between emitter device 136 and the upper left MCM substrate 20, waveguide 124a passed through a horizontal beam splitter 164, which divides off a portion of the light (e.g., 50%) to waveguide 124b, which meets waveguide 124a at a right angle. The construction of horizontal beam splitter 164 is described below in greater detail after the general description of backplane (motherboard) 100. Waveguide 124b is routed to the location where the lower-left MCM substrate 20 will be placed, and further over to the location where the lower-right MCM substrate 20 will be placed. Under each location for the MCM substrates, waveguide 124b passed through a vertical beam-splitter 154, which directs a portion of the light upward toward the MCM substrate 20, where it is coupled into a waveguide 24a by a receiving vertical coupler 44 (shown in FIG. 22). The constructions of vertical beam splitter 154 and receiving vertical coupler 44 are described below in greater detail after the general description of backplane (motherboard) 100.

Waveguide 124c conveys an optical signal between the lower-left MCM substrate 20 and the lower-right MCM substrate 20. To receive the optical signal from the lower-left MCM substrate, backplane (motherboard) 100 comprises a receiving vertical coupler 160 under the terminal end of the waveguide 24h of the MCM substrate. The light signal from the lower-left MCM substrate 20 is transmitted vertically toward the surface of backplane (motherboard) 100 by a transmitting vertical coupler 48. This light is received by a receiving vertical coupler 160 of backplane (motherboard) 100, which bends the light by 90° and directs it into waveguide 124c. Waveguide 124c conveys the optical signal to a transmitting vertical coupler 156, which is positioned underneath the lower-right MCM substrate 20. Coupler 156 bends the optical signal by 90° and directs it vertically upward into a receiving vertical coupler 44 of the lower-right MCM substrate 20. Coupler 44 receives the light, bends it 90° and directs it horizontally into waveguide 24g of substrate 20. The constructions of vertical couplers 44, 48, 156 and 160 are described below in greater detail after the general description of backplane (motherboard) 100. Waveguide 124e is configured similarly to waveguide 124c and it conveys an optical signal from the upper-left MCM substrate 20 to the upper-right MCM substrate 20 in a similar manner using a similar configuration of vertical couplers.

Waveguide 124d is coupled to an optical fiber 102 at one of its ends by a conventional V-groove connector 112, and receives an optical signal on fiber 102 from an outside source. Waveguide 124d is coupled to a second receiving vertical coupler 156 at its other end, and the second vertical coupler 156 directs the optical signal upward into a receiving vertical coupler 44 of the lower-left MCM substrate 20. This vertical coupler 44 directs the optical signal into waveguide 24g of the lower-left MCM substrate 20. Optical waveguide 124f is similarly coupled to an optical fiber 103 by a V-groove connector 113 at one of its ends, and a third vertical coupler 156 at its other end. Waveguide 124f receives an outside signal from an optical fiber 103.

Waveguide 124g is coupled to a second receiving vertical coupler 160 at one of its ends. This receiving vertical coupler 160 receives an optical signal from the lower-right MCM substrate 20 and directs it into waveguide 124g. The other end of waveguide 124g is coupled to an optical fiber 104 by a conventional V-groove connector 114, and the optical signal in waveguide 124g is conveyed as an output signal of backplane (motherboard) 100. Optical waveguide 124h is similarly coupled to a third receiving vertical coupler 160 (not shown in FIG. 21 but underneath the upper-right MCM substrate 20) and an optical fiber 105 through a V-groove connector 115. Waveguide 124h conveys an output signal from the upper-right MCM substrate to optical fiber 105.

Power supply voltages may be conveyed from backplane (motherboard) 100 to the MCM active substrates 20 by conductive pads 151 and 152, as shown in FIG. 21. The power may be distributed in backplane (motherboard) 100 by conductive layers within active substrate 120. Active MCM substrates 20 are augmented to have corresponding power pads for coupling to pads 151 and 152. Backplane (motherboard) 100 may have electrical traces for conveying electrical signals between MCM modules. These electrical traces may be formed in dielectrically-isolated conductive layers with vias being formed to respective connection pads.

Instead of using optical fibers to convey optical signals to and from the MCM module or backplane (motherboard), one may use what we call "film waveguide arrays" or simply "waveguide arrays". Such a waveguide comprises a thin flexible sheet of polymer material having plurality of optical waveguides surrounded by cladding material, and usually having vertical couplers at one or both ends of the waveguides. One edge of the waveguide array is adhered to an area of the active layer 120 in such a way that its vertical couplers in its edge are aligned with corresponding vertical couplers in layer 120. Fiber array or imaging guides are also useful. The optical power supply 136 may be placed on the OE-MCM side, or it may be supplied by an external light source. In the latter case, the active substrate of backplane 120 may only have waveguides, mirrors, and grating reflectors and no OE devices.

Having generally described the structure of backplane (motherboard) 100, the constructions of the beam splitters and vertical couplers of backplane (motherboard) 100 and MCM substrates 20 are now described with reference to FIGS. 22–26. In reviewing these figures, it will be seen that the underlying base substrates 12 has been removed from active substrates 20, which enables better optical coupling of the optical signals between backplane (motherboard) 100 and active substrates 20. Base substrate 12 may comprise aluminum or silicon, quartz, glass or other removable substrate materials, for example, and may be removed by etching or other removal methods. Other etchable metals and materials may be used. In this case, a protective etch stop layer may be disposed between base substrate 12 and active substrate 20. In addition, substrate release techniques, such as those described in U.S. Pat. No. 5,258,236 to Arjavalingam et al., may be used to separate base substrate 12 from active substrate 20. These methods typically use a transparent substrate, a polymeric release layer that can be ablated by a laser beam directed through the transparent substrate, and a reflective metal layer formed over the polymeric release layer to protect active substrate 20 from the laser beam. Another approach is to use a silicon wafer with a thick aluminum top layer as substrate 12, and then laterally etch the aluminum layer from the sides of the wafer (with a protective coating on the top surface of active substrate 20) to separate active substrate 20 from the silicon wafer.

FIG. 22 shows a cross-sectional view of backplane (motherboard) 100 and the upper-left MCM substrate 20 in the region of vertical beam splitter 154 of backplane (motherboard) 100 and receiving vertical coupler 44 of substrate 20. Backplane (motherboard) 100 comprises a base substrate 12, a conductive layer 151 for providing one potential of the power supply ($V_C$ or ground), a bottom cladding layer 121, a core layer 124, a top cladding layer 123, and a second conductive layer 152 for providing a second potential of the power supply (ground or $V_C$). Layers 121, 123, and 124 may comprise the same materials as layers 21, 23, and 24, respectively, as previously described above. Also, in some cases, materials which have lower thermal stability (e.g., cannot withstand high processing temperatures like epoxy, acrylate, etc.) but which have lower optical propagation losses compared to layers 21, 23, and 24 may be used for layers 121, 123, and 124. Vertical beam splitter 154 is formed in the path of waveguide 124b, and comprises an optical grating structure 155, which may have a variety of configurations, as is well known in the art. Grating 155 comprises a periodic structure of optical material having an index of refraction which is different from that of waveguide 124b (either higher or lower). When incident light strikes the material of grating 155, a portion of the light is reflected from the surface of grating 155 to a vertical direction and a portion is transmitted through grating 155, with the ratio of the reflected and transmitted portions being dependent upon the difference between the indices of refraction of the materials of grating 155 and the core material 124, and upon the number of periods in the grating. To achieve a 90° angle between the incident light and the reflect light, at least a portion of surface of grating 155 is angled at or near 45° with respect to the path of optical waveguide 124b. The gratings 155 are spaced such that the reflections from their surfaces are nearly in phase so that the reflections from the individual gratings constructively add to build the light beam that is transmitted to active substrate 20. (The spacing is usually on the order of one wavelength of light, as measured in the materials 124 and 155). U.S. Pat. No. 5,116,461 to Lebby, et al. discloses a method for etching 45° angle trenches in polymeric material for the purpose of fabricating such grating structures. Once formed, the etched structures may be filled with material having a different index of refraction. The fractional amount of light that is reflected upwards is a function of the number of gratings and the difference in the indices of refraction, and can be computed using optical analysis known to those of ordinary skill in the art.

Any number of the known grating structures may be used, and the gratings 155 do not need to extend through the entire height of waveguide 124b. If waveguide 124b is formed form a photosensitive core material, potions of it corresponding to grating portions 155 may be removed by photo exposure using an interference pattern, such as that generated by holographic means. In a similar manner, such an exposure may be used with a photo-refractive core material. In addition, other types of periodic grating structures may be used, such as that described by U.S. Pat. No. 4,806,454. Alternately, instead of using a grating a semi-transparent mirror (e.g., a metal mirror whose thickness and/or composition is selected to achieve a controlled reflectivity) or a multi-layer dielectric filter may also be used instead of a grating to perform the same function of vertically reflecting a fraction of the light upwards.

The portion of light reflected vertically from grating 155 pass though a ball of optical "glue" material 153 to substrate 20. The optical glue has an index of refraction which is relatively close to that of core materials 124 and 24 (e.g., much closer the indices of the waveguides than the index of air, n=1). The optical glue improves transmission efficiency between backplane (motherboard) 100 and active substrate 20 by reducing the magnitudes of reflected waves. Exemplary glues are disclosed by Norio Murata in an article entitled "Adhesives for Optical Devices", the 48$^{th}$ conference of the Electronic Components and Technology Conference (ECTC, May 1998). Polyimide material can also be used. One may also form photo-refractive glues based on the photo-refractive compositions disclosed in Japanese published patent applications JP 9-157352, JP 9-090153, JP 8-320422, 7-077637 and European patent publication EP-689,067-A, which are assigned to the assignee of the present application. The self-focusing beam effect (SOLNET) described in our European patent application EP-689,067 may be used to form a vertical waveguide in the body of optical "glue" disposed between the substrates. In this process, the portion of material through which a light beam is first passed through has its index of refraction raised by the light beam, which then causes this material to be a core material while the remainder of the material serves as a cladding material. This creates a self-aligned vertical optical waveguide. The initial beam of light may be provided through one of the waveguides, or it may be provided by an external application of a writing light beam directed from one side of the optical joint. In addition, it is effective to provide light from both waveguides, or beams from both sides of the optical junction.

In addition to these possibilities, one may use many conventional bonding sheets or underfill materials to improve the optical coupling (over the case where there is no material between substrates) since these materials will have indices of refraction which are relatively close to that of the waveguides.

Vertical coupler 44 of active substrate 20 is constructed in a similar as the optical waveguide which is coupled to the output of a VCSEL device previously described and illustrated with respect to FIG. 9. An optical via 45 is formed through layers 25*a*, 25*b*, and cladding layer 21 by forming an aperture in these layers by laser drilling, laser ablation, or plasma etching (preferably after they have been cured), and then filling them with core material, usually when layer 24 is formed. Then, mirror structure is formed by forming a bevel surface on the waveguide as previously described, and thereafter forming a layer of reflective metal or reflective material over the beveled surface. In some cases, the optical vias are not needed, such as when the optical absorption coefficients of layers 25*a* and 25*b* are sufficiently low. An anti-reflection (AR) coating may be deposited on the surfaces of the substrate to reduce reflection of light.

FIG. 23 shows a cross-sectional view of backplane (motherboard) 100 and the upper-right MCM active substrate 20 in the region of where optical waveguide 124*e* meets a vertical coupler 156. The vertical coupler 156 comprises a layer 158 of reflective metal formed on a beveled edge of a portion 157 of a material layer. The bevel may be formed by laser ablation (with the laser at a 45° angle tilt to the material layer), by laser assisted plasma etching (again with the laser as a 45° angle tilt, see for example U.S. Pat. No. 5,116,461), by plasma etching with a tilted substrate, ordinary plasma etching with a tapered mask, or tilted lithographic exposure (see for example Japanese patent JP 96-262265). A preferred laser ablation method for forming beveled cuts is described in greater detail below with respect to FIGS. 90–101.

Vertical coupler 156 can be formed in-situ and can be incorporated in the processing steps for forming active substrate 20 previously described above and illustrated in FIGS. 11–18. Such exemplary steps are provided below after the other optical couplers are described.

FIG. 24 shows a cross-sectional view of backplane (motherboard) 100 and the upper-left MCM active substrate 20 in the region of where optical waveguide 24*h* of the active substrate 20 terminates in a transmitting vertical coupler 48, which is over a receiving vertical coupler 160 of backplane (motherboard) 100. Transmitting vertical coupler 48 has the same construction as receiving vertical coupler 44 shown in FIG. 23, except for the orientation of the mirror layer 46. Receiving vertical coupler 160 has the same construction as transmitting vertical coupler 156 shown in FIG. 23, except for the orientation of mirror layer 158. It is also noted that instead of using couplers 156 and 158 on the backplane (motherboard) side, one may use couplers 44 and 48 on the backplane (motherboard) 100.

It is noted that the grating structure of vertical beam-splitter 154 may be used in place of any of vertical couplers 156, 160, 44, and 48, with an appropriate orientation of the gratings 155. In these structures, the reflected light may be increased over the transmitted light by selecting materials that have a large difference in their indices of refraction. Alternately, to achieve complete reflection, a mirror can be used instead of beam-splitter 154.

FIG. 25 shows a top plan view of horizontal beam-splitter 164, and FIG. 26 shows a cross-sectional view thereof. Its construction is similar to that of vertical beam-splitter 154 except that the gratings are placed in a different orientation, as shown at 165. Gratings 165 are easier to form than gratings 155 since gratings 165 are not tilted with respect to the surface of core layer 124. A simple anisotropic plasma etch or laser ablation of core layer 124 using a metal or photoresist mask (plasma etch only) or dielectric multilayer mirror (laser ablation only) may be used to form the apertures for gratings 165.

Referring now to FIGS. 90–108, a preferred laser ablation method for forming a beveled cut using a laser tilted at a 45° tilt angle impinging upon a shadow mask is shown in FIGS. 90–101. The preferred bevel cut method permits beveled mirrors to be fabricated which may be aligned to any preferred waveguide orientation. Moreover, the preferred bevel cut method permits different bevel cut orientations to be patterned on the same wafer.

In a first step, as shown in FIG. 90, a metal or dielectric ablation mask layer 810 is deposited on a polymer waveguide substrate 20 having cladding and core sub-layers, and optionally other components described herein. The ablation mask layer 810 is lithographically patterned with apertures 811 where all of the mirrors will eventually be formed. To reduce the number of lithographic patterning steps required, additional metal shadow masks 820-1, 820-2, 820-3, and 820-4 are used to select which apertures are ablated at a particular cut orientation. The shadow masks 820 preferably block, or obscure, a fraction of the apertures 811. Preferably, the shadow masks 820 have apertures 821 slightly larger than the lithographic apertures 811 which are to be ablated in a particular ablation step. A shadow mask 820 may be in direct contact with the wafer surface or placed slightly above the wafer surface.

To form a first bevel cut step, a metal shadow mask 820-1 is placed over the wafer to protect a desired fraction of the lithographically patterned apertures 811 from exposure. Referring to FIG. 91, the substrate 20 and laser 830 are oriented with respect to one another so that one edge of each exposed lithographic aperture 811 is uniformly shadowed by the ablation mask 810 during exposure of the polymer layer by the excimer laser beam 830 whereas the opposite edge of the aperture is undercut. That is to say, in the aperture of an exposed ablation mask a profile of constant illumination intensity as a function of depth in the trench forms a parallelepiped shaped region wherein the tilt of the parallelepiped relative to the surface normal of the trench is a function of the tilt angle of the laser. To form mirror surfaces, the substrate 20 and laser beam 830 are oriented at angle with respect to one another, including refraction and diffraction effects, to form aperture sidewalls which have an angle of approximately forty-five degree (45°) relative to the surface normal of the bottom of the waveguides (i.e., the top and bottom surface of the waveguides). The laser beam is scanned over the surface of shadow mask and substrate, such as by moving the laser beam or the substrate, or by a combination of moving both. We have called this scanning method "moving neon ablation", or NMA, method, although other types of lasers may be used. The laser exposure forms a parallelepiped-shaped trenches 840 in non-shadowed apertures with a forty-five degree side-wall angle on two of the walls as a consequence of the shadowing effect of lithographic mask layer 811, as shown at 840-1 in FIG. 92 where shadow mask 820-1 has been removed. The process may be repeated by placing changing the orientation angle between the surface normal of substrate 20 and laser 830, placing a second shadow mask over the surface to expose other apertures and then appropriately orienting the sample in another direction. (To distinguish these directions in the figures, we has assigned four directions 1–4 at the edges of the substrate.) For example, in order to form beveled cuts on the other two side walls, the sample may be rotated ninety degrees while keeping laser 830 fixed (as shown in FIG. 93, and then exposed again using a different shadow mask 830-2, as shown in FIG. 94. The resulting angled trench is shown at 840-2 in FIG. 95 By repeating the process, mirror surfaces with an arbitrary cut orientation and positions may be formed. This is shown by FIGS. 96–101, where two additional ablation steps using two additional shadow masks 820-3 and 820-4 are shown with corresponding trenches 840-3 and 840-4.

The same ablation process may be modified to obtain vertical sidewalls as well. Orientating the beam normal to the surface of the ablation mask will result in no shadowing. Consequently, the laser light will enter the aperture at a normal angle. This is shown in FIGS. 102–104, where shadow mask 820-4 has been used to form vertical sidewall cuts rather than angled sidewall cuts.

As is known in the field of integrated optics, vertical sidewalls may be used to form reflective surfaces to deflect a waveguide mode into another co-planar waveguide formed from the same active layers but oriented along a different direction, as shown in FIGS. 105 and 106, which are top plan and cross-sectional views of a corner turning mirror 850. This is useful, for example, in forming corner turning mirrors in a which a forty-five degree reflective surface is used to horizontally deflect the waveguide mode by a reflection angle of ninety degrees. As is well known in the field of integrated optics, the efficiency of a corner-turning mirror is strongly dependent upon how vertical the mirror surface is. A mirror surface that deviates even a few degrees from a true vertical surface has a significantly reduced efficiency. Thus, while RIE may be used to form a corner turning mirror, a laser ablation method is a preferred method because of its potentially smoother and more vertical mirror surfaces.

Referring to FIG. 105, light in a first waveguide section 851 reflects against a forty-five degree mirror surface 850 into a second perpendicular waveguide 852. The mirror preferably comprises a portion of the waveguide that is etched normal to the wafer surface. The etched surface is preferably etched all of the way through the core layer 24 and cladding layer 23 in order to achieve substantially complete reflection of light from first waveguide section 851 to second waveguide section 852. However, if less than complete reflection is desired, the mirror may only be partially etched through the outer cladding so that the effective reflection coefficient is reduced. As shown in FIG. 106, after the polymer cladding and core layers 23 and 24 are ablated, the side walls may also be coated by a reflective metal mirror surface 853, followed by deposition of the overcladding layer. The substrate may later be removed, if necessary.

A variety of different mask structures may used in a laser ablation process. In addition to a metal mask, a reflective multi-layer dielectric mask, may also be used. A multi-layer dielectric mask may comprise materials with a low optical absorption at excimer laser frequencies. Additionally, the dielectric constants and layer thickness of a multi-layer dielectric may be selected so that the mask efficiently reflects light at the excimer laser frequency. Generally, any mask that ablates at a significantly slower rate than the polymer layer may be used. A multi-layer dielectric lithograph mask is preferable, since its can be relatively thin, thus improving edge resolution. A laser ablation process preferably includes means to translate the beam relative to the sample to expose an large area. Any common technique may be used for this purpose, such as a movable stage or optics to scan the beam. While an excimer laser is a preferred laser, other ultraviolet lasers, such as the THG-YAG or FHG-YAG laser may also be used. An ablation gas, such as He, can be used for the carrier.

Many of the same principles may be used in a reactive ion etching (RIE) process. An RIE mask may be deposited and patterned on the surface of the substrate to form apertures. Additional shadow mask may then be used to protect some of the apertures from RIE. Directional RIE at oblique angles has ions impinging upon a substrate. Shadowing of ions will occur in a similar manner from a mask, thereby producing tilted sidewalls. Thus, the above process in FIGS. 90–104 may be repeated using an RIE process in place of a laser beam.

FIGS. 107 and 108 are top plan and cross-sectional views of another embodiment of a waveguide coupler with forty-five degree waveguide mirrors. A waveguide cladding layer 21, such as Fluorinated polyimide, is first deposited on a removable substrate, such as an Aluminum substrate. The core layer 24 is then deposited. The core layer 24 is patterned into waveguides. An overclad layer 23 is deposited over the patterned core layer 24. The core layer 24 and clad layers are then patterned using RIE or laser ablation to form mirror/coupler surfaces. The surfaces are then metalized, as shown at 853. The substrate is then removed. The substrate removal can be done after the film is attached to another board or film. Other variations, such as forming electrical contact pads and vias may also be performed before the substrate is removed. Optional buffer and passivation layers may also be added. If desired, the mirror may also be formed after the core layer 24 is formed prior to deposition of the overcladding layer 23.

Referring now to FIGS. 27–30, as mentioned above, the fabrication of vertical couplers 156 and 160 shown in FIGS. 20–26 may be easily incorporated in the fabrication steps for making optical switch 26 previously described above and illustrated in FIGS. 11–18. The additional steps are illustrated with respect to FIGS. 27–30. Referring to FIG. 27, at the same time of forming bottom electrode 27 for switch device 26, a bottom metal patch 159 is formed for the vertical coupler. Metal patch 159 serves as a barrier layer to a subsequent laser drilling, laser ablation, or plasma etching process, and is located mainly where a laser beam in this subsequent etching step will hit layer 121. Next, material layer 157 (the same as layer 626) is formed, and then a top metal mask layer 161 is formed which has apertures where the beveled cuts will be made. A angled etch is then performed to form an angled aperture 162 and the beveled edge for the vertical coupler. The angle etch may be performed by the previously-described steps of laser ablation, moving neon ablation (MNA) (previously described in regards to FIGS. 90–104), laser assisted plasma etching with tilted laser, or by plasma etching with tilted substrates or ordinary plasma etching with a tapered mask, etc. Layer 161 acts as etch mask for this step by providing the aperture through which the laser light will pass and strike layer 626 to form the angled trench. In the case of MNA, the second masks are used, and repeated ablation with changing angles may be performed. If the material is photosensitive, the angle cut may be defined by exposing the substrate to actinic radiation (whose beam direction is tilted with respect to the substrate surface), followed by developing the image. A blanket exposure to actinic radiation may be done since layer 161 acts as a portable conformal mask (PCM). The result of these steps is shown in FIG. 27.

Referring to FIG. 28, layer 161 is then removed, and the combined etch-stop/polish-stop layer 627 is formed over the surface of the substrate, as in the previously described process. Next, the mirror metal 158 for the vertical coupler is formed over layer 627, and then both layers are defined simultaneously by a standard pattern etched step through a patterned photoresist layer. The substrate is then subjected to a standard plasma etching process, as in the previously described method, which selectively etches polymeric material anisotropically. Such plasma etches are well known to the art. The result of these steps is shown in FIG. 28. Next, core layer 124 is formed over the substrate and cured, as shown in FIG. 29. Finally, the structure is polished by chemical mechanically polishing, as in the previously described method. The result is shown in FIG. 30. Typically, the top-most portions of mirror metal 158 are more easily removed than the polish-stop layer 627. The processing of the substrate then resumes with the previously describe steps after the polishing step (FIG. 15). As an optional step, top cladding layer 123 may have an aperture formed above the beveled mirror section and filled with the same material as core layer 124b. In general, it is not necessary to etch cladding layer 123 in those locations where the light is reflected vertically from the core material because the exiting light strikes the cladding layer at nearly a 90° angle, which is greater than the critical internal reflection angle. However, there is some amount of reflected light, and corresponding loss of efficiency, when there is a portion of cladding layer above the mirror, and this amount increases as the difference in indices of refraction increases.

It is desirable to have process variations which reduce the waveguide losses associated with any optical scattering associated with interface roughness at the CMP polishing surface. In the core layer coating step shown in FIG. 29, an optional clad layer can be coated on the core layer in order to improve the interface smoothness proximate to the core layer. After the core layer is cured (partially or fully), the optional cladding layer is coated followed by soft and full curing. If the core layer thickness is a little bit thinner than OE device height, the polishing plane will lie in the optional cladding layer above the core layer. This two-layer approach may improve the interface flatness between core and clad layer, since the optional cladding layer may be polished to a common plane resulting in a potential reduction in optical scattering losses. Additionally, the polishing plane may lie a significant distance in the cladding layer (e.g., more than a few thousand Angstroms) so that the optical intensity at the polished surface is reduced, further reducing scattering losses. It may thus be preferable to select the thickness of the core layer to be close to or less than the OE device/material height excluding the top metal since this permits the thickness of the optional cladding layer to be determined by the selection of the top metal thickness. Alternately, optical scattering losses may be reduced if the CMP process is applied after over cladding layer formation not after core layer formation. Another approach is to not perform CMP processing on either the core layer or the top cladding layer. This results in a non-planar surface, which can be planarized, if needed, by forming a planarizing layer over the top cladding layer and then performing CMP processing on the planarizing layer.

The fabrication process may also be further modified to eliminate CMP polishing steps which may introduce optical scattering losses at key interfaces. When a photo-sensitive material, which is hardened by light exposure, is used to pattern the waveguides, CMP is not always necessary. After the step shown in FIG. 29, waveguide patterning can be carried out by light pattern exposure if the core layer is coated in an appropriate thickness of a photo-sensitive material, that is, close to or less than the OE device/material height excluding the top metal. Although the patterned waveguide may traverse a portion of the 45-degree-surface of the reflector, this will not significantly interfere with its function in reflecting the guided light. Additional planarization layers may be applied after the overcladding layer is formed, if necessary.

The step of forming the beveled mirror surface may be performed after the top cladding layer is formed over the core layer. In this case, complete reflection is expected since the evanescent wave can be reflected. That is to say, the mirror surface can be etched through the upper cladding and core layers at least through part of the undercladding layer so that the entire optical mode intercepts and reflects from the mirror surface. As is well known in the field of integrated optics typically a small percentage of the optical mode power exists as an evanescent "tail" in the cladding regions. Thus, the efficiency of the mirror in reflecting mode energy is improved, somewhat, if the mirror surface extends through the upper and lower cladding layers.

The interconnection substrates having active layers may also be mounted vertically to a backplane (or motherboard) with optical signals being transmitted/received at the edges of the interconnect substrate, and being received/transmitted at the surface of the backplane (or motherboard). An embodiment of this configuration is shown at 200 in FIGS. 31–32, where a plurality of OE-MCM substrates 10" are mounted vertically to a backplane (motherboard) 210. MCM substrates 10" are fabricated in the same manner as MCM substrates 10 and 10' previously described, except that most of the waveguides which covey incoming and outgoing signals to the MCM substrate 10" are routed to the edge of the substrate which abuts backplane (motherboard) 210. Backplane (motherboard) 210 comprises a base substrate 212, an active layer 120", and a plurality of waveguides 224a–224g formed in active layer 120". Waveguides 224a–224g are used to covey optical signals between the MCM substrates 10". When optical switch devices (e.g., modulators) are used to transmit optical signals instead of light-emitting devices, external light power source are used. To provide external light sources, one example is to use an optical power source board 280 which interfaces to backplane (motherboard) 210 in the same manner as MCM substrate 10". In this case, waveguides 224a–224g may also convey sources of light power which are provided by optical power source board 280. Power source board comprises a plurality of laser diodes LD whose outputs are routed onto waveguides of board 280, which in turn are routed to the edge of the board where it abuts to backplane (motherboard) 210. The outputs of two or more laser diodes LD may be combined by a Y-combiner to increase the power level in such a waveguide and/or to add or multiplex light of two or more wavelengths on the same waveguide. This is shown by the middle two laser diodes LD on board 280. Multiple wavelengths of light can be separated from one another by grating filters, which are constructed in the same way as the grating beam-splitter described above. In some cases, it may be realized by forming dielectric multi-layer filters instead of metal reflective layers. Demultiplexing of the multiple-wavelength signals may be performed on the MCM or on the backplane (motherboard). Board 280 may be constructed in the same way as MCM substrates 10 and 10'.

Vertical couplers, such as coupler 160, are located within active layer 120" of backplane (motherboard) 210 to couple optical signals between waveguides 224a–224g of backplane (motherboard) 210 and the waveguides of OE-MCM substrates 10" and power source board 280. (Other optical couplers may be used, such as couplers 154 and 156 shown in FIGS. 22–23, or the same type of couplers 44 and 48 in which the mirror is formed on the end portions of the core and cladding layers). FIG. 32 shows a cross-section of the system configuration 200 in a region where the front-most OE-MCM substrate 10" abuts against backplane (motherboard) 210. For visual simplicity, FIG. 31 omitted the details of how the substrates 10" were abutted to backplane (motherboard) 210; FIG. 32 shows an example of those details. One will first seen that the active layer 20" of MCM substrate 10" has been separated from the base substrate 12 along the edge where substrate 10" abuts backplane (motherboard) 210. This configuration provides several benefits. First, it enables the base substrate 12 of substrate 10" to be firmly held by a receptacle 225 without damaging the waveguides at the end of substrate 10". Second, it enables electrical traces 30' on the top surface of substrate 12 to be routed to the edge of the substrate and mechanically coupled to a conventional electrical connector 226 in receptacle 225. Thus, there is no need to form vias though substrate 12. (If substrate 12 comprises a multi-layer electrical substrate, then vias are usually present.) Each electrical signal on a connector 226 is routed to a corresponding connection pad 232 of backplane (motherboard) 210 by a respective wire 227 and connection pad 228. Connection pads 228 and 232 are soldered together, which conveys the electrical signals, ground, and power, and which also serves to attach receptacle 225 to backplane (motherboard) 210.

As a third benefit, the separation of active layer 20" from substrate 12 enables the waveguides in layer 20" to be more accurately aligned to the vertical couplers (e.g., 160) in layer 120" of backplane (motherboard) 210. Oftentimes substrate 12 has a few microns of warpage; such warpage could cause large misalignments between the waveguides and the vertical coupler. A second receptacle 235 is adhered to the top surface of backplane (motherboard) 210, and is more accurately positioned with respect to the vertical couplers (e.g., 160) in backplane (motherboard) 210. When MCM substrate 10" is inserted into receptacle 225, the flexibility of active layer 20" enables it to be guided into second receptacle 235, and therefore into very accurate alignment in the X-axis direction with the vertical couplers (see FIG. 31 for the coordinate system definition). A standoff bridge 237 is used on MCM substrate 10" to maintain separation of layer 20" from substrate 12 in the X-direction. To achieve accurate alignment of the waveguides to the vertical coupler in the Y-direction, receptacle 235 may comprise a slot 239 (see FIG. 32) whose length is parallel to the Z-direction, and MCM substrate 10" may have a key 238 dispose on the top surface of active layer 20" and which fits snugly within slot 239. To achieve good optical coupling in the Z-direction, a small amount of optical glue or liquid refractive material may be disposed in the bottom of receptacle 235 and dried to a viscous or tacky state, and the end of active layer 20" may then contact the layer of optical glue and be adhered thereto. By directly contacting the edge of active layer 20" to layer 123, optical glue may no longer be needed to achieve substantially the same degree of good optical coupling. If necessary, anti-reflection coatings may be applied on the edges of active layer 20" and 123 to improve the optical coupling between these surfaces.

It may be appreciated that conventional optical couplers may be used to couple the waveguides from MCM substrate 10" to backplane (or motherboard) 210. This type of connection is convenient because it permits commercially available connectors to be used. In this case, two more connections per waveguide are needed, which increases the optical loss because of the optical insertion loss of the couplers. Referring to FIG. 32, a first waveguide connector could be attached to the edge or at the surface of active layer 20" whereas a second surface normal connector could be attached to the surface of layer 123 proximate to vertical coupler 160. The first and second connector may be coupled together. However, there are optical losses associated with the transitions at each waveguides/connector interface and also at the connector/connector interface. It may also be appreciated that optical signals and optical power sources may also be provided to MCM substrates 10" by optical fibers 102, film waveguides, optical fiber array, or imaging guides, which are coupled to waveguides in the active layers 20" of substrates 10" by conventional V-groove connections 112 or surface normal connectors.

While the active layers 20" and 120" have been shown as being directly constructed on their respective substrates 12 and 212, it may be appreciated that they can be constructed separately and then bonded to respective substrates or printed circuit boards. The embodiment is shown in FIG. 32-1. This approach enables one to use different technologies for constructing the electrical interconnections and the optical interconnections. It also make it easy to separate active layer 20" from substrate 12 at the edge where MCM substrate 10" abuts to backplane 120. In the case of the FIG. 32 where active layer 20" is built up on substrate 12, a sacrificial patch of material may be disposed on substrate 12 along the edge where layer 20" is to be separated from substrate 12, and so disposed before active layer 20" is formed. After layer 20" is formed, the sacrificial patch is etched away laterally from the edge.

Referring now to FIGS. 33–37 for additional embodiments of the inventions based on the active substrate technology, IC chips may be encapsulated in a dielectric film with contact pads formed on the film surface for attachment to an active substrate. This enables the stacking of the alternating IC chip layers and active substrate layers to form a 3-d multichip module with both electrical and optical interconnects.

FIG. 33 shows a schematic cross-sectional view of a chip layer 350 attached to an active substrate 320. In the example shown, two chips 351 and 352 are encapsulated in a dielectric film, and the active substrate 320 comprises a VCSEL emitter device 336 and a photo-detector device 328. The chip layer 350 may be laminated to the active substrate 320 by an anisotropic conductive film 302. Such films are well known to the art. The VCSEL emitter device 336 is controlled by chip 351, and transmits an optical signal to a vertical coupler 344 in the active substrate 320. A waveguide 324a is coupled to the vertical coupler 344. Waveguide 324a conveys the signal to a transmitting vertical coupler 348, which directs the light signal to photo-detector device 328. The electrical outputs of the photo-detector device is coupled to circuitry on second chip 352. Chip layer 350 and active substrate 320 also convey electrical signals to one another through opposing contact pads 332, and may have electrical traces 330 and electrical vias 333. The contact pads 332 are coupled to one another through spheres of conductive material that is dispersed in anisotropic conductive film 302. The electrical connection provided by pads 332 is often called a Z-axis connection because the connection is made vertically, rather than in the plane of the substrate (which would be the x- and y-axes).

For the sake of visual simplicity, the structure of the active substrate has only been shown schematically with the understanding that the basic layer structure is the same as that shown in previous embodiments, and that the active substrate may be constructed with the previously described construction steps. In addition, the relative sizes of the active components to the chip and pads are not to scale. The VCSEL and photodetector (PD) are shown larger than in constructed configurations. An exemplary detailed structure of the IC chip layer and exemplary constructions steps are provided below.

Instead of joining IC chip layer 350 to active substrate 320 with a layer of anisotropic conductive material, one may use an adhesive bonding sheet. In order to join the electrical pads 332 of layer 350 to the pads 332 of substrate 320, holes are made through the bonding sheet (such as by pre-punching) in the locations of the pads, and conductive bonding material is disposed on one set of pads. Substrate 320 and layer 350 are then laminated together with heat and mild pressure. One may also use the multilayer lamination process described in U.S. patent application Ser. No. 09/192,003, filed Nov. 13, 1998, entitled "Multilayer Laminated Substrates with High Density Interconnects and Methods of Making the Same," assigned to the assignee of the present application, and invented by Messrs. Hunt Jiang, Tom Massingill, Mark McCormack, and Michael Lee. In addition, one may also use the gas-less solder paste described in U.S. patent application Ser. No. 09/203,126, filed Dec. 1, 1998, entitled "Conductive Composition," assigned to the assignee of the present application, and invented by Messrs. Mark McCormack, Hunt Jiang, Solomon Beilin, Albert Chan, and Yasuhito Takahashi for the conductive bonding material used in the holes of the bonding sheet. (For diffusion bonding of two metal pads together in a Z-connection, the method newly invented by Messrs. Kuo-Chuan Liu and Michael G. Lee and described in yet to be filed patent application Ser. No. _____, entitled "Transient Liquid Alloy Bonding," (TBL) and assigned to the assignee of the present application, appears to be useful in the structures of the present application.) The Z-axis connection of pads 332 can also be done by solder joint or by metal diffusion joint. Metal diffusion joints are especially useful for making fine Z-connections (i.e., small Z-connections). In addition, the wire-interconnect structures (WITs) disclosed in U.S. Pat. No. 5,334,804, to Love, et al., and assigned to the assignee of the present application, may also be used, preferably with an underfill material. Any of the above methods and materials may be used to join various substrates together in the previously-described embodiments, and in the embodiments still to be described below in the present disclosure. An underfill material can also be used instead of a bonding sheet for solder joints, metal diffusion joints, TLB joints, or WIT connections.

Additional IC chip layers 350 and active substrate layers 320 may be stacked upon one another and connected to one another by additional anisotropic films 302 or bonding sheets or other Z-connection methods, as shown in FIG. 34. The active substrates 320 which are within the stack are preferably separated from the base substrate 12 used to construct them, which may be done by any of the above-described substrate separation methods. Some of the vias 333 of the layers 350 and substrate 321 may be stacked upon one another to convey ground and one or more power supply voltages to all of the layers, and to covey electrical signals from one chip layer 350 to another chip layer 350. An advantage of using a bonding sheet, or the multilayer lamination process developed by Hunt, et al., or other Z-connection methods except for those using anisotropic conductive sheets, is that optical signals may be transmitted vertically between an active substrate 320 and an IC chip layer 350 without being blocked by the conductive spheres or opaque material that is often used in anisotropic conductive films. The optical Z-connections are not shown in the figure; they can be readily realized by waveguide couplers, such as couplers 344 and 348.

The waveguides and the other active components of active substrate 320 may be fabricated in separate layers, as shown in FIGS. 35–36. In this example, the active substrate has been divided into a waveguide layer 320a and active-component layer 320b. Layers 320a and 320b are joined together by an adhesive bonding sheet 302' as described above, or by the multilayer lamination process by Hunt, et al., or by solder jointing, metal diffusion bonding, TLB bonding, or WIT connection. In the case the solder joints, metal diffusion bonded joints, TLB bonded joints, or WIT connections are used, one can also use a conventional underfill in place of the bonding sheet.

FIGS. 37-1 through 37-4 shows schematic diagrams of various ways light emitter devices (e.g., VCSELs) and switch devices (e.g., light modulators) may be incorporated in multiple layers. In FIG. 37-1, two waveguides in two separate layers are optically coupled (optical Z-connection) to one another through a transmitting vertical coupler and a receiving vertical coupled, each of which are attached to ends of corresponding waveguides. A light modulator device is placed between in the optical path between the two vertical couplers, and is encased in a separate layer. The light modulator device comprises a body of EO material (or electro-absorption (EA) material) and two contacts made to respective surfaces of the body. The body of EO (or EA) material may comprise an individual chip which is set during manufacturing of the layer, or the body may be formed in situ, such as was done for the EO material of switch device 25 shown in FIGS. 11–18. FIG. 37-3 shows the same configuration except that the bottom waveguide has been replaced by an emitter device (e.g., VCSEL). In both of these examples, the layer are built upon one another by a build-up fabrication process without the use of bonding sheets and Z-connection methods. However, if necessary or otherwise desirable, the three layers may be separately manufactured and joined together with bonding sheets, or underfill and solder joints, metal diffusion joints, TLB joints, or WIT connections. An example of this is shown in FIG. 37-2, which provides the same optical connectivity as the layer configuration in FIG. 37-3. Finally, FIG. 37-4 shows an emitter device on one layer which couples into a waveguide on a second layer without an intervening light modulator device. In the above examples, contacts to the opto-electronic devices may be routed to the bottom surface of the layer using vias. Conversely, in the examples of FIGS. 33–36, at least part of these layers can be built upon one another by a build-up fabrication process. Generally, any of the stacked structures of the present invention may be fabricated by a build-up process.

In embodiments where layers are separately manufactured and then assembled, as an option, one may use photo-refractive underfill materials or photo-refractive bonding sheets between the individual layers. With such an under fill, one is then able to form vertical waveguides through several stacked layers of components and underfill by using the SOLNET waveguide formation process described in European patent application publication No. EP-689,067-A, which is incorporated herein by reference, and which is assigned to the assignee of the present application, and which has Japanese priority patent applications JP 94-140502, JP 94-200974, JP 94-204922, JP 95-59240, and JP 95-61092. In this process, a light beam is focused on the location where the vertical waveguide is to be formed, and the photo-refractive material increases its index of refraction in response to the beam.

In FIGS. 33–37, only one light emitting device (VCSEL) and only one photo-detector device or light-modulator (switch) device have been shown for visual simplicity. Typical applications of the present invention will have several or a number of such opto-electronic devices. Instead of VCSELs, photodetectors, and optical switches, one can use driver-integrated VCSELs, driver-integrated switches (modulators), and amplifier-integrated photodetectors, respectively. In such cases, additional pads for power supplies and ground may be needed, as previously described. Chips 351 and 352 can be VCSEL driver and/or amplifier. IC chip layers can be stacked on each other. For example a first IC chip layer for processors chips stacked upon a second IC chip layer for drivers and amplifiers, which is then stacked upon and active substrate provides a structure where outputs and inputs of the first chips layer are provided drivers and amplifiers in the second IC chip layer, which in turn coupled to OE devices in the active substrate. In this case, the connection pads of the drivers and amplifiers can be made to face the pads of the first IC chip layer. It may be possible to make vias through driver/amplifier thin film chip. Or the chip may be divided into small pieces corresponding to VCSEL and photodetectors forming vias in surrounding polymer layer. It may also be possible to user ordinary die chip (not film) for the processor. In this case a structure such as a processor die/driver amplifier IC layer/and active substrate is constructed. In FIGS. 110 and 111 shown below, the same situation is possible. The driver/amplifier chip described above may comprise circuits such as driver circuits, amplifier circuits, bias circuits, temperature stabilizing circuits, (clock) skew compensation circuits, timing circuits, and other applicable circuits. It is also possible that chips (including driver/amplifier chips and or processor/memory chips) and OE-devices (such as VCSEL, photodetectors, and others) can co-exist in the same layer in FIGS. 33–37 and 110 and 111.

The chips in the chip layer can be thin film driver/amplifier chip with vias or divided thin film driver/amplifier chip. The structures shown in FIGS. 33–37 and 110–111 can be applied to all the embodiments described in this application, including FOLM and OE-MCM.

In addition, while non-branched waveguides have been shown in these figures for visual simplicity, typical applications will have branched waveguides, as previously illustrated in prior figures. The waveguides can be multiple-layer structures if the connection density is high. Generally, in all of the embodiments of the present application, multiple-layer waveguides may be used, as required, if the connection density is high.

The multiple-layer structure can be fabricated by a building-up process or by a z-connection process. In some applications, the waveguide from switch devices (e.g., modulators) and/or light emitting devices (e.g., VCSELs) may be connected to external optical fibers, or to fiber arrays, or fiber imaging guides, or external thin films which carry a plurality of waveguides. We call the latter three external components "film waveguide arrays" or simply "waveguide arrays". These optical fibers and waveguide arrays convey light signals away from the systems created by the laminated components shown in FIGS. 33–37. In a similar manner, these external optical fibers, fiber arrays, fiber imaging guides, and waveguide arrays can convey optical signals to photo-detector devices in the active layers. In each case, the optical fiber, fiber array, fiber imaging guides or waveguide array is attached to a system layer at a place where it is optically coupled directly to an internal waveguide or to a vertical coupler or beam splitter. A waveguide array may be coupled to one of layers 320, 320*a*, 320*b*, or 350 by forming this layer to have a tab portion at one of its sides which extends past the dimensions of the laminated stack, and this attaching the external waveguide array to the extended tab. Surface normal connections can be used for the bottom and top layers. An additional benefit of this structure is that unoccupied gaps between the layers 320, 320*a*, 320*b*, 350 may also be used as channels for a coolant gas or liquid to flow through the structure.

An exemplary method for constructing IC chip layer 350 is illustrated in FIGS. 38–45. Referring to FIG. 38, the vias through IC chip layer 350 are first formed by taking a temporary substrate 412, and forming via posts over its top surface. Any of the previously described methods of attaching and removing temporary substrates may be used (see U.S. Pat. No. 5,258,236 to Arjavalingam et al.). The via posts may be formed by electroplating or by sputtering, or by other methods. In the electroplating formation method, a temporary seed layer is sputtered over the surface of substrate 412, a thick photoresist layer is then formed over the substrate surface and patterned by lithographic pattern exposure and pattern development, as is well known to the art. Via apertures are thereby formed, and conductive material is then plated into the via apertures by any conventional electroplating method. Copper material is currently preferred, but other metals may be used. One preferably plates the conductive material to a greater thickness (or height) than needed in the final structure. In a sputtering method, a thick layer of conductive material is sputtered over the entire surface of the substrate. A photoresist is then formed over the sputtered layer, and then patterned exposed and developed to leave portions of photoresist over those locations were the vias will be formed. The remaining exposed portions of the photoresist layer are then etched away. After the etch, the remaining photoresist is removed.

As the next step in each of the via formation processes, the photoresist layer is removed, and the plating seed layer may be removed. As a variation to the basic method of forming IC chip layer 350, the seed layer may be retained and used in a later processing step to form the electrical traces on the bottom surface of layer 350. The seed layer may also be patterned at this general stage of the method to define the electrical traces 330 and interconnection pads 332 at the bottom surface of the IC chip layer 350. In this latter case, the seed layer is made to be relatively thick, such as by depositing additional conductive material by a blanket electroplating step. After the via posts have been formed in the photoresist layer, the photoresist layer may be pattern exposed and developed a second time (for a positive photoresist) to define the traces and pads to be formed at the bottom surface. This pattern step removes the positive photoresist in those locations where traces, pads, and vias are not to be formed. This second patterning step exposes the unwanted seed layer, which is then etched away by a suitable chemical etchant. The remaining photoresist is then removed. The definition steps of the thick seed layer may be delayed to a final step, as described below. As is well known in the art, a photoresist layer is sometimes exposed to a soft-bake step after being patterned exposed in order to improve the image. As a cautionary note, such post-exposure baking operations can reduce the amount of photo-initiator in a positive photoresist if the temperature exceeds an amount specified by the manufacturer. Thus, in order to have an effective second exposure, the critical temperature of the photoresist should not be exceeded in any soft-bake step after the first pattern exposure. In the case that this is not possible, and also in the case that a negative photoresist have been used, one may pattern the photoresist layer by anisotropic plasma etching through an etch mask.

Referring to FIG. 39, the next step in the process is to attach the IC chips 351 and 352 to the surface of the temporary substrate 412. To do this, a thin polymeric adhesion layer 414 may be formed over the surface of substrate 412 by spin coating. Chips 351 and 352 (or active components) are then set in place and adhered to layer 414. Layer 414 may be soft-baked to increase its tackiness, and to reduce the amount of solvent evolution in a subsequent cure step if the material of layer 414 requires curing and contains solvent. This chip attachment step is the same step used in the previously-described method for forming active substrate 20 (FIGS. 11–18), and the reader may refer there for further details. If the seed layer in the previous step has been retained, either in whole or in patterned form, then it is preferable that a thin chromium adhesion layer be formed over the seed layer before layer 414 is formed. Such an adhesion layer is also preferred if material 414 has an unacceptably poor adhesion to the particular material of substrate 412. As another approach for attaching chips 351 and 352, a metal pad may be formed on the seed layer, and the back surfaces of the chips are coated with metal. The chips may then be attached by the previously described metal bonding and TLB methods, as well as by conventional soldering. By the time layer 350 is completed, the metal pads at the back surfaces of the chips should be electrically isolated from signal lines on the bottom surface of layer 350 (but a coupling to a fixed ground or bias potential may be used if required by the electrical circuit).

Since a subsequent polishing process is going to be used, chips 351 and 352 preferably have electrodes 27 which have the multilayer metal structure 27x, 27y, 27z described above (FIG. 11), with sub-layer 27y comprising a polish-stop metal like tungsten (W). This multilayer structure is best formed while the IC chips are still in wafer form (i.e., not diced). If the chip has large areas of its surface in which there are no electrodes, then it is preferable to deposed an isolated patch of polish-stop material in these areas in order to prevent dishing in the subsequent polishing process. Such a polish-stop layer is preferably formed over the chip's top passivation layer. Chips 351 and 352 may typically be manufactured with the above-described epitaxial lift-off process, which enables one to make very thin chip components (in the range of a few microns to a few tens of microns). If the chips are manufactured with thick-wafer technology, then it is preferred that the chips be pre-polished at their back surfaces to reduce their thicknesses. This may be done while the chips are still in wafer form, and such pre-polishing methods are well known to the art. Since highly uniform polishing methods are well known in the art, and continue to improve, it may also be possible to obtain thin-film chips by polishing without ELO. In this regard, a chip thickness of 5 $\mu$m to 50 $\mu$m is acceptable.

While FIG. 39 shows that the IC chips 351 and 352 are placed in the face up position, it may be appreciated that the chip may be placed in the face down position. If the pads and electrical traces for the bottom surface of layer 350 have been formed in the previous steps, it is then possible to not use adhesion layer 414 and to then directly contact the pads of the chips to the traces of the bottom surface by metal diffusion bonding, TLB bonding, solder bonding, WIT connection, etc. Once the chips have been so joined, a high-temperature underfill material may be dispensed under the chips to prevent air pockets. If the pads and electrical traces for the bottom surface of layer 350 have not yet been formed, then the top surface of the IC chips 351 and 352 can be adhered to layer 414. To prevent air pockets, layer 414 may be left in a plastic flowable state at the time chips are placed and the chips may be pressed into the layer under a vacuum. Instead of this, an underfill material may be used. Placing the chips face down onto the substrate has the following advantage when using the above described epitaxial lift-off process for GaAs chips: that is the AlAs etch step (or AlGaAs etch step) used to removed the chips from the GaAs wafer may be delayed until the chips are placed faced down on temporary substrate 412. After placement on substrate 412, the AlAs (or AsGaAs) etch step is performed to separate the bulk GaAs substrate from the epitaxial layer which contains the circuits of the chip. Thus, one does not need a polymer film, glass substrate, or other substrate to support the IC chips during the placement steps since the GaAs bulk substrate provides this function. It may be appreciated that a whole GaAs wafer may be placed face down on substrate 412, or that the GaAs substrate may be first diced to separate the individual chips from one another. In the case that the whole wafer is placed, the placement is performed before via posts 333 are formed. Another advantage of attaching the device wafer to substrate 412 is that the back surface of the device wafer can have its back surface lapped to reduce the thickness of the chips; this is especially useful for chips which are difficult or impossible to be removed by the epitaxial lift-off step.

Referring to FIG. 40, the next step in the process is to form a polymeric layer 416 over the via posts 333, chips 351 and 352, and the exposed portions of adhesion layer 414. Layer 416 will encase these components in a single polymeric film. A number of polymeric materials may be used, including core materials, cladding materials, polyimides, and photo-refractive materials. Although not necessary, photo-refractive materials should be used if one wishes to form vertical waveguides in the stacked layers with the SOLNET waveguide formation process. The polymeric layer 416 is preferably formed by spin coating the material. After the layer is formed, it is cured if the material requires curing, which is usually the case. If the thickness of chips 351 and 352 is greater than about 15 µm, two or more separate coating and curing steps may be required for some polymeric materials, particularly those materials that undergo significant shrinkage during curing.

Referring to FIG. 41, the substrate is then polished to expose the electrodes (e.g., pads) of chips 351 and 352 and the tops of via posts 333, and to provide a more planar surface. Conventional polishing and chemical-mechanical polishing processes may be used, and such polishing techniques are well known to the art.

Referring to FIG. 42, a set of electrical traces 330 and connection pads 332 are formed over the top surface. This may be done by any conventional conductive layer formation method, many of which have been previously described and illustrated in FIGS. 11–18. For example, blanket sputtering of conductive material followed by a patterned subtractive etch process may be used.

At this point, the processing may take different directions. If the electrical traces 330 and connections pads 332 have been previously formed by patterning a thick seed layer, as described above, then the formation of IC chip layer 350 is complete and it may be removed from the temporary substrate 412. However, before removing the temporary substrate 412, the top surface of the layer 350 may be laminated to another component layer in a Z-connection assembly step since substrate 412 can provide layer 350 with very good dimensional integrity. If the bottom traces and pads have not been formed, then the next step in the process is to attach a second temporary substrate 418 to the top surface of IC chip layer 350 using a dissolvable adhesion layer 419. Once this is done, the first temporary substrate 412 is removed. The results of these steps is shown in FIG. 43. Many dissolvable epoxy and adhesion materials are well known to the art, and are compatible with the previously-described methods for first temporary substrate 412. No further curing steps are required in the processing after this point, which significantly increases the selection of dissolvable epoxy and adhesion materials. Instead of using a dissolvable adhesion layer, one may use an ordinary adhesion layer in the substrate release technique taught in U.S. Pat. No. 5,258,236, or may use a transparent substrate 418 and an adhesion layer 419 which loses it adhesion capacity when exposed to ultraviolet light. In the latter case, the substrate is released by exposing the adhesion layer to U.V. light transmitted through the transparent substrate, and then pealed off or exposed to a solvent. Other substrate release techniques described above may also be used.

Next, an optional polishing or etching step is performed to remove the polymeric adhesion layer 414, and to optionally reduce the thicknesses of chips 351 and 352. The result of this step is shown in FIG. 44.

Next, the bottom electrical traces 330 and connection pads 332 are formed, which may be done by any of the steps used for making the traces and pads at the top surface. The results of this step is shown in FIG. 45. The completed IC chip layer 350 is then usually attached to another component layer at its top surface in a Z-connection assembly step while the temporary substrate is still in place. This provides good dimensional integrity for layer 350 in the lamination process for the Z-connection assembly. The second temporary substrate 418 may then be released from layer 350 by the appropriate removal step (e.g., such as by dissolving the adhesion layer 419 if it is dissolvable, by performing the removal steps in U.S. Pat. No. 5,258,236 if that technique has been used, or by illuminating the adhesion layer 419 to U.V. light).

FIGS. 38–45 describe process steps that may be used in a variety of ways in combination with other processing steps described in the present application. For example, in addition to forming traces and pads, the bottom side processing mentioned above may also include steps for constructing other functional parts, such as 45° mirrors and optical gratings for beam splitting describe above. The process of FIGS. 38–45 may also be further modified so that the via posts are formed after the chips 351, 352 are set down. This has the advantage that the chips 351, 352 may be set down more smoothly upon the substrate. Additionally, the process steps of FIGS. 38–45 may be repeated with different device types other than chips 351, 352 (i.e., opto-electric films) and/or the device embedded on waveguide layers to fabricate a variety of single substrate or multiple substrate stacked structures.

This method of FIGS. 38–45 may be equally applied to constructing active-component layer 320b by replacing the IC chips with opto-electronic components or materials. Waveguide layer 320a may be constructed with the same steps shown in FIGS. 38–45 by adding any of the process step sequences described in this application to form a patterned waveguide core embedded in an overcladding layer and/or deleting the device-setting process. For example, via-post formation may be followed by the steps of clad-layer formation, core pattern formation, over-clad layer formation, CMP, and top metallization (or metallization prior to underclad layer formation). Waveguide layer 320a may also be formed from a subset of construction steps previously described and illustrated, such as for example, the fabrication steps of FIGS. 11–18, with the unused steps being related to the incorporation of the active components.

In all of the embodiments described in present application, and particularly those embodiments which have fine (i. e., very small) patterns and features, the polymer layers may be formed by CVD (chemical vapor deposition), evaporative polymerization, and/or MLD (molecular layer deposition) as described in U.S. Pat. No. 5,444,811, which is assigned by the assignee of the present application, and/or the combination of these and other conventional coating methods. In addition, in all of the embodiments described herein, the top and bottom surfaces of the component layers may have anti-reflective layers formed on them to reduce reflection noise.

Having described several exemplary methods of forming IC chip layers 350, we provided methods of forming polymer waveguide layer 320a in addition to those described above. Referring now to FIGS. 46–58, there is seen in FIG. 46, a cladding layer 21 is formed over a temporary substrate 450 and cured in any of the above described ways. The temporary substrate 450 may comprise aluminum, quartz, glass, or any of the above temporary substrate configurations. Before forming cladding layer 21, an adhesion layer and a seed layer may be formed over the surface of substrate 450, with the seed layer being used to electroplate form via posts for conductive vias through layer 320a. Referring to FIG. 47, a core layer 24 is then formed over cladding layer 21 and cured, which may be done in any of the previously described ways. If layer 320a is to have beam splitters or wavelength filters, then core layer 24 may be etched or photo-exposed at this point to form the gratings of these components, and the gratings may then be filled with material having a different index of refraction.

Referring to FIG. 48, laser cuts are used to define the sides of the optical waveguides 454. FIGS. 48 and 49 are end views of three parallel optical waveguides. The cladding layer 21 may be around 10 μm thick, the core layer 24 may be around 10 μm thick, the waveguides may be between 10 μm to 50 μm wide, and the waveguides may be spaced apart from one another by a pitch of around 250 μm. The laser cuts need only be as deep as the core layer 24, but in practice sometimes are as deep as the combined thickness of the cladding and core layers 21 and 24. The width of the laser cuts may be around 20 μm to 75 μm. A cleaning operation is preferably performed to remove debris from the laser cutting step. This clean may be performed by a plasma etching step, which tends to etch debris at a faster rate than cladding and core layers 21 and 24. To reduce the amount of debris that needs to be removed, one may form a layer of photoresist, or other uncured polymeric material, over the core layer 24 before the laser cutting operation is performed. During the cutting operation, a major portion of the debris will be left on top of the photoresist layer, and may then be easily removed by removing the photoresist layer by exposure to a solvent or developer solution. A brief plasma etch may then be done to ensure that the laser etched trenches are clean.

Referring to FIG. 49, a top cladding layer 23 is formed over the patterned core layer 24 and then cured by any of the previously described ways of forming cladding layers. At this point, via posts may be formed by laser drilling apertures to the seed layer, cleaning, and then plating. Also, the electric traces and pads at the top surface of cladding layer 23 may be made.

Referring to FIG. 50, which shows a side view of the parallel waveguides, laser cuts, such as those formed by laser ablation, are made at the ends of the waveguides to form the bevel edges for the mirror elements of the vertical couplers. The angle of these cuts may be inward, as is shown in view A at 455, or they may be outward, as is shown in view B at 456. A waveguide may also have an inward cut at one end, and an outward cut at the other end. If necessary, patches of metal may be formed at each laser cut site in order to provide more accurate laser cuts, as previously described above (see FIG. 27, layer 161). After this step, the beveled edges may be cleaned by a brief plasma etch step, and a layer 458 of reflective metal or reflective material is deposited over the beveled edges left by the outward laser cuts 456. If electrical traces and pads have been previously formed on the top surface of cladding layer 23, and if one forms the mirrors with a blanket deposition of reflective metal, then it is preferable that one first forms a photoresist lift-off layer over these traces and pads before the laser cut operation and the blanket deposition steps are preformed.

To form the mirror elements on the bevels of the inward cuts, a second temporary substrate 452 is attached to the top of layer 320a by any of the previously described methods, and the first temporary substrate 450 is removed, as shown in FIG. 51. In the embodiment shown in FIG. 51-1, an adhesive layer 453 is shown between second temporary substrate 452 and layer 320a. The bevels are cleaned with a brief plasma etch, and then coated with a layer 457 of reflective metal or a reflective material. Electrical traces and pads may then be formed on the bottom surface of layer 320a. Layer 320a is thus completed, and may them be assembled to an IC chip layer 350 or an active component layer 320b, after which the second temporary substrate 452 may be removed. As another approach to forming the mirror elements on the bevels of the inward cuts, one may deposit reflective metal on the inner surface by direct electroplating, electroless plating, direct plating, or high-pressure CVD (10 milli-torr to 100 milli-torr) before the second temporary substrate is attached. In the case of direct electroplating, the seed layer must be present. In the case of electroless plating, one exposes the surfaces of the polymeric material to appropriate activation and catalytic treatments.

In a modification of the process shown by FIGS. 46–51, the waveguide are defined by plasma etching of core layer 24 rather than by laser cutting. After the core layer has been formed and cured (FIG. 47), an adhesion layer, such as one comprising chromium, is formed over layer 24. A thick photoresist layer is formed over the adhesion layer and then patterned to define the locations where the waveguides 454 are to be formed. The exposed portions of the chromium adhesion layer are etched away by a quick chemical etchant for chromium, and the resulting structure is plasma etched to remove the exposed portions of layer 24, as shown in FIG. 52. A little over etching into bottom cladding layer 21 is preferably performed to ensure that no waveguide will have any leakage of light. After the plasma etch, the remaining photoresist and adhesion layers are removed, and cladding layer 23 is formed and cured (FIG. 53). The remaining processing steps illustrated by FIGS. 50 and 51 are then performed.

As previously discussed, in an alternate process, the core may comprise a photo-sensitive material, which is hardened by light exposure. For this case, the core patterning may be done by a patterned exposure process instead of by a RIE process. In this case, in addition to laser cutting or a RIE technique, a tilted lithographic exposure technique, such as that disclosed in Japanese Patent Application JP 96262265, can be used for making beveled edges. Direct exposure through a photomask is preferable for process simplicity. However, if the surface is stable enough after soft curing, a metal mask may be formed on the surface to act as photomask. If further planarization is desired, CMP can be applied after the over cladding layer is formed.

Generally, it is simpler to fabricate the outward cut mirror of FIG. 50-2 rather than the inward cut mirror of FIG. 50-1, although it is desirable to be able to be able to economically fabricate both types of mirror structures. Referring again to FIGS. 50-1 and 50-2, inward cut and outward cut mirrors both define trapezoidal shapes that are the mirror images of each other. If the top surface of the trapezoidal surface of FIG. 50-2 is attached to an OE substrate, it will perform as an inward cut mirror on the OE substrate to which it is attached. Consequently, a mirror fabricated as an outward cut mirror, as shown in FIG. 50-2, may be attached to another OE surface to that it functions as the inward cut mirror of FIG. 51-2. This method facilitates a high-yield process for fabricating a multiple-layer OE substrate having inward cut mirrors.

FIGS. 54–58 illustrate an exemplary method of adding an active component layer to the waveguide layer. The waveguide layer and via posts of FIGS. 54–58 may be formed by the previous methods, such as the methods illustrated with FIGS. 38–45 and FIGS. 46–53. Starting with the waveguide layer 320a shown in FIG. 51, the voids created by cuts 455 and 456 are filled with material (usually polymeric material), and the surface is planarized. Electrical traces and interconnection pads are formed over the exposed surface of cladding layer 21, and via posts are formed by electroplating by via formation steps previously described. The result of these steps is shown in FIG. 54. Next, referring to FIG. 55, a VCSEL emitting device 36 is placed face down on the substrate, and has its electrodes joined by metal-diffusion bonding to corresponding pads 332 and/or traces 330 that are formed over cladding layer 21. A high temperature underfill is then preferably dispensed under the emitting device 36. Other devices, such as photo-detecting devices, are similarly attached and processed, but are not shown in the figures for visual simplicity. Each of the devices so placed in FIG. 55 have the active area overlying a mirror structure 458 at an end of a waveguide, or at a branch of a vertical beam splitter.

Referring to FIG. 56, a polymeric layer 25 is then formed over the surface to encase device 36 and vias 333 in film of polymer material. Any type of material may be used, including cladding material, core material, polyimides, and photo-refractive material (which would be useful for making vertical waveguides by the SOLNET process). Layer 25 is cured, if needed, and then polished to expose the tops of vias 333, to make layer 25 more planar, and to optionally expose the surfaces of the devices embedded in layer 25, if such is necessary (such as to make additional electrical contacts to the components). The result of these steps are shown in FIG. 57. Next, as shown in FIG. 58, electrical traces and pads are formed on the top surface of polished layer 25. The traces may be formed by any of the previously described pad/trace formation steps. An active substrate 320 is thereby formed, which may be assembled to an IC chip layer 350 (or any other active layer, including waveguide layer, or chip) using temporary substrate 452 for dimensional control. The assembly may be done by any of the previously described methods. After assembly, temporary substrate 452 may be removed by any of the previously described substrate-release methods.

Alternately, it may also be possible to stack waveguide layers on the active device layer in a similar manner to that shown in FIGS. 54–58. For this case, the VCSEL should be placed in a face-up position. Additionally, various combinations of layers, such as waveguide layers, active devices layers, chip layers can be build-up using any combination of steps shown in FIGS. 38–58.

As indicated above, when one uses switch devices or lateral light-emitting devices which are pre-built on chips which have high indices of refraction compared with the index of the waveguide material, in some cases it is advisable to narrow the width of the device with respect to the width of the waveguide in order to provide good optical coupling between the waveguide and the chip device. A high coupling coefficient between a waveguide and chip device is desirable because it increases the efficiency of a variety of electro-optic processes. For example, a high coupling coefficient permits lower voltage switches and modulators to be used, because the optical mode interacts strongly with the switch/modulator. Narrow device widths of the active devices enables higher speed operation by decreasing device capacitance. By the same reasoning, it is also advisable to reduce the height of the chip component with respect to height of the waveguide, and to center the chip in the middle of the waveguide. Decreasing the thickness of the active devices enables lower power (voltage) operation by increasing the electric fields in the devices. Steps for performing the centering of chips with reduced height are described below, and these steps may be incorporated into the construction methods previously described. FIGS. 67 and 68 show the result that is desirable to obtain, where FIG. 67 is a top plan view and FIG. 68 is a cross-sectional view. Four switch devices 26a–26d in chip form, and having a high index of refraction, are coupled in line with four respective waveguides 24a–24d having greater widths and thicknesses. To reduce reflects at the interface between the waveguides 24a–24d and the devices 26a–26d, the ends of the devices 26a–26d are tapered. The amount of tapering, and the amount of width reduction between each device 26 and its waveguide 24, for optimal coupling is dependent upon the difference in indices of refraction. The values needed for optimal coupling are best computed through optical simulations. FIG. 68 is a cross-sectional view showing how the chip of switch device 26b has a lower height than the height of waveguide 24b, and how the chip is centered in the middle of the waveguide. The centering is achieved by a pedestal of cladding material 21b, which in turn is formed on a bottom cladding layer 21a.

Referring back to FIG. 59, we now describe exemplary steps for constructing the structure shown in FIGS. 67–68. Starting with a base substrate 12, a first cladding layer 21a is formed over the surface of base substrate 12, and cured. Cladding layer 21a may comprise any of the cladding materials previously described. Next, a second cladding 21b is formed over cladding layer 21a. This cladding layer can be any of the previously described cladding materials, including photosensitive cladding materials. Before cladding layer 21b is cured, a device chip 26 is adhered to it, such as was done in the previous construction methods. Layer 21b is then soft-baked to remove the solvent used to fluidize the polymeric cladding material. The results of these steps are shown in FIG. 60, which shows a cross-sectional view, and in FIG. 61, which shows a top plan view. If cladding layer 21b is not a photosensitive material, it is preferably cured at this point. (During these steps, appropriate electrode structures may be formed in the layers, as describe above; these steps are omitted here for the sake of brevity, but it will be apparent to one of ordinary skill in the art how these steps are incorporated given the previously-described construction methods).

At this stage of the process, chip 26 is a large piece of material which is now patterned to define the individual devices 26a–26d. This may be done by forming a photoresist layer over the top of cladding layer 21b and chip 26, pattern exposing and developing the photoresist layer it to leave patches of the photoresist over chip 26 where the individual devices 26a–26d are to be formed. The exposed portions of chip 26 are then etched away by a suitable etchant to define the individual devices. The results of these steps are shown in a cross-sectional view of FIG. 62 and in a top plan view of FIG. 63. This patterning and etching step also provides the tapers of the chip devices. If chip 26 is a multilayer structure, several etch exposure steps, using different etchants, may be needed.

If cladding layer 21b comprises a photosensitive material, then the pattern exposure of the photoresist layer could also pattern all of the portions of cladding layer 21b which are not under the whole chip 26, if a sufficiently long exposure is used. In this case, portions of cladding layer 21b would be removed in the development step of the photoresist layer. However, this is of no detrimental consequence. If one wishes, one can adjust the energy of the exposure step such that the photoresist layer is fully exposed but the cladding layer 21b is not fully exposed. One may also use portable conformal masking structures to avoid exposure of cladding layer 21b at this point.

As the next step, all portions of cladding layer 21b which are not underneath the patterned devices 26a–26b are removed. If layer 21b is photosensitive, this may be accomplished by performing a blanket exposure to actinic radiation, using the individual chips 26a–26d to block the radiation from hitting the locations where cladding layer 21b is to be retained. The cladding layer 21b may then be developed and then cured. This provides a self-aligned patterning of layer 21b, and the results of these steps are shown in the cross-sectional view of FIG. 64. Any photoresist material left on top of the individual chips 26a–26d in the previous patterning step will be exposed in this blanket exposure, and thus can be removed by a developer solution, sometimes by the developer used in the development step for cladding layer 21b. If the photoresist layer and the cladding layer 21 have incompatible chemistry, or if the solvent of the photoresist would dissolve cladding layer 21, then a barrier layer may be formed between these two layers. The layer is preferably opaque, and is removed after the photoresist layer has been used to pattern the devices 26a–26d. Cladding layer 21b may then be defined by a blanket exposure, as before. A chromium or tungsten layer may be used as the barrier layer.

If cladding layer 21b does not comprise a photosensitive material, the unwanted portions of cladding layer 21b may be removed by plasma etching, using the individual chip as an etch mask, along with the photoresist patch above it, if so desired. In this case, any excess photoresist may be stripped away after the etch step. While the etch time can be controlled to only etch layer 21b, one can form a plasma-etch stop layer over layer 21a before layer 21b is formed, and can remove the plasma-etch stop layer after layer 21b has been defined by the plasma etch step. A chromium layer may be used for this purpose.

The next step in the process is to form a core layer 24 over the resulting structure, as is shown in FIG. 65. The core material is then patterned to define the waveguides, as is shown in the top plan view of FIG. 67 and the cross-sectional view of FIG. 66. Any of the previously described patterning methods, including the use of a photosensitive or photo-refractive material and photo-exposure, may be used. The ends of the waveguides preferably abut the taper sides of devices 26a–26d, or penetrated part way into the taper sides. As the next step, a layer of cladding material 23 is formed over the structure and cured, as shown in FIG. 68. Additional processing steps to form traces, pads, mirror elements, beam-splitter elements, and other features previously described may be undertaken at this point.

When metal electrodes are formed on or in the second cladding layer 21b, mini chips can be placed on these metal electrodes and coupled thereto by the previously described metal diffusion, metal bonding techniques, TLB, and solder bonding. Additionally, if metal electrodes are formed on the top surface of a mini chip, one or more of the chip's electrodes may be bonded to metal pads formed on the top surface of cladding layer 23. This provides both electrical connection and physical attachment. Additionally, if a signal to the mini chip comes from a trace on the opposite surface, the via between surfaces may be located under the connection pad to provide for a more compact connection arrangement. This provides for efficient use of surface area for making the electrical connections to the mini chips.

In the core layer coating step shown in FIG. 65, an optional clad layer can be coated on the core layer. After the core layer is cured, the optional cladding layer is coated followed by soft and full curing. If the core layer thickness is a little bit thinner than OE device height, the polished surface can be in the cladding layer. This two-layer approach may improve the interface flatness between core and clad layer, thereby reducing optical scattering losses. Alternately, optical scattering losses may be reduced if the CMP process is applied after the over cladding layer formation.

In some process variations, one or more CMP steps may be eliminated to reduce the optical scattering losses associated with the optical mode scattering from the CMP planarization surface. When a photo-sensitive waveguide material is used, such as one that is hardened by light exposure, CMP planarization proximate to the core layer is not necessary. After the step shown in FIG. 65, waveguide patterning can be carried out by patterned light exposure. A planarization step may be applied after the overcladding layer is formed, if necessary.

As another variation on the core patterning process, the minichips may include core and cladding structures prior to attachment of the minichip to the cladding layer 21b in FIG. 60. For this case 26, 26a, 26b, and 26c are replaced by elements 26', 26a', 26b', and 26c' as shown in FIGS. 60-2, 61-2, and 63-2. This has several advantages. The refractive index profile can be controlled towards the edges of the mini-chip. In particular, the refractive index of the chip core and chip cladding can be very close to each other (small refractive index step) which facilitates increasing the beam spot size at both edges of the minichip for efficient optical coupling to waveguides.

The embodiments shown in FIGS. 11–20, 59–68, 74–81, and 82–89 are exemplary. One of ordinary skill in the art may combine aspects of one or more of these and other embodiments herein together according to the requirements of a particular application.

The method shown in FIGS. 59–68 may be utilized with a variety of non-epitaxial films as well. For example a large refractive index films, such as a TiO2, WO3, SiNx, or Si film can be embedded in the same ways. These films can be obtained as an lifted-off film using a substrate that can be selectively removed, such as a Si, metals, or polymer substrate. A high refractive index waveguide may be used as an optical delay line. If a rare-metal-doped glass film is embedded, then it may be used as an optical amplifier. Other optical films, such as luminescent films, photo-refractive films, and nonlinear optical films may similarly be incorporated as optical waveguides using the method shown in FIGS. 59–68. When the refractive index of the embedded film is larger than the core material, the core materials can be used for layer 21b. In this case, the etching of the core layer on the embedded film (FIG. 66) is not necessary and the overclad layer can be coated after the step shown in FIG. 65.

The previously described fabrication processes may also be used to fabricated films with active OE devices but no waveguide layer. FIGS. 147–153 show an exemplary process to fabricate an OE film with embedded devices. Electrical pads, electrical lines, and electrodes are formed on a substrate (FIG. 147). Thin film devices are then placed on the metal pads/lines on the substrate (FIG. 148). The thin film devices may be any thin film device such as those fabricated with an ELO process. A polymer film is then used to coat the substrate, embedding the thin film devices in the polymer (FIG. 149). The polymer is then planarized to the level of the thin film devices by polishing (FIG. 150). Surface contact pads and vias are then formed on the planarized polymer (FIG. 152). The substrate of the OE film may then be removed, either before (FIG. 152) or after (FIG. 153) the OE device film is attached to another layer, such as a waveguide layer. Alternately, via posts may by fabricated after the thin film device placement step, followed by the embedding, planarization, and contact pad formation steps.

Still yet another option is to insert a buffer polymer layer between the substrate and pads, electrical lines, and electrodes, regardless of how the vias are formed.

Additional multichip module interconnection configurations are now described by referencing FIGS. 69–72. These modules may be constructed by the above described construction methods. A free-space optical interconnection system is shown in FIG. 69 where optical signals are conveyed through free space between two laminated boards 501 and 502. Each laminated board 501–502 has a plurality of optical switches 506 which transmit light to opposing photo-detectors 508 through a section of air, or free space. Each optical switch is feed with optical power by a waveguide 503, which may have grating beam-splitters 504 to convey the power vertically to one surface of the switch 506. The light enters perpendicular to the surface of the optical device (e.g., a mini-chip of EA or EO material), and exits perpendicular to the opposite surface of the optical device. Before the light exits each board 501 and 502, is passes through a micro-lens 511 formed in a material layer 510. The light also passes through another such micro-lens before it enters a photo-detector device 508. The micro-lens is a section of material which has a higher index of refracting than the bulk material of layer 510, and it serves to focus the light as it is emitted and as it is collected. While the micro-lens may be used by itself, other optical elements may also be inserted between boards 501, 502 to adjust the optical focus of the micro-lens, if required.

The mirco-lens is preferably made by the SOLNET process by using a sheet of photo-refractive material (e.g., polyguide from DuPont), and exposing it by writing beams to form the micro-lenses. The cross section of each micro-lens, as looking from the top surface of layer 510, is circular or square. The surfaces of layers 510 may be coated with anti-reflective materials to improve optical coupling. In addition, optical materials having an index of refraction close to that of the micro-lenses may be disposed between boards 501 and 502 to improve optical coupling.

The layer of boards 501 and 502 have been separately constructed and then laminated together, according to the processes above. Between each layer, a bonding sheet or underfill may be used to improve optical coupling between the devices and the micro-lenses, and between the power waveguide 503 and the optical switches 506. These layers, of course, may be integrally formed, which is shown in FIG. 70 by boards 501 and 502.

The primary difference between the embodiment of FIGS. 69–70 and that of FIGS. 35–37 is the use of vertical optical switches (or light modulators) instead of VCSELs for the transmitters. However, micro-lens array may be used in conjunction with any of the techniques to couple light to the optical switches 506 mentioned in this application. For example, instead of using a grating for coupling optical power supply to a switches 506, forty-five degree mirrors could be used. Alternately, branched waveguides in the manner of FIG. 37 could be used to coupled light to optical switches 506. The vertical optical switches 506 may also include a variety of switch structures, such as EA modulators.

This concept may be extended to form vertical optical connections in stacks of active layers 320 and IC chip layers 350, as is schematically illustrated in FIG. 71. In FIG. 71, active components, such as VCSELs, photodetectors, and modulators are omitted for the sake of clarity, but may be included in a substrate with vertical couplers. As shown in FIG. 71, the layers are made from a photo-refractive material. The SOLNET process may be used to fabricate the vertical micro-lenses which, when stacked upon one another, form a vertical waveguide, or so called optical Z-connection. Bonding sheets made of photorefractive material may be used to laminate the active layers 320b, waveguide layers 320b, and IC chip layers 350 together. For the fabrication of the optical z-connection in each layer, other methods can be applied in addition to SOLNET.

The vertical optical connections may be organized in separate units 710 which are coupled to two sides of a set of active substrates 705, as is shown in FIG. 72. The active substrate 705 may take the form shown in FIG. 35. Units 710 have a plurality of vertical waveguides formed through their Z direction, and which optically connect to waveguides at the edges of substrates 705. Units 710 may be constructed using the sequence of fabrication steps shown in FIG. 73. Staring with a plurality of sheets of refractive material (e.g., polyguide), short sections of bonding sheets are attached to the left edges of the sheets. The sheets are then bonded together, and then the SOLNET process is applied to the right edges of the photo-refractive sheets (use of writing beams) to form the vertical waveguides. The sheets are then cured, and are then assembled to the substrates 705.

FIGS. 109–111 show alternate OE-3D stack configurations. Chips may be embedded in a variety of different OE-film substrate structures comprising active and passive device films to form optical interconnections.

FIG. 112 shows how in the present invention a plurality of OE films may be stacked using an optical Z-connection to construct multiple-layer OE substrates. As shown in FIGS. 113–116, a stacked may comprised a variety of different film types. As shown in FIG. 113, the OE film may comprise a passive polymer waveguide, with additional electrical lines, pads, vias, electrical voltage planes, and ground planes. As shown in FIG. 114, the polymer film may comprise OE devices embedded in the polymer film with additional metalization. The active OE devices may include any of the previously mentioned devices, such as VCSEL, light modulators, optical switches, optical amplifiers, wavelength filter, tunable filter, wavelength converter, photodetectors, driver chips, amplifier chips, transceiver chips, system LSI's, LSI chips, optical components, and resistors, capacitors, and other electrical components. Mini-chips, in which a plurality of components are integrated, can also be embedded. In the embodiment shown in FIG. 115, both passive waveguides and active OE devices may be integrated into one film, along with additional via and contact metallization. FIG. 115 shows a first embodiment having both waveguides, VCSELs, and photodetectors whereas FIG. 116 shows light modulators and photodetectors coupled to waveguides. More complex multi-layer waveguides may also be included in the embodiments of FIGS. 113, 115, and 116.

The ability to stack different OE film types using electrical and optical Z connections permits a variety of package structures. FIGS. 117–120 show side views of film optical link modules (FOLM). The FOLM structure permits optical signals to be conveniently extracted from a chip, CSP, or MCM to be linked to other boards and/or other system elements, giving the system engineer the flexibility to optically link modules of chips in a wide variety of ways. As indicated in FIG. 117, an OE film (OE-film-DW) with waveguides, VCSELs and photodetectors may be used for E/O and O/E conversion. VCSEL with an integrated driver, and a photodetector with an integrated amplifier may also be used. A fiber array, image guide, or waveguide array is connected with a connector to the waveguides at the edge of the OE film, thus forming an optical link to other elements. The VCSELs, in response to outputs of a chip, emit optical signals which are transmitted through the optical link (fiber array, waveguide array, or image array) to a board or unit which is connected to the OE-film. The fiber array, image guide, or waveguide array is preferably connected to other boards or units to enable an optical interconnections between boards and/or units. Conversely, optical signals coupled to the waveguides via the optical link from outside of the OE-film are received by the photodetectors in the OE-film. The optical signals are converted into electrical signals, which are input to the chip.

As shown in FIG. 118, the same function may also be achieved by stacking a passive waveguide substrate (OE-film-W) with another substrate having only active OE devices (OE-film-D), in the manner of an interposer. The VCSEL performs an E/O conversion function in response to the chip output whereas a photodetector performs an O/E conversion function in response to an received optical signal. FIG. 119 shows a FOLM embodiment in which an OE substrate with waveguides, VSCELs and photodetectors (OE-film-DW) under a MCM upon which chips are mounted. FIG. 120, shows a FOLM embodiment similar to FIG. 119 except with a passive waveguide film (OE-film-W) and active OE device film (OE-film-D).

The structure of FIG. 119, the OE film is stacked on the substrate without its left edge extending beyond the edge of the substrate. The horizontal optical connector used in FIGS. 117–118 is replaced by a vertical two-dimensional optical connector to the OE film. This vertical connector couples the waveguides in the OE film to the end of a two-dimensional (2D) fiber array (or fiber image guide). In location of the vertical connector, vertical couples (e.g., mirrors) are formed in the OE film to turn the optical signals in the OE film towards the 2D fiber array. In turn, the ends of several waveguide cores in the 2D fiber array terminate at the connecting face of the vertical connector, with each waveguide end being positioned over a corresponding vertical connector in the OE film. This type of surface normal coupling is effective for massive parallel interconnections, and is preferred for such types of applications. This surface normal coupling may be used with any of the embodiments of the present application where an OE film is optically coupled to (2D fiber arrays (or fiber image guides).

As we previously stated, the stacked structures shown in FIGS. 33–37 and 110–111 may be used in constructing FOLM structures. For example, in FIGS. 117 and 119, the driver/amplifier chip layer can be stacked on an OE-Film-DW to act as a interface between OE devices (e.g., VCSEL, photodiode, modulators, etc.) and the input/output terminals of chips or MCM modules. For FIGS. 118 and 120, the driver/amplifier chip layer can be stacked on an OE-Film-D. In both cases, OE-film and driver/amplifier chip layer can be stacked by a Z-connection (lamination) process or by a build-up process. Of course, the driver/amplifier chip layer may include any auxiliary circuits, such for example driver circuits, amplifier circuits, bias circuits, temperature stabilizing circuits, skew compensation circuits, timing circuits, and other appropriate circuits. It is also possible that the chips and OE devices may co-exist in the same layer (OE-film).

In comparison, the distances between electrical input/output terminals, and between E/O and O/E conversion parts are smaller those distances in conventional optical link modules. This improves interconnection performance. Furthermore, in conventional optical link modules, extra space is needed. Small or no extra space is needed in the FOLM structures of the present application.

FIG. 121 is a top view of a FOLM structure in which a portion of the OE film preferably has sufficient room so that the waveguides may be curved in order to adjust, if required, the optical path lengths to mitigate signal skew. More generally, it is desirable to adjust the waveguide routes, or path lengths, so that signals have the same transit time from the output to the input of various chips/regions, boards, units, or modules. Other techniques to adjust transit time, such as varying other waveguide parameters (e.g., refractive index) may also be utilized so prevent skew.

Figure 124:
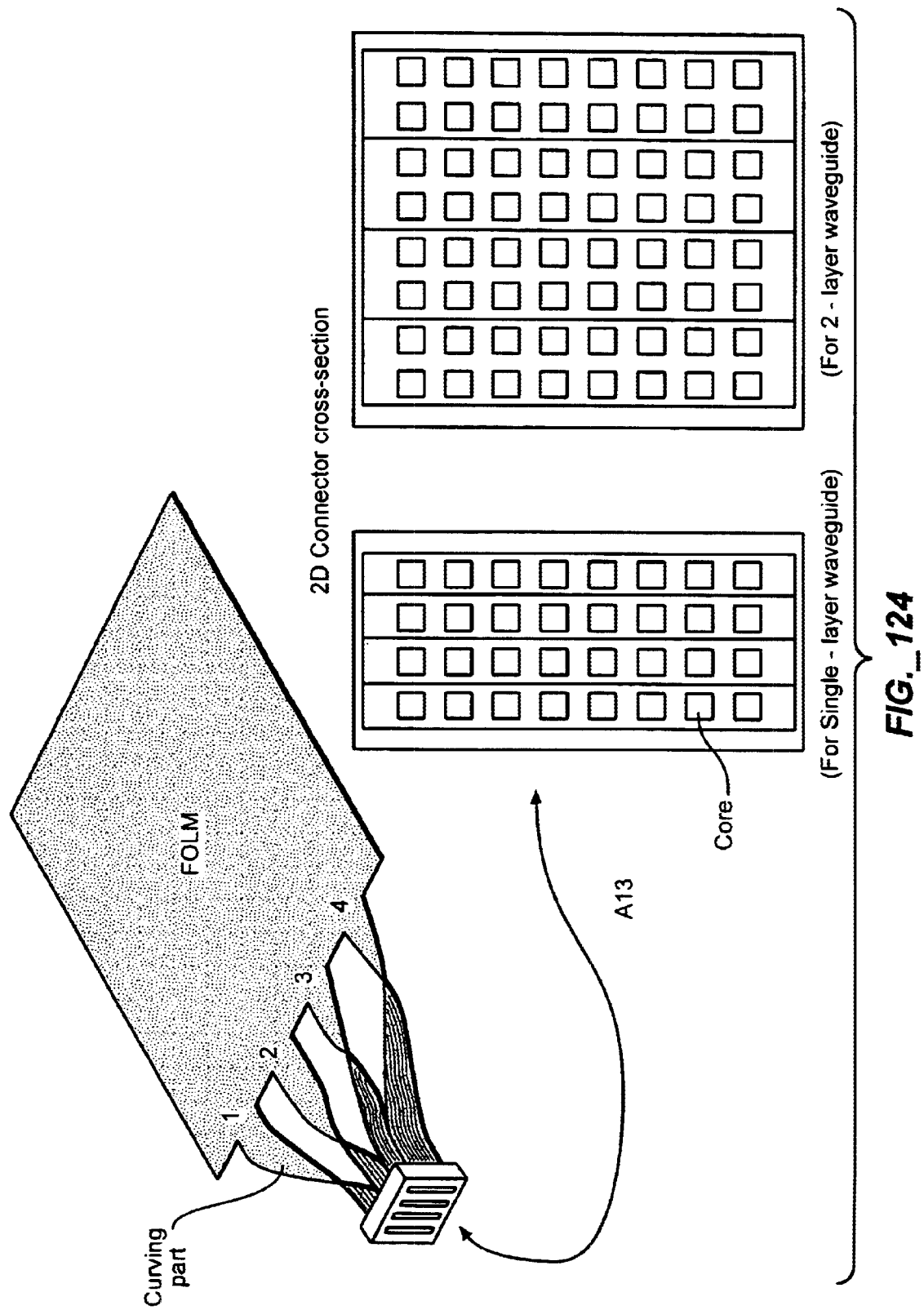
FIG. 124 is schematic perspective view of an further embodiment of a FOLM OE film according to the present inventions.
Figure 245:
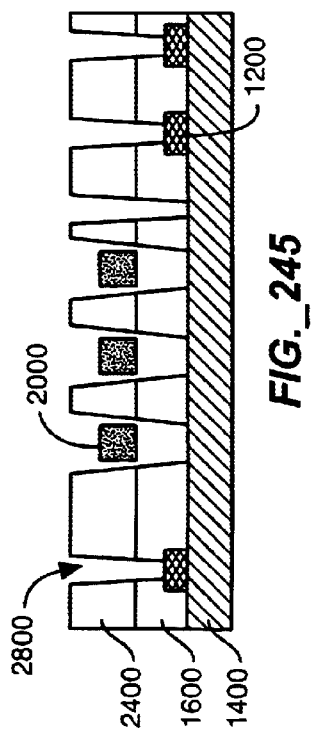
Figure 246:
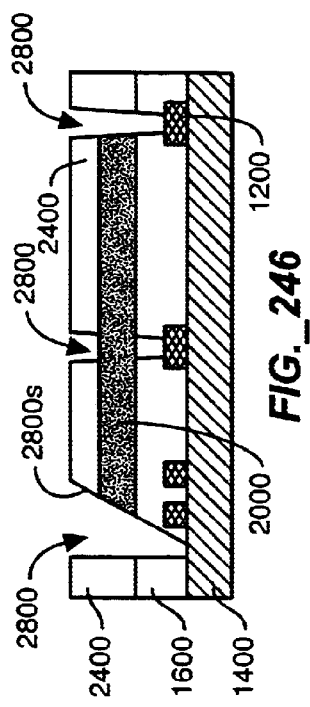
Figure 247:
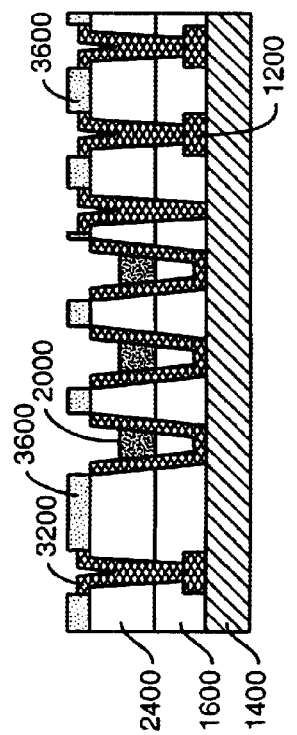
Figure 248:
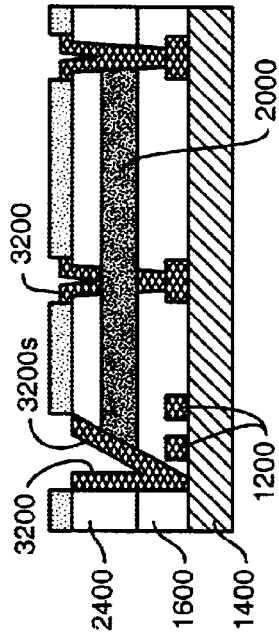
Figure 249:
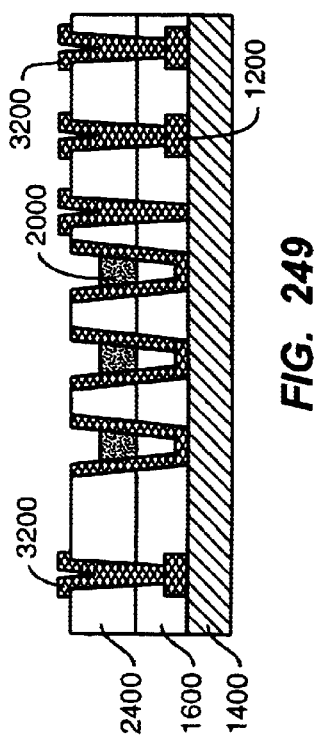
Figure 250:
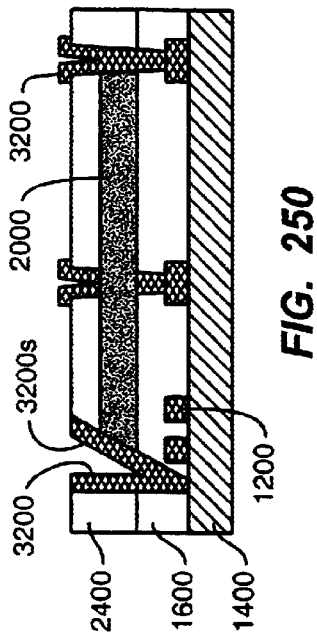

As shown in FIGS. 122 (top view) and 123 (side view), the connector preferably includes a connector buffer to perform optical adjustment functions which facilitate communicating signals to a connector. For example, a connector buffer may adjust spot size, and change the waveguide pitch (i.e., waveguide separation). For example, the connector buffer may have curved waveguide paths so that one or more planar, one-dimensional arrays of polymer waveguides are coupled to a two-dimensional array of waveguides. As indicated in FIG. 121, an extended portion of a flexible substrate region may be patterned into ribbons, each containing a plurality of waveguides. A plurality of ribbons may each be twisted so that the end of the ribbons forms a two-dimensional waveguide array. For a ribbon length of five centimeters, an individual ribbon may be twisted by ninety degrees with relatively low stress. A polymer film thickness in the range of about 10-to-250 microns is preferred. Each ribbon may, for example, contain 12 waveguides with a pitch in the range of about 30-to-250 microns. The edges of a plurality of ribbon may then be stacked into a frame-connector and polished to form a 2-D waveguide connector. The outer surface of the connector buffer is also preferably shaped (e.g., polished, sliced, or otherwise shaped to form a coupling surface with a planar surface) to facilitate coupling to external optical connectors. This permits the waveguides of the FOLM to be coupled to a variety of optical couplers, such as two-dimensional fiber arrays and image guides. FIG. 124 shows how optical signals in the connector buffer may be routed to a two dimensional waveguide array connector comprising a plurality of waveguide cores arranged in an array. The connector buffer preferably performs an optical adjustment function so that a plurality of waveguides of an OE film are optically coupled to a commercially available optical connector, such as a two dimensional optical connector. The MT connector, available from Furukawa Electric, Co., Ltd., Tokyo, Japan, is an example of a preferred multi-fiber connector. The connector buffer can also include wavelength-division multiplexing (WDM) functions, such as wavelength multiplexers (MUXs) and wavelength demultiplexers (DEMUXs), etc. to add WDM capability to the FOLM structures according to the present invention. In the case of surface normal 2D connectors shown in FIG. 119, the same functions and components described above may be used.

FIG. 125 shows a high speed FOLM embodiment. High speed optical modulators are driven by the outputs of a chip to generate optical signals from externally input light. The light modulator can operate with low current and low power dissipation compared with VCSELs. A high-speed and low heat-generation opto-electronic amplifier/driverless substrate (OE-ADLES) is preferably used at high optical signal levels. In OE-ADLES, the light modulator may be directly driven by chip outputs because it has voltage-drive characteristics that are compatible with the outputs of a chip. Consequently, an additional driver is not necessary to drive a modulator from a chip. Additionally, by increasing the input optical power, the optical signal at the photodetector is sufficiently strong so that a photodetector amplifier may be eliminated. An OE-ADLES apparatus and method is described in the paper of Yoshimura, et al., "Optoelectronic Amplifier/Driver-Less Substrate, OE-ADLES. For Polymer-Waveguide-Based Board Level Interconnection-Calculation Of Delay And Power Dissipation," submitted at the $8^{th}$ Iketani Conference, $4^{th}$ International Conference On Organic Nonlinear Optics (ICONO'4), Oct. 12–15, 1998, Chitose, Japan, the teachings of which are hereby incorporated by reference. OE-ADLES is preferred because it permits the elimination of drivers and amplifiers that increase the cost and complexity of the OE substrate as well as decreasing signal delays due to drivers and amplifiers.

A FOLM may comprise a variety of OE film substrate stacked structures. FIGS. 126–129 show details of preferred embodiments of a FOLM structure. FIG. 126 shows a side view of a FOLM structure. FIG. 127 shows a top view of the entire FOLM structure with spot size converters to couple the FOLM waveguides to commercially available MT connectors. As can be seen in FIG. 127, each of 16 MT connector outputs 12 waveguides of the FOLM, so that there are 196 channels for the communication of optical signals in the FOLM. Since the core of a commercially available MT connector has a core that is 62.5 microns×62.5 microns, a 5 centimeter length of the FOLM serves as a connector buffer to gradually increase the spot size of the OE waveguides (core dimensions of fifteen microns by fifteen microns) and translate the waveguides to efficiently couple to the MT connector.

FIGS. 128 and 129 show a detailed view of a portion of FOLM structure illustrating how the preferred fabrication method results in VCSELs that are electrically and optically coupled to waveguides by metallized forty-five degree mirrors. As can be seen in FIGS. 128 and 129, a portion of the Au contact layer of the VCSEL is electrically connected to the mirror metalization, facilitating a convenient electrical connection to the VCSEL. The optical emitting window of the VCSEL, which has an area on the order of about ten microns by ten microns, is orientated so that it impinges upon the metallized mirror and is reflected into the waveguide.

An exemplary fabrication process for a FOLM structure includes the steps of forming a first polyimide film, preferably on an Aluminum substrate, glass, quartz, or other suitable substrate which can later be preferentially removed. After the first polymer layer is formed, contact pads and electrodes are deposited on the surface of the polymer layer. The pads are patterned for mounting VCSELSs. ELO VCSELs and photodetectors are placed onto the contact pad. Preferably a Au/Sn/Au metal diffusion is used to bond the VCSEL to the contact pad. A second polyimide layer or other suitable polymer layer is then coated over the VCSELs. The surface is then planarized with CMP. A waveguide clad fluorinated polyimide layer is then formed over the planarized wafer. A core layer is then deposited, patterned, and embedded in an over-clad coating in the manner described in regards to previous embodiments. Forty-five degree mirrors are formed in any of the previously described fabrication processes, such as by RIE and laser ablation. The mirror surfaces are then metalized. The same metalization is preferably used to contact the electrodes of the VCSELs and/or pads and/or vias for the VCSELs. A polyimide layer is coated over the substrate and planarized by CMP, if necessary. The Al substrate is then removed and the first polyimide layer is removed or etched to make electrical contacts and/or pads and vias to the OE film. Alternately, removal of the Al substrate can be performed after the OE film is attached to another substrate.

As shown in FIGS. 130–137, a plurality of chips/CSP/MCM can be mounted and electrically and optically coupled using an opto-electronic interposer (OE-IP) or OE-film MCM fabricated from the previously described fabrication processes. An OE-IP is inserted between a chip, CSP or MCM and a single or multiple OE layers, and preferably provides an optical connection to at least one other element. Multiple OE layers can also be built up by the same method described earlier. The OE layers can be stacked by solder bonding, TLB, WIT, metal diffusion, and the method disclosed in U.S. Pat. No. 5,334,804, conducting paste or other building-up processes. One preferred paste lamination is the MAJIC paste lamination process, which is disclosed in MAJIC paste lamination, which is disclosed in U.S. patent application Ser. No. 09/192,003, and which is assigned to the Assignee of the present invention, the teachings of which are hereby incorporated by reference.

The OE-IP of the present invention may comprise a variety of light sources and/or photodetectors or other components and/or integrated components disposed in the OE-IP in a variety of ways. In the embodiment of an OE-IP of FIG. 130, VCSEL and photodetectors are embedded in the polymer film of the OE-IP. FIG. 133 shows an OE-IP using light modulators coupled to a light source instead of VCSELs the optical transmitters. The light source may be supplied from light sources on the OE layer or OE-IP. The light source may also be supplied from an external source via an optical fiber, optical fiber array, imaging guide, or flex waveguide array, as shown in FIG. 134. Suitable light modulators include electro-optic devices such as Mach-Zehnder modulators, internal total reflection switches, digital switches, directional coupler switches, or electro-absorption (EA) modulators.

FIG. 138 shows a case that OE-IP optical interconnections are on the opposite side of the chip/CSP/MCM-mounted surface compared to FIGS. 130 and 131. The VCSELs and photodiodes are embedded into the OE layer near the bottom surface. FIG. 135 shows an example of an OE-IP with optical interconnections to chips/MCMs mounted to both sides of the OE-IP. The OE-IPs can be merged in OE layer. This means VCSELs and photodiodes are embedded into the OE layer near the bottom and top surfaces.

The OE-IP of the present invention may also be used in a variety of ways with other OE layers. FIG. 139 and FIG. 130 are examples of OE-IP. FIG. 131 and FIG. 140 illustrate OE-film-MCM. FIGS. 136–137 show an OE-IP with external or flexible interconnections. The flexible interconnection enables the OE-film-MCM to be used as a parallel optical link module. As shown in FIGS. 136–137, the flexible optical connector can be attached at least to the edge of the OE-film-MCM. The flexible interconnection is useful for a variety of purposes, such as coupling a source of light power for optical signals and to provide a means of coupling to another OE-IP or OE layer. However, a flexible interconnection is also useful for forming a film optical link module (FOLM) or optical jumper.

The present invention may also be used to fabricate so-called "smart pixels". This is shown in FIGS. 141–142. Conventional smart pixels integrate an array of VCSELs and photodetectors onto a chip in order to facilitate OE communication of a chip to other elements. However, conventional smart pixels are expensive to manufacture and have a low yield. As shown in FIG. 141, a polymer film (OE-film-D) with an array of VCSELs and photodetectors embedded in it may be used to achieve the same function as a smart pixel. Additional electrical pad connections to the chip may be made with vias. As shown in FIG. 142, a smart pixel may also be fabricated using an active OE film with integrated waveguides, (OE-film-DW). A "smart pixel" may be fabricated by embedding an array of photodetectors and VCSELs in a polymer film which may then be electrically coupled to a chip. The smart pixel of the present invention is substantially easier to fabricate than conventional smart pixels. An OE-film-D plays the same role as VCSEL/ Photodetector array in a conventional chip-type smart pixel chip. The OE-film- has the advantage that comparatively expensive semiconductor devices are only placed where they are necessary in the OE-film-D. This may result in potential cost savings. Additionally, the polymer film facilitates the processing of vias, pads, and electrical lines.

FIG. 135 shows an illustration of an embodiment in which there is both-side packaging. As shown in the cut-out side view of FIG. 135, a first passive waveguide substrate communicates optical signals to an OE backplane layer and hence to a second passive waveguide substrate. OE film substrates with active layers may be connected to both sides of the first and second passive waveguide substrates. This permits chips or MCMs to be coupled to both sides of each passive waveguide. As shown in the perspective view of FIG. 135, this facilitates a three-dimensional module. Preferably additional support members (not shown in FIG. 135) are used, as required, to provide the requisite mechanical strength to the three dimensional module.

The present invention may be extended to include OE printed circuit boards or mother boards. As shown in FIG. 143, an OE printed circuit board is preferably optically coupled to an OE MCM using forty-five degree mirror optical couplers, although other optical couplers could also be used. Electrical outputs in each chip control the VCSELs in each OE MCM. The emitted light of some of the VCSELs may be coupled to other chips (intra MCMs). However, the light from other VCSELs may be coupled to the OE PCB from the backside to the OE-film, permitting optical communication to other elements, such as other OE MCMs.

FIG. 144 shows a stacked OE film structure used for both intra-MCM and inter MCM optical connection. A first OE-film with optical emitters and detectors is used for intra-MCM optical interconnections. As shown in FIG. 144, the first film may, for example, optically interconnect four chips. The first OE-film is also coupled to a second OE-film. The second OE-film has passive waveguides that may be used for inter-MCM (e.g., inter-board) optical interconnections. As shown in FIG. 144, the second film may, for example, couple four four-chip MCMs on a board. Separate optimization of the waveguide dimensions of the first OE-film and the second (passive) OE film are possible. As shown in FIG. 144, the waveguides and couplers in the second passive film may, for example, have larger apertures corresponding to a large beam spot size. Preferably, the photodetector apertures are also correspondingly enlarge in accord with the beam spot size of the waveguide coupler. Appropriate electrical connections are made by vias to electrical boards.

FIGS. 145 and 146 shows alternate embodiments of a stacked OE film structure used for both intra-MCM and inter-MCM (e.g., intra-board interconnections). As shown in FIGS. 145–146, the function of an active film incorporating waveguides, detectors, and optical emitters, may be implemented with a combination of passive waveguide films and active device films. This may, potentially, lead to a higher yield than the embodiment of FIG. 144.

In summary, the method of the present invention enables electronic devices and components and a wide variety of active and passive electro-optic devices to be embedded in a film in a manner consistent with the efficient optical transmission of signals to other electro-optic devices in an interposer, multi-chip module, or inter-multi-chip package. The method of the present invention may be generalized to fabricate a variety of passive waveguide film structures; films with embedded electro-optic and electrical devices; and films having both passive waveguides and active electro-optic devices. The ability to maintain the planarity of a single film and to extend vias and conventional Z connections through a signal film enables complex three-dimensional stacks of films to be fabricated. This flexibility is extremely useful in designing a high-yield, low cost, high-speed multi-chip module, substrate, optical link module, etc., to couple signals between a plurality of chips, CSPs, MCMs, or boards.

FIG. 154 show an additional embodiment 900 of the Z-direction optical coupling and Z-direction optical bus structures previously described with respect to FIGS. 71–73 and 109. Three-dimensional optical module 900 comprises a plurality of opto-electronic layers 905A–905E disposed over and above one another in a stacked arrangement, a plurality of Z-connector arrays 920A–920E disposed between layers 905, a holding unit 910 which holds the Z-connector arrays 920, and a plurality of vertical coupling elements 931–933. Each opto-electronic layer 905 has one or more edges, one or more optical waveguides 907–909, and usually one or more opto-electronic devices 904A–904C. In preferred embodiments, the layers 905 have the same shape, and have at least one of their edges aligned to one another. Unit 910 comprises a central body 911, and a plurality of sheet portions 912 extending from the central body and separated from one another by a plurality of gaps 914. Selected ends of the opto-electronic layers 905 are inserted into gaps 914, such as shown by the bottom layer 905E. Each Z-connector array 920 comprises a plurality of Z-connector segments 922 held by a respective sheet portion 912. The Z-connector arrays 920 are preferably disposed such that the arrangements of Z-connector segments are aligned to one another to provide a plurality of Z-direction waveguides. Each such Z-direction waveguide traverses through the layers 905 and the extended sheet portions 912, and comprises a Z-connector segment 922 from each of the Z-connector arrays 920A–920E. The Z-connector arrays are preferably positioned adjacent to the edges of the layers, nearer thereto than to the center of the layers.

Selected waveguides 907–909 of layers 905 have portions or ends which are located near the aligned edges of the layers and disposed so that each portion or end lies above a Z-connector segment 922 and/or lies below a Z-connector segment, and therefore lies within the optical path of a Z-direction waveguide. A vertical optical coupler may be placed at a point where such a waveguide portion or waveguide end intersects with a Z-direction waveguide in order to route a light beam from the layer waveguide to the Z-direction waveguide, or vice versa. For example, vertical coupler 931 directs light from a Z-connector segment 922 into an X-direction waveguide 907 on layer 905A. This light from this Z-connector segment may original from a layer disposed above layer 905A, or from a light-emitter or fiber disposed at the upper end of unit 910 (shown in FIG. 158). As another example, vertical coupler 932 directs light from X-direction waveguide 908 on layer 905A into a Z-connector segment 922. As yet another example, vertical coupler 933 directs a light beam in one Z-direction waveguide into a Y-direction waveguide 909, and another vertical coupler 934 directs the light beam from Y-direction waveguide 909 into a different Z-direction waveguide, as shown in the figure. In this way, a light beam may be directed from one Z-direction waveguide to another. In the above examples, vertical couplers 931–934 comprise mirrors, but may comprise diffraction gratings and other types of reflecting devices.

In general, the vertical optical couplers may comprise totally-reflecting mirrors, semi-transparent mirrors (e.g., beam splitters), grating structures, wavelength filters, optical pass-through holes (e.g., a Z-connector segment), and opaque light blockers. The vertical optical couplers can be configured to provide a variety of signal routing configurations, such as:

- 1:1 coupling of light from the Z-direction waveguide to the layer (X-Y) waveguide;
- 1:1 coupling of light from the layer (X-Y) waveguide to the Z-direction waveguide;
- 1:N coupling of light from one Z-direction waveguide to a plurality of N layer waveguides distributed on N layers;
- 1:N coupling of light from one layer waveguide to a plurality of N Z-direction waveguides distributed on N layer;
- N:1 coupling of light from a plurality of Z-direction waveguides to one layer waveguide;
- N:1 coupling of light from a plurality of N layer waveguides distributed on N layers to one Z-direction waveguide; and
- wavelength division multiplexing and demultiplexing.

FIGS. 155, 156-1, and 156-2 are schematic cross-sectional views of module 900 showing examples of the above signal routing configurations with different layers 905F–905Q. In each of layers 905F–905Q, the cladding layers are shown with a stipple fill pattern, while the inner core layer is shown with a clear fill pattern. In FIG. 155, a light beam 941 within a waveguide 942 on a layer 905F is directed by a mirror 944 onto a Z-direction waveguide 943 of a Z-direction waveguide and downward through layers 905G and 905H to layer 905I, where it is directed by a semi-transparent mirror 948 into a layer waveguide 947. This example shows 1:1 coupling of light between a layer waveguide and a Z-direction waveguide, in both directions. The light beam passes through the cladding layers of layers 905G and 905H with a small amount of attenuation, rather than being reflected, because the beam is directed perpendicular to the cladding layers. The semi-transparent mirror 948 also causes attenuation due to partial transmission of the incident light through mirror 948. If desired, an optical pass-through hole, such as shown at 953 in the figure, can be used to convey the beam through layers 905G and 905H. The pass-through hole replaces the portions of the cladding layer traversed by the light beam with core material.

Also in FIG. 155, a light beam 951 on a Z-direction waveguide 959 is split and distributed to three waveguides 945–947 on three different layers 905G–905I. Beam 951 passes through layer 905F through an optical pass-through hole 953 to an optical grating 954 in layer 905G. Grating 954 divides a fraction of light beam 951 and directs it into waveguide 945. The remaining fraction progresses through a Z-connector segment to a second optical grating 955 in layer 905H. Grating 955 divides a fraction of light beam 951 and directs it into waveguide 946. The remaining fraction progresses through a Z-connector segment to an optical mirror 956 in layer 905I. From there, the remaining fraction is directed into waveguide 947. This example shows 1:N coupling of light from one Z-direction waveguide to a plurality of N layer waveguides distributed on N layers. The directions of the light beams may be reversed to show N:1 coupling of light from a plurality of N layer waveguides one Z-direction waveguide. In this case, attenuation arises at mirrors 954 and 955 due to their semi-transparent (implying partially reflecting) characteristics. In either example, gratings 954 and 955 can be replaced by half-mirrors, or semi-transparent mirrors.

FIG. 155 also shows the combination of light beams 941 and 951 from two Z-direction waveguides 949 and 959, respectively, onto a single waveguide 947 of layer 905I by mirrors 948 and 956. The direction of the light beams may be reversed to show light from waveguide 947 being split into two Z-direction waveguides 949 and 959.

FIG. 156-1 shows how two or more light beams having different wavelengths may be combined onto, or multiplexed onto, a single Z-direction waveguide. A source of light 961 has two light beams at wavelengths $\lambda_1$ and $\lambda_2$, respectively, and is present on a Z-direction waveguide 969. The waveguide 969 conveys light 961 to a wavelength filter 964 (e.g., a diffraction grating, or a multi-layer dielectric filter) in layer 905J, which separates out a portion of the beam having wavelength $\lambda_1$ and directs it to a layer waveguide in layer 905J, as shown in the figure. The gratings in filter 964 are spaced according to the wavelength $\lambda_1$ in order to filter out the light beam at that wavelength. The remainder of light 961 is conveyed down to a second wavelength filter 965 in layer 905K, which separates out a portion of the beam having wavelength $\lambda_2$ and directs it to a layer waveguide in layer 905K. The gratings in filter 965 are spaced according to the wavelength $\lambda_2$ in order to filter out the light beam at that wavelength. The remainder of light 961, which contains light beams at both frequencies, is conveyed down to a light blocking device 966 in layer 905L, which prevents the light beams from propagating into layers 905L and 906M. In this way, light beams having different wavelengths may be separated from a common Z-direction waveguide (i.e., de-multiplexed) and directed to separate layers 905. Instead of blocking the light by blocking device 966, it is also possible to release the light out of the system by conveying it perpendicular to layers 905L and 905M.

FIG. 156-1 also shows a structure where two light beams having different wavelengths $\lambda_1$ and $\lambda_2$, and originating in different waveguides on different layers 905L and 905M, are combined (multiplexed) together onto a single Z-direction waveguide 979. The light beam on layer 905L has wavelength $\lambda_1$ and is combined onto Z-direction waveguide 979 by half mirror 975. The light beam on layer 905M has wavelength $\lambda_2$ and is combined onto Z-direction waveguide 979 by half mirror 976. The combined beams pass through optical pass-through holes 973 and 974. Optical gratings, or multi-layer dielectric filters, tuned to the specific wavelengths may be used instead of half-mirrors, and additional light beams may be multiplexed onto Z-direction waveguide 979 by using additional half-mirrors, gratings, or multi-layer dielectric filters. The optical routing structures shown in FIG. 156-1 show how several different wavelengths of light may be combined on a single Z-direction waveguide to increase the optical density and effective size of the vertical optical device without increasing the physical size of the bus. In this regard, it is pointed out that wavelength filters requires approximately the same amount of space as standard mirrors.

FIG. 156-2 also shows how two or more light beams 961' and 971' having different wavelengths $\lambda_1$ and $\lambda_2$ and present on two different Z-direction waveguides 969' and 979', respectively, may be combined onto, or multiplexed onto, a single waveguide of a layer 905N. The combination may be accomplished by the placement of a wavelength filter 964, tuned to $\lambda_1$ as previously described, at the intersection of Z-direction waveguide 969' and the waveguide of layer 905N, and by the placement of a wavelength filter 965, tuned to $\lambda_2$ as previously described, at the intersection of Z-direction waveguide 979' and the waveguide of layer 905N. The same may be accomplished by using semi-transparent mirrors 975 and 976 instead, as illustrated for a layer 905O. FIG. 156-2 also shows how a light beam on a layer 905Q and having different wavelengths $\lambda_1$ and $\lambda_2$ may be separated onto, or de-multiplexed onto, two different Z-direction waveguide segments by use of wavelength filters 964' and 965'.

The structure structures shown in FIGS. 154 through 156-2 enable one to route light signals freely by just designing the distribution of photonic Z-connection devices on the layers that are inserted between the arrays of Z-direction waveguides. The same photonic Z-connection devices can be used for any routing as a common platform, and the array of Z-waveguides can provide a common platform for implementing a variety of different opto-electronic systems.

FIG. 157 shows several examples of the routing of optical signals within module 900. Two holding units 910A and 910B are shown. The number of holding units 910 may be increased to the number of sides in each layer 905. A mirror, semi-transparent mirror, grating, or wavelength filter may be formed at each cross point where the direction of the light beam is changed.

FIG. 158 shows how light emitting devices 981, and optic fibers 982 may be coupled to the end surfaces of holding unit 910. Each fiber 982 may be attached to the surface of holding unit 910 by an MT-type mounting device 983. Each fiber 982 and light emitting device 981 is mounted over a respective segment 922 of a Z-direction waveguide and directs light down into the Z-direction waveguide.

Holding unit 910 may be constructed in a number of ways. In one way, as shown in FIG. 159, a cladding layer is formed on a support substrate 908, and the following steps are then repeated until a desired height of holding unit 910 is obtained:

1. Forming a core layer over the last-formed cladding layer;
2. Patterning the core layer to leave segments 922 of core material;
3. Forming a cladding layer over the patterned core layer; and
4. Polishing the resulting surface, such as by chemical-mechanical polishing, to make it more planar.

Thereafter, gaps 914 are formed, such as by laser cutting or dicing saw cutting.

In another method, as shown in FIG. 160, a block of photo-refractive material is formed, then exposed to actinic radiation 990 through a mask 991, as shown in FIG. 160. Mask 991 has a plurality of apertures 992 corresponding to the locations where the Z-direction waveguides and corresponding Z-connector segments 922 are to be formed. The photorefractive material may comprise, for example, DuPont's hologram material. By exposing light of a wavelength specified by the material's manufacturer, the index of refraction of the material along the light direction defined by the mask apertures 992 can be altered to convert the material from cladding material to core material. The conversion process begins first with the material closest to the mask aperture 992, and progresses downward. The initial conversion of the material closest to the aperture focuses the light 990 to the desired path of the Z-direction waveguide, and because of this, the process is called the Self-Organized Lightwave NETwork (SOLNET) process. Mask 991 may be made from any opaque material, such as metal. After exposure to actinic radation 990, gaps 914 may be formed, such as by laser cutting or dicing saw cutting. The above methods enable the Z-direction waveguides and gaps to be easily formed and mass produced.

FIG. 161 show an additional embodiment 900 of the Z-direction optical coupling and bus structures previously described with respect to FIGS. 71 and 109–111. Three-dimensional optical module 1000 comprises a plurality opto-electronic (OE) waveguide layers 1005 interleaved with a plurality of opto-electronic/chip layers 1012. The OE waveguide layers 1005 comprise waveguides 1007 (core material, shown in clear fill in FIG. 161) embedded in cladding material, which is shown in a stipple-pattern fill in the figure. The OE waveguide layers 1005 also comprise vertical optical couplers, such as mirrors 1008 and gratings 1009 (or multi-layer dielectric filters and other wavelength filters), as required by the desired routing of optical signals. In FIGS. 161–169, only waveguides are shown in OE waveguide layers 1005 for visual simplicity, but is should be understood that layers 1005 may comprise opto-electronic devices, such as VCSELs, Photo-diodes, optical switches, etc., in addition to waveguides. Each opto-electric/chip layer 1012 comprises one or more chips and/or opto-electronic devices 1010A–1010D embedded in a cladding material. Both types of layers 1005 and 1012 comprises respective electrical connection pads 1015 which serve to convey electrical signals between these layers and to adhere the layers to one another. Both layers may also comprise electrical vias. Light beams 1001 external to module 1000 and from adjacent OE waveguide layers 1005 are directed vertically through portions of the cladding material of respective opto-electronic/chip layers 1012, as shown in FIG. 161. These vertically directed beams are located within one or more three-dimensional volumes 1002, which are preferably located near sides of module 1000, near to the edges of the layers 1005,1012 than the center of the layers. Module 1000 can provide the same ability to route optical signals as module 900 shown in FIGS. 154–156.

FIG. 162 shows modified embodiment 1000' of embodiment 1000 of FIG. 161 where the distal ends of opto-electronic/chip layers 1012 have been shorted so that the vertical coupling of light beams between OE waveguide layers 1005 occurs within air or other material filled within the gaps. All other components of module 1000' are the same as in module 1000.

FIG. 163 shows modified embodiment 1000" of embodiment 1000 of FIG. 161 where blank through-holes 1020 have been formed in opto-electric/chip layers 1012 at the locations where vertical light beams pass through layers 1012. All other components of module 1000" are the same as in module 1000.

FIG. 164 shows modified embodiment 1000''' of embodiment 1000 of FIG. 161 where Z-waveguide segments 1030 or optical lenses 1040 have been placed in opto-electric/chip layers 1012 at the locations where vertical light beams pass through layers 1012. All other components of module 1000''' are the same as in module 1000.

The embodiments of FIGS. 161–164 provide simple photonic Z-connections and efficient coupling of vertically coupled light beams.

FIG. 165 shows a modified module 1050 of module 1000 of FIG. 161. Module 1050 is identical to module 1000 with the exception that the gaps between layers 1005 and 1012 are filled with photo-refractive material 1052 (a photorefractive bonding sheet may be used for this purpose, as previously described above with reference to FIG. 72). Photo-refractive material 1052 is exposed to patterned actinic radiation to form Z-waveguide segments 1054 in photo-refractive material 1052 at the locations where vertical light beams are located. The SOLNET process is preferably used to define the segments 1054. (The photo-refractive materials shown in FIGS. 165–169 is shown by a cross-hatch fill pattern.)

FIG. 166 shows a modified module 1050' of module 1000' of FIG. 162. Module 1050' is identical to module 1000' with the exception that the gaps between layers 1005 and 1012' are filled with photo-refractive material 1052. Photo-refractive material 1052 is exposed to patterned actinic radiation to form Z-waveguide segments 1054' in photo-refractive material 1052 at the locations where vertical light beams are located. The SOLNET process is preferably used to define the segments 1054'.

FIG. 167 shows a modified module 1050" of module 1000" of FIG. 163. Module 1050" is identical to module 1000" with the exception that the gaps between layers 1005 and 1012 are filled with photo-refractive material 1052, and that the blank through-holes 1020 are filled with photo-refractive material 1052. Photo-refractive material 1052 is exposed to patterned actinic radiation to form Z-waveguide segments 1054" in photo-refractive material 1052 at the locations where vertical light beams are located. Segments 1054" pass through the filled through-holes 1020. The SOLNET process is preferably used to define the segments 1054".

FIG. 168 shows a modified module 1050''' of module 1000''' of FIG. 164. Module 1050''' is identical to module 1000''' with the exception that the gaps between layers 1005 and 1012 are filled with photo-refractive material 1052. Photo-refractive material 1052 is exposed to patterned actinic radiation to form Z-waveguide segments 1054' in photo-refractive material 1052 at the locations where vertical light beams are located. Segments 1054' abut next to Z-waveguide segments 1030 and lenses 1040 to form composite Z-waveguide segments between layers 1005. The SOLNET process is preferably used to define the segments 1054'.

The embodiments of FIGS. 165–168 provide simple photonic Z-connections that are self-aligned and formed in one step, and provide an efficient coupling of vertically coupled light beams.

FIG. 169 shows a modified module 1060 of module 1000 of FIG. 161. Module 1060 is identical to module 1000 with the exception that the gaps between layers 1005 and 1012 are filled with photo-refractive material 1052, and in that layers 1012 are replaced by layers 1012' which comprise photo-refractive material 1052 in the three-dimensional volumes 1002. Photo-refractive material 1052 in the gaps and in layers 1012' is exposed to patterned actinic radiation to form Z-waveguide segments 1054''' in photo-refractive material 1052 at the locations where vertical light beams are located. Each segment 1054''' extends through a layer 1012' and one or two gaps one either side. The SOLNET process is preferably used to define the segments 1054'''. This structure and method of making provide a module with very high-efficiency Z-direction coupling with Z-direction waveguides that are self-aligned and formed in one step.

The process previously described with respect to FIGS. 38–41 may be augmented to include the placement of Z-waveguide segments, lenses, holographic optical elements (HOEs), and diffractive optical elements (DOEs). An example thereof is described with reference to FIGS. 170–176 where an exemplary opto-electronic/chip layers 1012' with an integral Z-waveguide segment, optical lens, electrical via, and two chip/opto-electronic devices.

Referring to FIG. 170, a plurality of electrical traces and pads 331 are formed at the surface of a temporary support substrate 412'. Any of the previously described methods of attaching and removing temporary substrates may be used (see U.S. Pat. No. 5,258,236 to Arjavalingam et al.). The traces may be formed by any of the well-known metal formation methods, and may be formed onto of the surface of substrate 412', may be embedded within a top material layer of the substrate 412', or may be embedded into preformed trenches in the top surface of substrate 412'. The latter of which is shown in FIG. 170. Vias posts 333' are thereafter formed on top of surface 412', each preferably on top of a pad 331. The via posts may be formed by any of the methods previously described for the formation of via post 333 in FIGS. 38–45.

Referring to FIG. 171, the next step in the process is to attach Z-waveguide segment 1030, optical lens 1040, and two chip/opto-electronic devices 904A and 904B to the top surface of temporary substrate 412' (chip/devices 904A and 904B may have any electrical and/or optical functions). To do this, a thin polymeric adhesive buffer layer 414 may be formed over the surface of substrate 412' by spin coating. Preformed waveguide segment(s) 1030, preformed lens(es) 1040, and chip/optical devices 904A and 904B (and active components) are then set in place and adhered to layer 414. Layer 414 may be soft-baked to increase its tackiness, and to reduce the amount of solvent evolution in a subsequent cure step if the material of layer 414 requires curing and contains solvent. This chip attachment step is the same step used in the previously-described methods for forming active substrate 20 (FIGS. 11–18) and chip layers 350 (FIGS. 38–45), and the reader may refer there for further details. If a seed layer was previously used to form pads 331 and via post 333', then it is preferable that a thin chromium adhesion layer be formed over the seed layer before layer 414 is formed. Such an adhesion layer is also preferred if material 414 has an unacceptably poor adhesion to the particular material of substrate 412'. Instead of an optical lens, device 1040 may comprise a holographic optical element, and a diffractive optical element.

As previously describe with respect to FIGS. 11–18 and 38–45, the epitaxial lift-off process may be used to make and set chip/devices 904A and 905B, and the reader is referred to those sections of the Specification for further details. An analogous method may be used to make and set the Z-waveguide segments 1030 and optical lenses 1040. These optical components may be formed onto of a temporary layer which can be later dissolved without disturbing the optical components. This temporary layer may be set upon a rigid substrate, if desired. In the case at hand, a silicon wafer with a thick silicon oxide layer as the temporary layer may be used. The optical components are formed on top of the temporary layer, and separated from one another by etching or patterning. A top supporting substrate, such as a polymer film like as Mylar, is then laminated to the top surfaces of the optical components (e.g., 1030 and 1040), and the entire substrate is then exposed to a etchant which etches glass but not the optical components (e.g., hydrofluoric acid when the optical devices are made from common polymer optical materials). The etching results in the release of the optical components from the temporary layer while still being attached to the top supporting substrate (e.g., polymer film). The components may then be cut from the polymer film, or they may be held by the film until used. In the latter case, layer 414 is soft-baked to a point where it has more tacky adhesion force than the laminated top supporting substrate. When the component is pressed in the tacky layer 414, it is retained on layer 414 when the top supporting substrate is pulled away, and it is separated from the top supporting substrate.

Instead of using layer 414 to attach chip/devices 904A and 905B, Z-waveguide segments 1030 and optical lenses 1040 to substrate 412', metal may be deposited on the back surfaces of these components and the top surface of substrate 412', and the components may be adhered by soldering, metal diffusion bonding, transient liquid alloy bonding, AuSn bonding, AuInSn bonding, AuIn bonding, Pd bonding, or other similar bonding processes. Once layer 1012' is completed, the metal attached to the bottom surfaces of Z-waveguide segments 1030 and optical lenses 1040 is removed, such as by etching in an selective etchant. Also by the time layer 1012' is completed, the metal pads at the back surfaces of the chips/devices 904 should be electrically isolated from signal lines on the bottom surface of layer 1012' (but a coupling to a fixed ground or bias potential may be used if required by the electrical circuit).

Since a subsequent polishing process is going to be used, chips/devices 904 preferably have electrodes 27 which have the multilayer metal structure 27*x*, 27*y*, 27*z* described above (FIG. 11), with sub-layer 27*y* comprising a polish-stop metal like tungsten (W). This multilayer structure is best formed while the IC chips are still in wafer form (i.e., not diced). If the chip has large areas of its surface in which there are no electrodes, then it is preferable to deposed an isolated patch of polish-stop material in these areas in order to prevent dishing in the subsequent polishing process. Such a polish-stop layer is preferably formed over the chip's top passivation layer.

While FIG. 171 shows that chips/devices 904 are placed in the face up position, it may be appreciated that they may be placed in the face down position. If the pads and electrical traces for the bottom surface of layer 350 have been formed in the previous steps, it is then possible to not use adhesion layer 414 and to then directly contact the pads of the chips to the traces of the bottom surface by metal diffusion bonding, solder bonding, WIT connection, transient liquid alloy bonding, etc. Once the chips have been so joined, a high-temperature underfill material may be dispensed under the chips to prevent air pockets.

Referring to FIG. 172, the next step in the process is to form a polymeric cladding layer 416' over the via posts 333', chips/devices 904, Z-waveguide segments 1030, and optical lenses 1040 and the exposed portions of adhesion layer 414. Layer 416' will encase these components in a single polymeric film. The polymeric layer 416' is preferably formed by spin coating the material. After the layer is formed, it is cured if the material requires curing, which is usually the case. If the thickness of the components 904, 1030, and 1040 is greater than about 15 μm, two or more separate coating and curing steps may be required for some polymeric materials, particularly those materials that undergo significant shrinkage during curing. Cladding layer 416' has an index of refraction which is less than the index of refraction of the core region of devices 1030 and 1040.

The next step in the process is to expose the tops of via 333', Z-waveguide segment 1030, lens 1040, and contact pads 27. One approach for this is to pattern-etch cladding layer 416' in a controlled manner to remove those portions of layer 416' which overlay these tops. This may be done by plasma etching with a patterned metal mask disposed on the top of the substrate. The result of this step is shown in FIG. 173. Another method is to polish the top of the substrate to expose the tops and to provide a more planar surface. Conventional polishing and chemical-mechanical polishing processes may be used, and such polishing techniques are well known to the art. The result of the polishing step is shown in FIG. 174. Also shown in FIG. 174, pads 332' and optionally electrical traces 332' have been formed onto the exposed tops of via 333' and pads 27. At this point, layer 1012' is fully formed.

At this point, an OE waveguide layer 1005 may be attached to the top surface of opto-electronic/chip layers 1012' and secured by contact pads 332', as shown in FIG. 175. Finally, temporary substrate 412' can be removed by any of the previously described methods, the result of which is shown in FIG. 176.

It may be appreciated that the above methods enable one to easily integrate preformed optical lenses, holographic optical elements, diffractive optical elements, and Z-direction waveguides into chip/opto-electric layers. These preformed components may be coated with protective coatings that guard against scratching, and may have anti-reflective coatings, such as on their side surface to reduce reflections and noise in the layer 1012'.

In the preceding fabrication method, the Z-direction waveguides and other components were pre-fabricated, then set in place and encased by cladding layer 416'. It may be appreciated that cladding layer 416' may be replaced by a layer of photo-refractive material and then exposed to patterned actinic radiation to define the Z-direction waveguides. This approach is illustrated by FIGS. 177–180. Starting from the construction shown in FIG. 170, components 904A, 904B, 333', and 1040 are placed on the surface of the substrate, as previously described above with respect to FIG. 171. The result of this step is shown in FIG. 177, where a photo-refractive material layer 414' has been used in place of buffer layer 414. Next, a layer 416' of photo-refractive material is formed over the surface of the substrate in the same manner as layer 416 in FIG. 172 was formed. The resulting structure is shown in FIG. 178. Next, the photo-refractive layer 416' is selectively exposed to actinic radiation 990 through a mask 991 which has apertures 992 where Z-waveguide segments 1030 are to be formed. The exposure creates a Z-waveguide segment 1030 which passes through layers 416' and 414'. The substrate may be finished as previously described to expose the tops of via 333', pads 27, and optical lens 1040, and to attach an OE waveguide layer 1005.

It may be further appreciated that the above method can be expanded to form lenses, holographic optical elements and diffractive optical elements in situ within layer 416'. As is known to the art, these additional devices can be formed by various methods, such as surface etching of layer 416', film deposition with thickness modulation, modulation of the refractive index of several layers, and selective exposure of a photo-refractive material to actinic radiation.

It may be appreciated that the above methods enable one to easily integrate optical lenses, holographic optical elements, diffractive optical elements, and Z-direction waveguides into chip/opto-electric layers.

Referring in detail now to FIGS. 181–316 for descriptions of various additional preferred embodiments of the inventions, there is seen in FIGS. 181–200 illustrations for supporting an exemplary method of a fabrication process of optical interconnect substrates. In FIGS. 181–182 electrodes 1200 are formed on a base of substrate 1400 by conventional deposition and photo-lithographic steps that are well known to the art. In addition to forming electrodes 1200, alignment marks for further processing steps may be formed, or these alignment marks may be etched in the surface of base substrate 1400 prior to forming electrodes 1200. Subsequently, a cladding layer 1600 is formed on base substrate 1400, such as by spin-coating a fluidized polymer, and covers the electrodes 1200. Preferably, cladding layer 1600 is manufactured from a material which possesses adhesive capabilities, such as previously mentioned Hitachi's fluorinated polyimide OPI-N1005, or a solvent-free (non-gaseous) epoxy materials. The thickness for cladding layer 1600 may be any suitable thickness, such as from about 1 $\mu$m to about 20 $\mu$m, preferably from about 5 $\mu$m to about 15 $\mu$m, after any shrinkage from a subsequent curing step.

Referring now to FIGS. 185–186, a waveguide layer 1800 of optical core material is disposed on the cladding layer 1600 by any suitable method, such as by spin coating where the optical core material comprises a polymer material which has been fluidized (i.e., made into a viscous fluid) with a solvent. The fluidized core material may therefore comprise, for example, Hitachi's fluorinated polymide F-PI-N3405 (Hitachi Chemical Co.). Waveguide layer 1800 is then exposed to a softbaking step to remove the fluidizing solvent, and then to a curing step which is appropriate for its material composition, such as by exposure to heat, radiation, time, or a combination thereof. Guidelines for the softbaking and curing of core material, cladding materials, and electro-optical materials are provided by the manufacturers. The thickness of waveguide layer 1800 is preferably less than about 30 $\mu$m, and more preferably from about 15 $\mu$m to about 25 $\mu$m.

After the waveguide layer 1800 has been disposed on the cladding layer 1600, optical waveguides 2000 are then defined in waveguide layer 1800 by patterning with a conventional dry etch process that employs a patterned etch mask disposed over portions of the waveguide layer 1800 which are to be retained. Wet etching may also be employed. In FIGS. 187 and 188 waveguide layer portions 1800a are the sections of the waveguide layer 1800 which are to be etched or otherwise removed to produce the layered structures of FIGS. 189 and 190, respectively.

A layer 2400 of cladding material is subsequently formed over the exposed regions of cladding layer 1600 and optical waveguides 2000, as best shown in FIGS. 191 and 192. This results in the tops and sides of the optical waveguide 2000 being covered with cladding material. Subsequently via apertures 2800 may be formed in layers 2400 and 1600 by any number of conventional ways. Such methods includes laser drilling and wet or dry etching using a photolithographical defined etch mask. In FIG. 194 one of the via apertures 2800 has a slanted wall 2800s. Once the via apertures 2800 are formed, via apertures 2800 may be filled with conductive material 3200 by any conventional filling method, such as by a patterned resist mask 3600 in combinations with chemical vapor deposition (CVD), plating, etc. Metals are preferred for the conductive materials, with copper or copper mixed with another metal (e.g., a chromium and copper mixture, or a nickel and chromium and copper mixture) being one of the more preferred metals.

In FIG. 196, a reflective surface 3200s (e.g. a mirror, such as mirror 639) has been disposed on slanted wall 2800s. After the deposition of the metal, the resist masks 3600 is removed or stripped, such as by etching, to produce the structures illustrated in FIGS. 197 and 198; and then substrate 1400 is removed by any suitable conventional method to produce the structures of FIGS. 199 and 200 which may be coupled by any well known procedure (e.g. solder joining) to a printed circuit board, generally illustrated as 4000 in FIGS. 201 and 202.

Referring now to FIGS. 203–232 there is seen another embodiment of present invention wherein, as best illustrated in FIGS. 205 and 206, after electrodes 1200 are formed, an electro-optic device 1230 (e.g. a VCSEL) is disposed on substrate 1400. Subsequently cladding layer 1600 is disposed such as to cover the exposed portions of the substrate 1400 and to cover electrodes 1200 and electro optic device 1230 (see FIGS. 209 and 210). Any cladding material extending above the electrodes 1200 is removed, such as by chemical mechanical polishing (CMP), as best shown in FIGS. 209 and 210 where cladding layer 1600 has been leveled such that the tops of the electrodes 1200 collimate with the polished cladding layer 1600. In FIG. 212 and opening (or via) 1602 is formed in the cladding layer 1600 for receiving conductive material 1200b. Subsequently electrodes 1200a are disposed on the polished cladding layer 1600 such as to be in contact with electrodes 1200. In FIG. 212 one of the electrodes 1200a has been placed in conductive contact with conductive material 1200b. Electrodes 1200b and exposed portions of the polished cladding layer 1600 are then covered as shown in FIGS. 213 and 214 with an undercladding layer 1700 which may be formed or produced by spin-coating a fluidized polymer, such as previously indicated Hitachi's fluorinated polyimide. The remaining steps illustrated in FIGS. 215–232 for manufacturing an embodiment of the optical interconnect substrates are essentially similar to the steps illustrated in FIGS. 185–202 (i.e., the depositing of the waveguide layer 1800, the formation of the optical waveguides 2000, the depositing of the layer 2400, producing via apertures 2800, filling with conductive material 3200, and coupling to a printed circuit board 4000). In the embodiment of the invention illustrated in FIGS. 233–258, the substrate 1400 is removed after coupling to printed circuit board 4000, instead of before coupling as illustrated in FIGS. 199–202 and FIGS. 229–232.

Referring now to FIGS. 259–316 for another embodiment of the present invention, cladding layer 1600 is disposed on substrate 1400 as shown in FIGS. 259 and 283. This step is followed by depositing waveguide layer 1800 to subsequently produce the optical waveguides 2000 after patterning with a conventional etch process (i.e. either a dry or a wet etch process) which employs a patterned etch mask disposed over selective portions of the waveguide layer 1800. After formations of optical waveguides 2000, the layer 2400 of cladding material is subsequently formed over the exposed regions of cladding layer 1600 and the formed optical waveguides 2000, as best shown in FIGS. 265, 266, and FIGS. 289 and 290. For the embodiment of the invention illustrated in FIGS. 267–282, after deposition of the layer 2400 of cladding material, via apertures 2800 are formed, followed by depositions of conductive material 3200 with the assistance of patterned resist masks 3600 which is subsequently removed so that substrate 1440 (see FIGS. 273–274) may be coupled to one exposed side of the deposited conductive material 3200. After substrate 1400 (see FIGS. 275–276) is removed to expose another side of the deposited conductive material 3200, electrodes 1200 are deposited or otherwise formed on the exposed other side of the conductive material 3200 (see FIGS. 277–278). Electrodes 1200 may then be coupled to the printed circuit board 4000 as shown in FIGS. 279–280, followed by removal of substrate 1440 (see FIGS. 281–282).

In the embodiment of the invention in FIGS. 291–312, after depositing layer 2400, electrodes 1200 are then formed on layer 2400 along with disposing on layer 2400 electro-optic device 1230. Intermediate cladding material 1660 is then disposed as shown in FIGS. 297–298. A polishing step (e.g. CMP) may then be employed to polish or trim down the top portions of electrodes 1230 such that there is registry among the top of the electro-optic device 1230, the tops of the electrodes 1230, and polished intermediate cladding material 1660 (see FIGS. 299 and 300). Subsequently electrodes 1200a are disposed on electrodes 1200. In FIG. 302 one of the electrodes 1200 is disposed on the electro-optic device 1230. Substrate 1440 is then preferably coupled to electrodes 1200a (see FIGS. 303 and 304), and substrate 1400 may thereafter be removed. Via apertures 2800 may then be formulated in cladding layer 1600 and layer 2400 down to electrodes 1200 and electro-optic device 1230. As previously indicated, depositions of conductive material 3200 may then follow with the assistance of patterned resist marks 3600 (see FIGS. 398 and 310) which may be removed, as shown in FIGS. 311 and 312, to leave exposed portions of the conductive material 3200 that are then coupled to the printed circuit board 4000. Substrate 1440 may be conveniently removed to expose electrodes 1200a and electro-optic device 1230.

Figure 317:
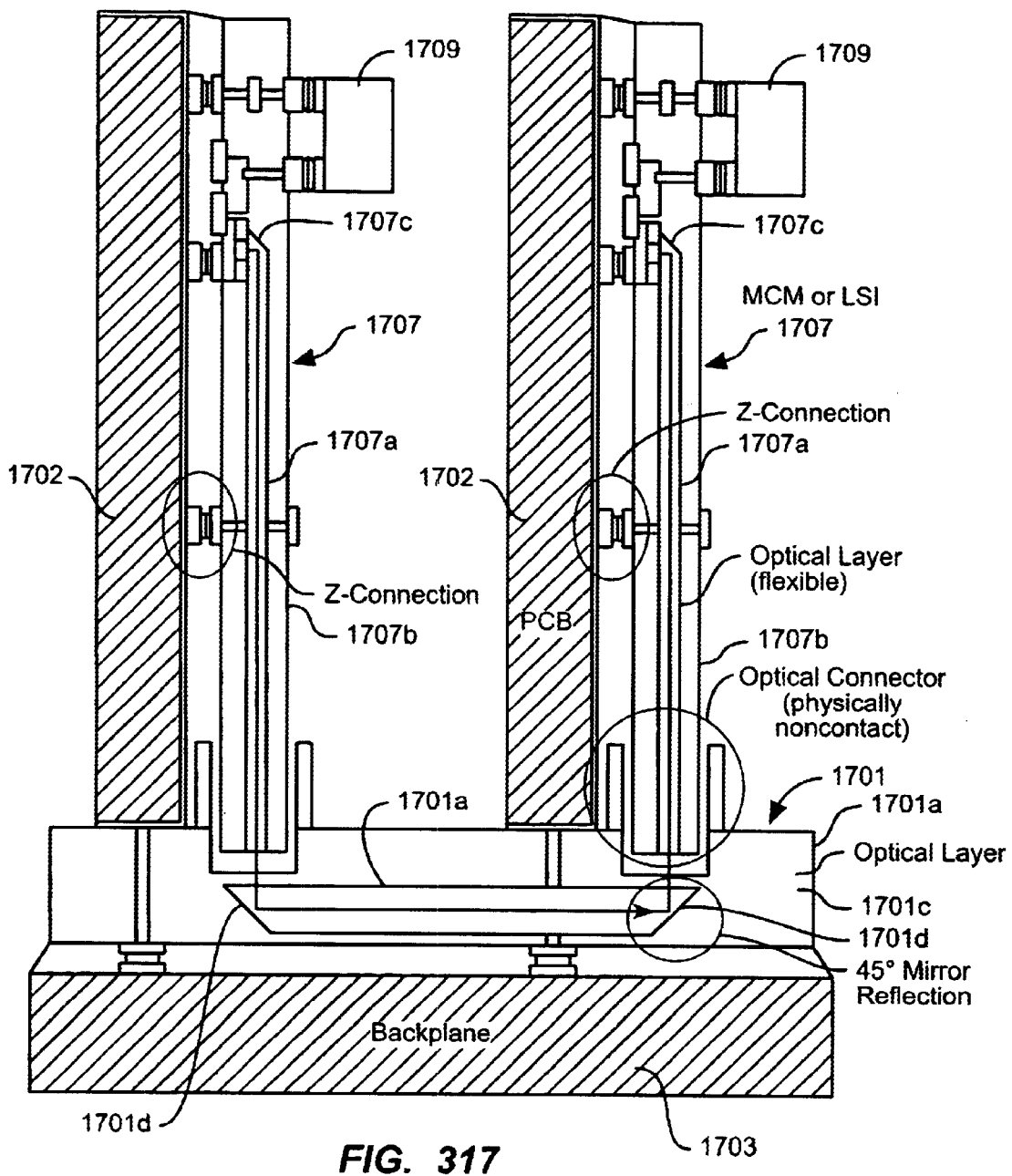
FIG. 317 illustrates an example for surface mount type waveguide coupling in an optical PCB and backplane.

Referring now to FIG. 317 there is seen an illustration of a surface mount type waveguide assemblies 1701 and 1707—1707 for coupling a pair of PCBs 1702—1702 to a backplane 1703. The waveguide assembly 1701 includes optical layer 1701a having core layer 1701b with a pair of 45° mirror surfaces 1701d—1701d and embedded within cladding material 1701c. Each waveguide assembly 1707 comprises a core layer 1707a spaced from and optically coupled to core layer 1701b through one of the mirror surfaces 1701d. Each core layer 1707a is embedded in cladding material 1707b. Each core layer 1707a also terminates in a mirror surface 1707c. An MCM or LSI 1709 may be coupled to the PCB 1702 through the cladding material 1707b.

Referring now to FIGS. 318–321 there is seen an example of monolithic type optical coupling structure and fabrication process image. On an optical layer or substrate 1710, in which waveguides 1712 are formed with mirrors 1714 (or grating or hologram), polymer (for example polyimide) 1716 and metal layer (for example Cu) 1718 are attached. Referring to markers 1720 on the optical layer 1710, holes for guiding optical components are formed on the polymer layer 1716 by for example UY-YAG laser. The metal layer 1718 acts as an etch stop. Using the polymer layer 1716 as a mask, underlying metal layer 1718 is etched away by wet chemical etching, to expose waveguide portions 1712a.

FIGS. 322–328 shows another example in which a multiple-polymer/metal layer structure is used. Here, 3-step case is shown. The layer structure can be made by bonding polymer and metal-coated polymer layer (or block), or bonding buildup layer, or direct buildup on the optical layer or optical substrate. More specifically, on top of polymer 1716, a polymer 1722 and metal 1721 may be deposited, followed by the depositing of polymer 1726 and metal 1724. A portion of polymer 1726, may be removed (e.g., by laser etching) to expose metal 1724 (see FIG. 323), followed by removal of metal 1724 to expose polymer 1722 (see FIG. 324). Polymer 1722 may then be removed by laser etching, or the like, to expose metal 1721, which may be subsequently removed (e.g., by wet etching) to expose polymer 1716. As previously indicated for FIGS. 320–321, polymer 1716 and then the underlying metal layer 1718 may be removed to expose waveguide portions 1712a. Instead of laser etching, reactive ion etching (RIE) etc. are also applicable. The polymer and metal layers are covered on either a part or the whole of the optical layer or optical substrate 1710. In addition to the coupling area, other areas can also be etched if necessary. The metal layers are effective to improve mechanical strength of the coupling structures. When photo-definable polymer, for example, photoplastic material, is used for the polymer layer, the patterns can be made by exposure/develop. In this case, the metal layer is not always necessary. When the polymer is photo-definable polymer, the etching can be done by exposure/develop procedure instead of laser or RIE.

FIGS. 329–331 shows precise process steps corresponding to FIGS. 318–321. In the case of FIGS. 332–335, polymer 1716 is etched by using metal window (i.e. photoresist 1730 and metal 1732) as a mask. FIGS. 336–342 illustrate the precise process steps corresponding to FIGS. 322–326. In FIGS. 343–349, an optional case is illustrated in which some side etch occurs such that openings 1737a, 1737b, and 1737c vary in size. Due to multiple-layered metal hole, guide size accuracy can be maintained. In the case that a gap 1738 is needed at coupling edges, the process illustrated in FIGS. 350–356 is effective. For example, the lowest polymer layer is etched with smaller diameter than the upper layers by using laser etching. For the example in FIGS. 357–361, the lowest polymer layer 1716 remains (there is no metal layer 1718) to prevent the optical layer surface from being damaged by inserted optical components. This configuration is also useful for easy in/out-operation.

FIGS. 362–364 illustrate an example of optical layer 1710 being directly built-up together with metal layer 1718 and polymer layer 1716. Optionally, the optical layer 1710 is formed on a metal-coated polymer layer, more specifically on metal layer 1718 which supports the polymer layer 1716. An alternate example is shown in FIGS. 365–374, more specifically, there is seen in FIG. 365 a formation substrate 1736 supporting the polymer layer 1716 which supports metal layer 1718. FIG. 366 is a side elevational view of the assembly in FIG. 365. An underclad coat 1738 is disposed over metal layer 1718, followed by wave guide 1712 deposition, patterning, and subsequent deposition of polymer layer (i.e. optical substrate 1710). An overclad layer 1742 is disposed on top of the optical substrate 1710 including waveguides 1712. An opening 1744 is subsequently cut through overclad layer 1742, waveguide 1742 and undercoat 1738. FIG. 374 is a side elevational view of the assembly of FIG. 373 after the lower substrate has been removed and after the assembly has been rotated 180°.

Referring now to FIGS. 375–377 for an example of an optical connector fabrication process, there is see in FIG. 375 a side elevational view of an optical assembly having optical substrate 1710 including embedded waveguide layer 1712, and metal layer 1718 disposed on the optical substrate 1710, a polymeric layer 1716 disposed on the metal layer 1718, and patterned upper metal layer 1721 disposed on the polymeric layer 1716. FIG. 376 is a side elevational view of the optical assembly of FIG. 375 after the exposed portion of the polymeric layer 1716 has been etched down to the lower metal layer 1718. FIG. 377 is a side elevational view of the optical assembly of FIG. 376 after the exposed lower metal layer 1718 has been etched down to the optical substrate 1710. Thus, in FIGS. 375–377, metallization, electrode patterning, z-connection, and substrate removal process, etc. can be incorporated. In FIGS. 378–387, there is illustrated the process steps for producing the optical assembly of FIGS. 365–374, but additionally including patterned electrode 1748 disposed underneath polymeric layer 1716.

Referring not to FIGS. 388–395, there is seen optical substrate 1710 having a ridge or lug 1710a and a plurality of waveguides 1712. Releasably separated from the optical substrate 1710 are combined and interconnected patterned polymeric layer 1716, patterned metal layer 1721, patterned polymeric layer 1722, patterned metal layer 1724, patterned polymeric layer 1726, and patterned metal layer 1727 (see FIG. 388). Patterned polymeric layer 1716 includes recess 1716a wherein the ridge or lug 1710a lodges. The embodiment of the invention in FIG. 389 includes patterned metal layer 1718 supporting polymeric layer 1716, and patterned metal layers 1721 and 1724 are respectively formed with lips 1721a and 1724a. In FIGS. 390 and 391, the optical substrate 1710 includes substrate recess 1710b wherein polymeric lugs 1716b lodge. As best shown in FIGS. 392 and 393, the optical substrate 1710 may include a pair of recesses 1710b—1710b for receiving a pair of lugs 1716b—1716b respectively. In FIGS. 394 and 395 optical substrate 1710 includes a pair of lugs 1710a—1710a for lodging in a pair of recesses 1716a—1716a. Thus, FIGS. 388–391 and 392–395 represent examples hybrid type structures. The fabrication method of guiding parts are the same as described in the monolithic type structure section. The difference is that guiding holes (e.g., recess(es) 1710b) and/or bumps (e.g., lug(s) 1710a) are formed on both the optical layer (or optical substrate 1710) and guiding parts.

FIGS. 396–398 illustrate an example to make guiding parts by exposing laser or reactive ion to a stacking structure with metal layers with aligned holes. FIGS. 399–406 illustrates various bond examples to make metal-incorporated structures. As shown in FIGS. 399–406 bonding sheet 1770 and adhesives 1772 and 1774 are employed for interconnecting or bonding respective metal or polymer layers.

While most of the illustrations herein are described for laser or RIE process, it is to be understood that any suitable other etching or cutting processes may be employed. Also, the polymer 1716 can be replaced by a photo-definable polymer 1778 (see FIG. 407), like photoplastic material (the SU-8) reported by Swiss Federal Institute of Technology. The photo-definable polymer 1778 may be patterned and etched down to metal layer 1718 (see FIG. 408). As best shown in FIG. 409, metal layer 1718 may be etched down to optical substrate 1710.

Referring now to FIGS. 410–429 there is illustrated super-wave multiplexing and all-optical coding and decoding methods in optical networking. By modulating optical signals with definite frequencies or branching an optical signal into a plurality of light signals and shifting the mutual phases and superposing them in an optical route, super-waves are generated. In addition to TDM and WDM super-waves provide another multiplexing dimension in optical networking. All-optical coding/decoding method using optical waveguide circuits enables low-cost and large multiplexing. A new dimension of multiplexing is provided, including simple encoding/decoding methods in optical networking. Due to the extremely rapid growth of internet, optical network load is increasing by a factor of 10 every two years. To follow the demand, DWDM implementation into a lot of optical networking systems is in progress. However, it is apparent that the data traffic will exceed the DWDM capacity in the future. Therefore, what is needed and what is being proposed is a new multiplexing dimension by generating "Super-Wave (SW)".

FIGS. 410 and 411 show whole system image for Super-Wave Multiplexing (SWM). Electrical signals (for example, 10 Gbps) are input into a coding unit 1820. The signals are converted into optical signals 1824 that are transmitted using SW as a carrier. The wavelengths of SW are shorter than that of input electrical signals and longer than that of lightwave. The relationship between the SW and lightwave is analogous with that between the super-lattice and the real lattice in semiconductor crystals. The frequency of SW is typically 100 Gbps–1 Tbps or higher, implying that the wavelength is ~1 mm–10 um or shorter. In the schematic depicted in FIGS. 410 and 411, two channels are multiplexed in the coding unit 1820 by using SWs of different wavelengths. The transmitted optical signals 1824 are demultiplexed in a decoding unit 1828 to be converted to electrical signals. The SWM is preferably coupled with WDM and/or TDM, meaning that the coding unit 1820 is connected with wavelength MUX and the decoding unit 1828 is coupled with wavelength DEMUX. As shown in FIG. 410, each pulse included in an aggregate comes from the same origin, branching into each pulse as will be described later with respect to the schematic in FIGS. 415–419, in order to cause coherent interference between the pulses.

FIGS. 412 and 413 illustrates an exemplary SWM wave pattern. The signals of Ch-SW 1, 2, 3, and 4 respectively designated with numbers 1830, 1832, 1834, and 1836, are coded by SW of wavelength Λ1, 2, 3, and 4, respectively. Ch-SW 1, 2, 3, and 4 in FIG. 413 and FIG. 414 are respectively designated 1830a, 1832a, 1834a, and 1836a, and 1830b, 1832b, 1834b, and 1836b. FIG. 414 also illustrates an exemplary SWM wave pattern. In this case, the pulse duration is longer than the interval between the adjacent pulses. The pulses are superposed with a spatial shift (in other words, phase shift) of Λ1, Λ2, Λ3, and Λ4, respectively corresponding to Ch-SW 1, 2, 3, and 4.

FIG. 415 illustrates a coding unit for SWM. For Ch-SW 1, pulsed laser light is divided into branches, which are coupled to a main waveguide. By adjusting the connection period to be Λ1, SW of Λ1 is generated. The electrical signal (E) to optical signal (O) conversion of the input electrical signals are performed by a light modulator 1842. For Ch-SW2, pulsed laser light is divided into 4 branches, which are coupled to a main waveguide with a period of Λ2, generating SW of Λ2.

FIG. 416 shows another embodiment of a coding unit for SWM. E/O conversion of the input electrical signals are performed by direct modulation of a light source 1844. For Ch-SW1, a light source is divided into branches, which are coupled to a main waveguide. By adjusting the spatial delay between adjacent superposed optical signals to be Λ1, SW of Λ1 is generated. For Ch-SW2, the light source is divided into 4 branches, which are coupled to a main waveguide with a period of Λ2, generating SW of Λ2.

In the example shown in FIG. 417, E/O conversion of the input electrical signals are performed by a short-pulsed light source 1846. For Ch-SW1, the optical signal is divided into a plurality of pulses, and the pulses are superposed into a main waveguide with a spatial shift of Λ1 by using arrayed-waveguide AWG 1, generating SW of Λ1. For Ch-SW2, SW of Λ2 is generated by AWG 2, which has different phase-shift characteristics from AWG 1. The two SWs are combined by an MMI (Multimode Interference) coupler 1848.

In another example as shown in FIG. 418, E/O conversion of the input electrical signals are performed by direct modulation of a light source 1849. For Ch-SW1, the optical signal is divided into a plurality of pulses, and the pulses are superposed into a main waveguide with a spatial shift of Λ1 by using arrayed-waveguide AWG 1, generating SW of Λ1. For Ch-SW2, SW of Λ2 is generated by AWG 2, which has different phase-shift characteristics from AWG 1. The two SWs are combined by an MMI coupler.

In the example shown in FIG. 419, E/O conversion of the input electrical signals are performed by the light modulator 1842. For Ch-SW1, the optical signal is divided into a plurality of pulses, and the pulses are combined into a main waveguide through the MMI coupler 1848 with a spatial shift of Λ1 by adjusting the branching waveguide length. For Ch-SW2, similarly, SW of Λ2 is generated. The two SWs are combined into the same optical route.

FIG. 420 shows an example of a decoding unit for SWM. The transmitted optical signal is introduced from a main waveguide through optical amplifier 1850 to branch waveguides B1, 2, 3, and 4 which optically communicate with photodetector 1854. For Ch-SW 1, the branching period is Λ1. This enables synchronous detection of the pulse train of Ch-SW 1, which results in strong peaks, while the optical signals of the other channels make only asynchronous background. For Ch-SW2, the branching period is Λ2, which enables synchronous detection of the pulse train of Ch-SW2.

FIG. 421 shows another example of a decoding unit for SWM. The structure is essentially the same as that shown in FIG. 420. The difference is in the end structure of branch waveguides that are aligned in an array to radiate the optical signals into free guided space where a waveguide lens is formed. This configuration improves S/N ratio, because synchronous optical signals propagate in a definite directions. Therefore, by putting PD 1854 on the path of the synchronous optical signal path, background noise can be reduced.

In the method illustrated in FIGS. 420 and 421, the periods between the branching points are not essential, since the total path lengths are to be controlled to realize synchronous detection for each channel. In order to achieve uniform power distribution for the branches, the branching ratio may be adjusted as, for example, Ipass:Itap=3:1, 2:1, 1:1, and 0:1 for B4, 3, 2, and 1, respectively. The connection period may be modulated; that is, the distance between the connections should not always be constant, but may be irregular to generate more complicated SWs.

FIG. 422 shows a third example of a decoding unit for SWM. The structure is essentially the same as the one illustrated in FIGS. 420 and 421. In this case, by adjusting the total path lengths, optical signals for Ch-SW1 and 2 propagate in definite directions. By putting PDs 1854 on the path of each channel, decoding may be achieved in one set of branches.

The upper illustration in FIG. 423 shows a fourth example of a decoding unit for SWM. The structure is the same as the above-mentioned one. Pulse shape is near-rectangular. The lower illustration in FIG. 423 shows a fifth example of a decoding unit for SWM. The structure is essential the same as the previously described one. In this case, to separate the two SWs, a phase difference between the two SWs is used. Namely, the difference in spatial period between SW1 and SW2 causes a diffraction angle difference between the two SWs. By putting PDs 1854—1854 on the path of each channel, decoding can be achieved.

FIG. 424 shows a sixth example of a decoding unit for SWM. The input optical route is connected to an arrayed waveguide (AWG) 1858. The difference in spatial shift amount between SW1 and SW2 causes a diffraction angle difference between the two SWs. By putting PDs 1854—1854 on the path of each channel, decoding can be achieved.

FIG. 425 shows a detail description on the relationship between the phase of pulses and the propagation direction of radiated light in free space region. For example, if the pulse trains of Ch-1 in the branching waveguides are synchronized, the radiated light will propagate to the normal direction. In this case, for the pulse trains of Ch-2 in the branching waveguides, a phase shift will arise due to the difference in pulse periods (Λ1 and Λ2), resulting in a radiated light propagation with a different angle from the Ch-1 light propagation. The angle difference depends on Λ.

FIG. 426 shows a similar description as that shown in FIG. 425. In the case of FIG. 425, for Ch-1, pulses of m, m+1, m+2, . . . , m+S, . . . , . . . are synchronized (S=1). In the case of FIG. 426, pulses of m, m+2, m+4, . . . , m+S', . . . , . . . are synchronized (S=2). With an increase in S, the angle difference increases. It is to be understood that S is not restricted to integers. Arbitrary values are acceptable. The channel counts are not limited to two. More channels may be included in the multiplexing proposal.

The actual structure for AWG 1858 may be designed by state of art technology as shown in the references: T. Miya, IEEE Journal of Selected Topics in Quantum Electronics, Vol. 6-(1), 38 (2000), K. Kato et al., IEEE Journal of Selected Topics in Quantum Electronics, Vol. 6 (1), 4 (2000), both incorporated herein by reference thereto.

FIG. 427 illustrates examples of coded wave pattern. The upper schematic in FIG. 427 shows a double SW case, where SW is coded by shorter-wavelength SW. The lower schematic in FIG. 427 shows a coding with arbitrary patterns.

FIG. 428 shows an example of an all-optical coding unit. For Ch-1, all the divided pulsed laser lights are connected to a main waveguide, resulting in full pulse train as output. For Ch-2 and 3, some of the divided waveguides are disconnected to the main waveguide, inducing coded pulse trains. For Ch-4, a non-equal branching ratio is provided for the divided lights, which generates a coded waveform with non-equal pulse heights.

FIG. 429 illustrates another embodiment of all-optical decoding unit. The pulse train of Ch-2 induces a grating with a period of Λ1, and that of Ch-2 a grating of Λ2. The gratings diffract laser light towards certain directions depending on the period. By collecting the diffracted light by waveguide lens 1871—1871, the signals of Ch-SW1 and 2 are detected by photodetectors (PDs) 1854—1854 separately. For the nonlinear optical waveguide, compound semiconductor with multiple quantum wells and/or quantum dots, polymer, J-aggregate compound, etc. may be used. In order to enhance the diffracted light intensity, it is desirable to increase the light intensity of the pulse trains. To do this, insertion of optical amplifier 1842 is effective. FIG. 429 also illustrates an embodiment of all-optical decoding unit for coded patterns. The transmitted optical signal is introduced into nonlinear optical waveguide. The refractive index is modulated by the optical pulse trains. In this case, matched filter method can be applied. Matched filters for each coded pattern are placed between the two waveguide lenses 1871—1871. When the pulse train of Ch-2 passes through the nonlinear optical waveguide, a strong correlation peak is induced at PD 1854 for Ch-2 through the matched filter for Ch-2. Similarly, when the pulse train of Ch-3 passes through the nonlinear optical waveguide, a strong correlation peak is induced at PD 1854 for Ch-SW3 through the matched filter for Ch-3. Thus, the signals of Ch-1 and 2 are separately converted into electrical signals. Insertion of the optical amplifier 1842 is effective to improve the S/N ratio.

Referring now to FIGS. 430–438, there are illustrated improved methods for producing mirrors and filters. For optical waveguide, vertical mirrors or filters are necessary in many applications. Vertical mirrors and filters are planes with 45° angle with respect to a horizontal surface, and direct laser from horizontal movement to vertical movement (or vice versa). Formation of mirrors and filters with a smooth surface and an accurate angle with respect to a horizontal surface is desirable.

A common practice for vertical mirror formation is using tilted laser cut or plasma etching. The surface and angle control for those processes is always a challenge. A new mirror and filter fabrication process is proposed and is illustrated in FIGS. 430–438. The approach employs anisotropic etching of thin (50 to 100 um) silicon wafers to form mirrors or filters.

It is well known that anisotropic etching of silicon wafers can form very smooth planes with about 54.74° angle to surfaces. The plane is usually a top surface that is associated with silicon wafers. It is proposed to align the silicon such that one of the surfaces is orientated at 45° to the optical substrate. Two ways are proposed to make this 45° angle. The first method is to cut the wafers in such a manner that the top surface is about 9.74° offset towards an orthogonal plane. By doing that, the wafers are oval instead of round. The second method is to change the seed orientation during the silicon boule (ingot) formation. The seed is so orientated that the top surface is about 9.74° from the orthogonal plane. The etching of such silicon wafer will form one plane with 45° angle to the top surface. The etched surface can serve as the mirror or filter for waveguide.

Referring now to FIG. 430, a clad layer 1873 is disposed on top of a substrate 1874. The clad layer 1873 is a polymer, usually a polyimide (PI). The polyimide is soft baked, which may partially cure the polyimide. A piece of thin silicon wafer 1876 is thin laminated on top of the clad layer 1873, as shown in FIG. 431. The top surface of the silicon wafer 1876 is offset about 9.74° from a regular plane. The silicon wafer 1876 may contain vent holes (through holes) so that water can escape during the curing process. The structure is then at least partially cured; that is, totally cured, half cured, or partly cured.

A mask layer 1878 is subsequently deposited and pattern etched, as shown in FIG. 432. The mask materials may be $Si_3N_4$ or $SiO_2$ or other materials. The silicon wafer 1876 is then anisotropically etched to form silicon "islands" 1876a. One side-surface of each of the silicon islands 1876a is slanted about 45° with respect to the horizontal surface. Subsequently, reflective or filtering layers 1880 are coated and patterned on the silicon island(s) 1876a, as shown in FIG. 434. This is an optional step since the silicon layer itself may be used for some reflective/filtering applications. A core layer 1892 is then coated, cured, and planarized, together with the silicon. Finally, a second clad layer 1894 is coated and cured to produce the final structure as shown in FIG. 435.

In an alternative embodiment, instead of planarizing the core layer 1892 as shown in FIG. 435, both the core layer 1892a and the second clad layer 1894a are coated, as shown in FIG. 437; and then, optionally, the structure is planarized. The final structure is shown in FIG. 438. In addition to polyimide, epoxy, or UV-curing epoxy, or any other suitable polymeric materials, well-known to those skilled in the art, may be used as waveguide materials.

As previously indicated, one etched sidewall will be about 45 degrees relative to the top surface if the top surface is about $$9.73561 \left(\text{i.e., } acos\frac{1}{\sqrt{3}} 45\right)$$

degrees off the orthogonal plane. In another embodiment, there may be two adjacent etched sidewalls of silicon formed at 45 degrees relative to the top surface, if the top surface of the silicon is (1, 0, 2+√3). This top surface would be exactly 15 degrees off the regular orthogonal plane, instead of about 9.736 degrees. The top surface can be formed by one or both the similar two previously described methods, i.e., either by dicing the ingot at 15 degrees relative to the orthogonal plane, or by adjusting the seed orientation. This approach may not only make vertical mirrors/filters, but also horizontal mirrors (e.g., by directing laser from x direction to y direction). In order to generate a horizontal mirror, one etched silicon surface should be perpendicular (i.e., 90°) to the horizontal surface. This may be achieved by using surface as the top silicon surface, since surface is perpendicular to plane.

Referring now to FIG. 439, there is seen a device which includes an improved wire interconnect structure (WIT). The purpose of the device in FIG. 439 is to allow for the transmission of light through the improved WIT structure. This modified structure would accommodate photo polyimide or some other light transmitting chemical, as the central core material surrounded with copper. This improved photo WIT would have applications in chip to chip optical interconnects and in chip to substrate interconnects. It would provide a circuit where light could be transmitted to and from a single or multiple connections and/or sources. A photo polyimide 1911 or similar light transmitting chemical would be fabricated in conjunction with the copper WIT post 1913.

Some of the advantages of the proposed improved photo WIT include: high density optical interconnects, fine pitch optical connections, the ability to transmit light at a right angle from one substrate to another and to be able to transmit and receive light from a multiple of sources through a multiple of photo WITs. The traces that lead to and from the photo WITs would be chrome or nickel coated so as to decrease the amount of light loss as it travels the length of the photo polyimide trace. By surrounding the photo trace with chrome or nickel, the light would be reflected down the trace with a minimal loss of intensity. This coating processing would allow for slight bends in the traces and for branching. This would allow multiple photo WITs to be attached to the same host trace and it would allow multiple traces to extend from multiple photo WITs.

Manufacturable techniques for forming optical waveguide and waveguide devices were described. In the foregoing description, numerous specific details, such as layer thickness, process sequences, film compositions, etc. were set forth in order to provide a more thorough understanding of the present invention. It will be obvious, however, to one skilled in the art that the present invention may be practiced without employing such specific details. In other instances, well-known process and processing techniques have not been described in detail in order not to unnecessarily obscure the present invention.

While diagrams representing preferred embodiments of the present invention were illustrated, these illustrations are not intended to limit the invention. The specific processes described herein are only meant to help clarify an understanding of the present invention and to illustrate preferred embodiments of how the present invention may be implemented in order to form preferred devices. For the purposes of discussion, a semiconductor substrate is a substrate comprising any material or materials used in the manufacture of a semiconductor device. A substrate is a structure on which or to which a processing step acts upon.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. An optical apparatus comprising:

an optical substrate having a waveguide embedded therein, wherein the waveguide has a first and a second end;

an optical device adapted to receive light transmitted from the first end of the waveguide;

and a coupling structure for coupling the optical device to the substrate, wherein the coupling structure comprises a thin metallic layer having an aperture, and wherein at least a portion of the optical device is disposed in the aperture.

2. The apparatus of claim 1 wherein the coupling structure further comprises a thin polymeric layer having an aperture, the portion of the optical device being disposed in the aperture.

3. The apparatus of claim 1 here the coupling structure further comprises plural polymeric and plural metallic layers having co-extensive apertures, the portion of the optical device being disposed in the co-extensive apertures.

4. A method for making an optical apparatus comprising:

forming an optical substrate having a waveguide embedded therein, wherein the waveguide has a first end and a second end;

depositing a metal layer over the first end of the waveguide;

depositing a polymeric layer over the layer of metal;

forming an aperture in the metal layer and the polymer layer by removing a portion of the metal layer and a portion of the polymeric layer disposed over the first end of the waveguide; and inserting at least a portion of an optical device within the aperture so that the optical device is positioned to receive light from the first end of the waveguide.

* * * * *